US011482676B2

(12) United States Patent
Joo et al.

(10) Patent No.: US 11,482,676 B2
(45) Date of Patent: Oct. 25, 2022

(54) LIGHT EMITTING DIODE INCLUDING BORON COMPOUND

(71) Applicant: SFC CO., LTD., Cheongju-si (KR)

(72) Inventors: Sung Hoon Joo, Cheongju-si (KR); Ji-Hwan Kim, Cheongju-si (KR); Byung-sun Yang, Cheongju-si (KR); Hyeon Jun Jo, Cheongju-si (KR); Sungeun Choi, Cheongju-si (KR); Su-Jin Kim, Cheongju-si (KR); Bong-Ki Shin, Cheongju-si (KR); Soon-Wook Cha, Cheongju-si (KR); Yoona Shin, Cheongju-si (KR); Sung woo Kim, Cheongju-si (KR); Jiwon Lee, Cheongju-si (KR); Tae Young Kim, Cheongju-si (KR); Seok-bae Park, Cheongju-si (KR); Yu-rim Lee, Cheongju-si (KR); Hee-dae Kim, Cheongju-si (KR); Seongeun Woo, Cheongju-si (KR); Dong Myung Park, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 331 days.

(21) Appl. No.: 16/932,802

(22) Filed: Jul. 19, 2020

(65) Prior Publication Data

US 2021/0036233 A1 Feb. 4, 2021

(30) Foreign Application Priority Data

Jul. 29, 2019 (KR) ........................ 10-2019-0091889

(51) Int. Cl.
*H01L 51/00* (2006.01)
*H01L 51/50* (2006.01)

(52) U.S. Cl.
CPC ...... *H01L 51/0059* (2013.01); *H01L 51/0073* (2013.01); *H01L 51/0074* (2013.01); *H01L 51/5056* (2013.01); *H01L 51/5072* (2013.01); *H01L 51/5092* (2013.01)

(58) Field of Classification Search
CPC ............. H01L 51/0059; H01L 51/0073; H01L 51/0074
See application file for complete search history.

(56) References Cited

U.S. PATENT DOCUMENTS

| | | | |
|---|---|---|---|
| 2018/0123055 | A1 | 5/2018 | Park et al. |
| 2019/0207112 | A1 | 7/2019 | Hatakeyama et al. |

FOREIGN PATENT DOCUMENTS

| | | | |
|---|---|---|---|
| CN | 109155368 | A | 1/2019 |
| EP | 3660024 | A1 | 6/2020 |
| KR | 1020160119683 | A | 10/2016 |
| KR | 1020180077887 | A | 7/2018 |
| KR | 1020180134850 | A | 12/2018 |
| WO | WO2017188111 | A1 | 11/2017 |

OTHER PUBLICATIONS

The Extended European Search Report of 20187460.9, dated Feb. 15, 2021.
Office Action from Korean Intellectual Property Office of 10-2019-0091889, dated Dec. 3, 2019.

*Primary Examiner* — Anthony Ho
(74) *Attorney, Agent, or Firm* — STIP Law Group, LLC

(57) ABSTRACT

Disclosed herein is an organic light emitting diode comprising a compound represented by Chemical Formula A or B and an anthracene derivative represented by Chemical Formula H. Here, Chemical Formulas A, B, and H are as described in the specification.

26 Claims, 1 Drawing Sheet

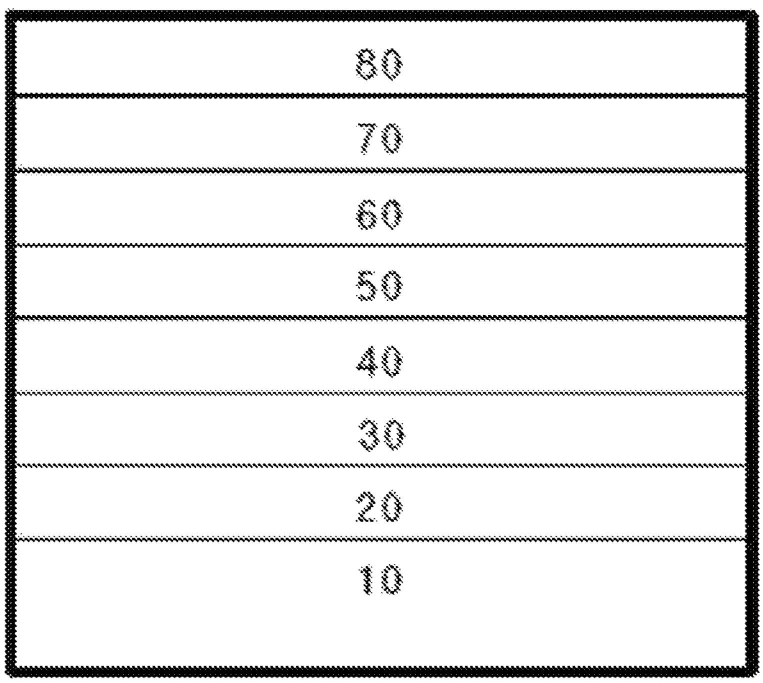
80
70
60
50
40
30
20
10

LIGHT EMITTING DIODE INCLUDING BORON COMPOUND

CROSS-REFERENCE TO RELATED APPLICATIONS

This application claims the priority of the Korean Patent Applications NO 10-2019-0091889 filed on Jul. 29, 2019 in the Korean Intellectual Property Office, the disclosure of which is incorporated herein by reference.

BACKGROUND OF THE INVENTION

1. Field of the Invention

The present disclosure relates to an organic light emitting diode comprising a boron compound and, more particularly, to an organic light-emitting diode comprising a boron compound as a dopant material in a light emitting layer thereof, thereby achieving the diode properties of high luminance efficiency and a long life span.

2. Description of the Prior Art

Organic light-emitting diodes (OLEDs), based on self-luminescence, are used to create digital displays with the advantage of having a wide viewing angle and being able to be made thinner and lighter than liquid crystal displays. In addition, an OLED display exhibits a very fast response time. Accordingly, OLEDs find applications in the full color display field or the illumination field.

In general, the term “organic light-emitting phenomenon” refers to a phenomenon in which electrical energy is converted to light energy by means of an organic material. An organic light-emitting diode using the organic light-emitting phenomenon has a structure usually including an anode, a cathode, and an organic material layer interposed therebetween. In this regard, the organic material layer may have, for the most part, a multilayer structure consisting of different materials, for example, a hole injection layer, a hole transport layer, a light-emitting layer, an electron transport layer, and an electron injection layer in order to enhance the efficiency and stability of the organic light-emitting diode. In the organic light-emitting diode having such a structure, application of a voltage between the two electrodes injects a hole from the anode and an electron from the cathode to the organic layer. In the luminescent zone, the hole and the electron recombine to produce an exciton. When the exciton returns to the ground state from the excited state, the molecule of the organic layer emits light. Such an organic light-emitting diode is known to have characteristics such as self-luminescence, high luminance, high efficiency, low driving voltage, a wide viewing angle, high contrast, and high-speed response.

Materials used as organic layers in OLEDs may be divided according to functions into luminescent materials and charge transport materials, for example, a hole injection material, a hole transport material, an electron transport material, and an electron injection material. As for the luminescent materials, there are two main families of OLED: those based on small molecules and those employing polymers. The light-emitting mechanism forms the basis of classification of luminescent materials as fluorescent and phosphorescent materials, which use excitons in singlet and triplet states, respectively.

When a single material is employed as the luminescent material, intermolecular actions cause the maximum luminescence wavelength to shift toward a longer wavelength, resulting in a reduction in color purity and luminous efficiency due to light attenuation. In this regard, a host-dopant system may be used as a luminescent material so as to increase the color purity and the luminous efficiency through energy transfer.

This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light with desired wavelengths can be obtained depending on the kind of the dopant because the wavelength of the host moves to the wavelength range of the dopant.

Meanwhile, studies have been made to use boron compounds as dopant compounds. With regard to related art pertaining to the use of boron compounds, reference may be made to Korean Patent No. 10-2016-0119683 A (issued Oct. 14, 2016), which discloses an organic light-emitting diode employing a novel polycyclic aromatic compound in which multiple aromatic rings are connected via boron and oxygen atoms. In addition, International Patent No. WO 2017/188111 (Nov. 2, 2017) disclosed an organic light emitting diode in which a compound structured to connect multiple polycondensed aromatic rings via boron and nitrogen atoms is used as a dopant in a light emitting layer while an anthracene derivative is used as a host.

Despite a variety of kinds of compounds prepared for use in light emitting layers in organic light emitting diodes including the related arts, there is still the continuing need to develop an organic light emitting diode that is capable of stably driving at a lower voltage and exhibit high efficiency.

RELATED ART DOCUMENT

Korean Patent Number 10-2016-0119683 A (Oct. 14, 2016)
International Patent No. WO 2017-188111 (Nov. 2, 2017)

SUMMARY OF THE INVENTION

Therefore, a primary purpose of the present disclosure is to provide an organic light emitting diode (OLED) in which a boron compound with a novel structure is employed as a dopant material in an light emitting layer, whereby the organic light emitting diode can exhibit improved properties including high luminance efficiency and a long life span.

In order to accomplish the purpose, the present disclosure provides an organic light-emitting diode comprising: a first electrode; a second electrode facing the first electrode; and a light emitting layer interposed between the first electrode and the second electrode, wherein the light emitting layer comprises at least one of compounds represented by Chemical Formula A or Chemical Formula B, and an anthracene derivative represented by Chemical Formula H:

[Chemical Formula A]

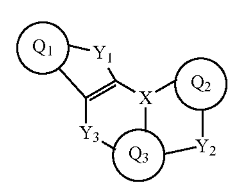

-continued

[Chemical Formula B]

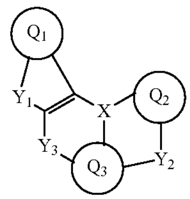

wherein,

Q1 to Q3, which may be the same or different, are each independently a substituted or unsubstituted aromatic hydrocarbon ring of 6 to 50 carbon atoms or a substituted or unsubstituted heteroaromatic ring of 2 to 50 carbon atoms, X is any one selected from B, P, P═O, and P═S, and $Y_1$ to $Y_3$, which may the same or different, are each independently any one selected from N—$R_1$, $CR_2R_3$, O, S, Se, and $SiR_4R_5$, wherein $R_1$ to $R_5$, which may the same or different, are each independently any one selected from a hydrogen atom, a deuterium atom, a substituted or unsubstituted alkyl of 1 to 30 carbon atoms, an alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, $R_2$ and $R_4$ may be connected to $R_3$ and $R_5$, respectively, to form an additional mono- or polycyclic aliphatic or aromatic ring, $R_1$ to $R_5$ in $Y_1$ may each be independently connected to the $Q_1$ ring moiety to form an additional mono- or polycyclic aliphatic or aromatic ring, $R_1$ to $R_5$ in $Y_2$ may each be independently connected to the $Q_2$ ring moiety or the $Q_3$ ring moiety to form an additional mono- or polycyclic aliphatic or aromatic ring, $R_1$ to $R_5$ in $Y_3$ may each be independently connected to the $Q_1$ ring moiety or the $Q_3$ ring moiety to form an additional mono- or polycyclic aliphatic or aromatic ring;

in Chemical Formula B, any of $R_1$ to $R_5$ in $Y_1$ may be connected to any of $R_1$ to $R_5$ in $Y_3$ to form an additional mono- or polycyclic aliphatic or aromatic ring; and

[Chemical Formula H]

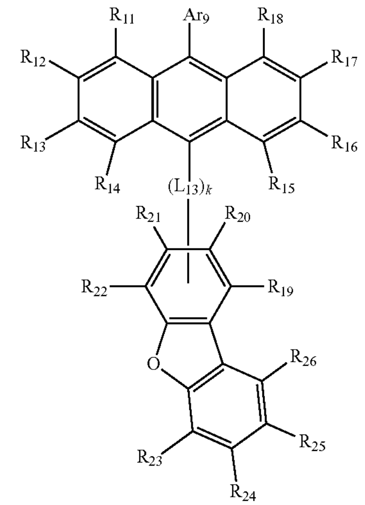

wherein, $Ar_9$ is a substituted or unsubstituted aryl of 6 to 50 carbon atoms or a substituted or unsubstituted heteroaryl of 2 to 50 carbon atoms;

$R_{11}$ to $R_{18}$, which may be the same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, and $R_{19}$ to $R_{26}$, which may be the same or difference, are each independently a hydrogen atom, a deuterium atom, or a substituted or unsubstituted aryl, wherein one of $R_{19}$ to $R_{22}$ is a single bond connecting to linker $L_{13}$, $L_{13}$ is a single bond or a substituted or unsubstituted arylene of 6 to 20 carbon atoms, and k is an integer of 1 to 3 wherein when k is 2 or greater, the $L_{13}$'s are the same or different.

BRIEF DESCRIPTION OF THE DRAWINGS

The above and other aspects, features and advantages of the present disclosure will be more apparent from the following detailed description taken in conjunction with the accompanying drawings, in which:

FIG. 1 is a schematic diagram of an organic light-emitting diode according to some embodiments of the present disclosure.

DETAILED DESCRIPTION OF THE EXEMPLARY EMBODIMENTS

Below, a detailed description will be given of the present disclosure. In each drawing of the present disclosure, sizes or scales of components may be enlarged or reduced than their actual sizes or scales for better illustration, and known components are not depicted therein to clearly show features of the present disclosure. Therefore, the present disclosure is not limited to the drawings. When describing the principle of the embodiments of the present disclosure in detail, details of well-known functions and features may be omitted to avoid unnecessarily obscuring the presented embodiments.

In drawings, for convenience of description, sizes of components may be exaggerated for clarity. For example, since sizes and thicknesses of components in drawings are arbitrarily shown for convenience of description, the sizes and thicknesses are not limited thereto. Furthermore, throughout the description, the terms "on" and "over" are used to refer to the relative positioning, and mean not only that one component or layer is directly disposed on another component or layer but also that one component or layer is indirectly disposed on another component or layer with a further component or layer being interposed therebetween. Also, spatially relative teams, such as "below", "beneath", "lower", and "between", may be used herein for ease of description to refer to the relative positioning.

Throughout the specification, unless explicitly described to the contrary, the word "comprise" and variations such as "comprises" or "comprising" will be understood to imply the inclusion of stated elements but not the exclusion of any other elements.

In order to endow an organic light emitting diode with high efficiency and a long life span, especially with a long life span, the present disclosure provides an organic light emitting compound for use as a host in a light emitting layer of the organic light emitting diode, which is based on an anthracene derivative in which a phenanthrene group and an arylene group are adopted as linkers, an unsubstituted or deuterium-substituted phenyl group is introduced at a specific position of the anthracene derivative, and the anthracene moiety should be substituted with a hydrogen atom or a deuterium atom, except for the phenyl group and the linkers, thereby guaranteeing a long life span characteristics and further improved efficiency.

The present disclosure provides an organic light-emitting diode comprising: a first electrode; a second electrode facing the first electrode; and a light emitting layer interposed between the first electrode and the second electrode, wherein the light emitting layer comprises at least one of compounds represented by Chemical Formula A or Chemical Formula B, and an anthracene derivative represented by Chemical Formula H:

[Chemical Formula A]

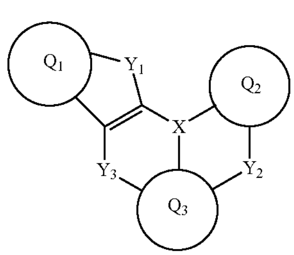

-continued

[Chemical Formula B]

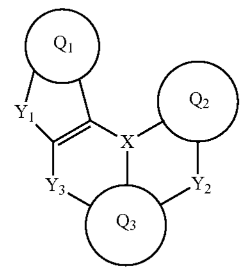

wherein,

Q1 to Q3, which may be the same or different, are each independently a substituted or unsubstituted aromatic hydrocarbon ring of 6 to 50 carbon atoms or a substituted or unsubstituted heteroaromatic ring of 2 to 50 carbon atoms, X is any one selected from B, P, P═O, and P═S, and $Y_1$ to $Y_3$, which may the same or different, are each independently any one selected from N—$R_1$, $CR_2R_3$, O, S, Se, and $SiR_4R_5$, wherein $R_1$ to $R_5$, which may the same or different, are each independently any one selected from a hydrogen atom, a deuterium atom, a substituted or unsubstituted alkyl of 1 to 30 carbon atoms, an alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, $R_2$ and $R_4$ may be connected to $R_3$ and $R_5$, respectively, to form an additional mono- or polycyclic aliphatic or aromatic ring, $R_1$ to $R_5$ in $Y_1$ may each be independently connected to the $Q_1$ ring moiety to form an additional mono- or polycyclic aliphatic or aromatic ring, $R_1$ to $R_5$ in $Y_2$ may each be independently connected to the $Q_2$ ring moiety or the $Q_3$ ring moiety to form an additional mono- or polycyclic aliphatic or aromatic ring, $R_1$ to $R_5$ in $Y_3$ may each be independently connected to the $Q_1$ ring moiety or the $Q_3$ ring moiety to form an additional mono- or polycyclic aliphatic or aromatic ring;

in Chemical Formula B, any of $R_1$ to $R_5$ in $Y_1$ may be connected to any of $R_1$ to $R_5$ in $Y_3$ to form an additional mono- or polycyclic aliphatic or aromatic ring; and

[Chemical Formula H]

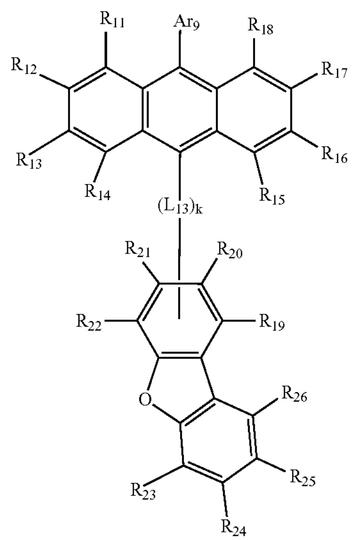

$Ar_9$ is a substituted or unsubstituted aryl of 6 to 50 carbon atoms or a substituted or unsubstituted heteroaryl of 2 to 50 carbon atoms;

$R_{11}$ to $R_{18}$, which may be the same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, and $R_{19}$ to $R_{26}$, which may be the same or difference, are each independently a hydrogen atom, a deuterium atom, or a substituted or unsubstituted aryl, wherein one of $R_{19}$ to $R_{22}$ is a single bond connecting to linker $L_{13}$, $L_{13}$ is a single bond or a substituted or unsubstituted arylene of 6 to 20 carbon atoms, and k is an integer of 1 to 3 wherein when k is 2 or greater, the $L_{13}$'s are the same or different.

wherein the team "substituted" in the expression "substituted or unsubstituted" used for compounds of Chemical Formulas A, B, and Chemical Formula H means having at least one substituent selected from the group consisting of a deuterium atom, a cyano, a halogen, a hydroxyl, a nitro, an alkyl of 1 to 24 carbon atoms, a halogenated alkyl of 1 to 24 carbon atoms, alkenyl of 2 to 24 carbon atoms, an alkynyl of 2 to 24 carbon atoms, a cycloalkyl of 3 to 24 carbon atoms, a heteroalkyl of 1 to 24 carbon atoms, an aryl of 6 to 24 carbon atoms, an arylalkyl of 7 to 24 carbon atoms, an alkylaryl of 7 to 24 carbon atoms, a heteroaryl of 2 to 24 carbon atoms, a heteroarylalkyl of 2 to 24 carbon atoms, an alkoxy of 1 to 24 carbon atoms, an alkylamino of 1 to 24 carbon atoms, a diarylamino of 12 to 24 carbon atoms, a diheteroarylamino of 2 to 24 carbon atoms, an aryl(heteroaryl)amino of 7 to 24 carbon atoms, an alkylsilyl of 1 to 24 carbon atoms, an arylsilyl of 6 to 24 carbon atoms, an aryloxy of 6 to 24 carbon atoms, and an arylthionyl of 6 to 24 carbon atoms.

The expression indicating the number of carbon atoms, such as "a substituted or unsubstituted alkyl of 1 to 30 carbon atoms", "a substituted or unsubstituted aryl of 5 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. It may be a single or a fused aromatic system, and when it comes to the latter, the aromatic system may include a fused ring that is formed by adjacent substituents on the aryl radical.

Examples of the aryl include phenyl, o-biphenyl, m-biphenyl, p-biphenyl, o-terphenyl, m-terphenyl, p-terphenyl, naphthyl, anthryl, phenanthryl, pyrenyl, indenyl, fluorenyl, tetrahydronaphthyl, perylenyl, chrysenyl, naphthacenyl, and fluoranthenyl, but are not limited thereto. At least one hydrogen atom of the aryl may be substituted by a deuterium atom, a halogen atom, a hydroxy, a nitro, a cyano, a silyl, an amino (—$NH_2$, —NH(R), —N(R')(R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms, or a heteroarylalkyl of 2 to 24 carbon atoms.

The term "heteroaryl substituent" used in the compound of the present disclosure refers to a hetero aromatic radical of 2 to 24 carbon atoms bearing 1 to 3 heteroatoms selected from among N, O, P, Si, S, Ge, Se, and Te. In the aromatic radical, two or more rings may be fused. One or more hydrogen atoms on the heteroaryl may be substituted by the same substituents as on the aryl.

In addition, the term "heteroaromatic ring", as used herein, refers to an aromatic hydrocarbon ring bearing as aromatic ring members 1 to 3 heteroatoms selected particularly from N, O, P, Si, S, Ge, Se, and Te.

As used herein, the term "alkyl" refers to an alkane missing one hydrogen atom and includes linear or branched structures. Examples of the alkyl substituent useful in the present disclosure include methyl, ethyl, propyl, isopropyl, isobutyl, sec-butyl, tert-butyl, pentyl, iso-amyl, and hexyl. At least one hydrogen atom of the alkyl may be substituted by the same substituent as in the aryl.

The term "cyclo" as used in substituents of the present disclosure, such as cycloalkyl, cycloalkoxy, etc., refers to a structure responsible for a mono- or polycyclic ring of saturated hydrocarbons such as alkyl, alkoxy, etc. Concrete examples of cycloalkyl radicals include cyclopropyl, cyclobutyl, cyclopentyl, cyclohexyl, methylcyclopentyl, methylcyclohexyl, ethylcyclopentyl, ethylcyclohexyl, adamantyl, dicyclopentadienyl, decahydronaphthyl, norbornyl, bornyl, and isobornyl. One or more hydrogen atoms on the cycloalkyl may be substituted by the same substituents as on the aryl and it can be applied to cycloalkoxy, as well.

The term "alkoxy" as used in the compounds of the present disclosure refers to an alkyl or cycloalkyl singularly bonded to oxygen. Concrete examples of the alkoxy include methoxy, ethoxy, propoxy, isobutoxy, sec-butoxy, pentoxy, iso-amyloxy, hexyloxy, cyclobutyloxy, cyclopentyloxy, adamantyloxy, dicyclopentyloxy, and bornyloxy, isobornyloxy. One or more hydrogen atoms on the alkoxy may be substituted by the same substituents as on the aryl.

Concrete examples of the arylalkyl used in the compounds of the present disclosure include phenylmethyl (benzyl), phenylethyl, phenylpropyl, naphthylmethyl, and naphthylethyl. One or more hydrogen atoms on the arylalkyl may be substituted by the same substituents as on the aryl.

Concrete examples of the silyl radicals used in the compounds of the present disclosure include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethyl furylsilyl. One or more hydrogen atoms on the silyl may be substituted by the same substituents as on the aryl.

As used herein, the term "alkenyl" refers to an unsaturated hydrocarbon group that contains a carbon-carbon double bond between two carbon atoms and the team "alkynyl" refers to an unsaturated hydrocarbon group group that contains a carbon-carbon triple bond between two carbon atoms.

As used herein, the term "alkylene" refers to an organic aliphatic radical regarded as derived from a linear or branched saturated hydrocarbon alkane by removal of two hydrogen atoms from different carbon atoms. Concrete examples of the alkylene include methylene, ethylene, propylene, isopropylene, isobutylene, sec-butylene, tert-butylene, pentylene, iso-amylene, hexylene, and so on. One or more hydrogen atoms on the alkylene may be substituted by the same substituents as on the aryl.

Furthermore, as used herein, the term "diarylamino" refers to an amine radical having two identical or different aryl groups bonded to the nitrogen atom thereof, the term "diheteroarylamino" refers to an amine radical having two identical or different heteroaryl groups bonded to the nitrogen atom thereof, and the term "aryl(heteroaryl)amino" refers to an amine radical having an aryl group and a heteroaryl group both bonded to the nitrogen atom thereof.

As more particular examples accounting for the term "substituted" in the expression "substituted or unsubstituted" used for compounds of Chemical Formulas A, B, and C, the compounds may be substituted by at least one substituents selected from the group consisting of a deuterium atom, a cyano, a halogen, a hydroxy, a nitro, an alkyl of 1 to 12 carbon atoms, a halogenated alkyl of 1 to 12 carbon atoms, an alkenyl of 2 to 12 carbon atoms, an alkynyl of 2 to 12 carbon atoms, a cycloalkyl of 3 to 12 carbon atoms, a heteroalkyl of 1 to 12 carbon atoms, an aryl of 6 to 18 carbon atoms, an arylalkyl of 7 to 20 carbon atoms, an alkylaryl of 7 to 20 carbon atoms, a heteroaryl of 2 to 18 carbon atoms, a heteroarylalkyl of 2 to 18 carbon atoms, an alkoxy of 1 to 12 carbon atoms, an alkylamino of 1 to 12 carbon atoms, an arylamino of 6 to 18 carbon atoms, a heteroarylamino of 1 to 18 carbon atoms, an alkylsilyl of 1 to 12 carbon atoms, an arylsilyl of 6 to 18 carbon atoms, an aryloxy of 6 to 18 carbon atoms, and an arylthionyl of 6 to 18 carbon atoms.

In the present disclosure, the compound represented by Chemical Formula A or B is characterized by the structure in which the $Q_2$ and $Q_3$ ring moieties, which are each a substituted or unsubstituted aromatic hydrocarbon ring of 6 to 50 carbon atoms or a substituted or unsubstituted heteroaromatic ring of 2 to 50 carbon atoms, are each bonded to the central atom X and linked to each other via the linker $Y_2$; and the $Q_3$ ring moiety is bonded to the linker $Y_3$, wherein, of the two doubly bonded carbon atoms common between the 5-membered ring bearing $Y_1$ and the 6-membered ring bearing $Y_3$, one is bonded to both $Q_1$ and $Y_3$ or to both $Y_1$ and $Y_3$ and the other is bonded to both $Y_1$ and X or to both $Q_1$ and X whereby the 5-membered ring bearing $Y_1$ and the 6-membered 1 ring bearing X and $Y_3$ form a fused ring.

It is meant by the expression "$R_2$ and $R_4$ may be connected to $R_3$ and $R_5$, respectively, to form an additional mono- or polycyclic aliphatic or aromatic ring" that $R_2$ and $R_3$ are each deprived of a hydrogen radical and then connected to each other to form an additional ring and $R_4$ and $R_5$ are also each deprived of a hydrogen radical and then connected to each other to form an additional ring.

What is meant by the expression "$R_1$ to $R_5$ in $Y_1$ may each independently bond to the $Q_1$ ring moiety to form an additional mono- or polycyclic aliphatic or aromatic ring" is that the $Q_1$ ring moiety and $R_1$ are each deprived of a hydrogen radical and then connected to each other to form an additional ring; $Q_1$ ring moiety and $R_2$ or $R_3$ are each deprived of a hydrogen radical and then connected to each other to form an additional ring; and/or $Q_1$ ring moiety and $R_4$ or $R_5$ are each deprived of a hydrogen radical and then connected to each other to form an additional ring. In this context, the wording " . . . connected to each other to form an additional ring", as used herein, means that two substituents are each deprived of a hydrogen radical and then connected to each other to form a ring.

The ring moieties $Q_1$ to $Q_3$ in Chemical Formulas A and B may be the same or different and are each independently a substituted or unsubstituted aromatic hydrocarbon ring of 6 to 50 carbon atoms, or a substituted or unsubstituted heteroaromatic ring of 2 to 50 carbon atoms, particularly a substituted or unsubstituted aromatic hydrocarbon ring of 6 to 20 carbon atoms or a substituted or unsubstituted heteroaromatic ring of 2 to 20 carbon atoms, and more particularly a substituted or unsubstituted aromatic hydrocarbon ring of 6 to 14 carbon atoms or a substituted or unsubstituted heteroaromatic ring of 2 to 14 carbon atoms.

In an embodiment, at least one of the linkers $Y_2$ and $Y_3$ both bonded to the $Q_3$ ring moiety in Chemical Formulas A and B may be N—$R_1$. In this regard, $R_1$ is as defined above.

When at least one of the linkers $Y_2$ and $Y_3$ both bonded to the $Q_3$ ring moiety in Chemical Formulas A and B may be N—$R_1$, the substituent $R_1$ may be a substituted or unsubstituted aryl of 6 to 50 carbon atoms or a substituted or unsubstituted heteroaryl of 2 to 50 carbon atoms, and particularly a substituted or unsubstituted aryl of 6 to 20 carbon atoms or a substituted or unsubstituted heteroaryl of 2 to 20 carbon atoms.

In addition, the linkers $Y_2$ and $Y_3$ in Chemical Formulas A and B may be the same or different and at least one of them may be the linker represented by the following Structural Formula A:

[Structural Formula A]

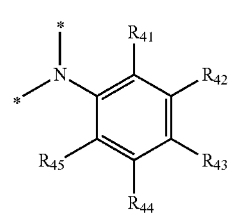

wherein "-*" denotes a bonding site at which the N atom is bonded to the doubly bonded carbon atom connected to Y1, the doubly bonded carbon atom connected to Y3 in the 5-membered ring bearing Y1, an aromatic carbon atom in the Q2 ring moiety, or an aromatic carbon atom in the Q3 ring moiety;

$R_{41}$ to $R_{45}$, which may be the same or different, are each independently any one selected from a hydrogen atom, a deuterium atom, a substituted or unsubstituted alkyl of 1 to 30 carbon atoms, alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen, and $R_{41}$ and $R_{45}$ may each independently be bonded to the $Q_1$, $Q_2$, or $Q_3$ ring moiety to form an additional aliphatic or aromatic mono- or polycyclic ring.

In the context that the linkers $Y_2$ and $Y_3$ in Chemical Formulas A and B may be the same or different and at least one of them may be the linker represented by the following Structural Formula A, at least one of $R_{41}$ and $R_{45}$ in Structural Formula A may be bonded to the $Q_3$ ring moiety to form an additional aliphatic or aromatic mono- or polycyclic ring.

Meanwhile, the expression "at least one of $R_{41}$ and $R_{45}$ may be bonded to the $Q_3$ ring moiety to form an additional aliphatic or aromatic mono- or polycyclic ring" means that the substituent $R_{41}$ or $R_{45}$ and the $Q_3$ ring moiety are each deprived of a hydrogen radical and connected to each other to form an additional ring, as described for the foregoing connection between $R_2$ and $R_3$ and between $R_4$ and $R_5$, and the meaning is true of the expression "to form an additional ring" that will be given herein.

In an embodiment, the linkers $Y_2$ and $Y_3$, which are bonded to the $Q_3$ ring moiety in Chemical Formulas A and B, may be the same or different and may each independently N—$R_1$ wherein $R_1$ is as defined above.

In Chemical Formulas A and B, $Y_1$ may be an oxygen atom (O) or sulfur atom (S) and the central atom X may be particularly a boron atom (B).

In the compound represented by Chemical Formula A or B of the present disclosure, $Q_1$ to $Q_3$ ring moieties, which may be the same or different, may each be independently a substituted or unsubstituted aromatic hydrocarbon ring of 6 to 50 carbon atoms. In detail, the aromatic hydrocarbon ring may be any one selected from a benzene ring, a naphthalene ring, a biphenyl ring, a terphenyl ring, an anthracene ring, a phenanthrene ring, a pyrene ring, a perylene ring, a chrysene ring, a naphthacene ring, a fluoranthene ring, and a pentacene ring.

When the aromatic hydrocarbon rings of $Q_1$ to $Q_3$, which may be the same or different, are each independently a substituted or unsubstituted aromatic hydrocarbon ring of 6 to 50 carbon atoms, the aromatic hydrocarbon rings of $Q_1$ and $Q_2$ in Chemical Formulas A and B may each independently any one selected from [Structural Formula 10] to [Structural Formula 21], below:

[Structural Formula 10]

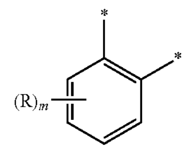

[Structural Formula 11]

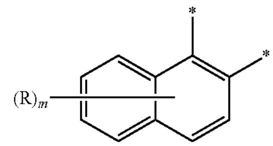

[Structural Formula 12]

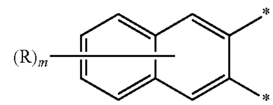

[Structural Formula 13]

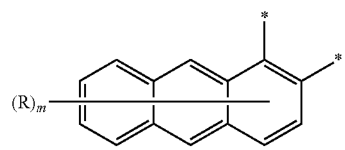

[Structural Formula 14]

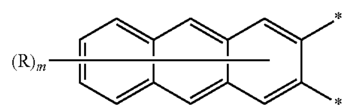

[Structural Formula 15]

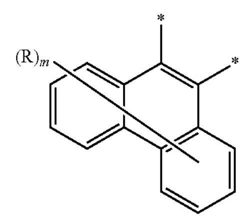

[Structural Formula 16]

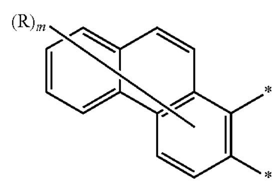

[Structural Formula 17]

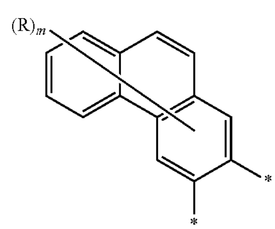

[Structural Formula 18]

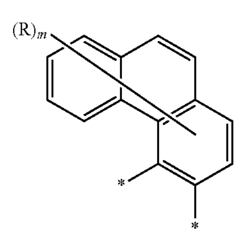

-continued

[Structural Formula 19]

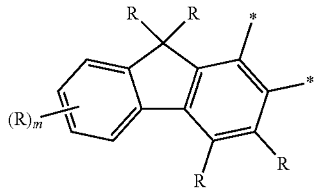

[Structural Formula 20]

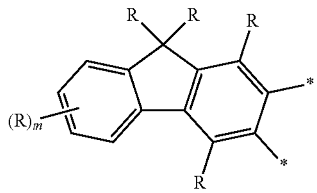

[Structural Formula 21]

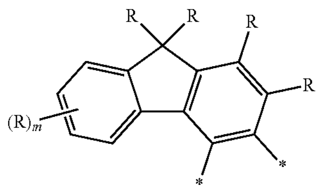

wherein,

"-*" denotes a bonding site at which the carbon ring member of $Q_1$ is bonded to $Y_1$ or a carbon member of the 5-membered ring bearing $Y_1$ or at which the carbon ring member of $Q_2$ is bonded to X or $Y_2$;

R's, which may be the same or different, are each independently any one selected from a hydrogen atom, a deuterium atom, a substituted or unsubstituted alkyl of 1 to 30 carbon atoms, alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a diarylamino of 12 to 24 carbon atoms, a diheteroarylamino of 2 to 24 carbon atoms, an aryl(heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a nitro, a cyano, and a halogen; and m is an integer of 1 to 8 wherein when m is 2 or greater or when two or more R's exist, the individual R's may be the same or different.

In addition, when the $Q_1$ to $Q_3$ ring moieties, which may be the same or different, are each independently a substituted or unsubstituted aromatic hydrocarbon ring of 6 to 50 carbon atoms, the aromatic hydrocarbon ring of $Q_3$ in Chemical Formulas A and B may be a ring represented by the following [Structural Formula B]:

[Structural Formula B]

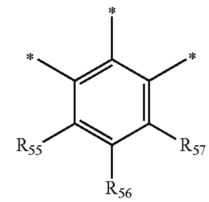

wherein,

"-*" denotes a bonding site at which the corresponding aromatic carbon ring members of $Q_3$ are bonded to $Y_2$, X and $Y_3$, respectively; and $R_{55}$ to $R_{57}$, which may be the same or different, are each independently any one selected from a hydrogen atom, a deuterium atom, a substituted or unsubstituted alkyl of 1 to 30 carbon atoms, alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted diarylamino of 12 to 24 carbon atoms, a substituted or unsubstituted diheteroarylamino of 2 to 24 carbon atoms, a substituted or unsubstituted aryl(heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a nitro, a cyano, and a halogen, and $R_{55}$ to $R_{57}$ may each be linked to an adjacent substituent to form an additional aliphatic or aromatic mono- or polycyclic ring.

Alternatively, when the $Q_1$ to $Q_3$ ring moieties in the compounds represented by Chemical Formula A or B are each a substituted or unsubstituted heteroaromatic ring of 2 to 50 carbon atoms, the corresponding heteroaromatic rings may be the same or different and may each be independently any one selected from Structural Formulas 31 to 40: [Structural Formula 31] [Structural Formula 32] [Structural Formula 33]

[Structural Formula 34]

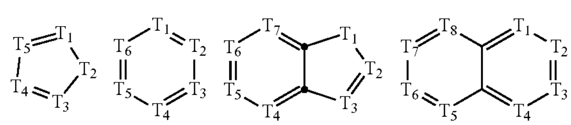

[Structural Formula 35]

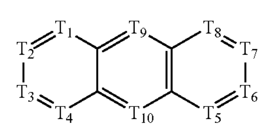

[Structural Formula 36]

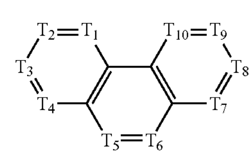

-continued

[Structural Formula 37]

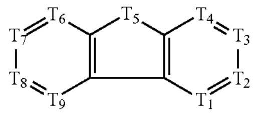

[Structural Formula 38]

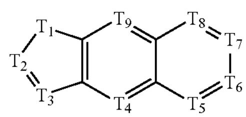

[Structural Formula 39]

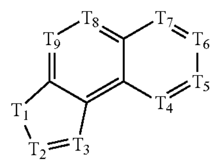

[Structural Formula 40]

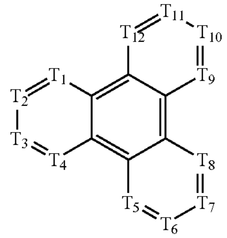

wherein, $T_1$ to $T_{12}$, which may be the same or difference, are each independently any one selected from $C(R_{61})$, $C(R_{62})(R_{63})$, $N(R_{64})$, O, S, Se, Te, $Si(R_{65})(R_{66})$, and $Ge(R_{67})(R_{68})$, with a proviso that all of the T's as ring members in each aromatic ring moiety are not carbon atoms, wherein $R_{61}$ to $R_{68}$ are each as defined for $R_1$ above.

Here, the compound of Structural Formula 33 may include the compound represented by the following Structural Formula 33-1 due to a resonance structure based on delocalized electrons:

[Structural Formula 33-1]

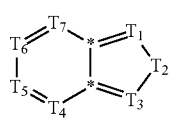

wherein, $T_1$ to $T_7$ are as defined in Structural Formulas 31 to 40.

Furthermore, the compounds of Structural Formulas 31 to 40 may each be any one selected from heterocyclic compounds of the following Structural Formula 50:

[Structural Formula 50]

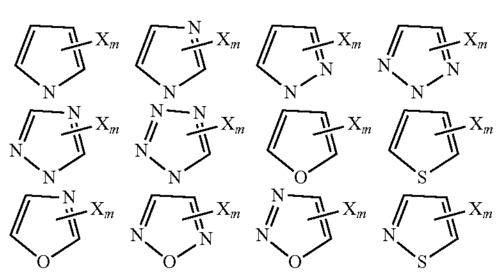

-continued

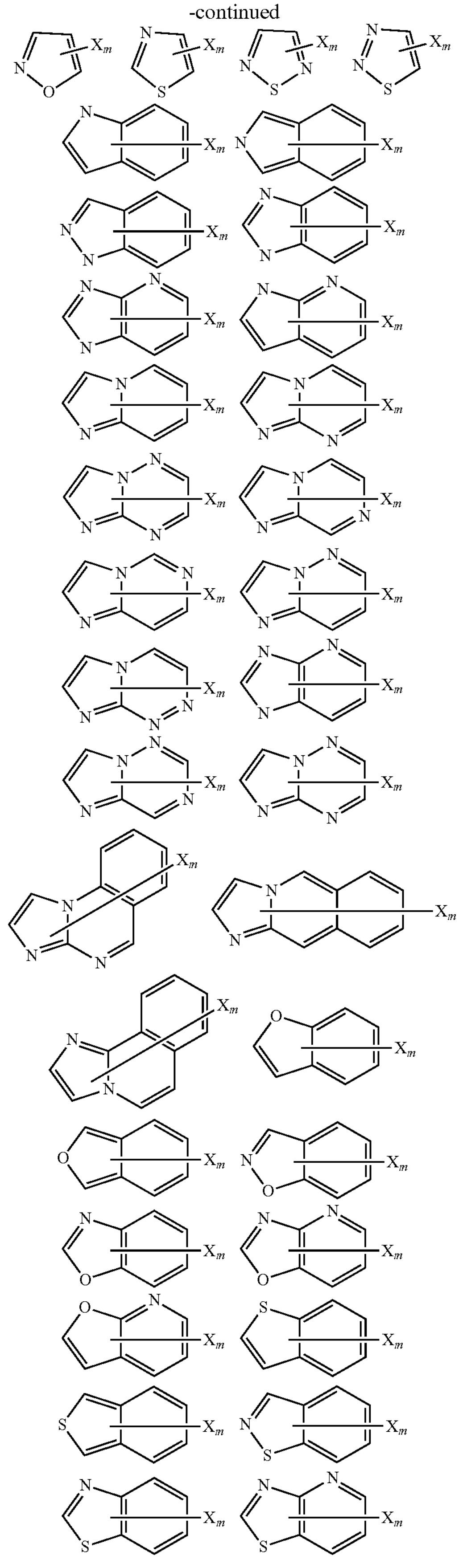

-continued
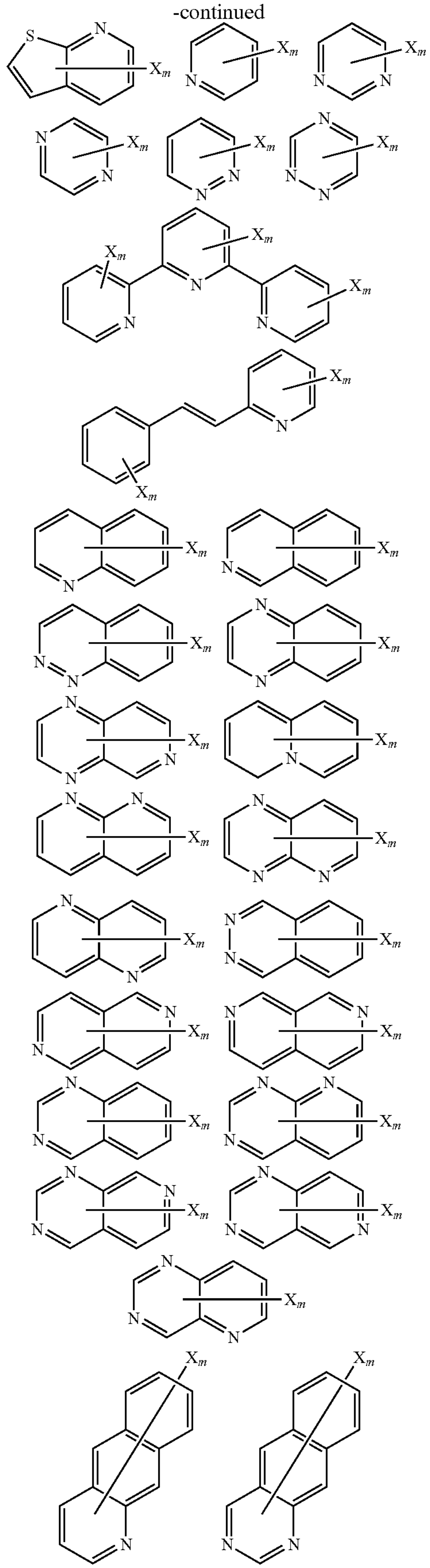
-continued
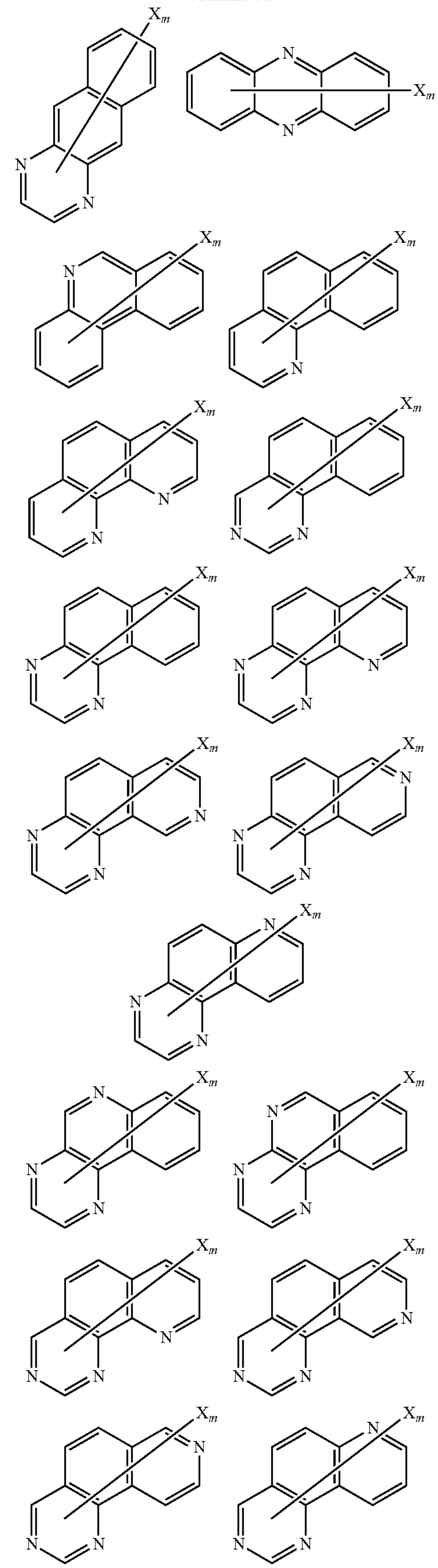

-continued

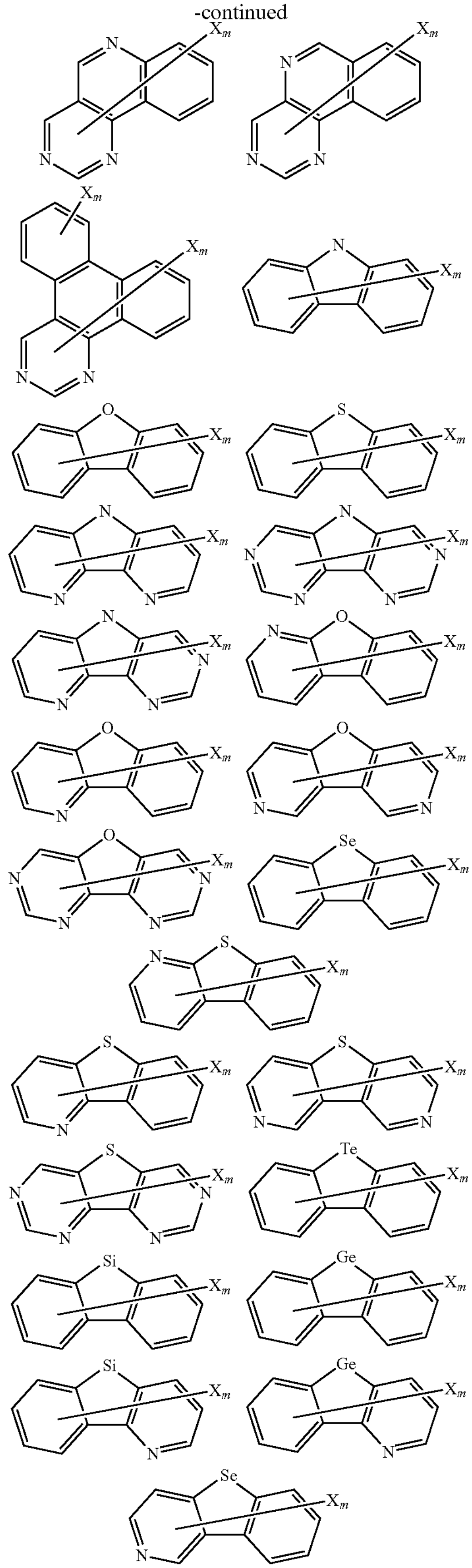

wherein, the substituent X is as defined for $R_1$ above, and m is an integer of 1 to 11 wherein when m is 2 or greater, the corresponding multiple X's are the same or different.

In the compound represented by Chemical Formulas A and B, at least one of the Q1 to Q3 ring moieties may have as an substituent an amine radical selected from a substituted or unsubstituted diarylamino of 12 to 24 carbon atoms, a substituted or unsubstituted diheteroarylamino of 2 to 24 carbon atoms, and a substituted or unsubstituted aryl(heteroaryl)amino of 7 to 24 carbon atoms. Particularly, one or two of the Q1 to Q3 ring moieties may have as a substituent an amine radical selected from a substituted or unsubstituted diarylamino of 12 to 24 carbon atoms, a substituted or unsubstituted diheteroarylamino of 2 to 24 carbon atoms, and a substituted or unsubstituted aryl(heteroaryl)amino of 7 to 24 carbon atoms. In this context, the term "substituted" in the expression "substituted or unsubstituted" is as defined above.

In Chemical Formulas A and B of the present disclosure, the aromatic hydrocarbon ring of 6 to 50 carbon atoms or the heteroaromatic ring of 2 to 50 carbon atoms of at least one of the Q1 to Q3 ring moieties may be bonded to an aryl amino radical represented by the following Structural Formula F:

[Structural Formula F]

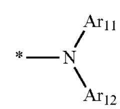

wherein,

"-*" denotes a bonding site participating in forming a bond to a carbon aromatic ring member of any one of $Q_1$ to $Q_3$, and $Ar_{11}$ and $Ar_{12}$, which may be the same or different, are each independently a substituted or unsubstituted aryl of 6 to 18 carbon atoms, and particularly a substituted or unsubstituted aryl of 6 to 12 carbon atoms, and may be linked to each other to form a ring.

In addition, the compounds represented by Chemical Formula A or B may each be any one selected from <Chemical Formula 1> to <Chemical Formula 204>:

[Chemical Formula 1]

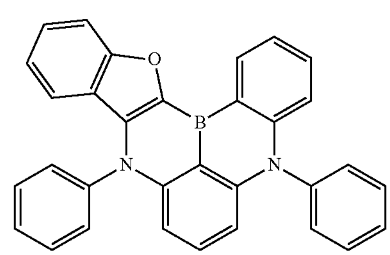

-continued
[Chemical Formula 2]
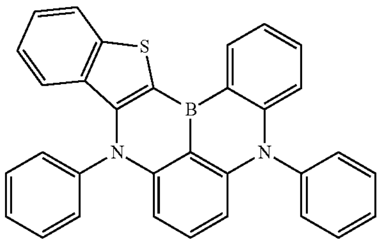
[Chemical Formula 3]
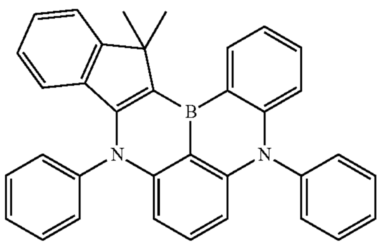
[Chemical Formula 4]
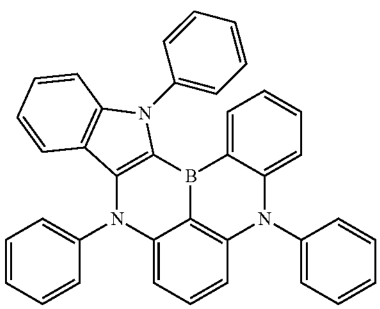
[Chemical Formula 5]
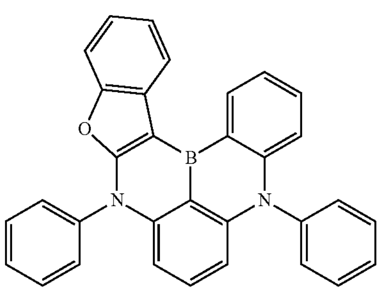
[Chemical Formula 6]
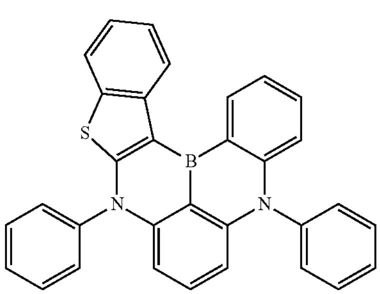
-continued
[Chemical Formula 7]
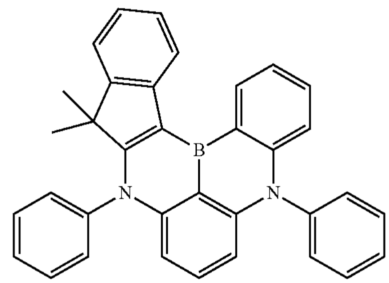
[Chemical Formula 8]
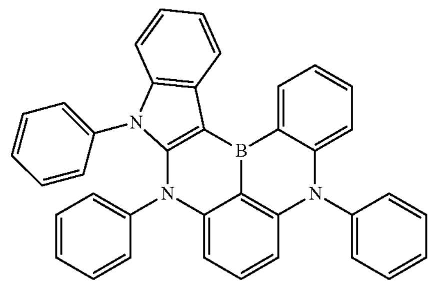
[Chemical Formula 9]
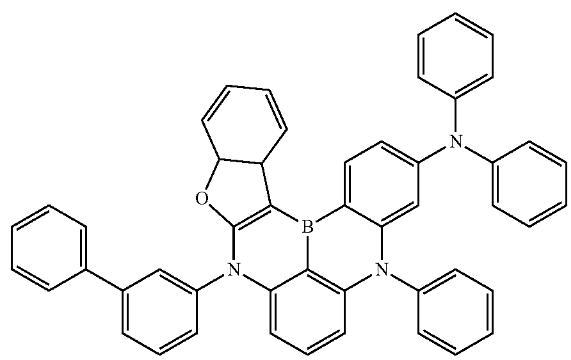
[Chemical Formula 10]
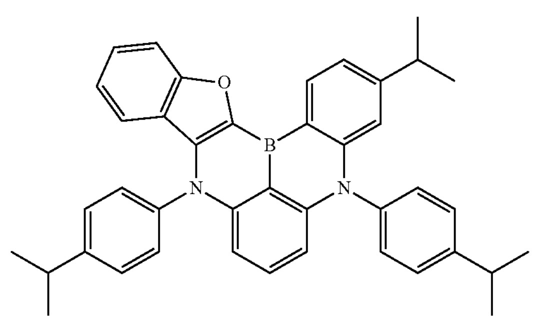
[Chemical Formula 11]
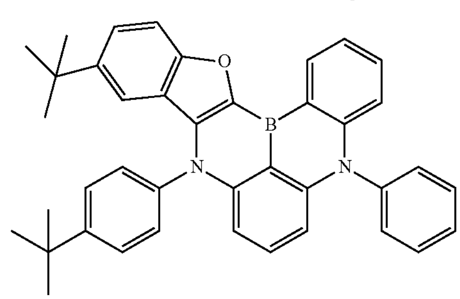

[Chemical Formula 12]
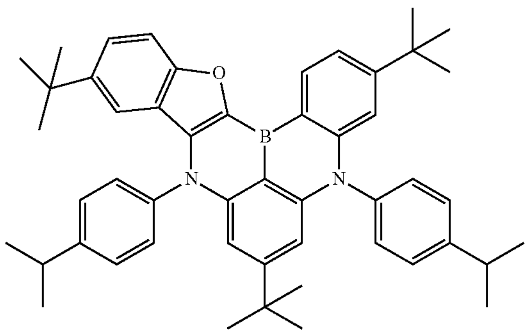
[Chemical Formula 13]
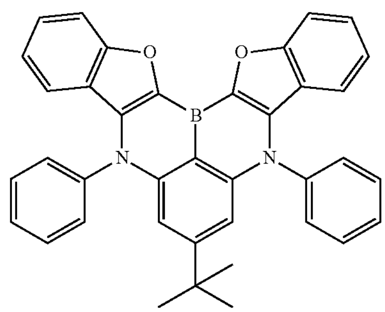
[Chemical Formula 14]
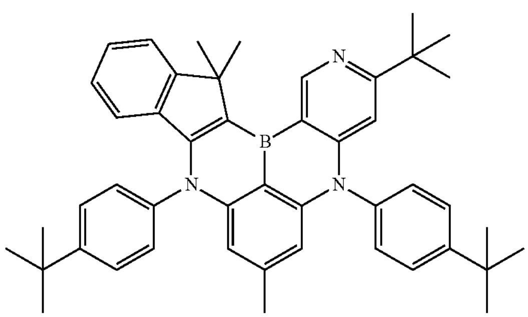
[Chemical Formula 15]
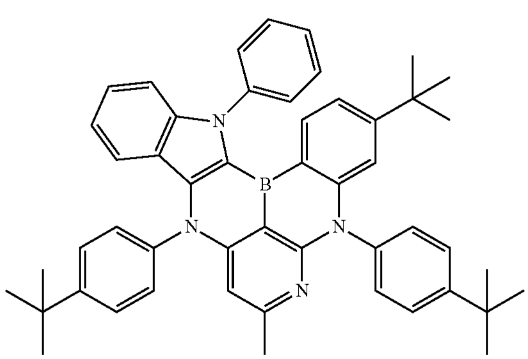
[Chemical Formula 16]
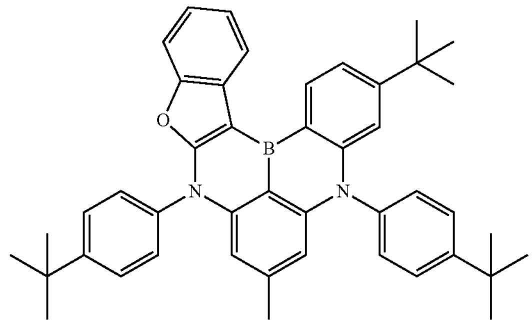
[Chemical Formula 17]
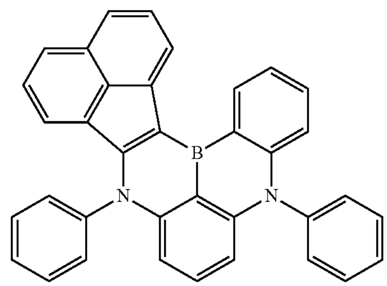
[Chemical Formula 18]
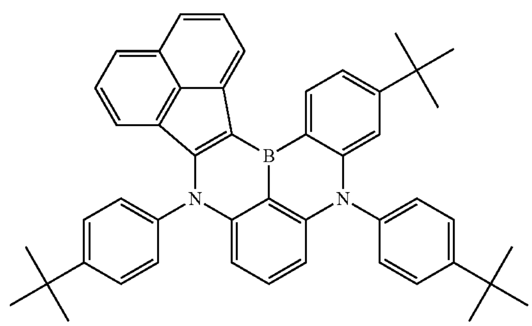
[Chemical Formula 19]
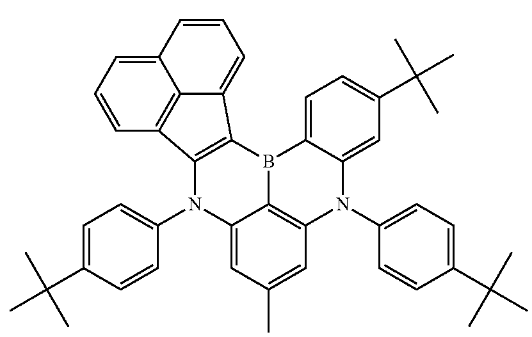

-continued
[Chemical Formula 20]
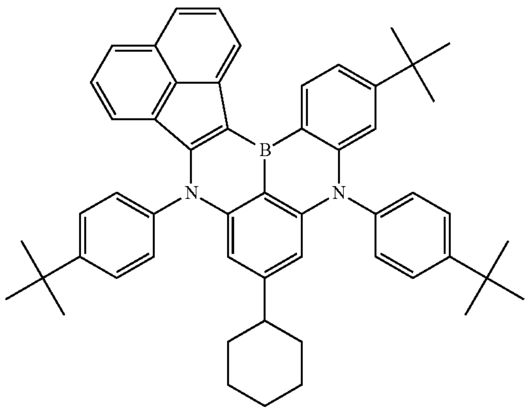
[Chemical Formula 21]
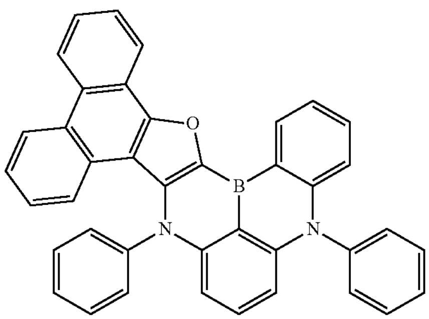
[Chemical Formula 22]
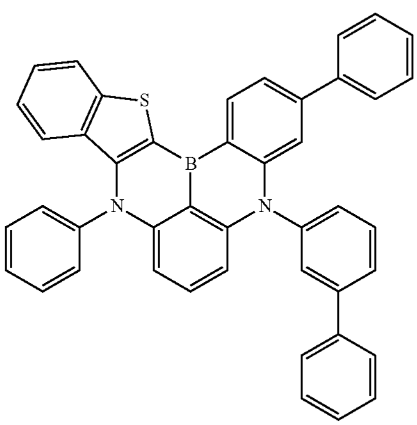
[Chemical Formula 23]
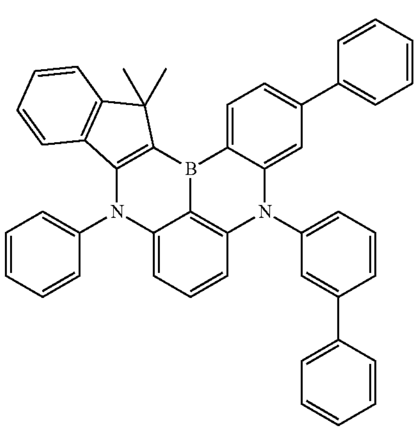
-continued
[Chemical Formula 24]
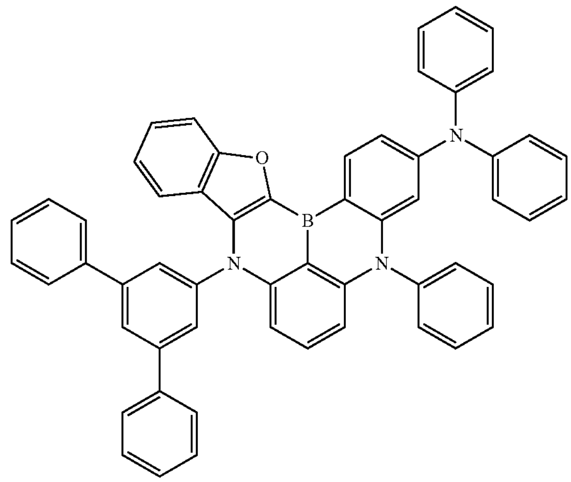
[Chemical Formula 25]
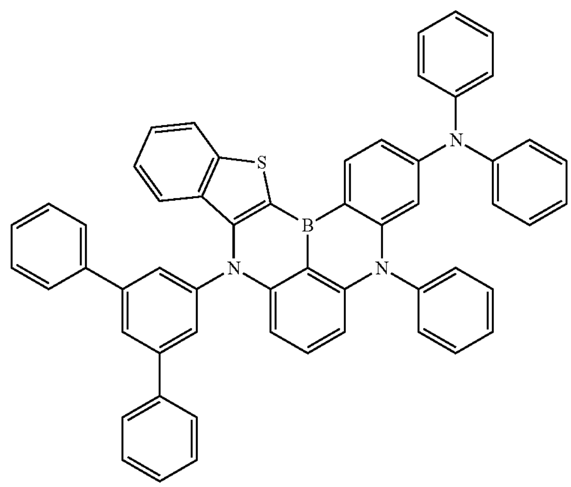
[Chemical Formula 26]
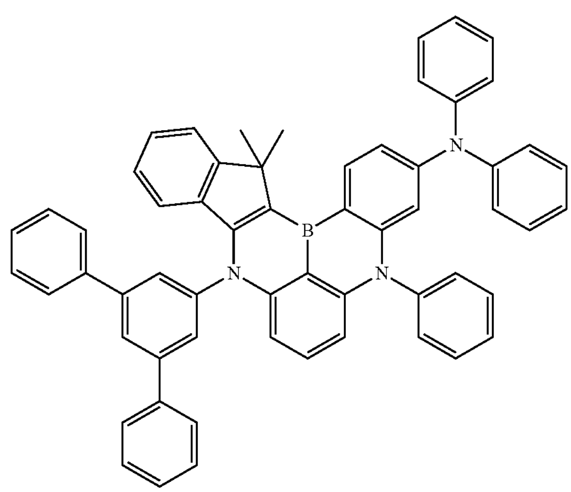

[Chemical Formula 27]
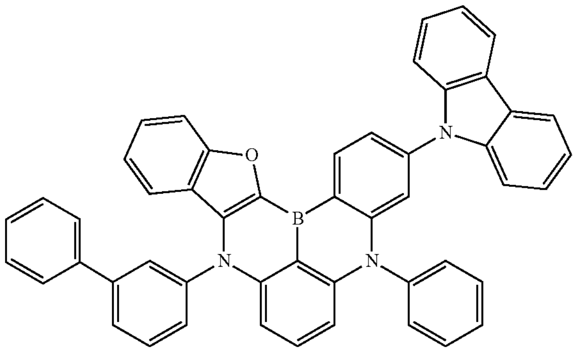
[Chemical Formula 28]
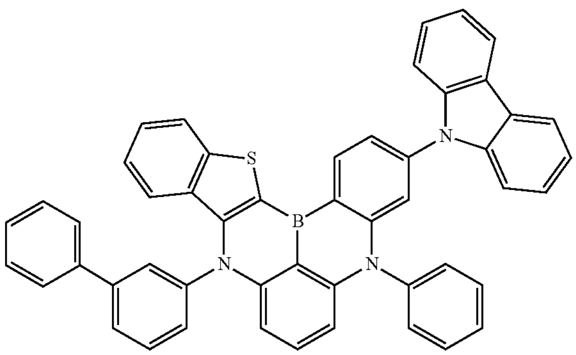
[Chemical Formula 29]
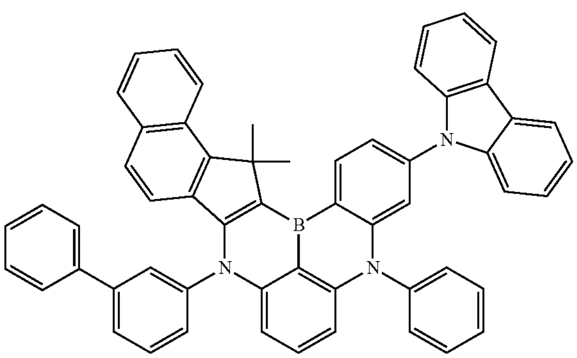
[Chemical Formula 30]
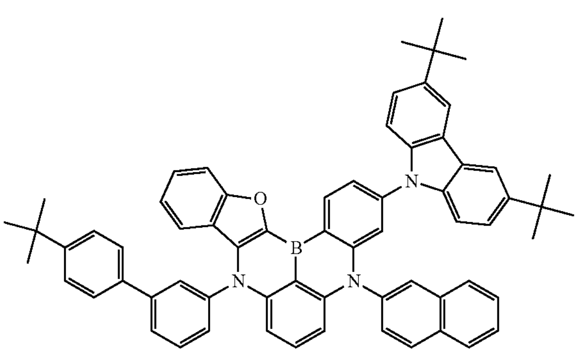
[Chemical Formula 31]
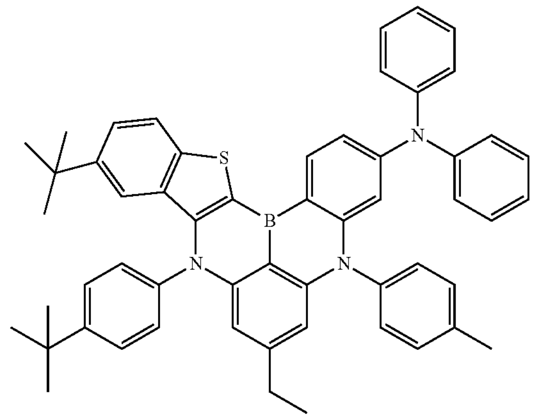
[Chemical Formula 32]
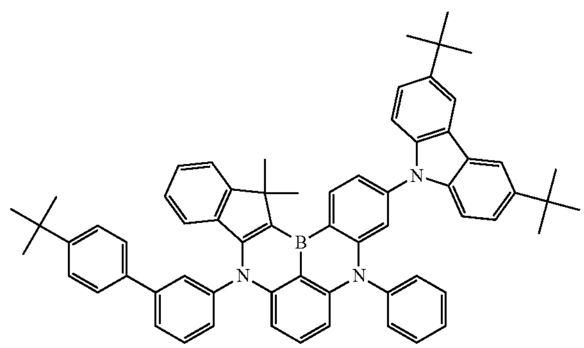
[Chemical Formula 33]
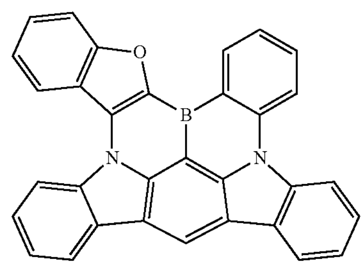
[Chemical Formula 34]
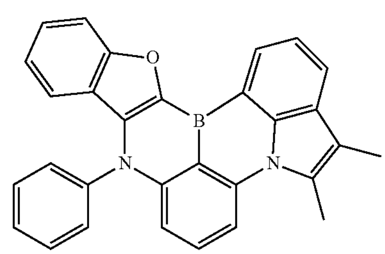
[Chemical Formula 35]
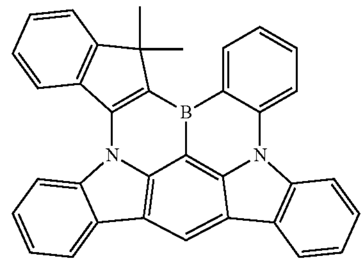

-continued
[Chemical Formula 36]
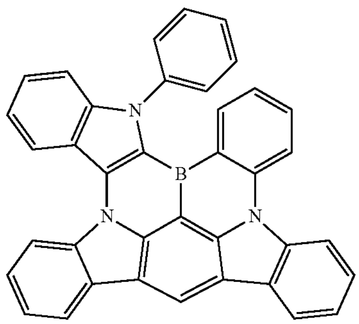
[Chemical Formula 37]
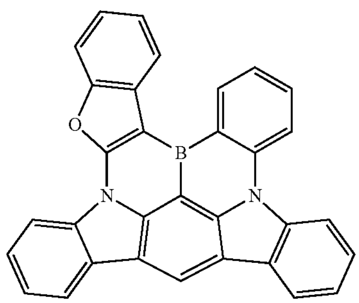
[Chemical Formula 38]
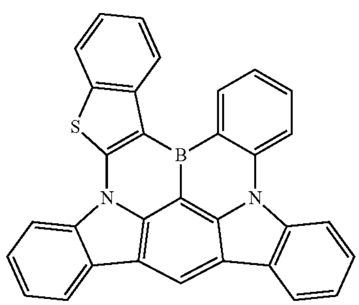
[Chemical Formula 39]
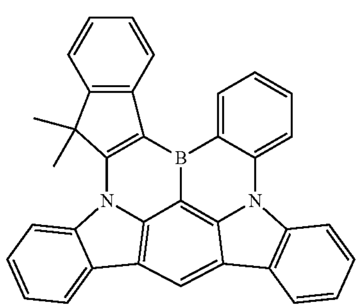
[Chemical Formula 40]
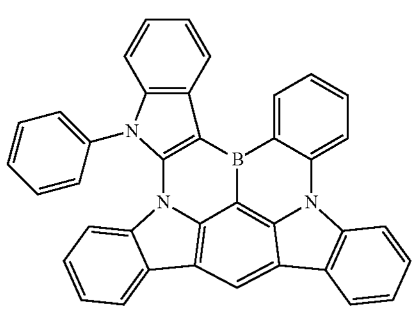
-continued
[Chemical Formula 41]
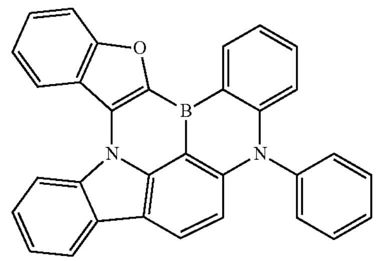
[Chemical Formula 42]
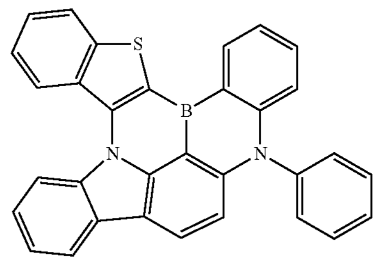
[Chemical Formula 43]
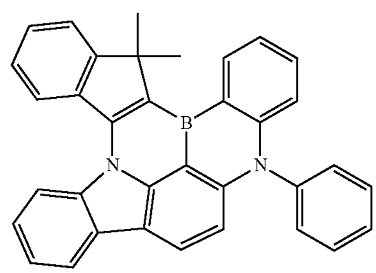
[Chemical Formula 44]
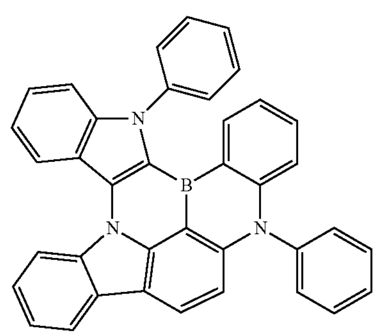
[Chemical Formula 45]
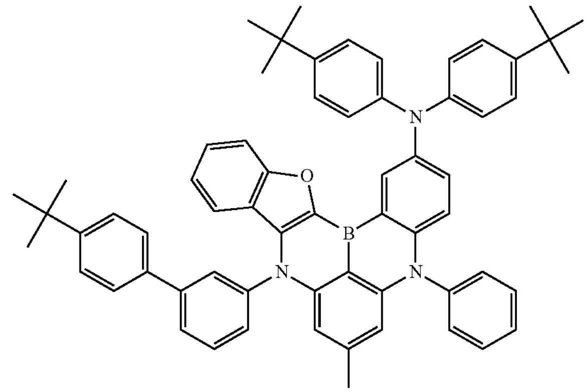

[Chemical Formula 46]
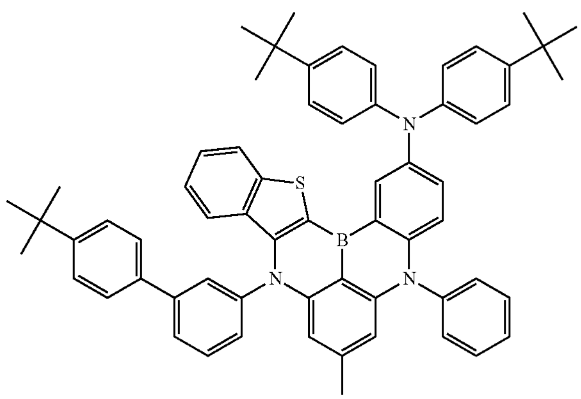
[Chemical Formula 47]
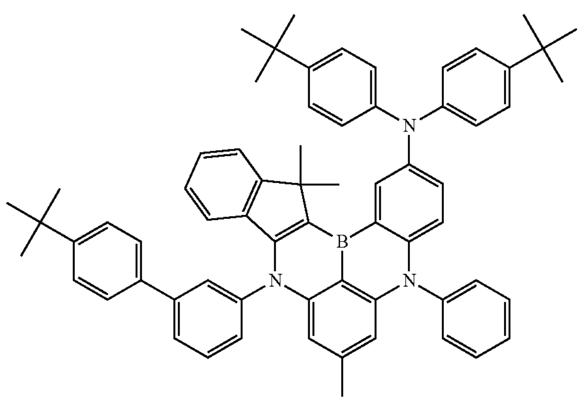
[Chemical Formula 48]
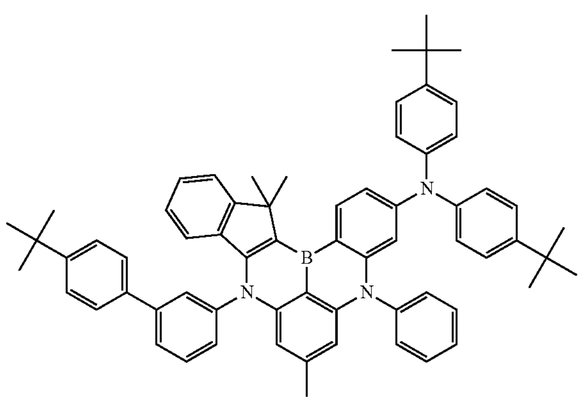
[Chemical Formula 49]
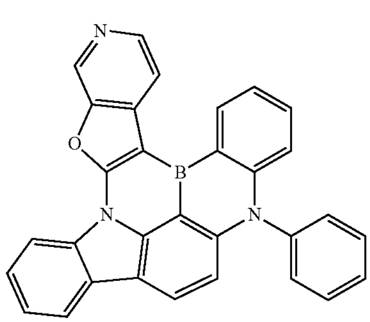
[Chemical Formula 50]
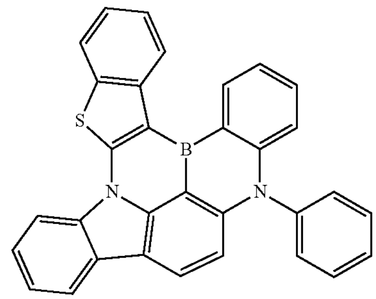
[Chemical Formula 51]
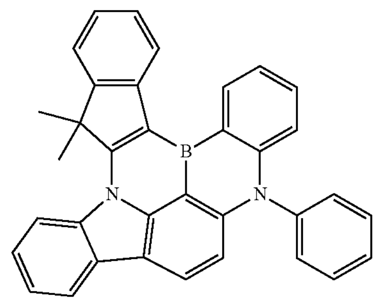
[Chemical Formula 52]
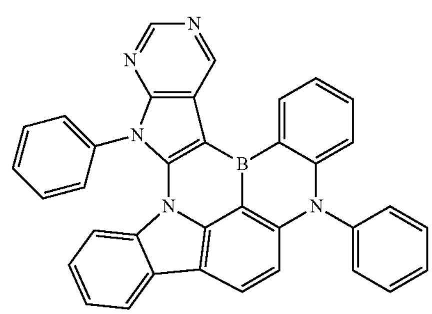
[Chemical Formula 53]
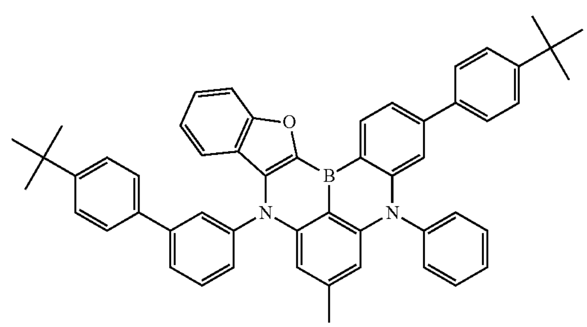
[Chemical Formula 54]
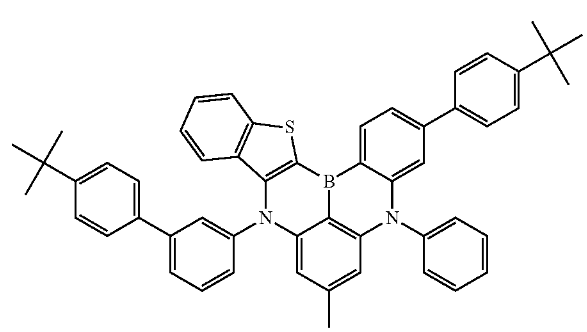

-continued
[Chemical Formula 55]
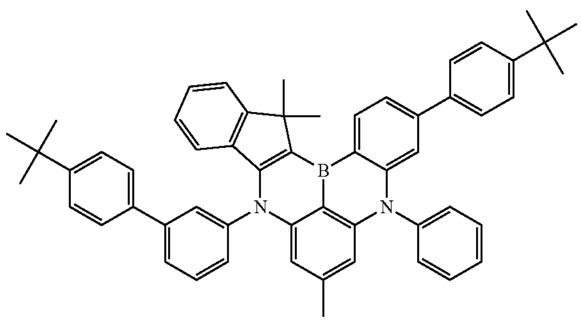
[Chemical Formula 56]
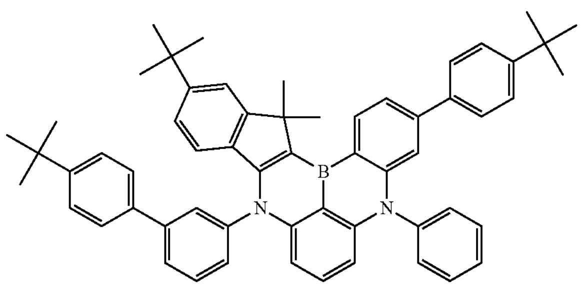
[Chemical Formula 57]
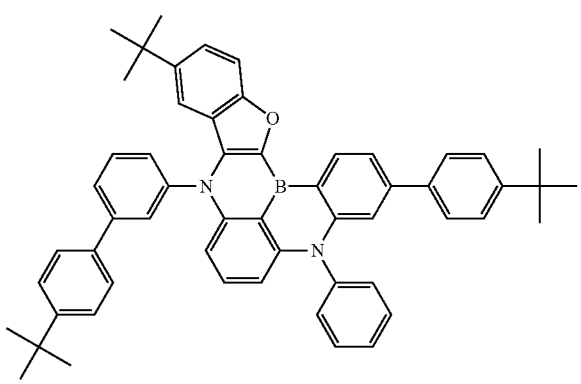
[Chemical Formula 58]
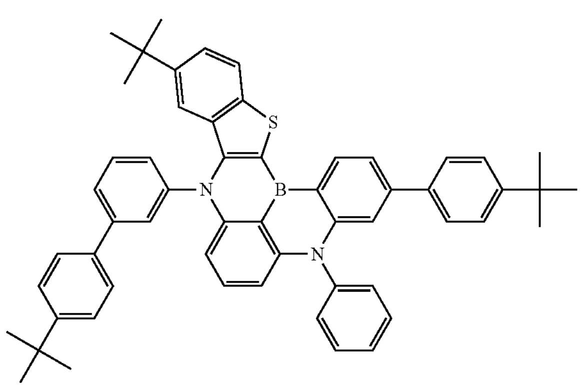
-continued
[Chemical Formula 59]
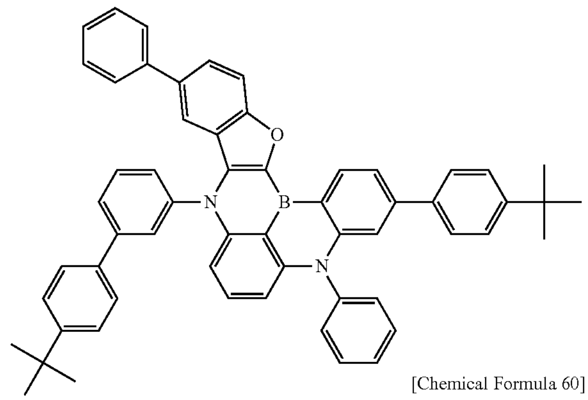
[Chemical Formula 60]
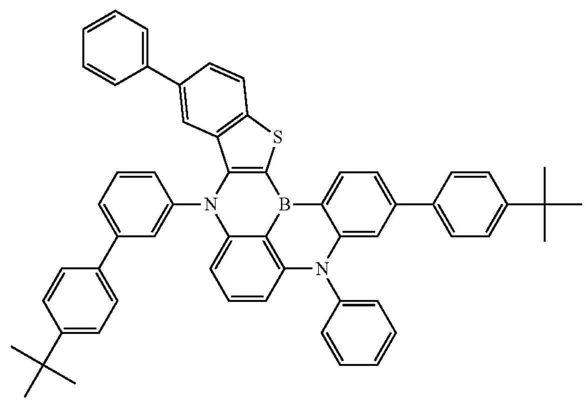
[Chemical Formula 61]
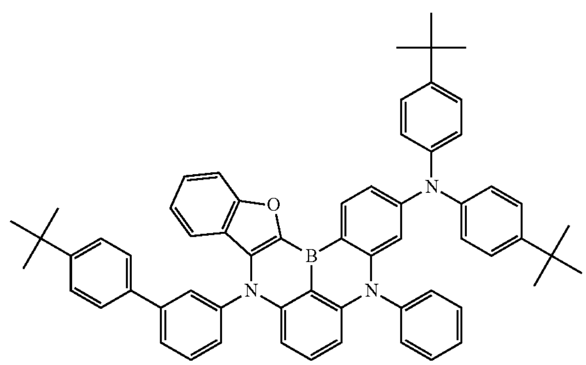
[Chemical Formula 62]
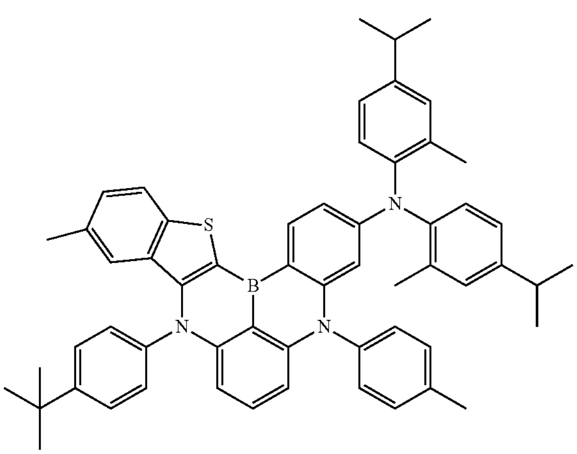

[Chemical Formula 63]
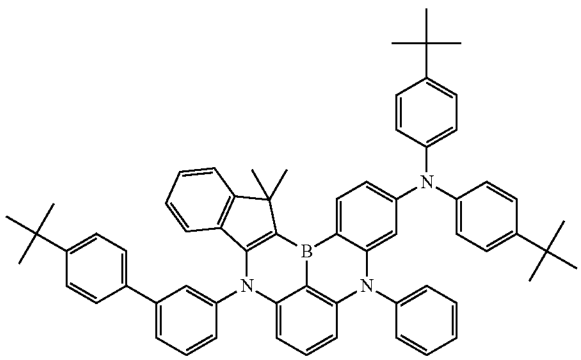
[Chemical Formula 64]
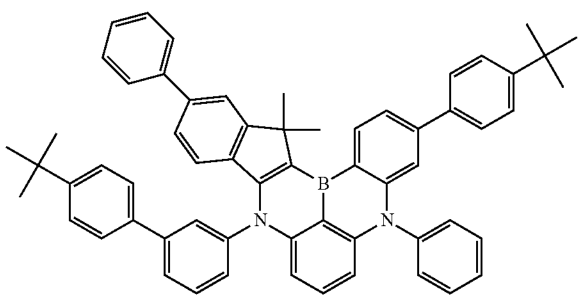
[Chemical Formula 65]
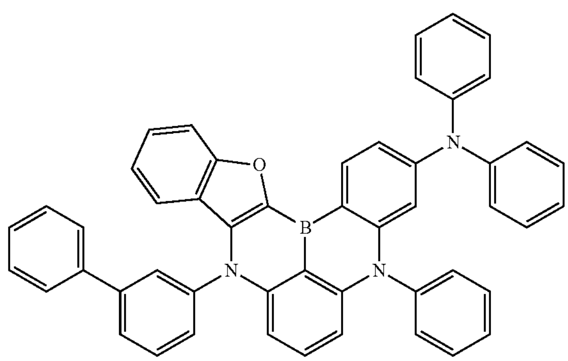
[Chemical Formula 66]
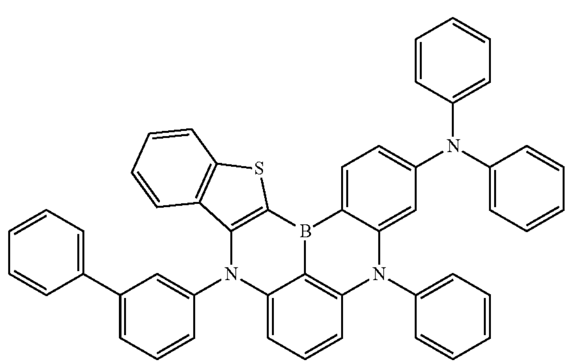
[Chemical Formula 67]
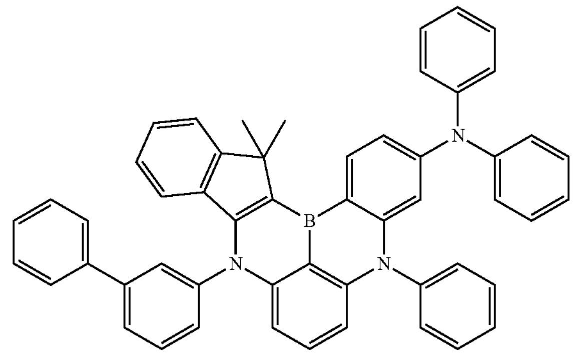
[Chemical Formula 68]
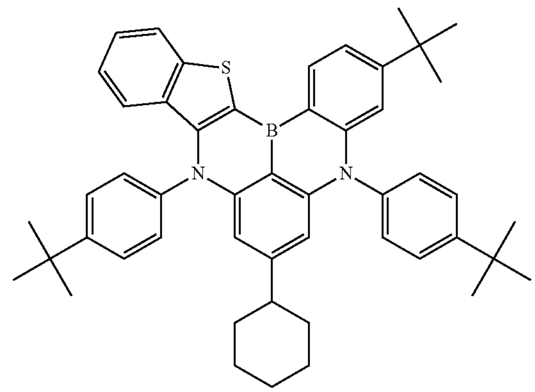
[Chemical Formula 69]
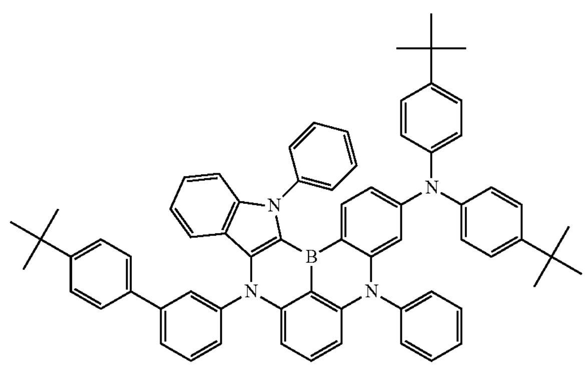
[Chemical Formula 70]
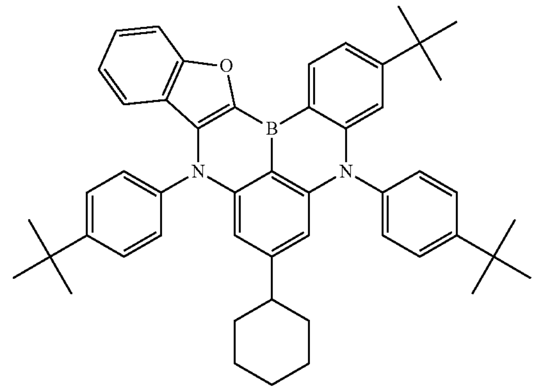

-continued
[Chemical Formula 71]
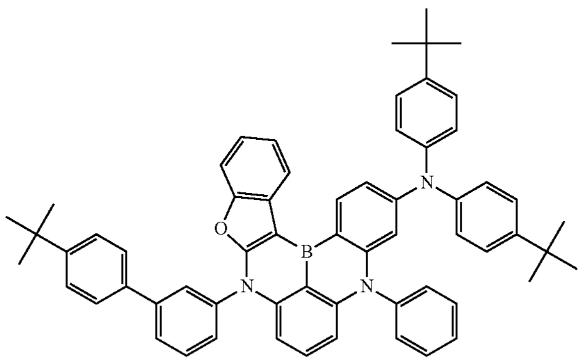
[Chemical Formula 72]
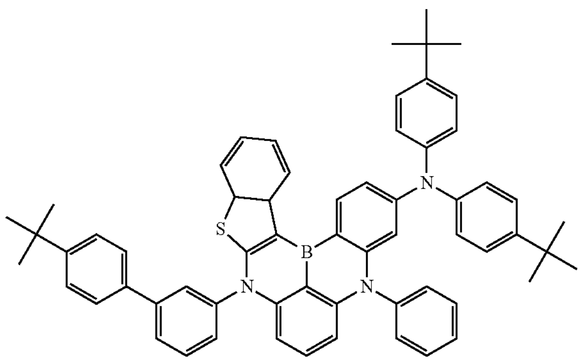
[Chemical Formula 73]
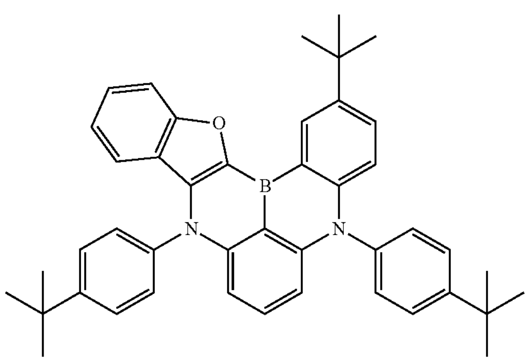
[Chemical Formula 74]
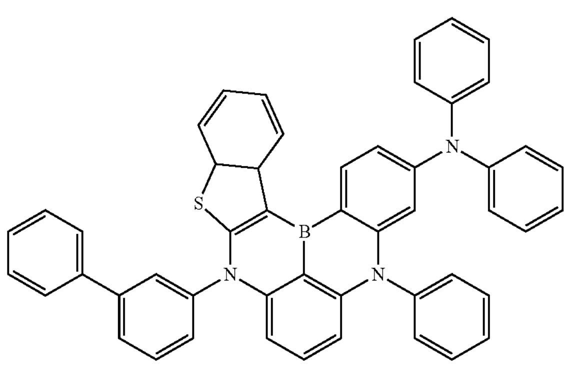
-continued
[Chemical Formula 75]
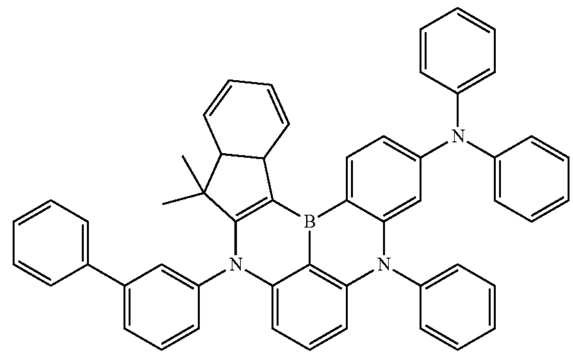
[Chemical Formula 76]
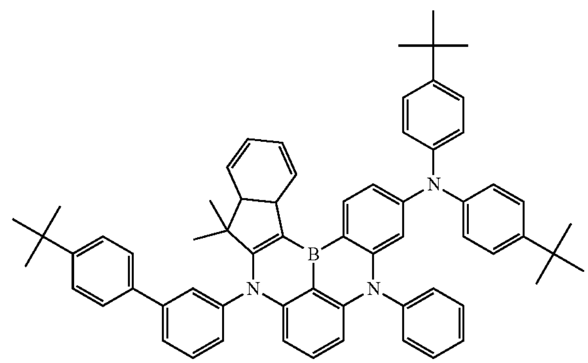
[Chemical Formula 77]
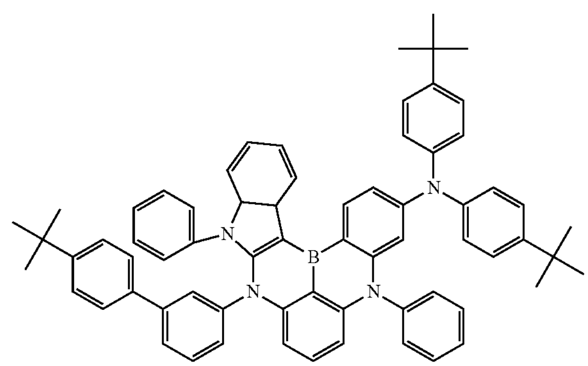
[Chemical Formula 78]
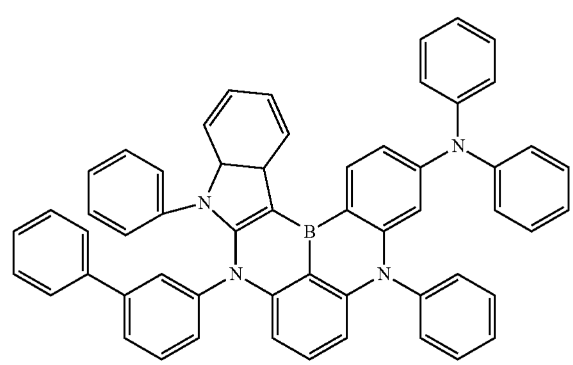

[Chemical Formula 79]
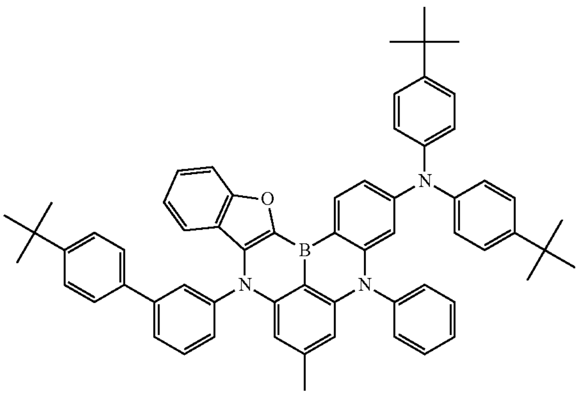
[Chemical Formula 80]
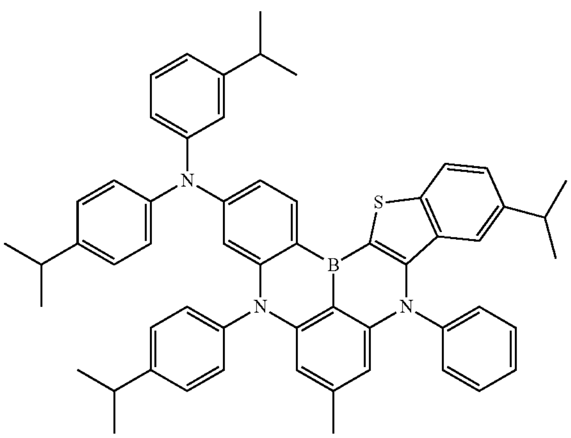
[Chemical Formula 81]
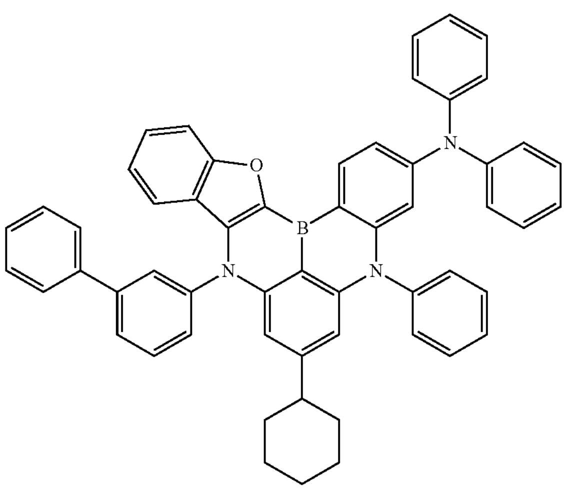
[Chemical Formula 82]
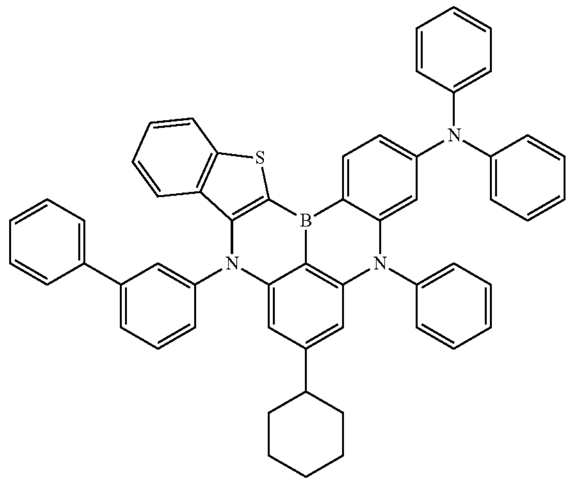
[Chemical Formula 83]
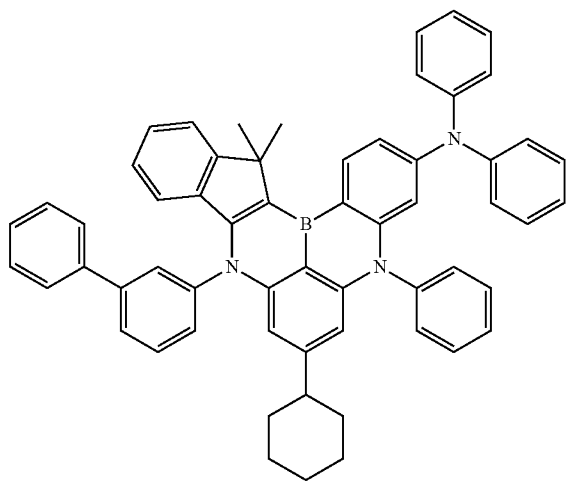
[Chemical Formula 84]
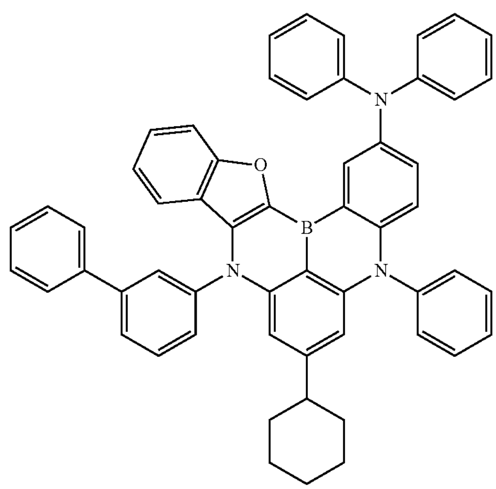

-continued
[Chemical Formula 85]
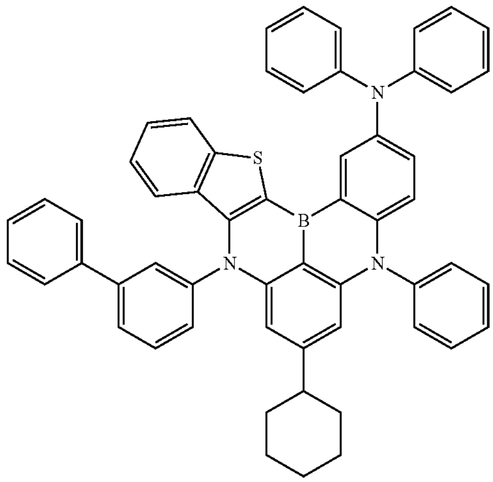
[Chemical Formula 86]
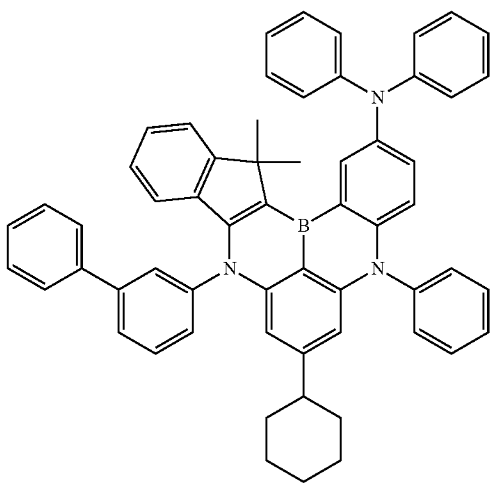
[Chemical Formula 87]
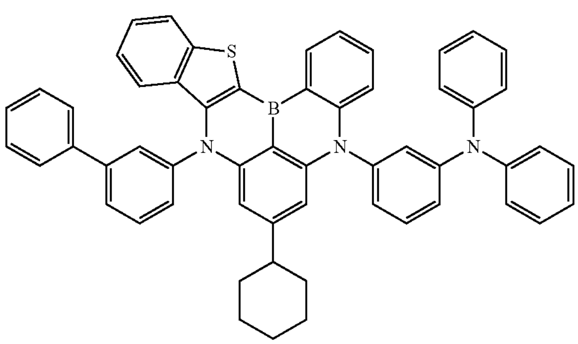
-continued
[Chemical Formula 88]
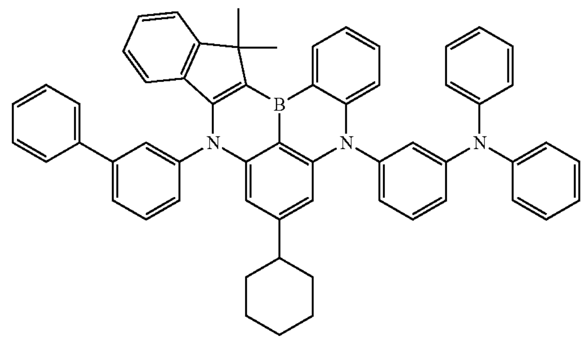
[Chemical Formula 89]
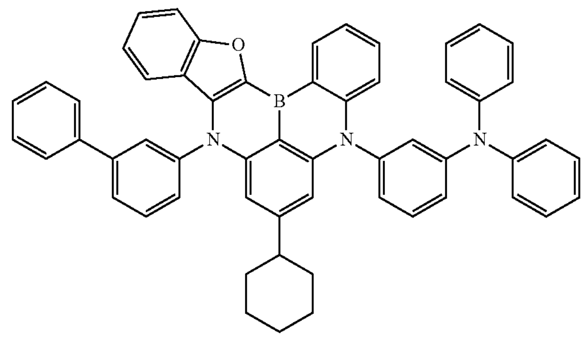
[Chemical Formula 90]
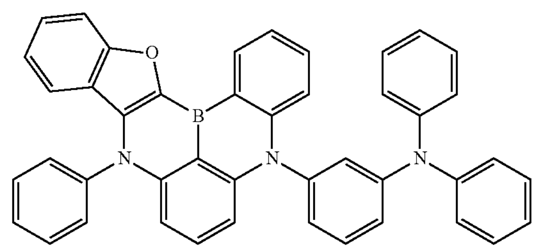
[Chemical Formula 91]
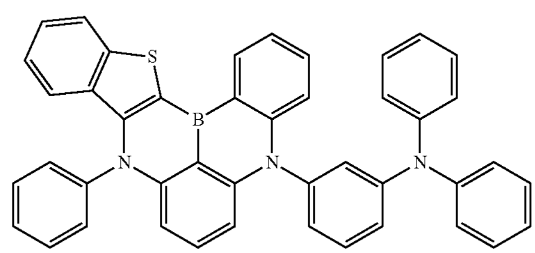
[Chemical Formula 92]
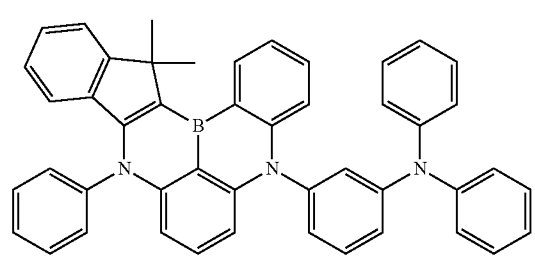

[Chemical Formula 93]
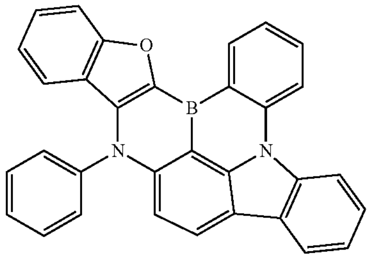
[Chemical Formula 94]
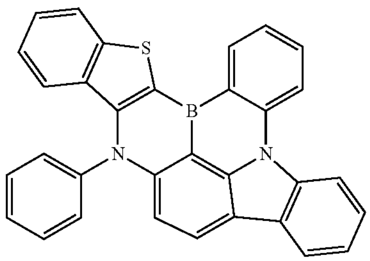
[Chemical Formula 95]
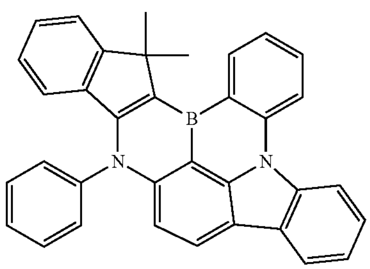
[Chemical Formula 96]
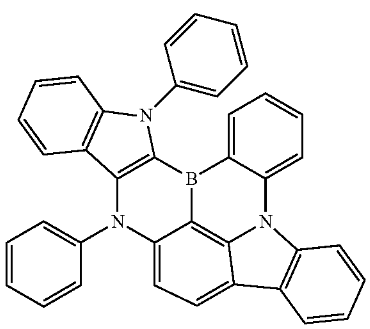
[Chemical Formula 97]
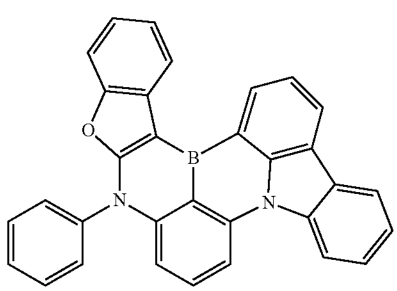
[Chemical Formula 98]
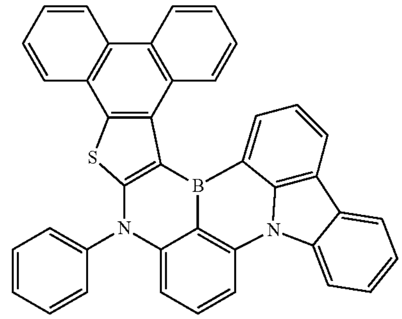
[Chemical Formula 99]
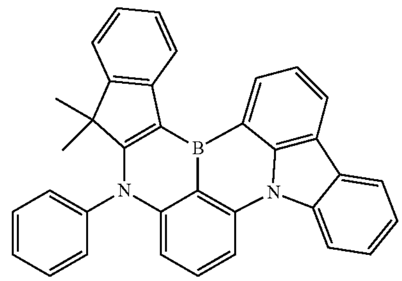
[Chemical Formula 100]
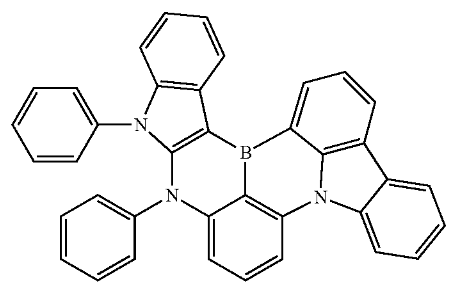
[Chemical Formula 101]
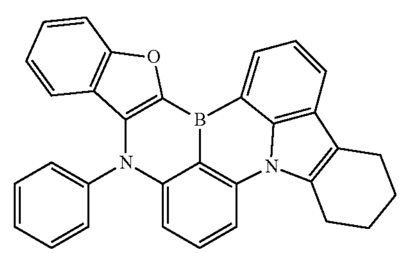
[Chemical Formula 102]
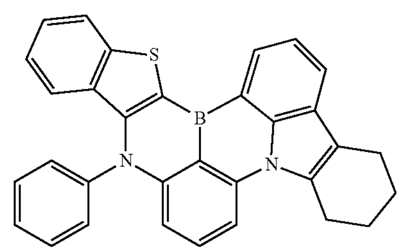

[Chemical Formula 103]
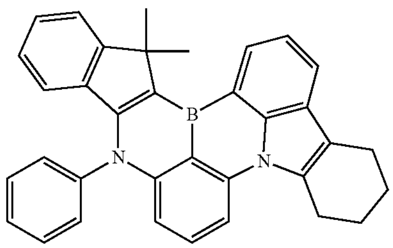
[Chemical Formula 104]
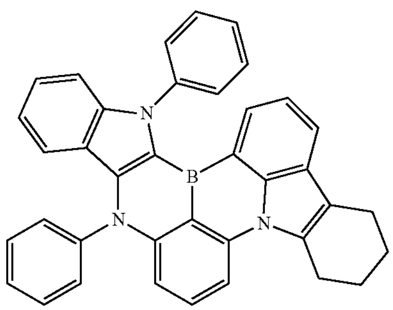
[Chemical Formula 105]
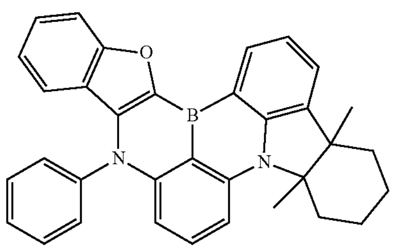
[Chemical Formula 106]
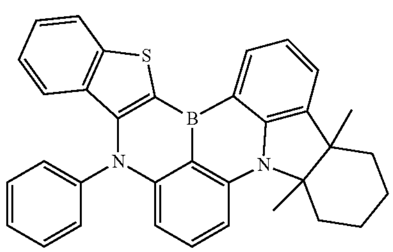
[Chemical Formula 107]
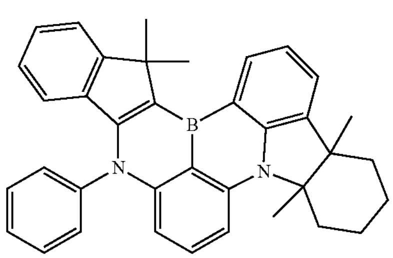
[Chemical Formula 108]
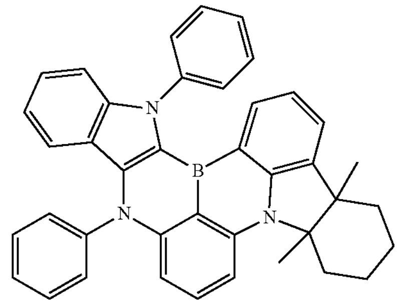
[Chemical Formula 109]
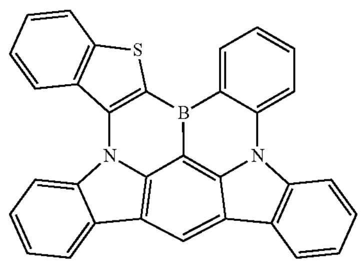
[Chemical Formula 110]
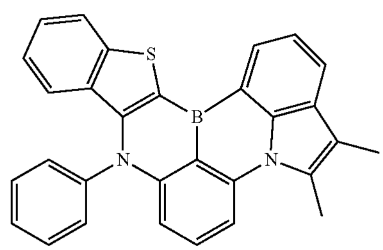
[Chemical Formula 111]
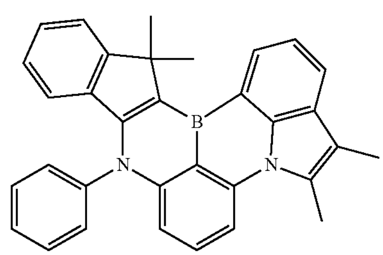
[Chemical Formula 112]
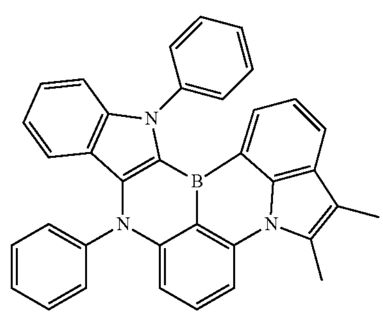

[Chemical Formula 113]
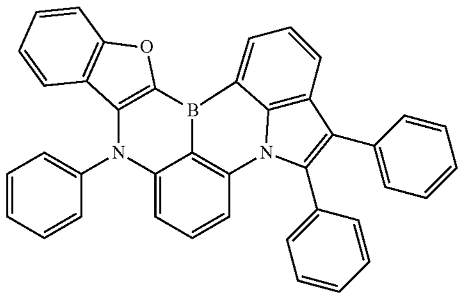
[Chemical Formula 114]
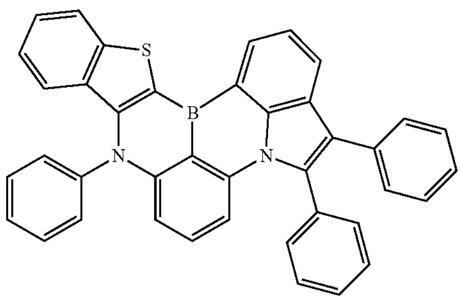
[Chemical Formula 115]
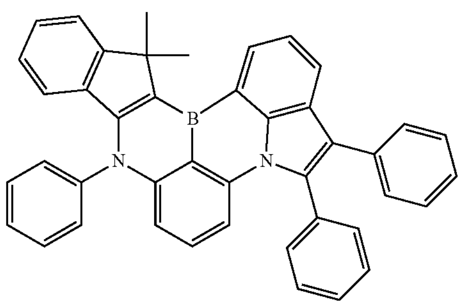
[Chemical Formula 116]
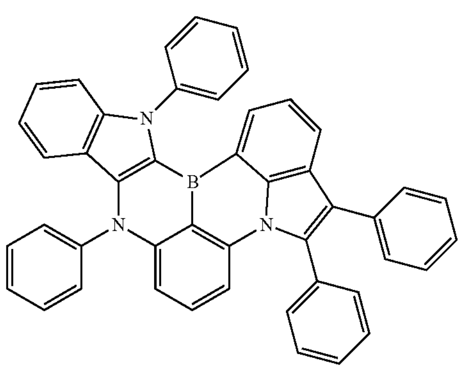
[Chemical Formula 117]
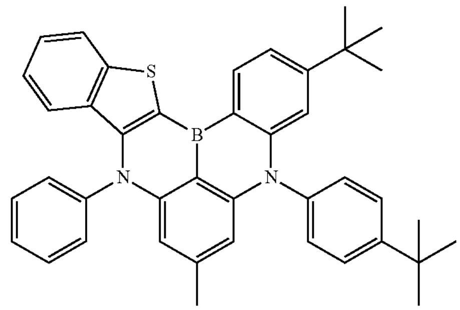
[Chemical Formula 118]
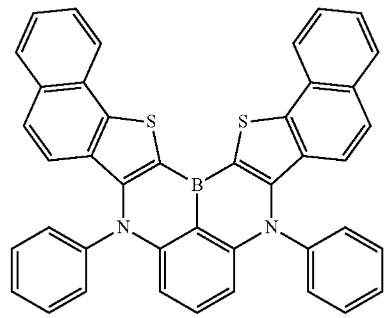
[Chemical Formula 119]
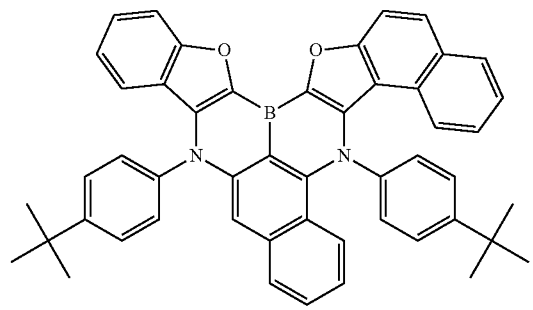
[Chemical Formula 120]
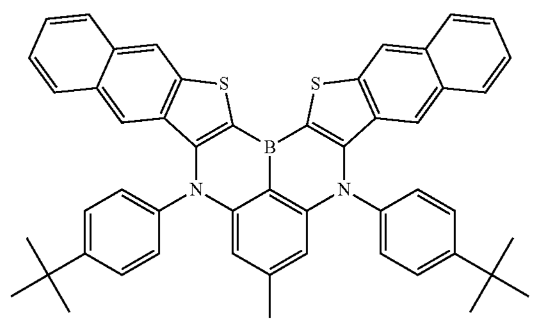
[Chemical Formula 121]
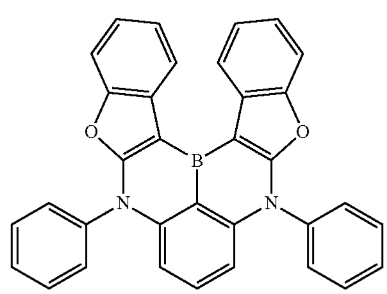

-continued
[Chemical Formula 122]
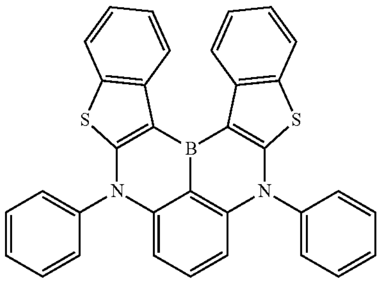
[Chemical Formula 123]
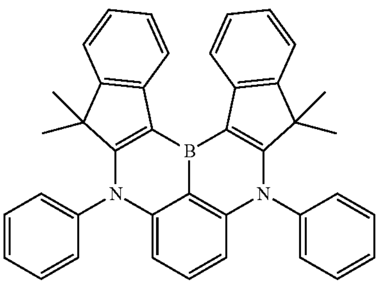
[Chemical Formula 124]
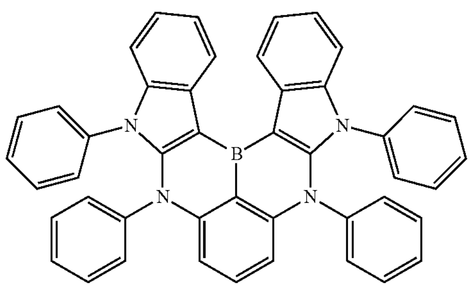
[Chemical Formula 125]
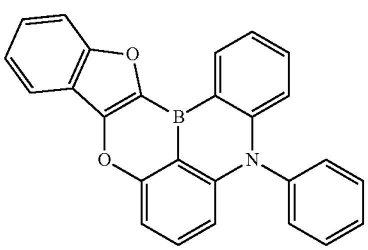
[Chemical Formula 126]
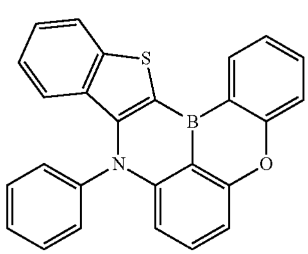
-continued
[Chemical Formula 127]
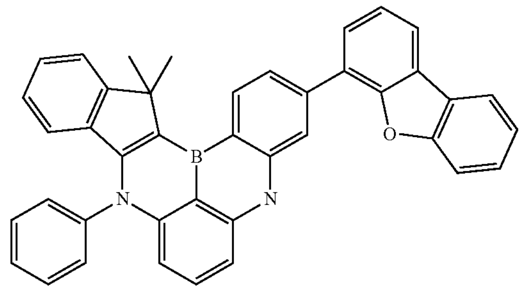
[Chemical Formula 128]
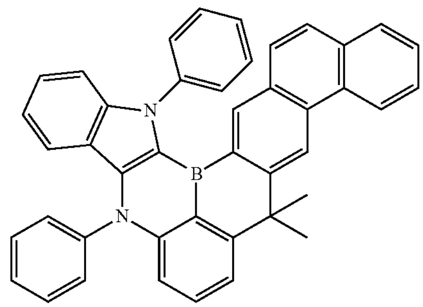
[Chemical Formula 129]
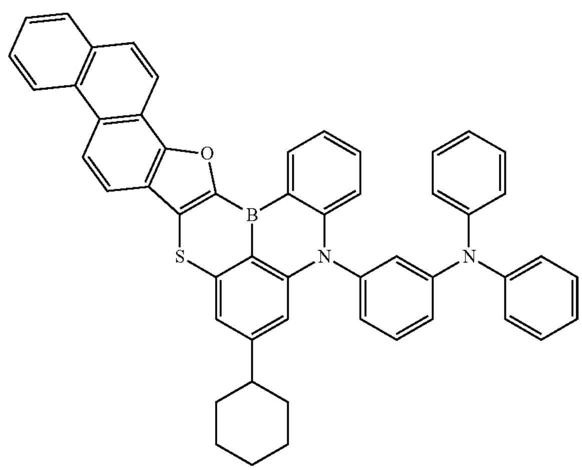
[Chemical Formula 130]
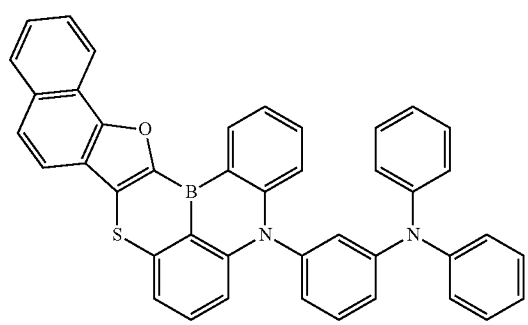

-continued
[Chemical Formula 131]
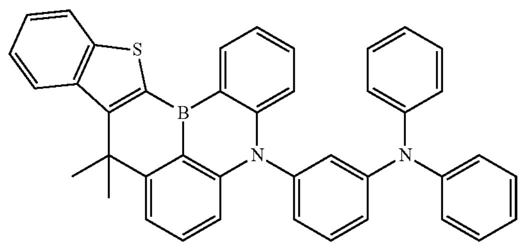
[Chemical Formula 132]
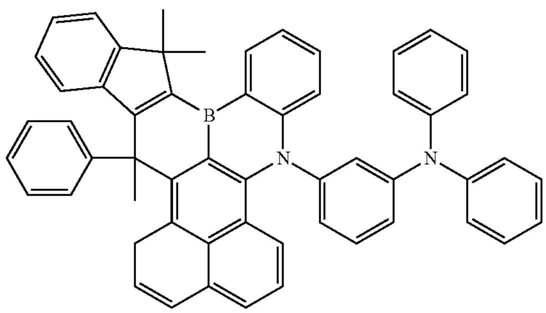
[Chemical Formula 133]
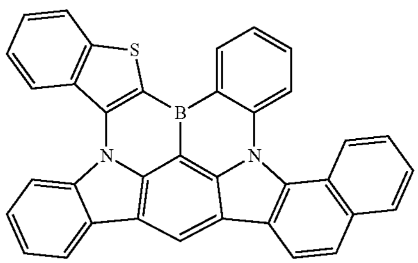
[Chemical Formula 134]
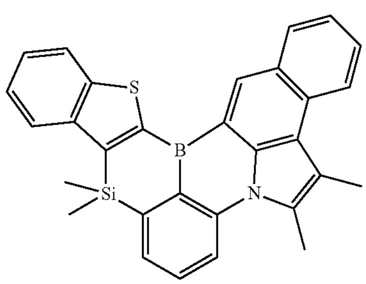
[Chemical Formula 135]
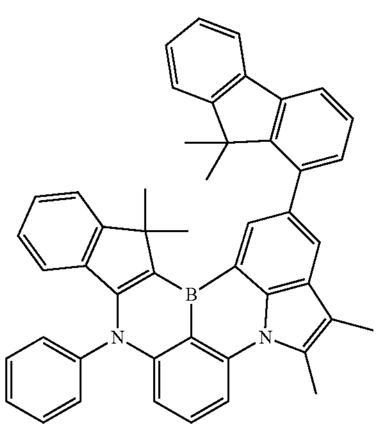
-continued
[Chemical Formula 136]
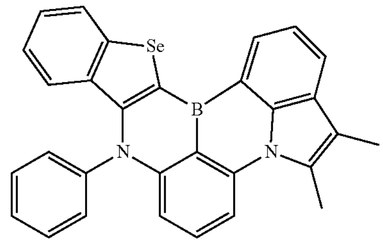
[Chemical Formula 137]
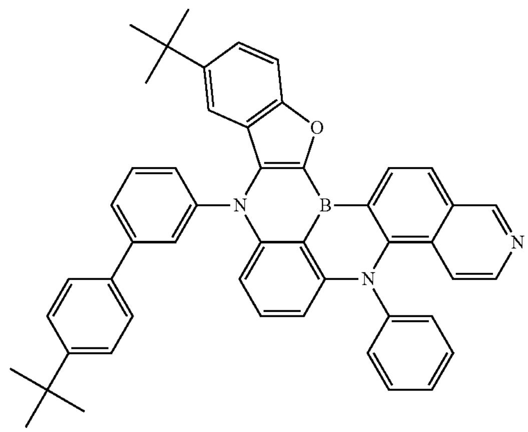
[Chemical Formula 138]
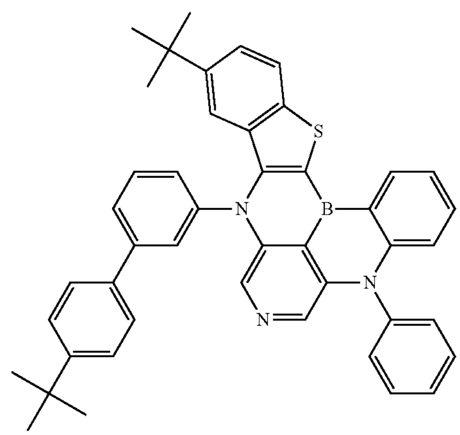
[Chemical Formula 139]
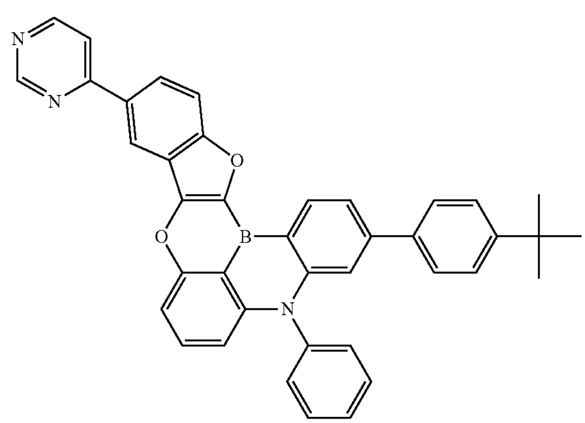

[Chemical Formula 140]
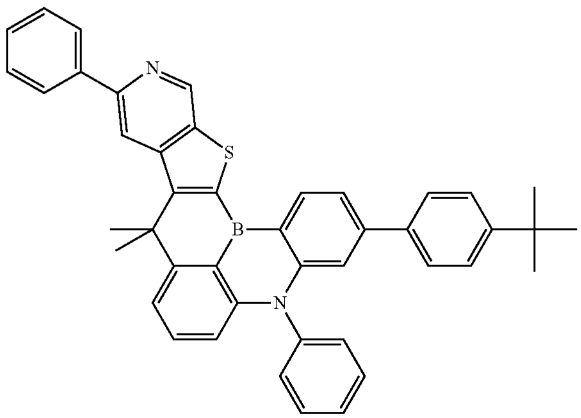
[Chemical Formula 141]
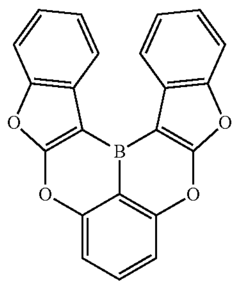
[Chemical Formula 142]
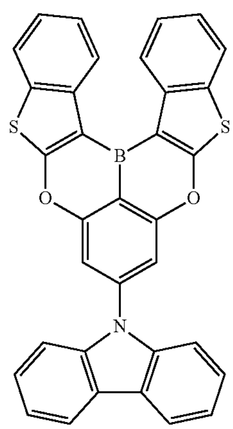
[Chemical Formula 143]
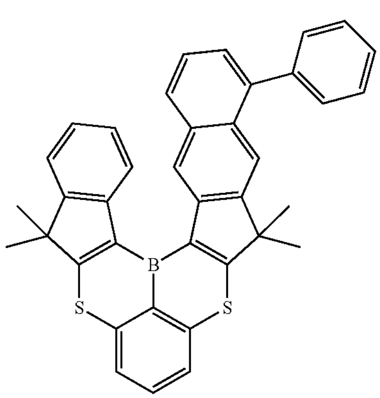
[Chemical Formula 144]
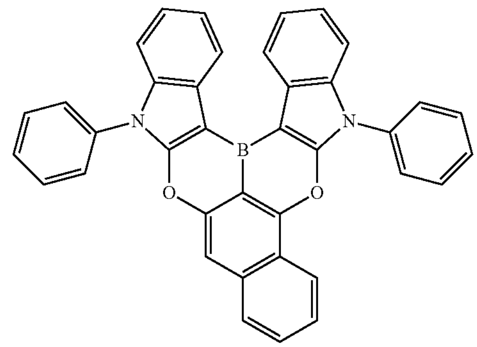
[Chemical Formula 145]
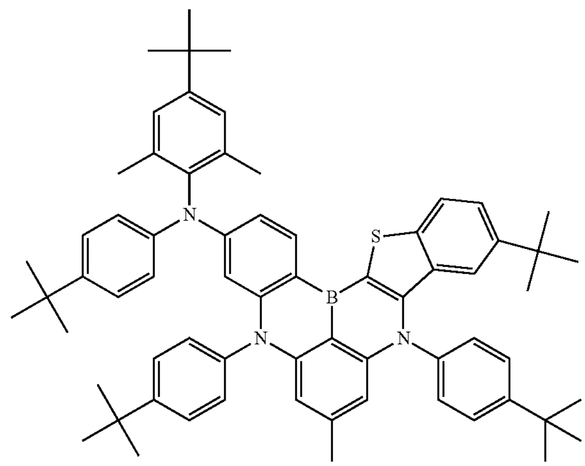
[Chemical Formula 146]
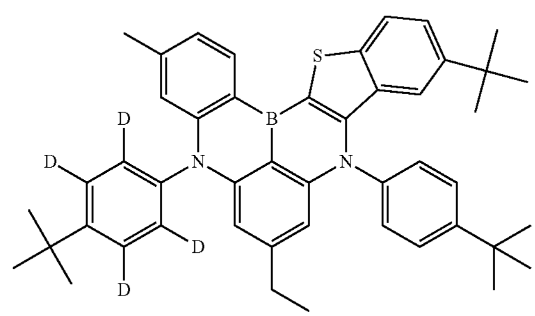
[Chemical Formula 147]
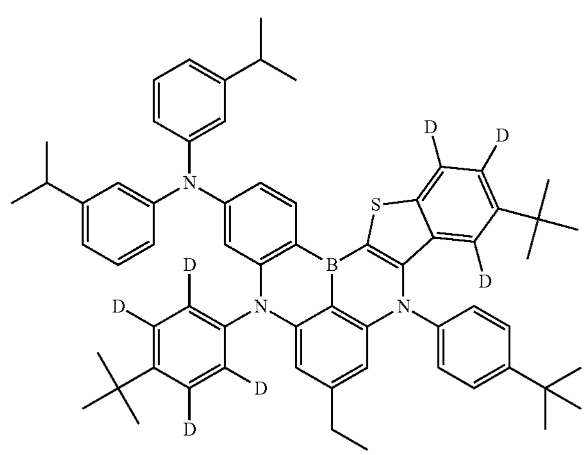

-continued
[Chemical Formula 148]
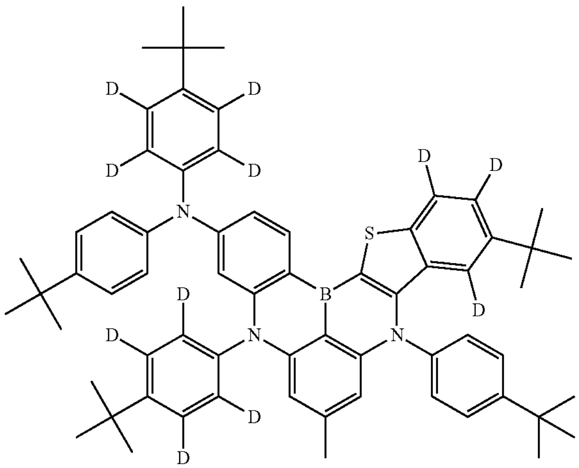
[Chemical Formula 149]
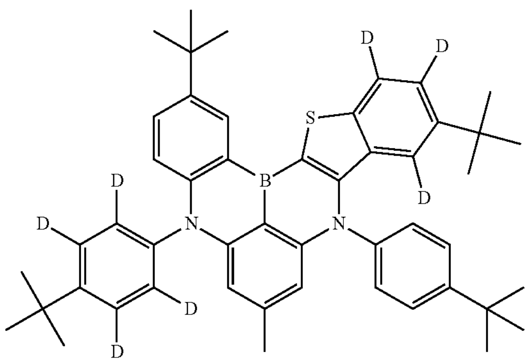
[Chemical Formula 150]
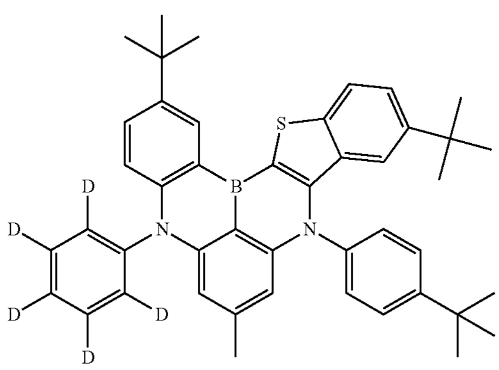
[Chemical Formula 151]
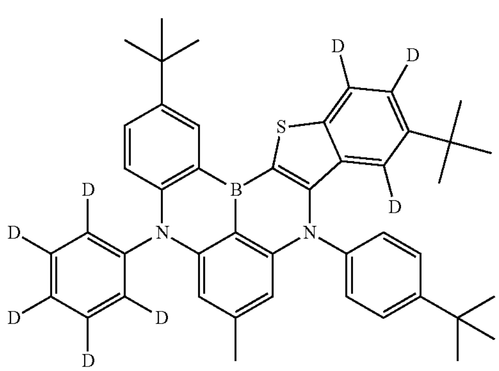
-continued
[Chemical Formula 152]
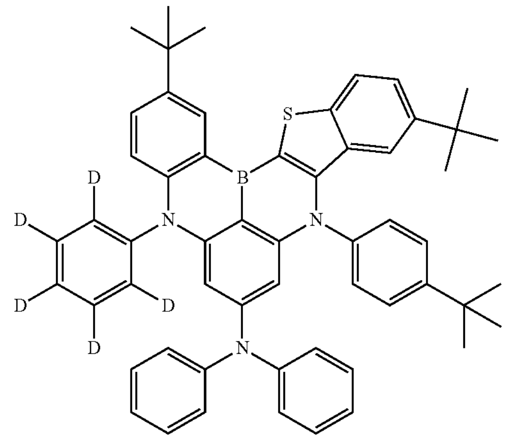
[Chemical Formula 153]
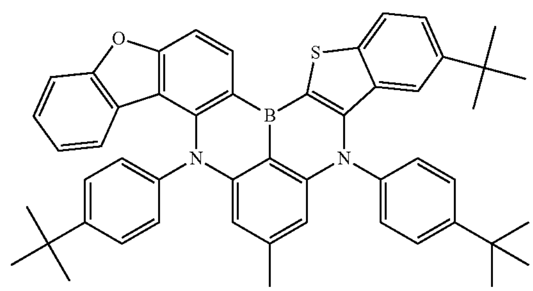
[Chemical Formula 154]
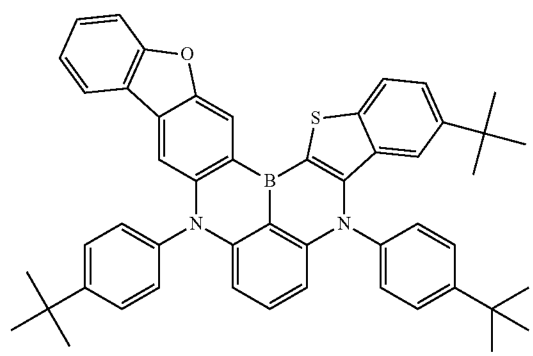
[Chemical Formula 155]
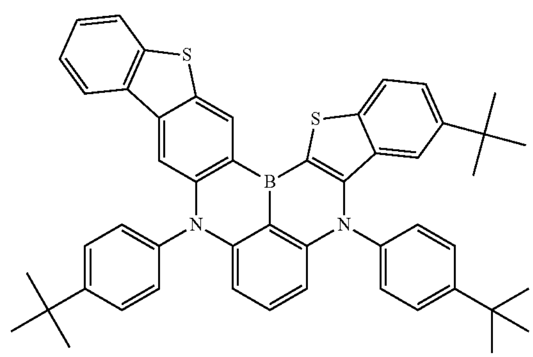

[Chemical Formula 156]
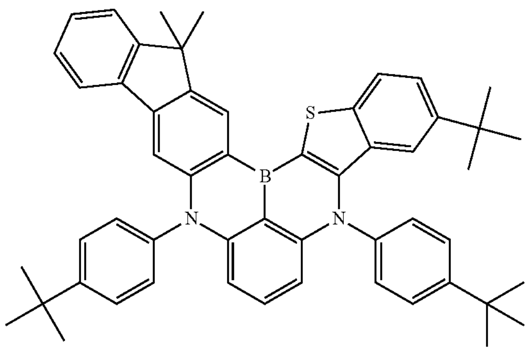
[Chemical Formula 157]
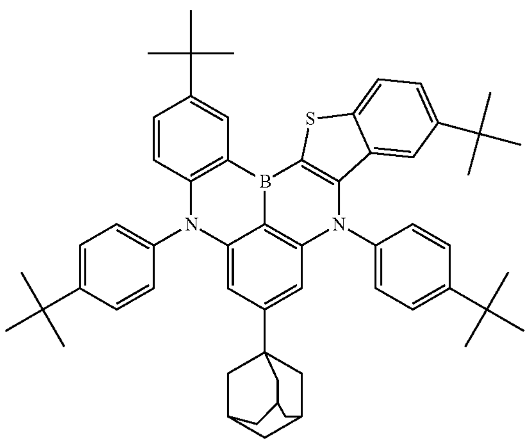
[Chemical Formula 158]
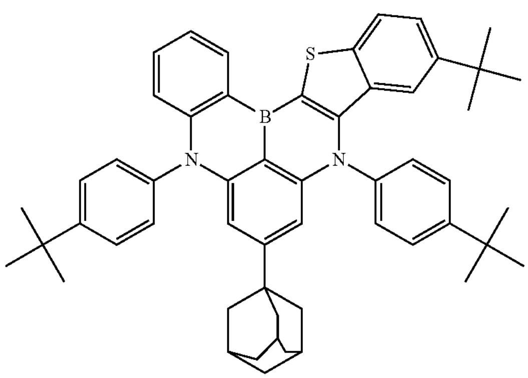
[Chemical Formula 159]
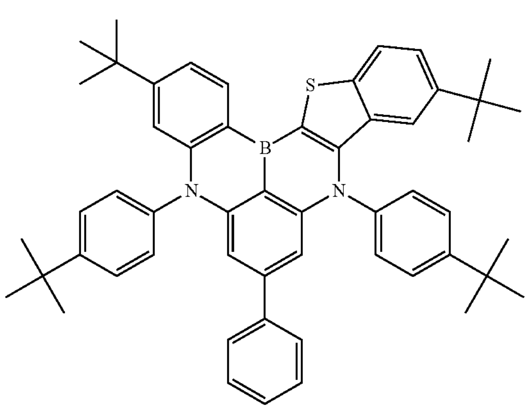
[Chemical Formula 160]
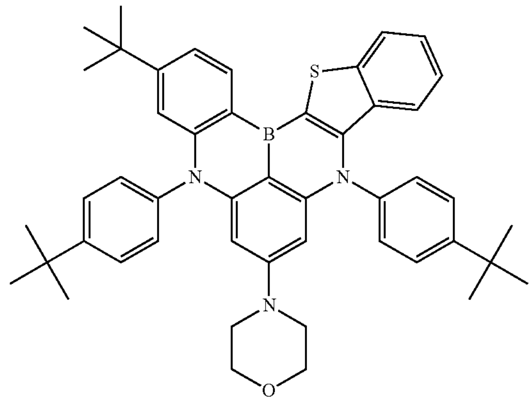
[Chemical Formula 161]
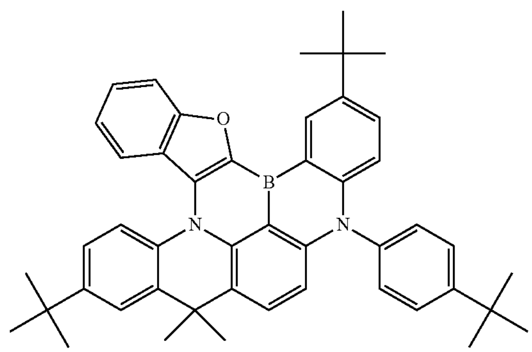
[Chemical Formula 162]
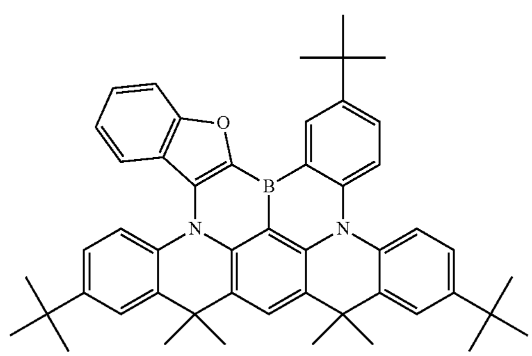
[Chemical Formula 163]
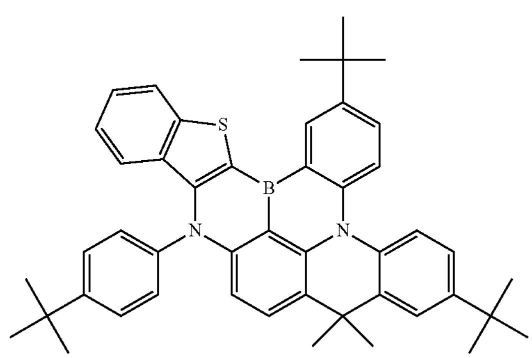

-continued
[Chemical Formula 164]
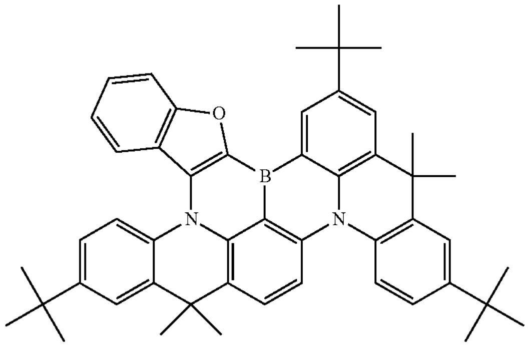
[Chemical Formula 165]
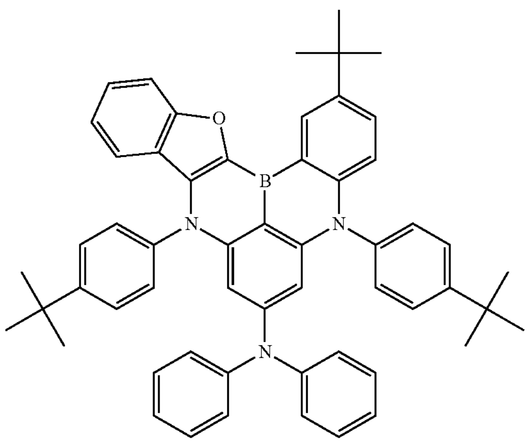
[Chemical Formula 166]
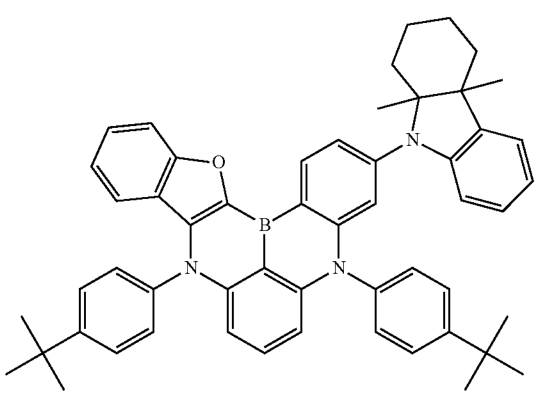
-continued
[Chemical Formula 167]
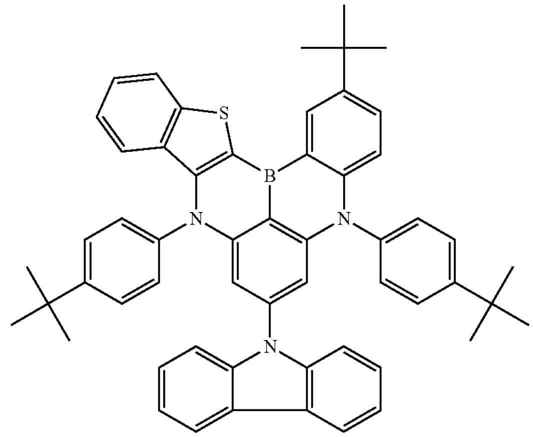
[Chemical Formula 168]
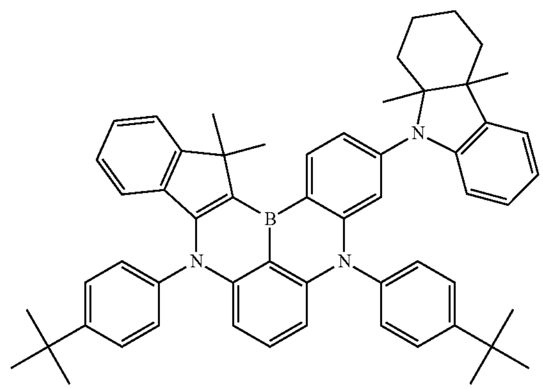
[Chemical Formula 169]
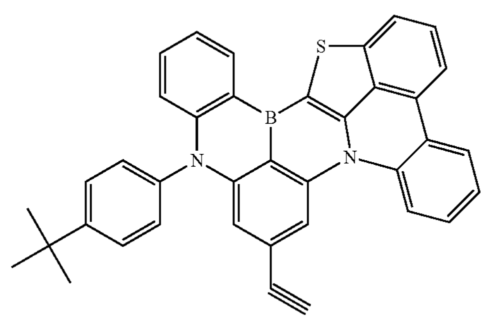
[Chemical Formula 170]
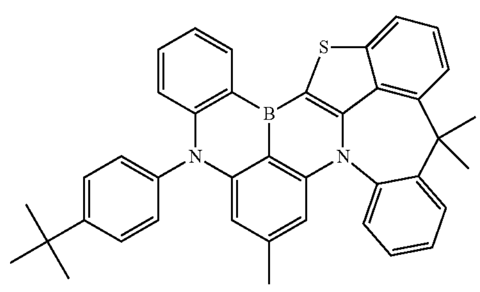

-continued
[Chemical Formula 171]
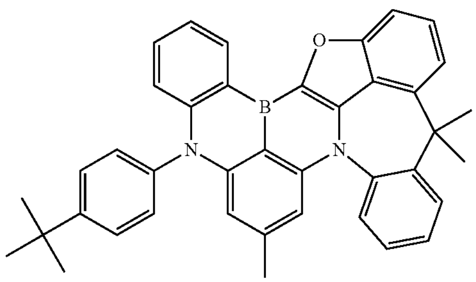
[Chemical Formula 172]
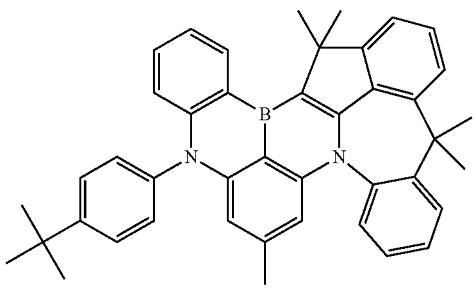
[Chemical Formula 173]
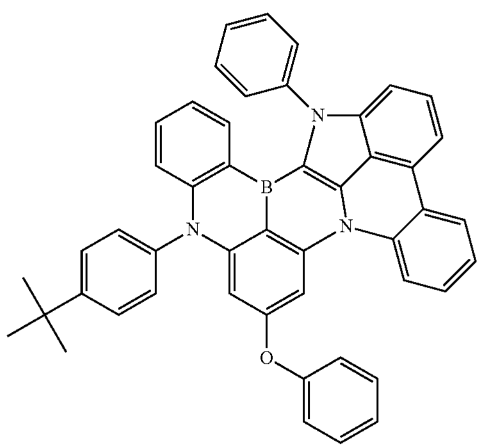
[Chemical Formula 174]
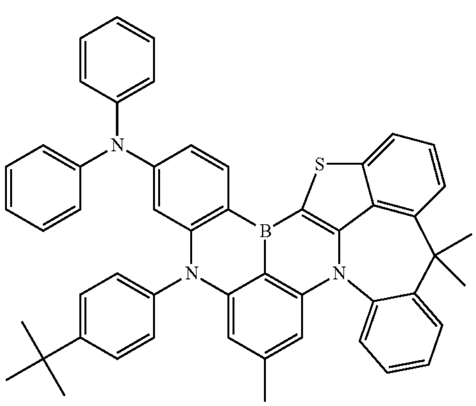
-continued
[Chemical Formula 175]
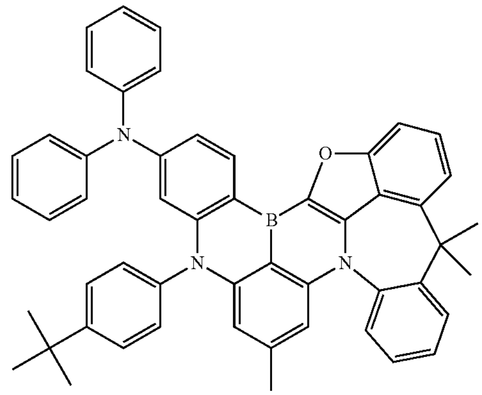
[Chemical Formula 176]
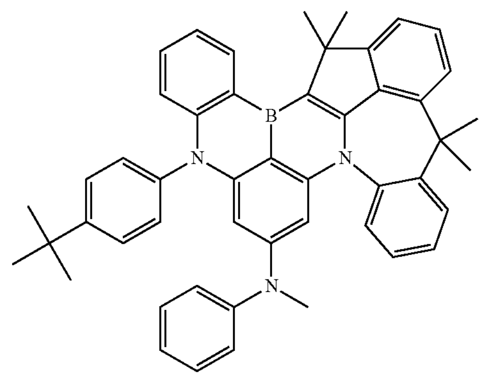
[Chemical Formula 177]
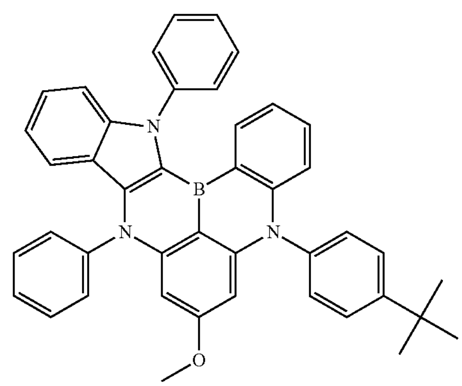
[Chemical Formula 178]
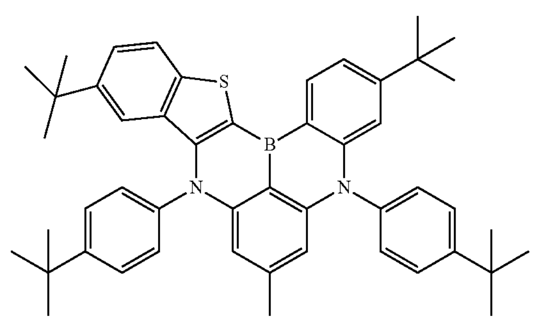

[Chemical Formula 179]
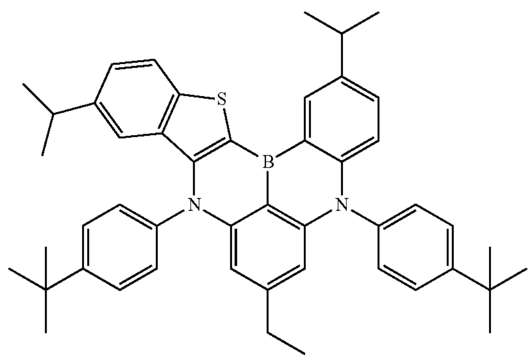
[Chemical Formula 180]
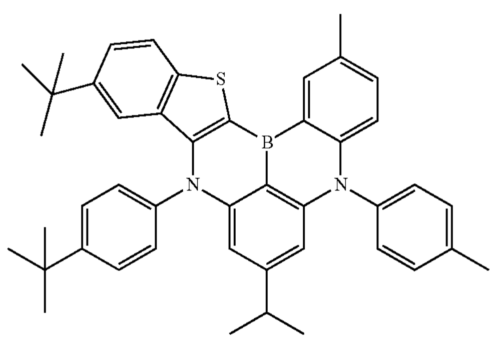
[Chemical Formula 181]
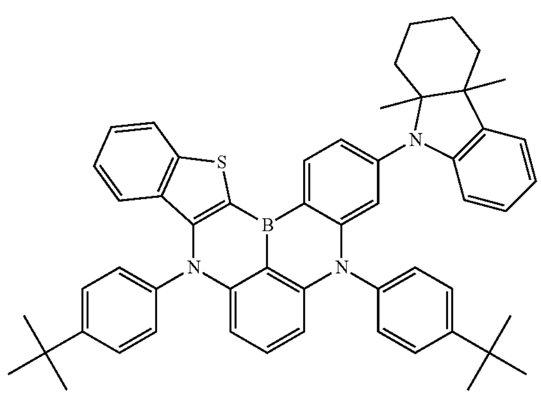
[Chemical Formula 182]
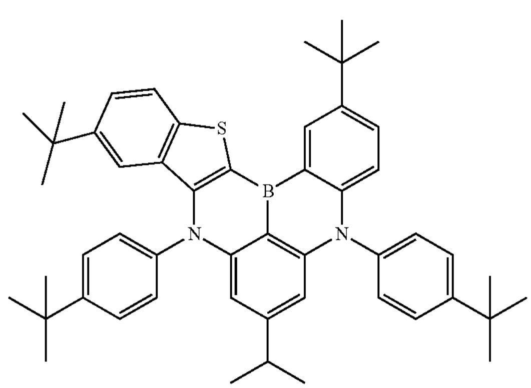
[Chemical Formula 183]
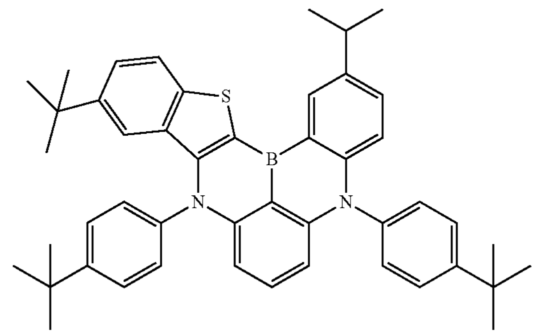
[Chemical Formula 184]
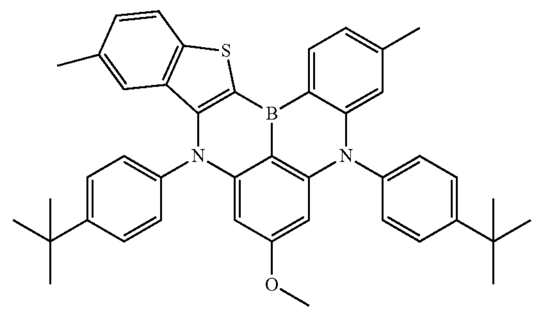
[Chemical Formula 185]
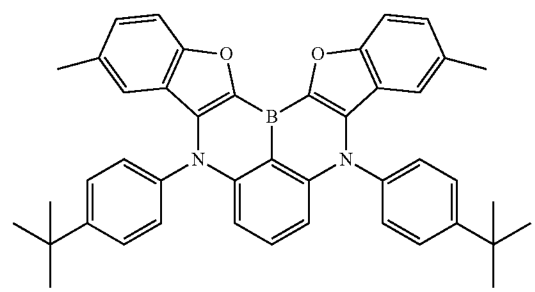
[Chemical Formula 186]
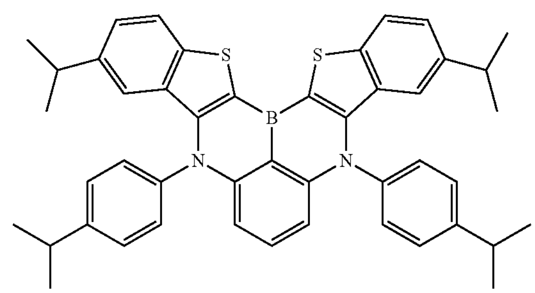
[Chemical Formula 187]
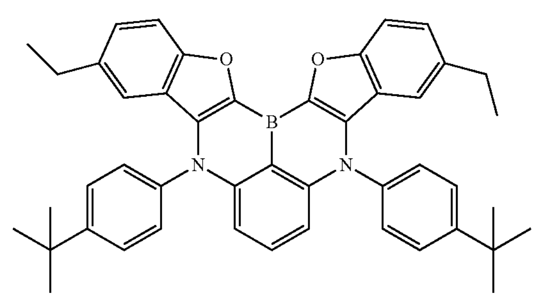

-continued
[Chemical Formula 188]
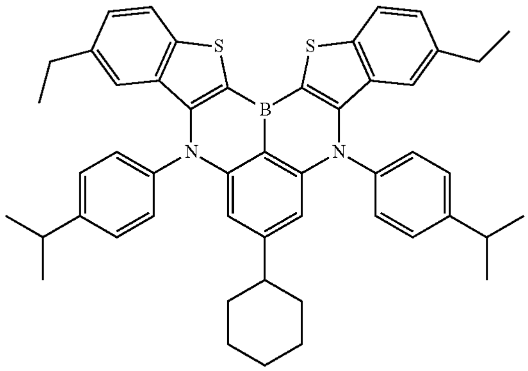
[Chemical Formula 189]
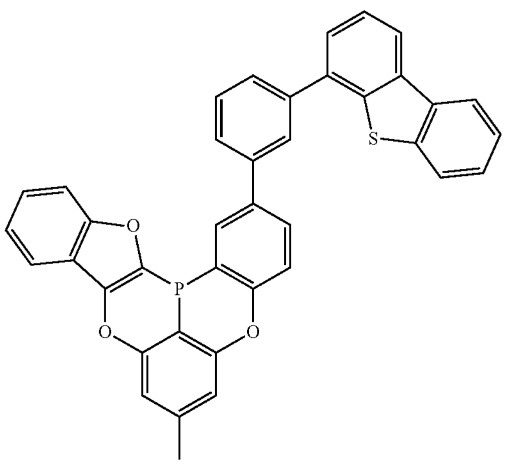
[Chemical Formula 190]
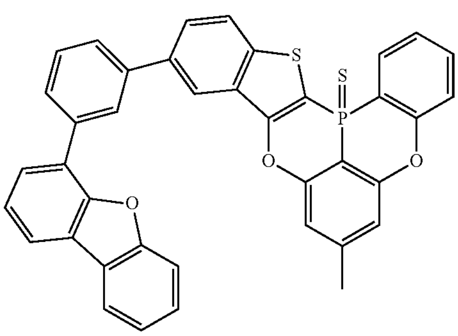
[Chemical Formula 191]
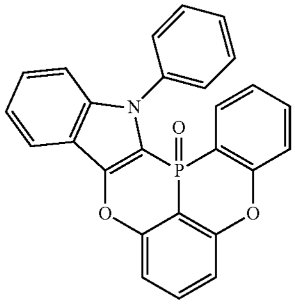
-continued
[Chemical Formula 192]
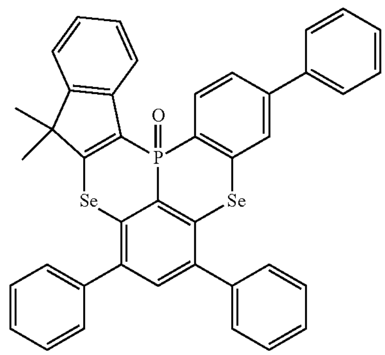
[Chemical Formula 193]
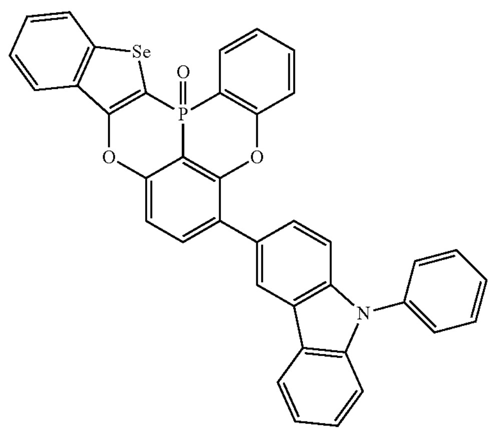
[Chemical Formula 194]
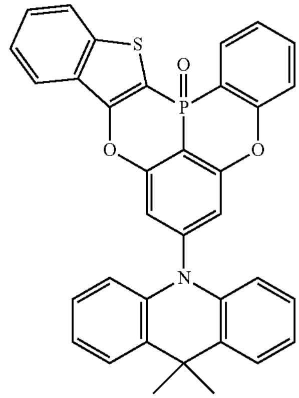

-continued
[Chemical Formula 195]
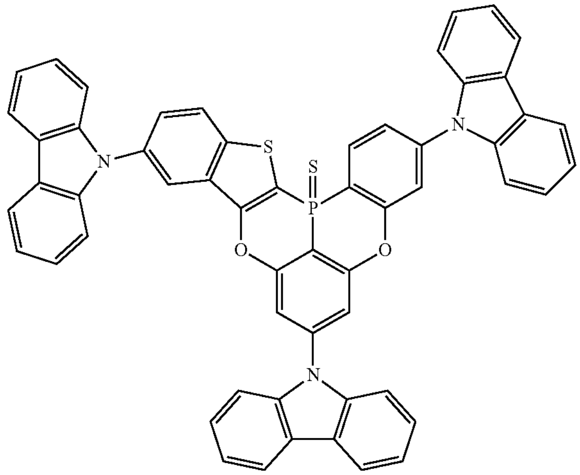
[Chemical Formula 196]
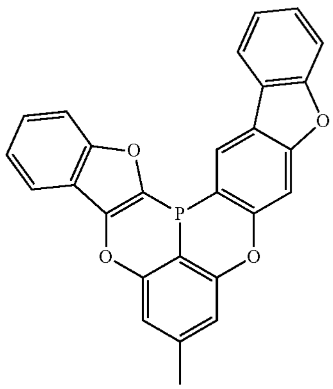
[Chemical Formula 197]
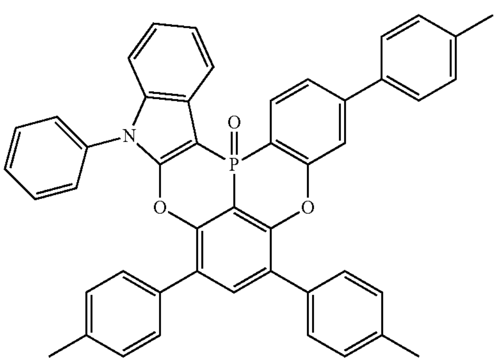
[Chemical Formula 198]
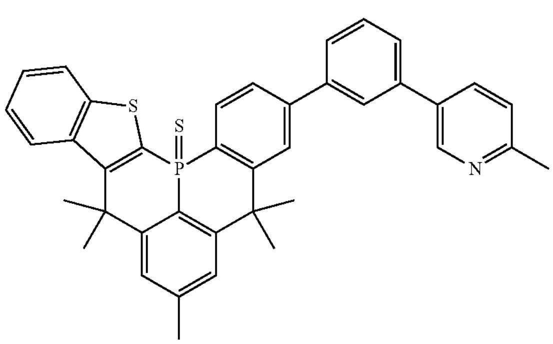
-continued
[Chemical Formula 199]
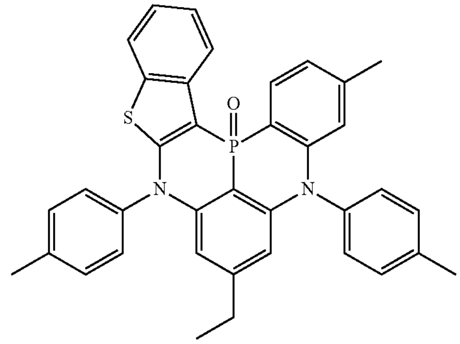
[Chemical Formula 200]
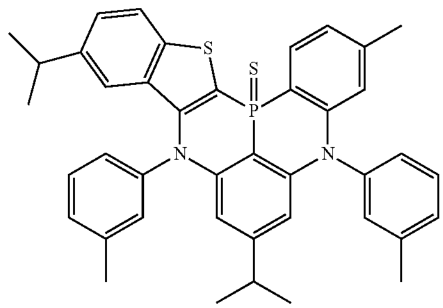
[Chemical Formula 201]
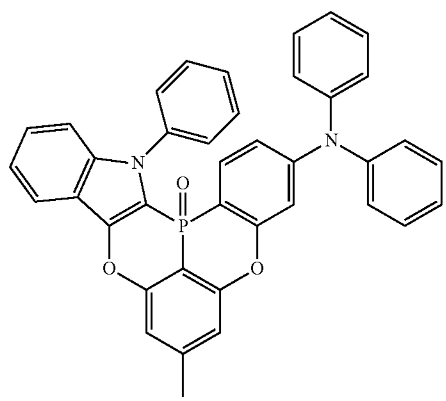
[Chemical Formula 202]
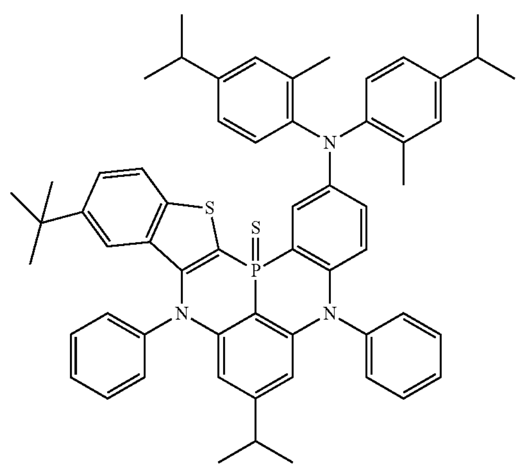

-continued

[Chemical Formula 203]

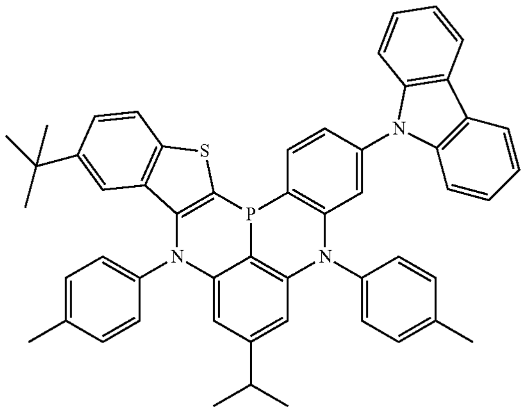

[Chemical Formula 204]

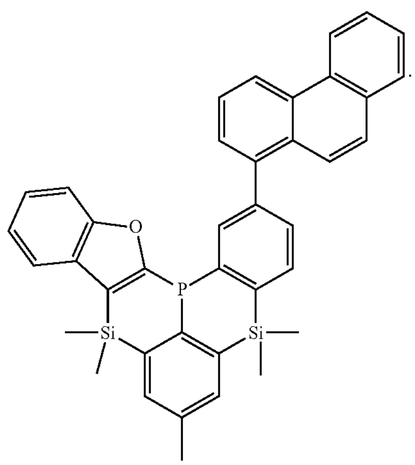

In the compound represented by Chemical Formula H, available for the organic light emitting diode of the present disclosure, the anthracene ring moiety have a substituted or unsubstituted aryl of 6 to 50 carbon atoms or a substituted or unsubstituted heteroaryl of 2 to 50 carbon atoms bonded thereto at position 9 and a linker $L_{13}$ bonded thereto at position 10 while the substituent $L_{13}$ is linked to a carbon atom as a ring member of one benzene ring in the dibenzofuran moiety.

More particularly, the compound represented by Chemical Formula H is characterized by the structure in which position 1 or 2 of one phenyl ring or position 1' or 2' of the other phenyl ring in the dibenzofuran moiety shown in the following Diagram 1 may be connected to position 10 of the anthracenyl moiety. The use of the compound represented by Chemical Formula H as a host material in the light emitting layer can guarantee improved properties in the organic light emitting diode due to the structural characteristics.

[Diagram 1]

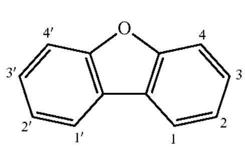

In a particular example of the anthracene derivative represented by [Chemical Formula H] according to the present disclosure, $Ar_9$ may be a deuterium-substituted or unsubstituted phenyl and $R_{11}$ to $R_{18}$ may be the same or different and may each be independently a hydrogen atom or a deuterium atom. In more particular example, the anthracene derivative represented by Chemical Formula H includes a deuterium atom at a degree of deuteration of 30% or higher.

Here, the anthracene derivative represented by Chemical Formula H may have a degree of deuteration of 30% or higher, particularly 35% or higher, more particularly 40% or higher, 45% or higher, 50% or higher, 55% or higher, 60% or higher, 65% or higher, or even more particularly 70% or higher.

As for a degree of deuteration applied in the description, “a deuterated derivative” of compound X refers to the same structure of compound X with the exception that at least one deuterium atom (D), instead of a hydrogen atom (H), is bonded to a carbon atom, a nitrogen atom, or an oxygen atom within compound X.

As used herein, the term “yy % deuterated” or “a degree of deuteration of yy %” means that deuterium atoms bonded directly to carbon, nitrogen, and oxygen atoms within compound X exist at yy %, based on the total number of hydrogen and deuterium atoms bonded directly thereto.

For example, the benzene compound C6H4D2, which has two deuterium atoms and four hydrogen atoms, is 33% deuterated because the degree of deuteration thereof is calculated as $2/(4+2)\times100=33\%$.

When the anthracene derivative compound of the present disclosure is deuterated, the degree of deuteration is expressed as a percentage of the deuterium atoms bonded directly to the carbon atoms within the anthracene derivative relative to all hydrogen and deuterium atoms bonded directly to the carbon atoms within the anthracene derivative.

For the anthracene derivative represented by the following Chemical Formula 1, for example, there is a total of 10 deuterium atoms from 5 deuterium atoms on the phenyl radical bonded to the anthracene moiety and 5 deuterium atoms on the phenyl radical bonded to the dibenzofuran moiety while there are 8 hydrogen atoms on the anthracene moiety and 6 hydrogen atoms on the two 6-membered aromatic rings of the dibenzofuran moiety. Thus, the degree of deuteration is expressed as $100*10/(10+8+6)=41.7\%$.

[Compound 1]

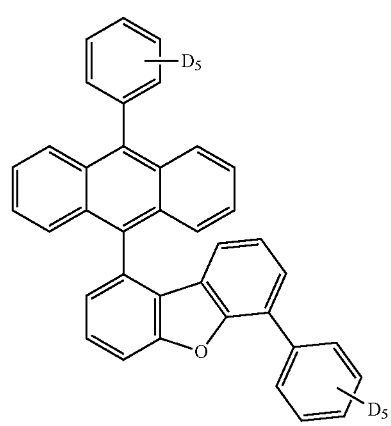

For a specific compound, an average degree of deuteration may be given because degrees of deuteration may differ from one substituent to another.

An average degree of deuteration is more suitable for accounting for an anthracene compound partially substituted with deuterium atoms. For example, perdeuterated anthracene derivatives may be prepared and used. However, compounds with hydrogen atoms and deuterium atoms on carbon atoms at specific positions or in specific moieties may be obtained in mixture according to reaction conditions during the preparation and it is very difficult to separate the compounds from each other. In this case, an average amount of deuterium atoms existing in the compositions can be obtained and used to calculate a degree of deuteration with reference to the structural formula thereof.

Among the anthracene derivatives represented by Chemical Formula H, deuterated anthracene derivatives can improve the life span of the organic light emitting diode of the present disclosure.

According to a particular embodiment, $R_{11}$ to $R_{18}$ in Chemical Formula H, which may be the same or different, may each be independently a hydrogen or a deuterium atom and $Ar_9$ may be a perdeuterated phenyl radical.

In the compound of Chemical Formula H according to some particular embodiments, $Ar_9$ is a deuterium-substituted or unsubstituted phenyl, and $R_{11}$ to $R_{14}$ may each be a deuterium atom or $R_{15}$ to $R_{18}$ may each be a deuterium, and particularly, $R_{11}$ to $R_{18}$ may each be a deuterium atom.

In the compound of Chemical Formula H according to the present disclosure, at least one of $R_{23}$ to $R_{26}$ may be a deuterated aryl of 6 to 20.

In addition, the linker $L_{13}$ in Chemical Formula H may be a single bond.

Concrete examples of the anthracene derivative represented by Chemical Formula H according to the present disclosure include Compounds 1 to 78:

<Compound 1>

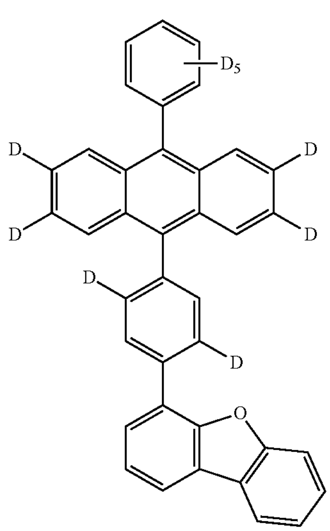

-continued

<Compound 2>

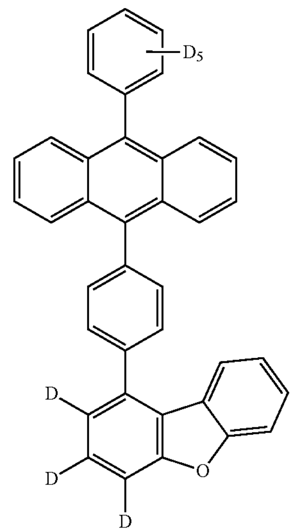

<Compound 3>

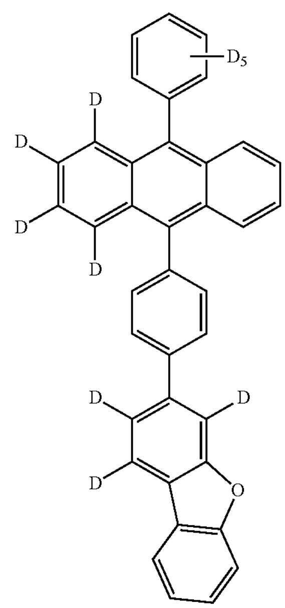

<Compound 4>

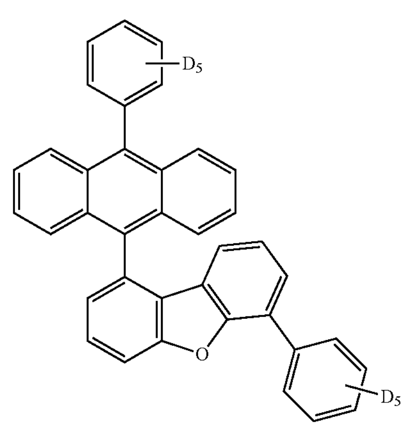

<Compound 5>
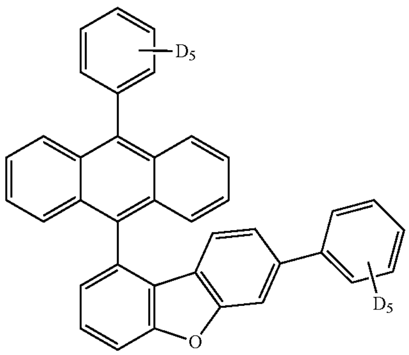
<Compound 6>
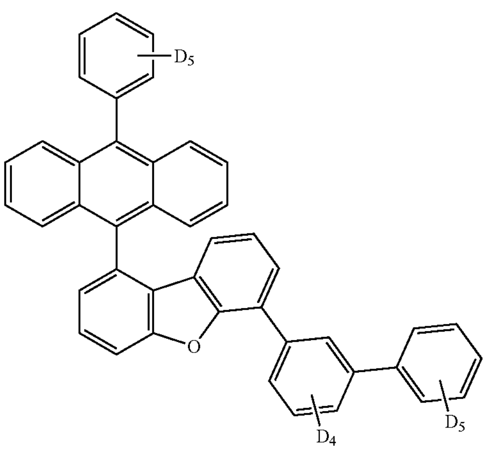
<Compound 7>
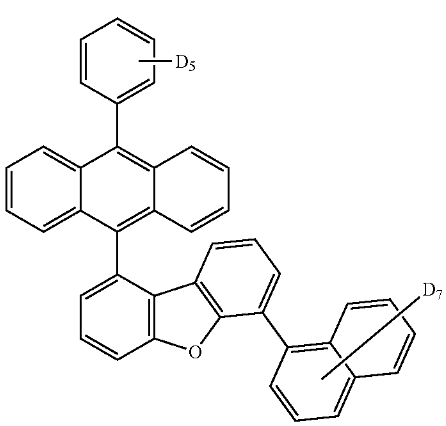
<Compound 8>
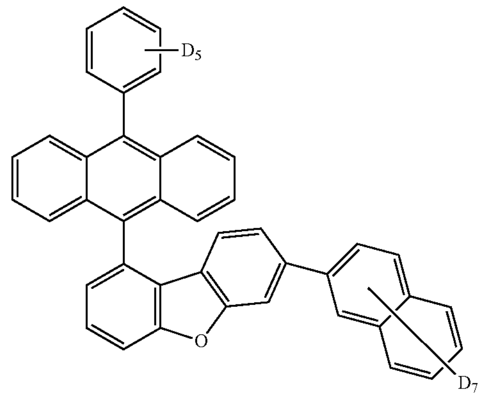
<Compound 9>
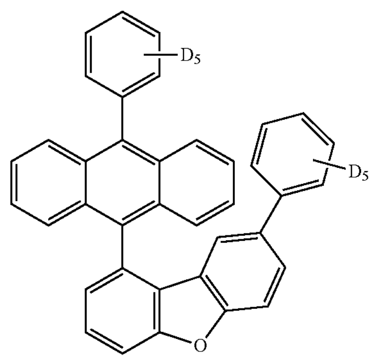
<Compound 10>
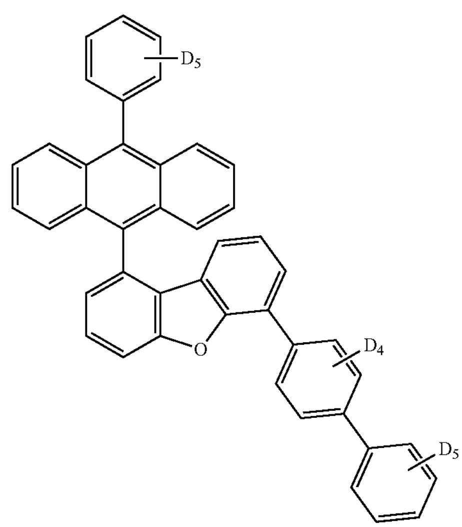

-continued
<Compound 11>
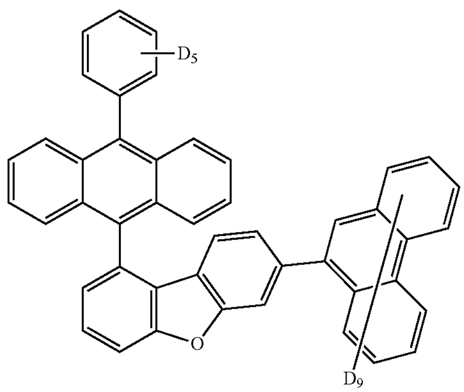
<Compound 12>
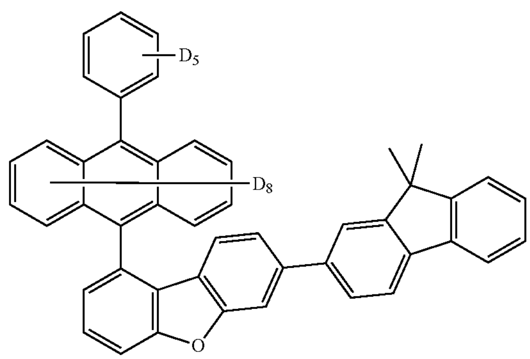
<Compound 13>
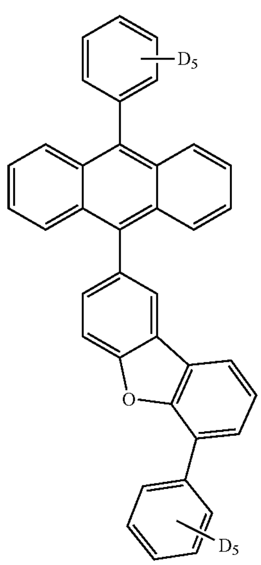
-continued
<Compound 14>
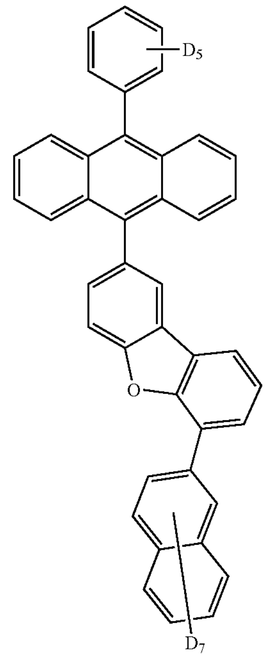
<Compound 15>
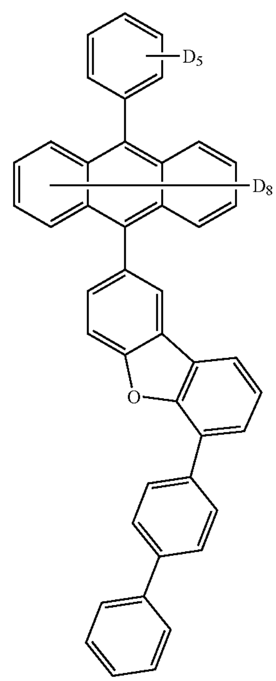

-continued
<Compound 16>
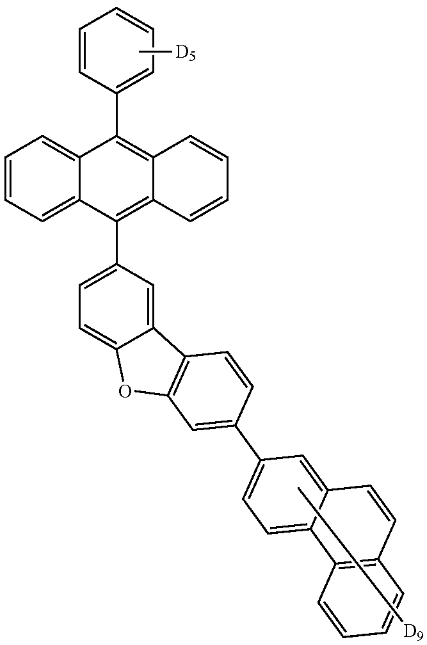
<Compound 17>
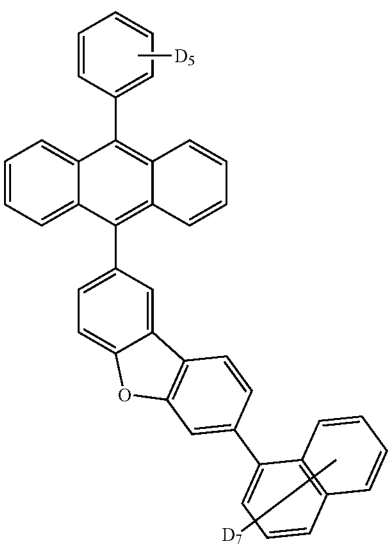
<Compound 18>
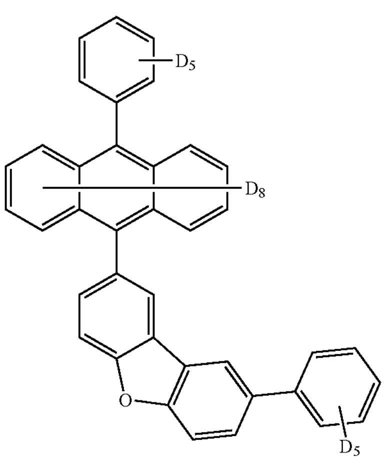
-continued
<Compound 19>
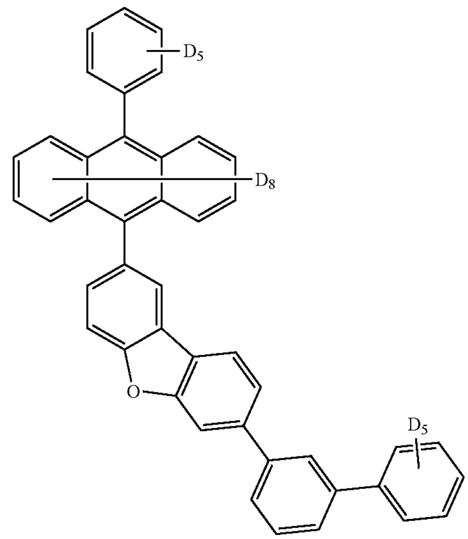
<Compound 20>
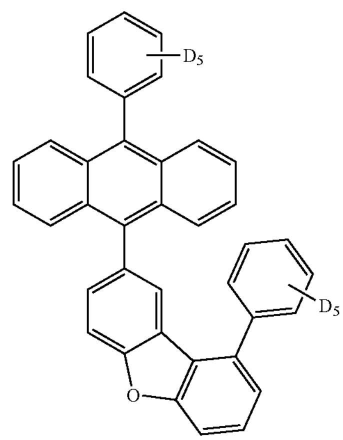
<Compound 21>
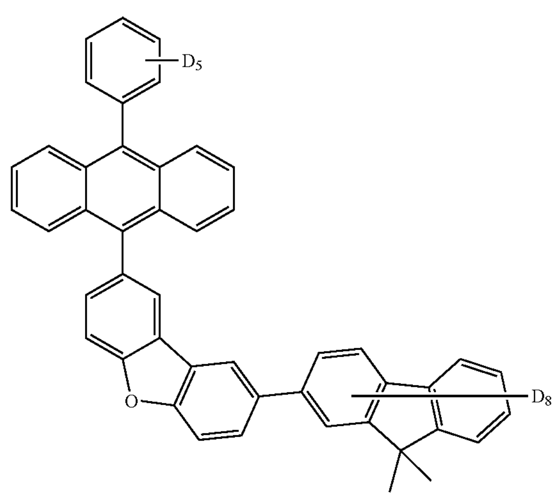

-continued
<Compound 22>
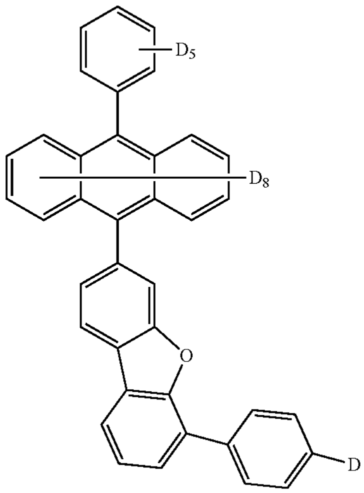
<Compound 23>
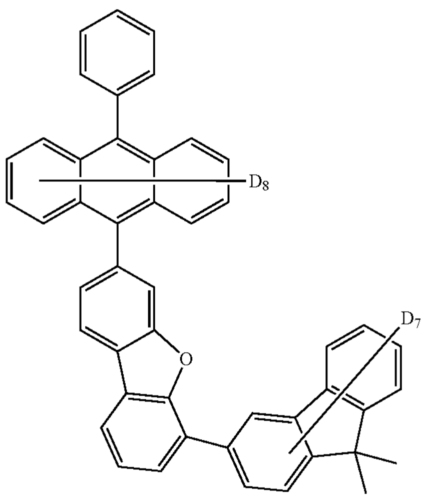
<Compound 24>
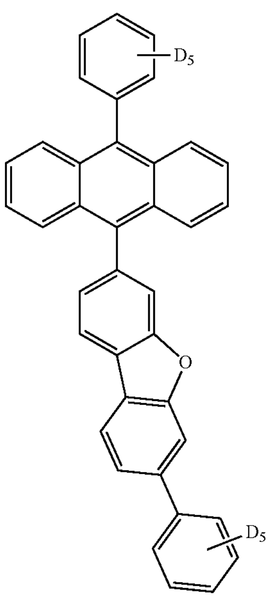
-continued
<Compound 25>
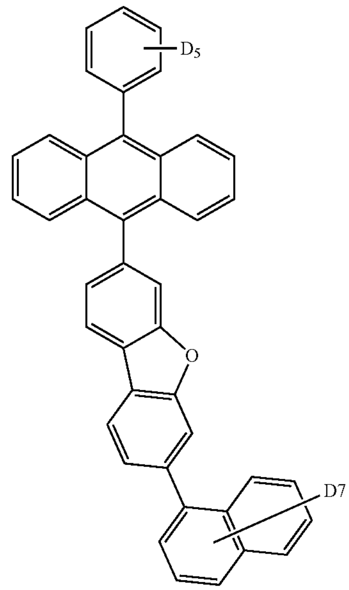
<Compound 26>
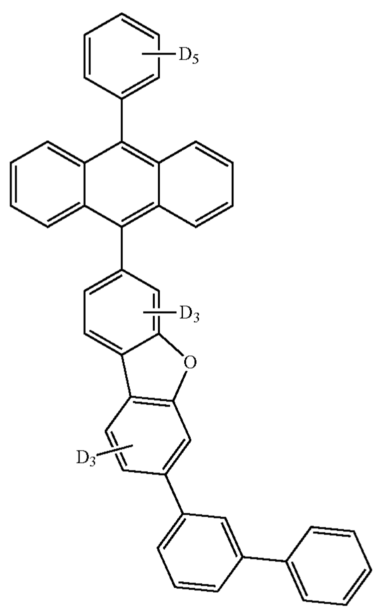

<Compound 27>
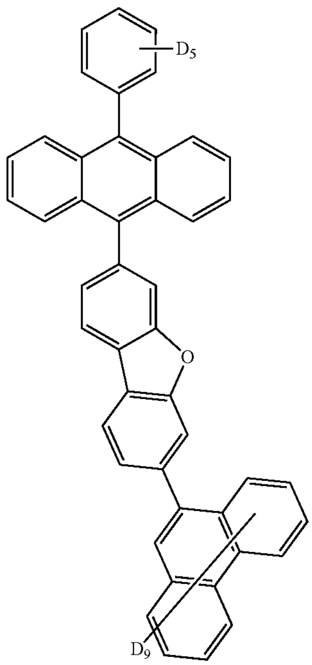
<Compound 28>
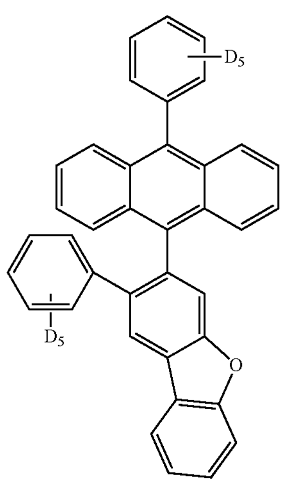
<Compound 29>
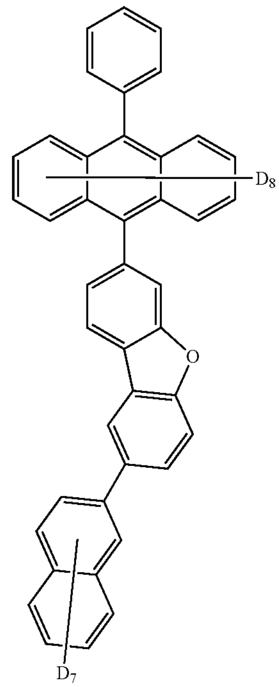
<Compound 30>
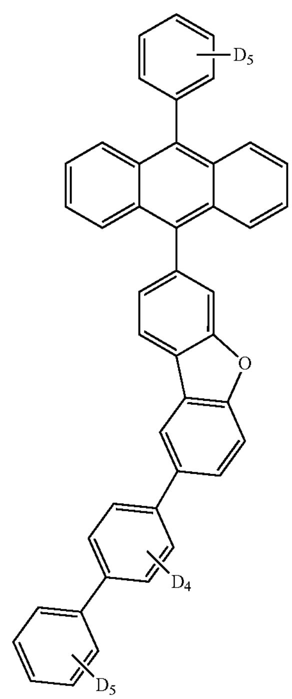

-continued
<Compound 31>
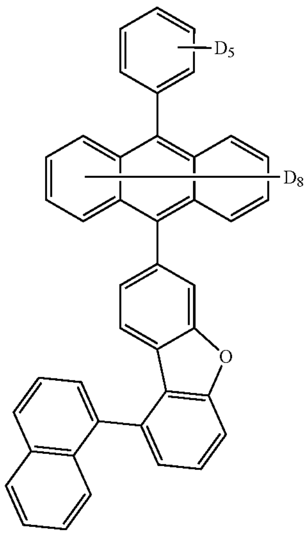
<Compound 32>
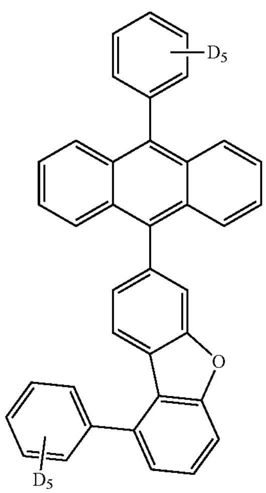
<Compound 33>
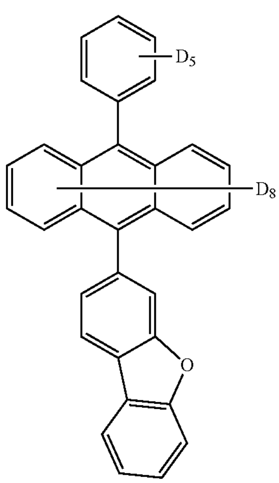
-continued
<Compound 34>
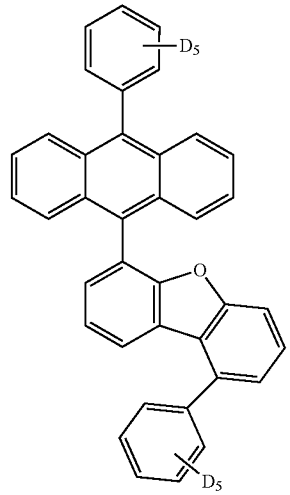
<Compound 35>
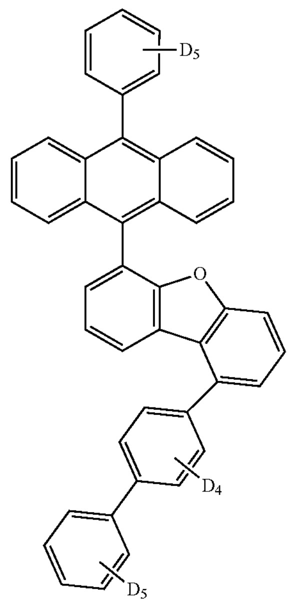
<Compound 36>
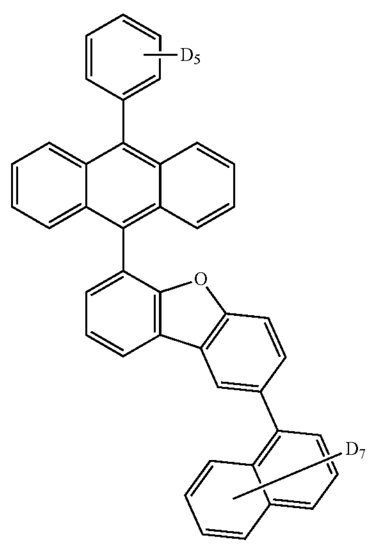

<Compound 37>
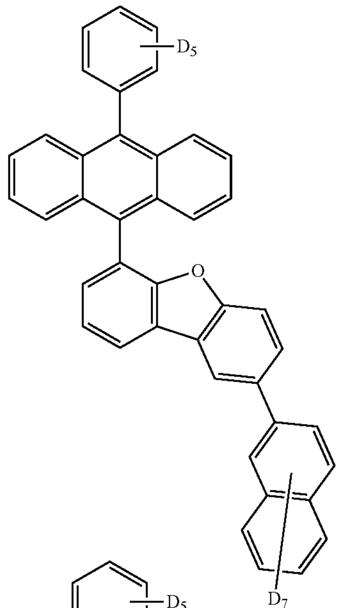
<Compound 38>
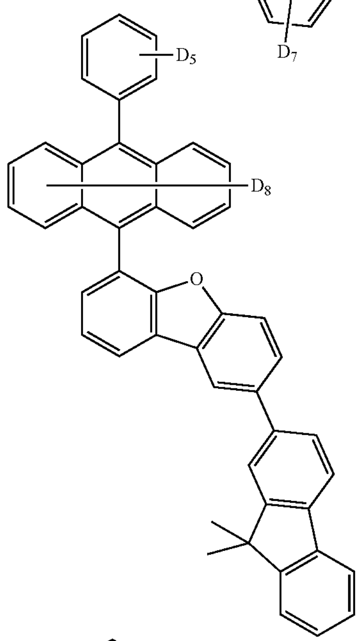
<Compound 39>
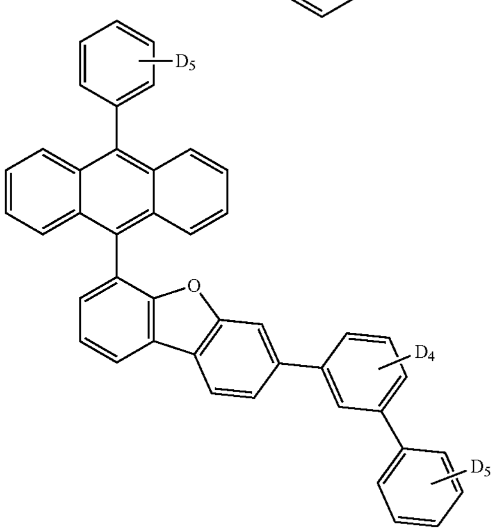
<Compound 40>
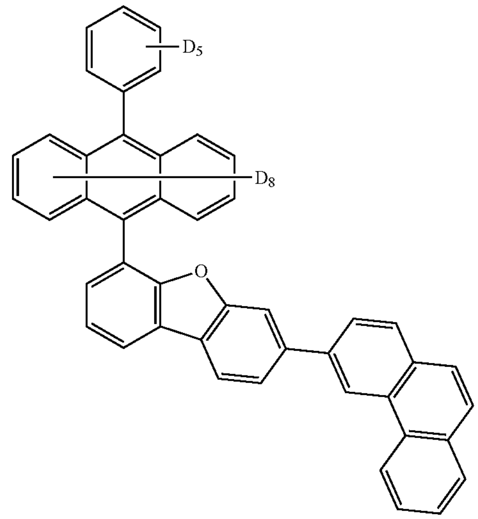
<Compound 41>
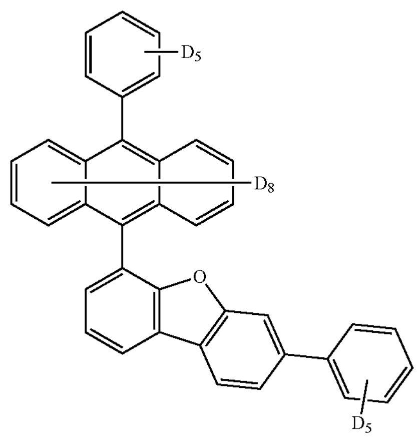
<Compound 42>
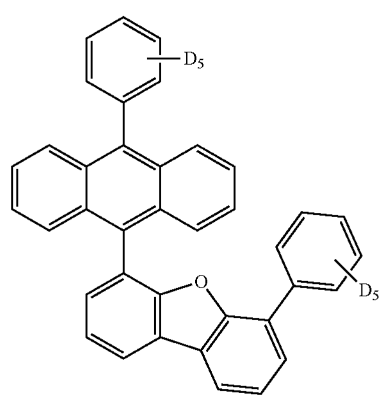

-continued
<Compound 43>
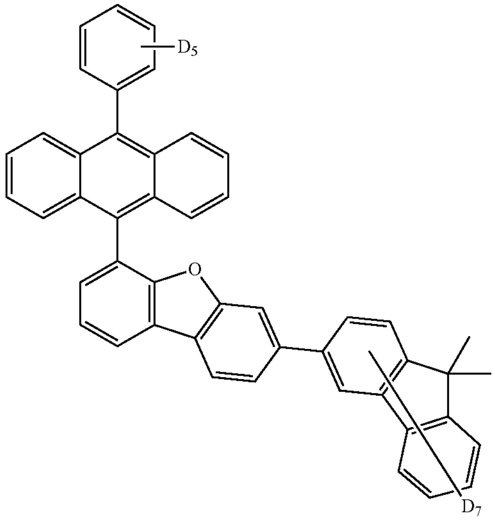
<Compound 44>
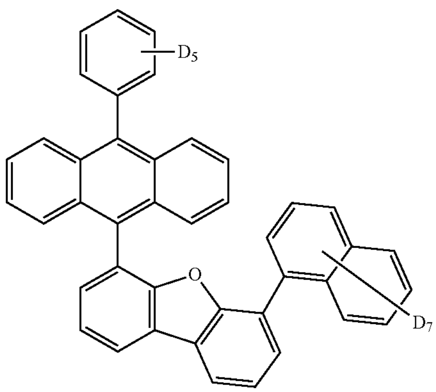
<Compound 45>
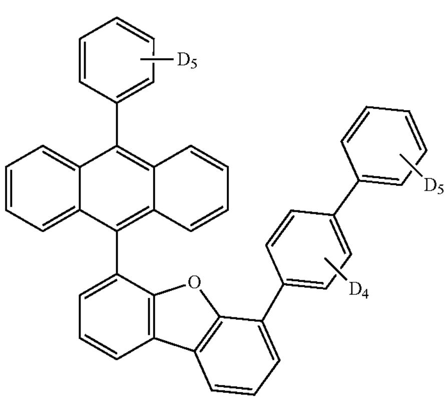
-continued
<Compound 46>
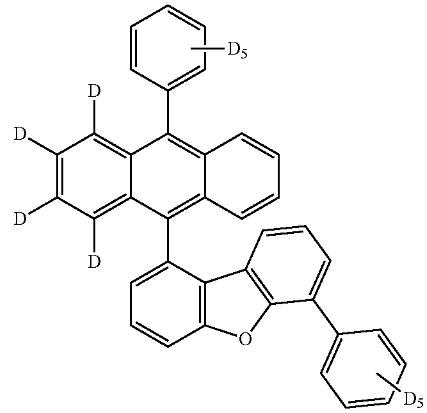
<Compound 47>
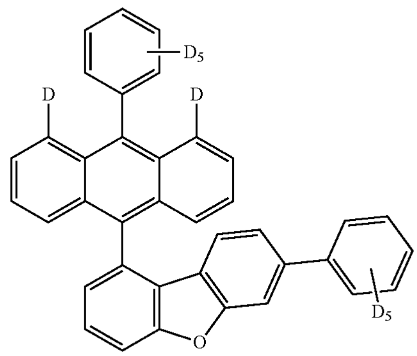
<Compound 48>
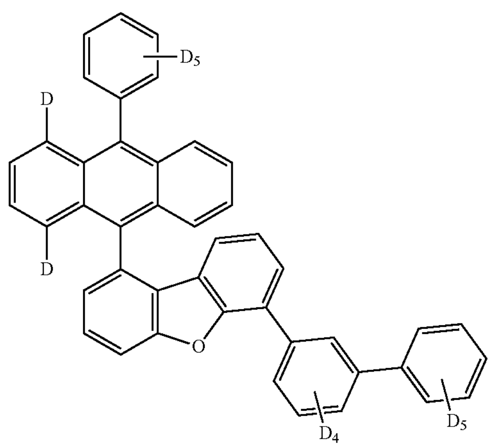

-continued
<Compound 49>
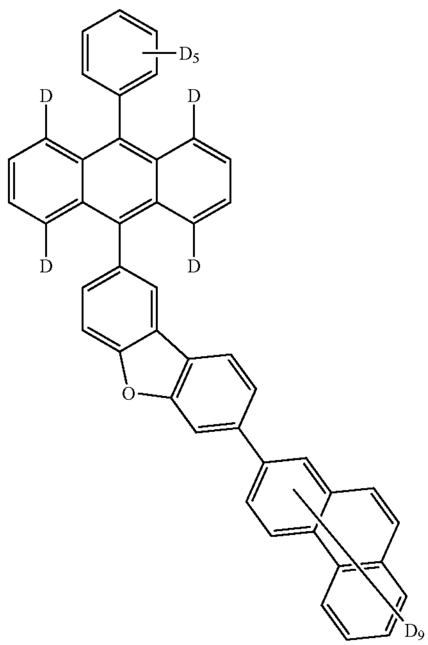
<Compound 50>
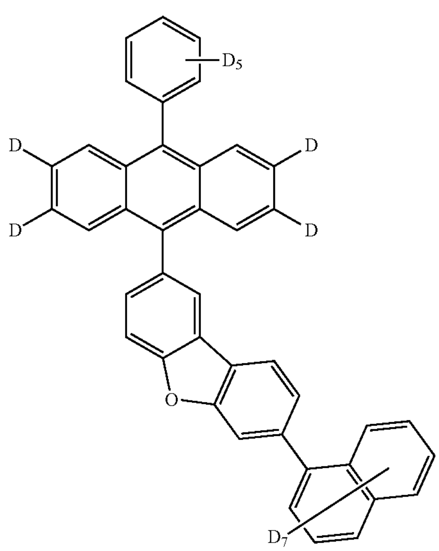
-continued
<Compound 51>
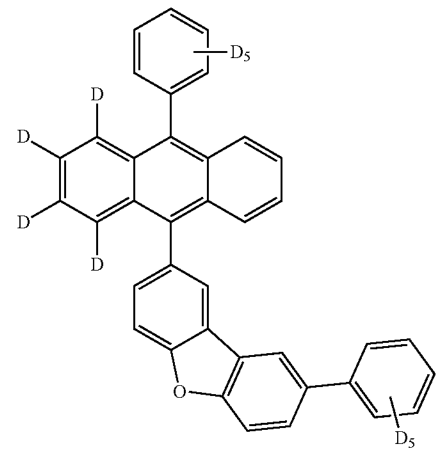
<Compound 52>
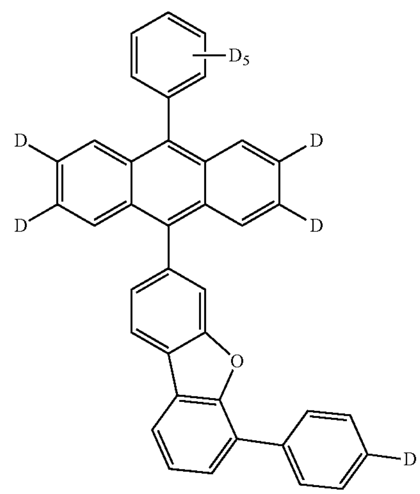
<Compound 53>
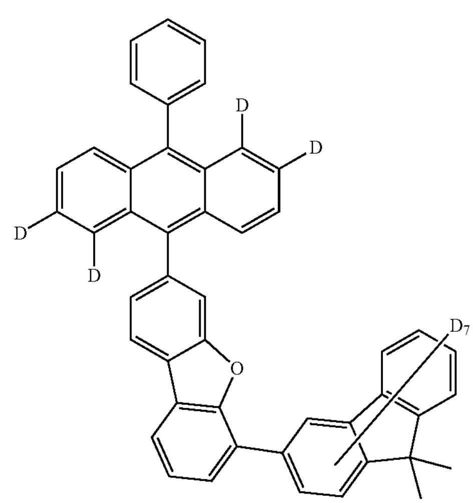

-continued
<Compound 54>
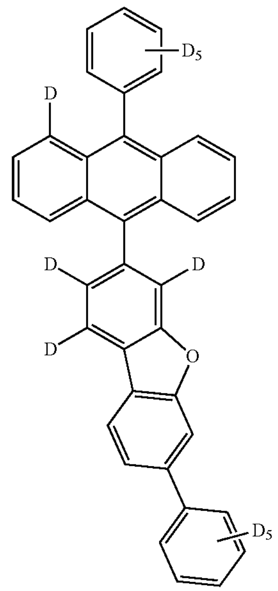
<Compound 55>
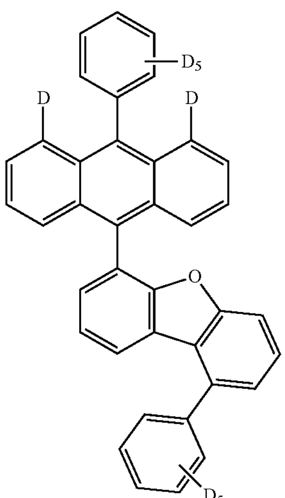
<Compound 56>
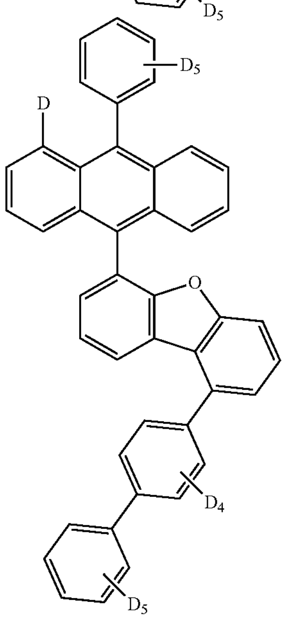
-continued
<Compound 57>
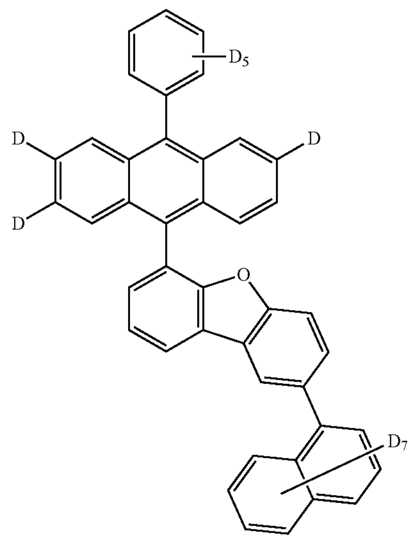
<Compound 58>
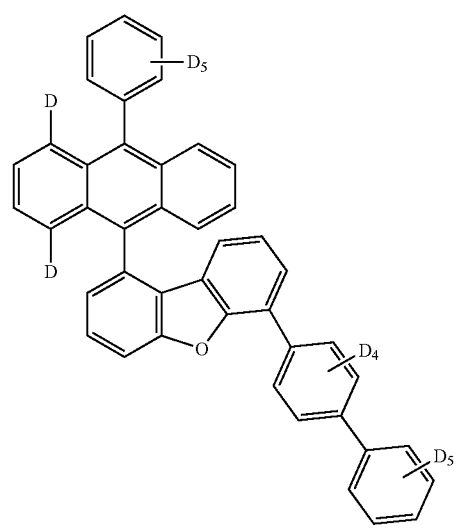
<Compound 59>
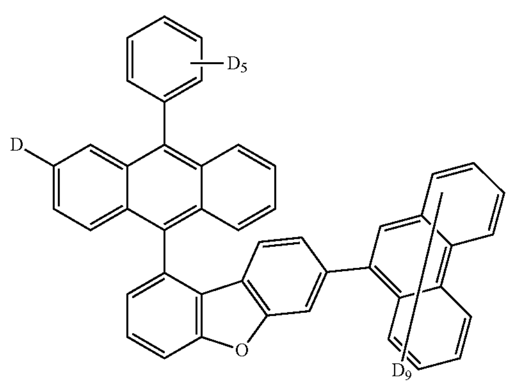

-continued
<Compound 60>
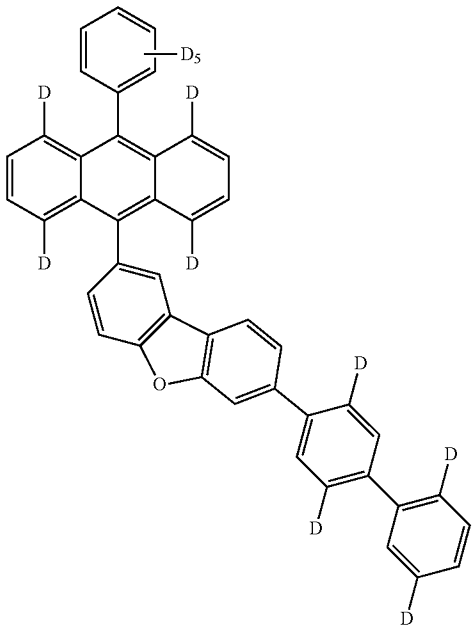
<Compound 61>
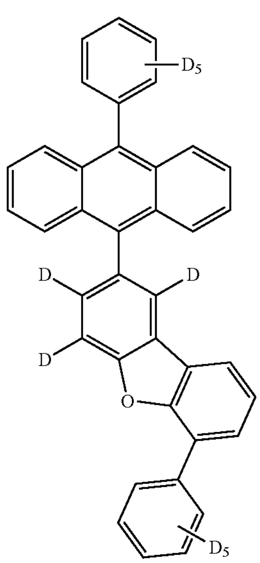
-continued
<Compound 62>
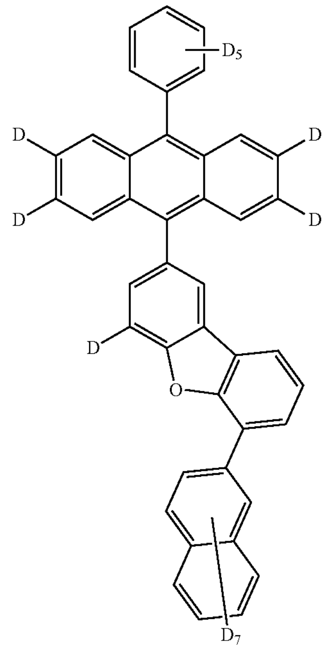
<Compound 63>
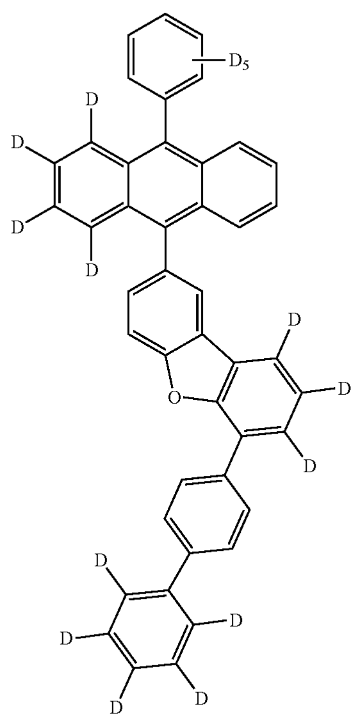

<Compound 64>
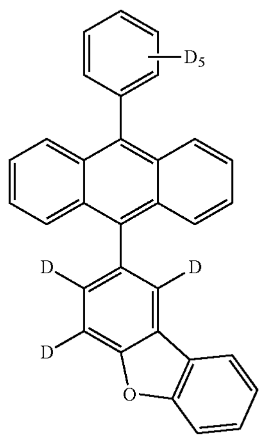
<Compound 65>
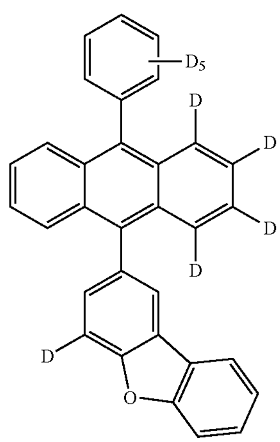
<Compound 66>
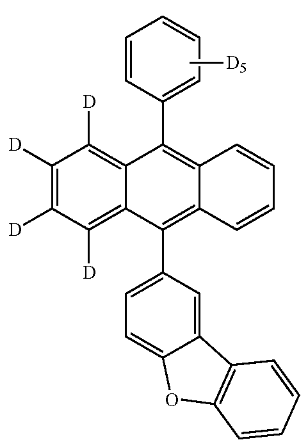
<Compound 67>
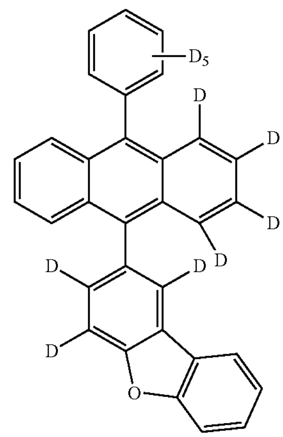
<Compound 68>
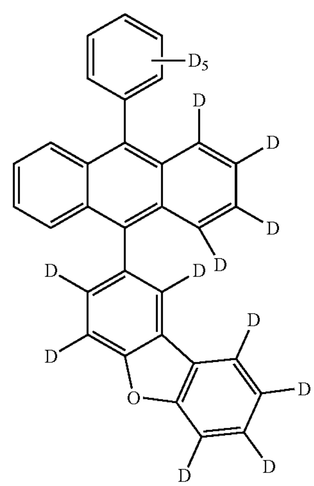
<Compound 69>
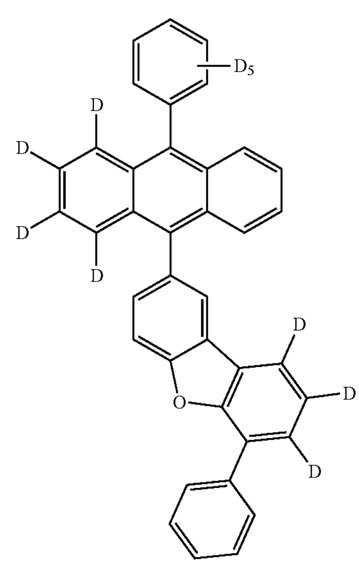

<Compound 70>
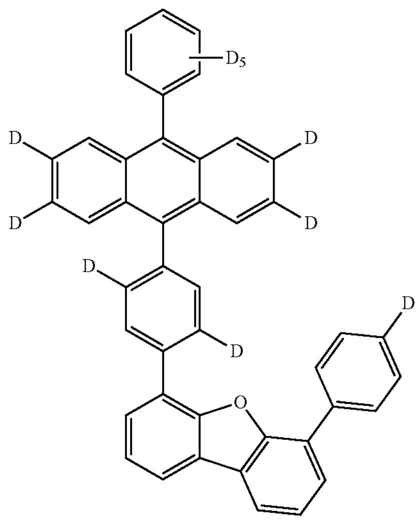
<Compound 71>
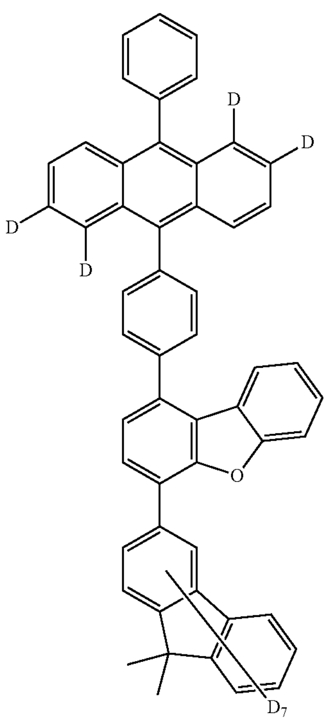
<Compound 72>
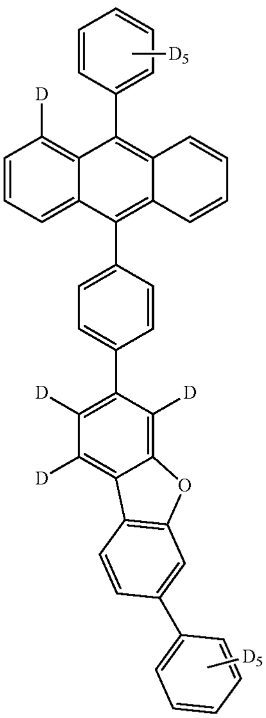
<Compound 73>
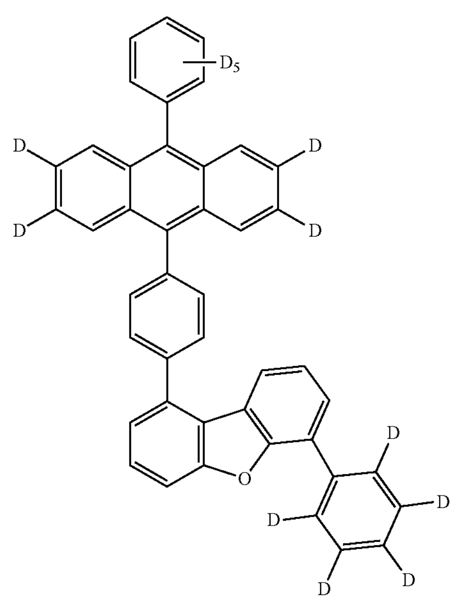

-continued

<Compound 74>

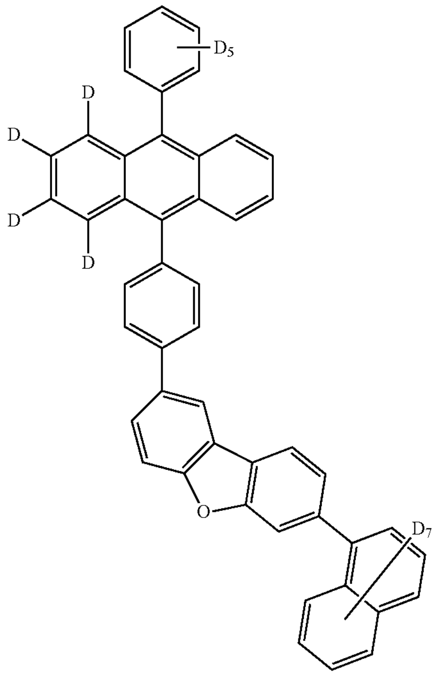

<Compound 75>

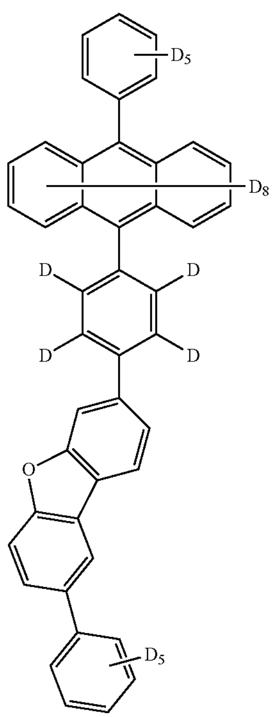

-continued

<Compound 76>

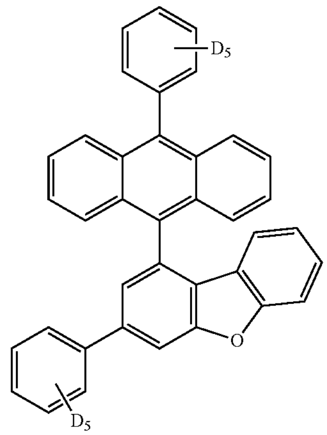

<Compound 77>

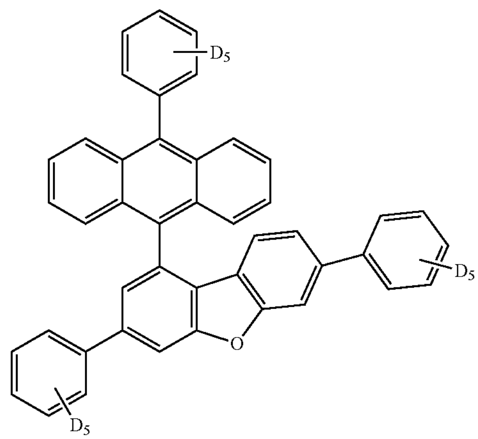

<Compound 78>

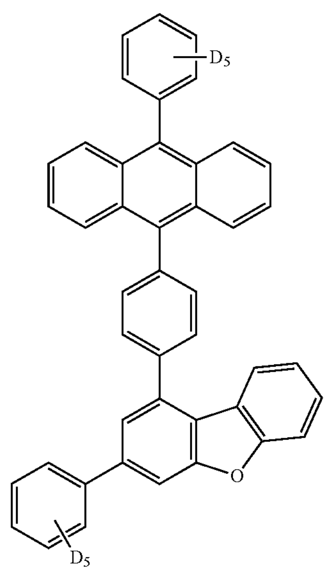

Throughout the description of the present disclosure, the phrase "(an organic layer) includes at least one organic compound" may be construed to mean that "(an organic layer) may include a single organic compound species or two or more difference species of organic compounds falling within the scope of the present disclosure".

An organic light emitting diode according to the present disclosure comprises an anode as a first electrode; a cathode as a second electrode; and a light emitting layer interposed between the anode and the cathode, wherein the light emitting layer includes a boron compound represented by Chemical Formula A or B as a dopant and a compound represented by Chemical Formula H as a host. Having such structural characteristics, the organic light emitting diode according to the present disclosure can drive at low voltage with high luminous efficiency.

In this regard, the organic light emitting diode according to the present disclosure may include at least one of a hole injection layer, a hole transport layer, a functional layer capable of both hole injection and hole transport, an electron transport layer, and an electron injection layer, in addition to the light-emitting layer.

When the light-emitting layer contains a host and a dopant, the content of the dopant in the light-emitting layer may range from about 0.01 to 20 parts by weight, based on 100 parts by weight of the host, but is not limited thereto.

Furthermore, the light emitting layer may contain various host materials and various dopant materials in addition to the dopant and host.

Below, an organic light-emitting diode according to an embodiment of the present disclosure is explained with reference to FIG. 1.

FIG. 1 is a schematic cross-sectional view of the structure of an organic light-emitting diode according to an embodiment of the present disclosure.

As shown in FIG. 1, the organic light-emitting diode according to an embodiment of the present disclosure comprises an anode 20, a hole transport layer 40, an organic light emitting layer 50 containing a host and a dopant, an electron transport layer 60, and a cathode 80 in the order, that is, comprises an anode as a first electrode, a cathode as a second electrode, a hole transport layer between the anode and the light emitting layer, and an electron transport layer between the light emitting layer and the cathode.

In addition, an organic light emitting diode according to an embodiment of the present disclosure may comprise a hole injection layer 30 between the anode 20 and the hole transport layer 40 and an electron injection layer 70 between an electron transport layer 60 and a cathode 80.

Reference is made to FIG. 1 with regard to the organic light emitting diode of the present disclosure and the fabrication thereof. First, a substrate 10 is coated with an anode electrode material to form an anode 20. So long as it is used in a typical organic light emitting diode, any substrate may be used as the substrate 10. Preferable is an organic substrate or transparent plastic substrate that exhibits excellent transparency, surface smoothness, ease of handling, and waterproofness. As the anode electrode material, indium tin oxide (ITO), indium zinc oxide (IZO), tin oxide ($SnO_2$), or zinc oxide (ZnO), which are transparent and superior in terms of conductivity, may be used.

A hole injection layer material is applied on the anode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

No particular limitations are imparted to the hole injection layer material, as long as it is one that is typically used in the art. For example, mention may be made of 2-TNATA [4,4',4"-tris(2-naphthylphenyl-phenylamino)-triphenylamine], NPD [N,N'-di(1-naphthyl)-N,N'-diphenylbenzidine)], TPD [N,N'-diphenyl-N,N'-bis(3-methylphenyl)-1,1'-biphenyl-4,4'-diamine], or DNTPD [N,N'-diphenyl-N,N'-bis-[4-(phenyl-m-tolyl-amino)-phenyl]-biphenyl-4,4'-diamine], but the present disclosure is not limited thereby.

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenylbenzidine (a-NPD).

Meanwhile, an electron barrier layer may be further formed on the hole transport layer. The electron barrier layer functions to prevent electrons injected from the electron injection layer from passing through the hole transport layer through the light emitting layer, thereby improving a life span and luminance efficiency of the diode and may be formed at a suitable site between the light emitting layer and the hole injection layer and particularly between the light emitting layer and the hole transport layer.

Then, an organic light-emitting layer 50 is deposited on the hole transport layer 40 or an electron barrier layer by deposition in a vacuum or by spin coating.

Herein, the light emitting layer may contain a host and a dopant and the materials are as described above.

In some embodiments of the present disclosure, the light-emitting layer particularly ranges in thickness from 50 to 2,000 Å.

Here, an electron transport layer is deposited on the organic light emitting layer by deposition in a vacuum or by spin coating.

A material for use in the electron transport layer functions to stably carry the electrons injected from the electron injection electrode (cathode), and may be an electron transport material known in the art. Examples of the electron transport material known in the art include quinoline derivatives, particularly, tris(8-quinolinorate)aluminum (Alq3), Liq, TAZ, Balq, beryllium bis(benzoquinolin-10-olate) (Bebq2), Compound 201, Compound 202, BCP, and oxadiazole derivatives such as PBD, BMD, and BND, but are not limited thereto:

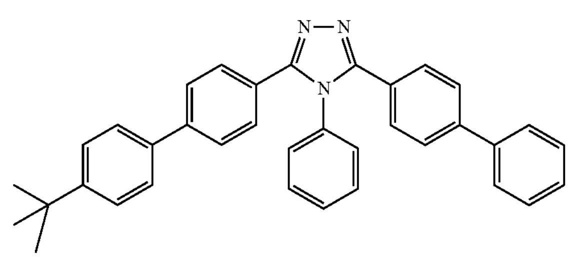

TAZ

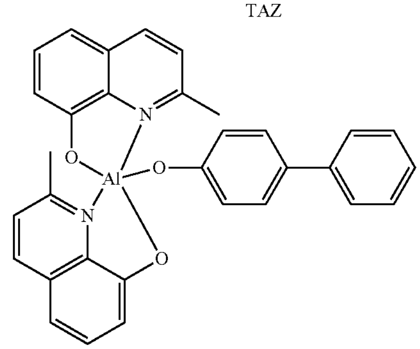

BAlq

-continued

<Compound 201>

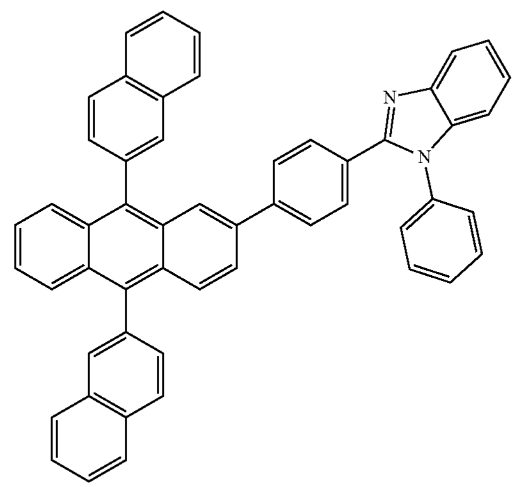

<Compound 202>

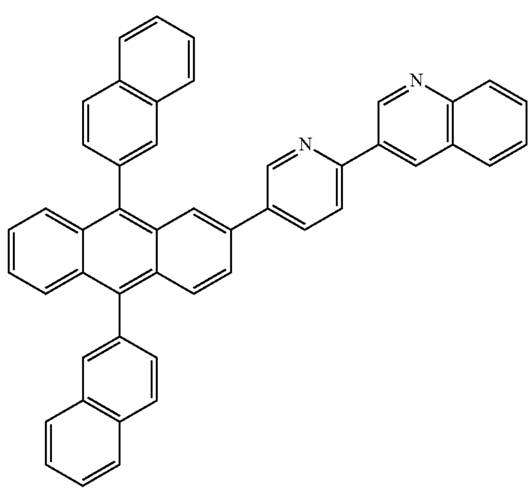

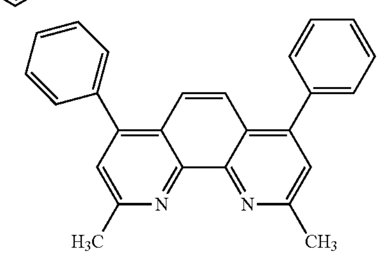

BCP

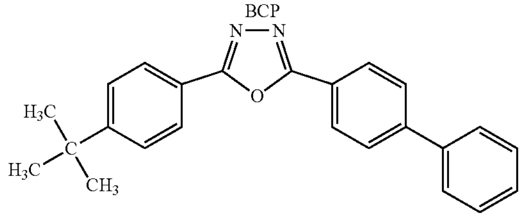

PBD

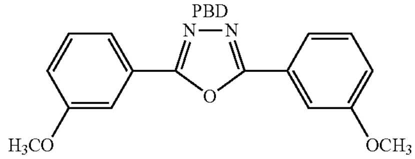

BMD

-continued

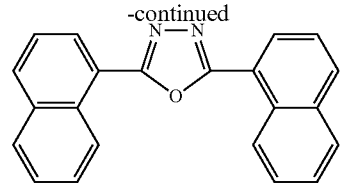

BND

In the organic light emitting diode of the present disclosure, an electron injection layer (EIL) that functions to facilitate electron injection from the cathode may be deposited on the electron transport layer. The material for the EIL is not particularly limited.

So long as it is conventionally used in the art, any material can be available for the electron injection layer without particular limitations. Examples include LiF, NaCl, CsF, $Li_2O$, and BaO. Deposition conditions for the electron injection layer may vary, depending on compounds used, but may be generally selected from condition scopes that are almost the same as for the formation of hole injection layers.

The electron injection layer may range in thickness from about 1 Å to about 100 Å, and particularly from about 3 Å to about 90 Å. Given the thickness range for the electron injection layer, the diode can exhibit satisfactory electron injection properties without actually elevating a driving voltage.

Here, a transparent cathode may be made using lithium (Li), magnesium (Mg), calcium (Ca), aluminum (Al) alloys thereof, aluminum-lithium (Al—Li), magnesium-indium (Mg—In), or magnesium-silver (Mg—Ag), ITO, or IZO.

In another embodiment, the light-emitting diode of the present disclosure may further comprise a light-emitting layer, made of a blue light-emitting material, a green light-emitting material, or a red light-emitting material, which can emit light in a wavelength range of 380 nm to 800 nm. That is, the light-emitting layer in the organic light-emitting diode of the present disclosure may have a multilayer structure in which the additional blue, green, and/or red light-emitting layer may be made of a fluorescent or phosphorescent material.

Further, one or more layers selected from among a hole injection layer, a hole transport layer, a light emitting layer, an electron transport layer, and an electron injection layer may be deposited using a single-molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, and monochrome or grayscale flexible illumination devices.

A better understanding of the present disclosure may be obtained through the following examples which are set forth to illustrate, but are not to be construed as limiting the present invention.

EXAMPLES

Synthesis of Compound Represented by Chemical Formula A or B

Synthesis Example 1: Synthesis of Compound of Chemical Formula 1

Synthesis Example 1-1: Synthesis of <Intermediate 1-a>

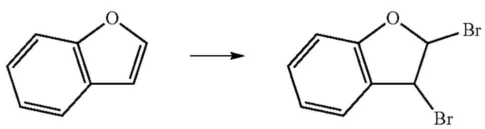

<Intermediate 1-a>

In a 1-L reactor, benzofuran (50 g, 423 mmol) and dichloromethane (500 mL) were stirred together. The mixture was cooled to −10° C. and a dilution of bromine (67.7 g, 423 mmol) in dichloromethane (100 mL) was dropwise added thereto before stirring at 0° C. for 2 hours. After completion of the reaction, a sodium thiosulfate solution was added and stirred. Extraction with ethyl acetate and $H_2O$ separated layers. The organic layer thus formed was concentrated in a vacuum and recrystallized in ethanol to afford <Intermediate 5-a> (100 g). (yield 93%)

Synthesis Example 1-2: Synthesis of <Intermediate 1-b>

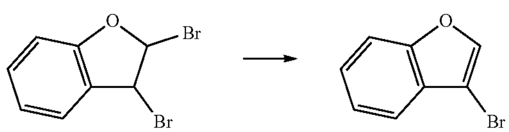

<Intermediate 1-a> <Intermediate 1-b>

In a 1-L reactor, potassium hydroxide (48.6 g, 866 mmol) was dissolved in ethanol (400 mL). A solution of <Intermediate 1-a> (120 g, 433 mmol) in ethanol was dropwise added at 0° C. and then stirred under reflux for 2 hours. After completion of the reaction, the reaction mixture was concentrated by evaporating the ethanol and the concentrate was extracted with ethyl acetate and water. The organic layer thus formed was concentrated, followed by separation through column chromatography to afford <Intermediate 1-b> (42 g). (yield 50%)

Synthesis Example 1-3: Synthesis of <Intermediate 1-c>

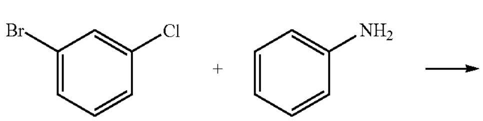

-continued

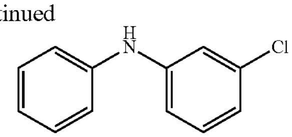

<Intermediate 1-c>

In a 100-mL reactor, 1-bromo-3-chlorobenzene (4.5 g, 16 mmol), aniline (5.8 g, 16 mmol), palladium acetate (0.1 g, 1 mmol), sodium tert-butoxide (3 g, 32 mmol), bis(diphenylphosphino)-1,1'-binaphthyl (0.2 g, 1 mmol), and toluene (45 mL) were stirred together for 24 hours under reflux. After completion of the reaction, filtration was carried out. The resulting filtrate was concentrated and separated by column chromatography to afford <Intermediate 1-c> (5.2 g). (yield 82%)

Synthesis Example 1-(4): Synthesis of <Intermediate 1-d>

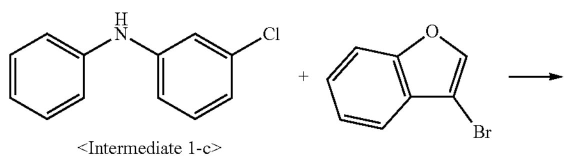

<Intermediate 1-c> <Intermediate 1-b>

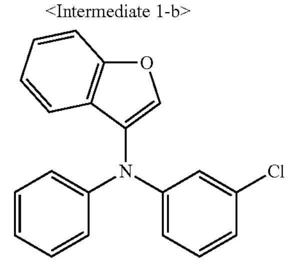

<Intermediate 1-d>

In a 250-mL reactor, <Intermediate 1-c> (20 g, 98 mmol), <Intermediate 1-b> (18.4 g, 98 mmol), palladium acetate (0.5 g, 2 mmol), sodium tert-butoxide (18.9 g, 196 mmol), tri-tert-butylphosphine (0.8 g, 4 mmol), and toluene (200 mL) were stirred together for 5 hours under reflux. After completion of the reaction, filtration was carried out. The filtrate was concentrated and separated by column chromatography to afford <Intermediate 1-d> (22 g). (yield 75%)

Synthesis Example 1-5: Synthesis of <Intermediate 1-e>

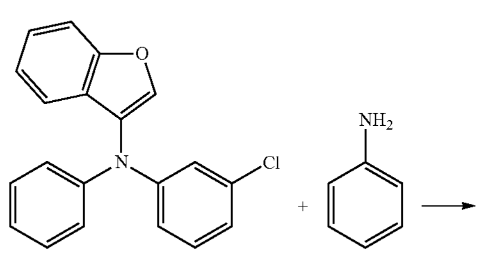

<Intermediate 1-d>

-continued

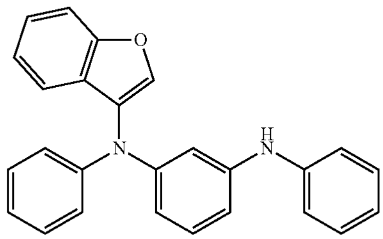

<Intermediate 1-e>

The same procedure as in Synthesis Example 1-3 was carried out, with the exception of using <Intermediate 1-d> instead of 1-bromo-3-chlorobenzene, to afford <Intermediate 1-e> (18.5 g, yield 74.1%).

Synthesis Example 1-6: Synthesis of <Intermediate 1-f>

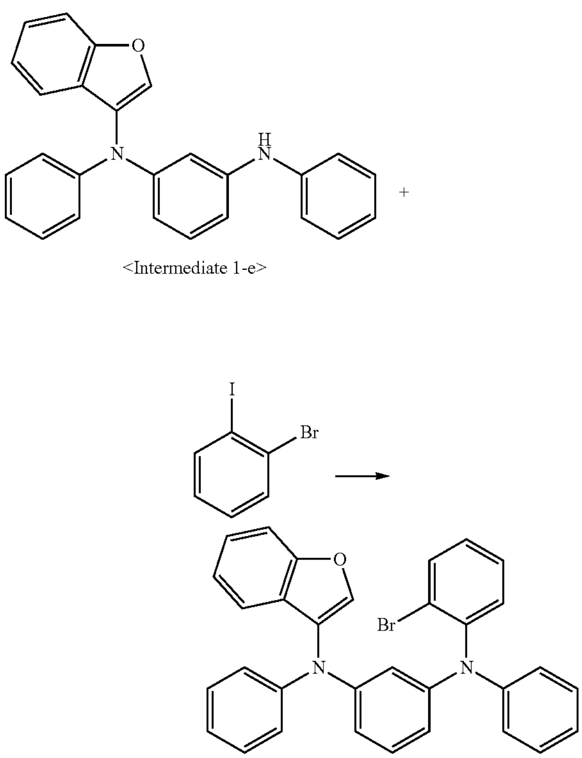

<Intermediate 1-e>

<Intermediate 1-f>

The same procedure as in Synthesis Example 1-(4) was carried out, with the exception of using <Intermediate 1-e> and 1-bromo-2-iodobenzene instead of <Intermediate 1-c> and <Intermediate 1-b>, respectively, to afford <Intermediate 1-f> (12 g, yield 84.1%).

Synthesis Example 1-7: Synthesis of <Chemical Formula 1>

<Chemical Formula 1>

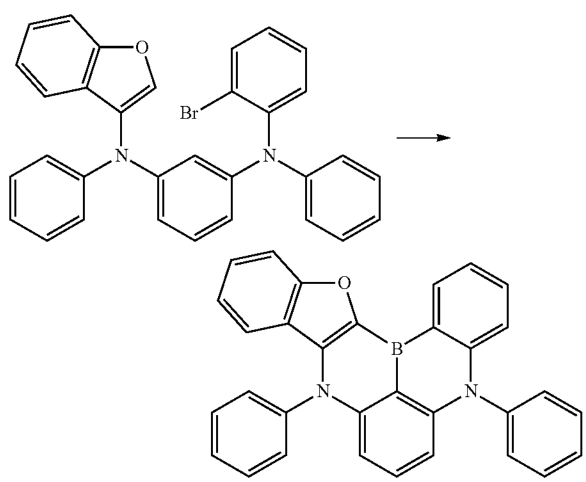

In a 300-mL reactor were added <Intermediate 1-f> (12 g, 23 mmol) and tert-butyl benzene (120 mL). At −78° C., n-butyl lithium (42.5 mL, 68 mmol) was dropwise added. Then, the mixture was stirred at 60° C. for 3 hours. Subsequently, nitrogen was introduced at 60° C. into the reactor to remove heptane. Boron tribromide (11.3 g, 45 mmol) was dropwise added at −78° C. and then stirred at room temperature. N, N-Diisopropylethylamine (5.9 g, 45 mmol) was added at 0° C. and then stirred at 120° C. for 2 hours. After completion of the reaction, an aqueous sodium acetate solution was added at room temperature and stirred. Extraction was carried out with ethyl acetate. The organic layer was concentrated and separated by column chromatography to afford the <Chemical Formula 1> (0.8 g, yield 13%).

MS (MALDI-TOF): m/z 460.17 [$M^+$]

Synthesis Example 2: Synthesis of Compound of Chemical Formula 2

Synthesis Example 2-1: Synthesis of <Intermediate 2-a>

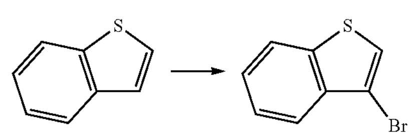

<Intermediate 2-a>

In a 1-L reactor, benzothiophene (50 g, 373 mmol) and chloroform (500 mL) were stirred together. At 0° C., a dilution of bromine (59.5 g, 373 mmol) in chloroform (100 mL) was dropwise added. The mixture was stirred at room temperature for 4 hours. After completion of the reaction, an aqueous sodium thiosulfate solution was added and stirred. Extraction was carried out, and the organic layer thus obtained was concentrated in a vacuum and then separated by column chromatography to afford <Intermediate 2-a> (70 g, yield 91%).

Synthesis Example 2-2: Synthesis of <Intermediate 2-b>

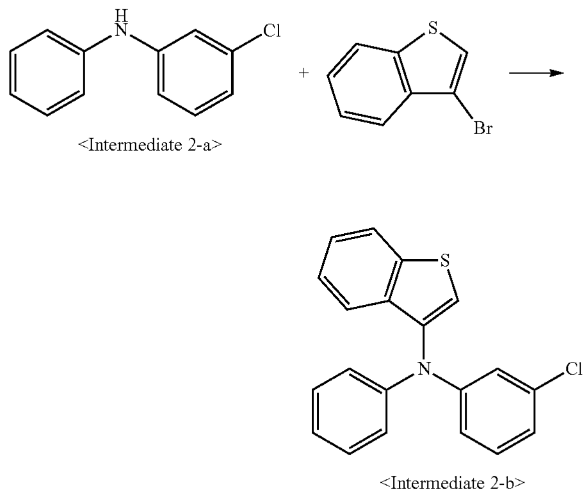

The same procedure as in Synthesis Example 1-(4) was carried out, with the exception of using <Intermediate 2-a> instead of <Intermediate 1-b>, to afford <Intermediate 2-b> (32 g, yield 75.4%)

Synthesis Example 2-3: Synthesis of <Intermediate 2-c>

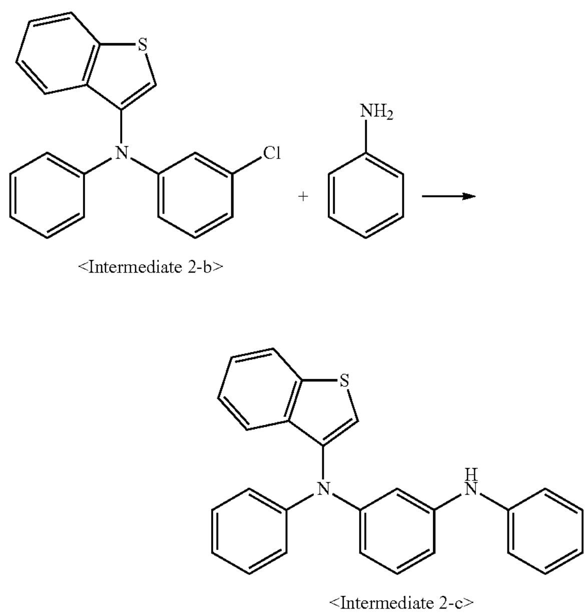

The same procedure as in Synthesis Example 1-3 was carried out, with the exception of using <Intermediate 2-b> instead of 1-bromo-3-chlorobenzene, to afford <Intermediate 2-c> (24.5 g, yield 73.1%).

Synthesis Example 2-4: Synthesis of <Intermediate 2-d>

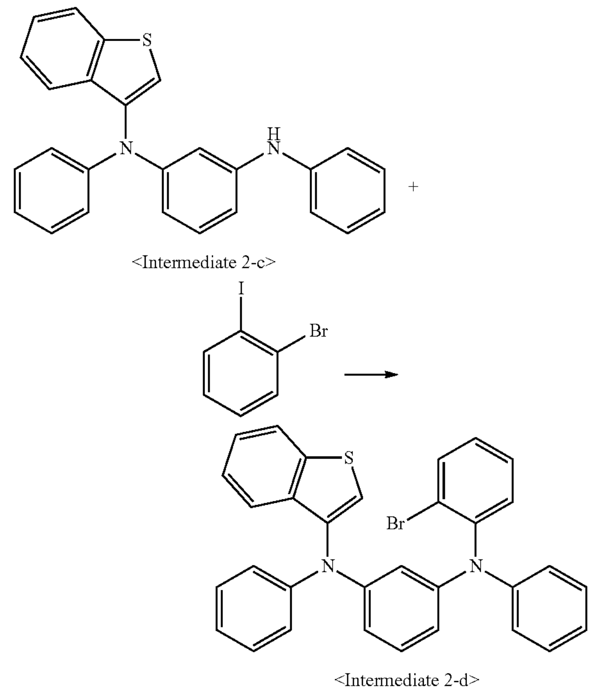

The same procedure as in Synthesis Example 1-(4) was carried out, with the exception of using <Intermediate 2-c> and 1-bromo-2-iodobenzene instead of <Intermediate 1-c> and <Intermediate 1-b>, respectively, to afford <Intermediate 2-d> (21 g, yield 77.5%).

Synthesis Example 2-5: Synthesis of <Chemical Formula 2>

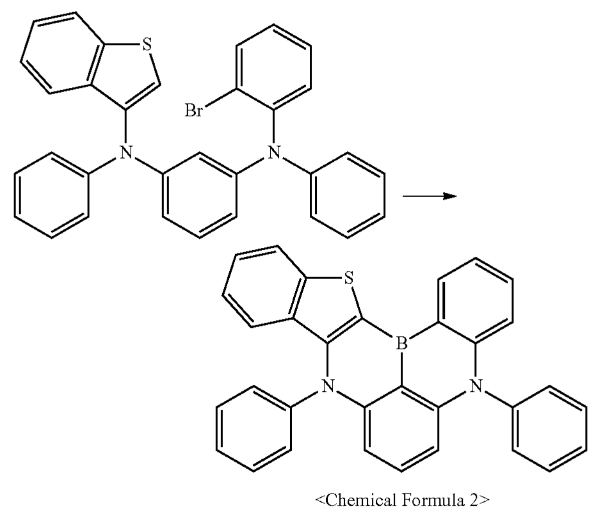

The same procedure as in Synthesis Example 1-7 was carried out, with the exception of using <Intermediate 2-d> instead of <Intermediate 1-f>, to afford <Chemical Formula 2> 1.5 g, yield 10.1%)

MS (MALDI-TOF): m/z 467.15 [$M^+$]

Synthesis Example 3: Synthesis of Compound of Chemical Formula 13

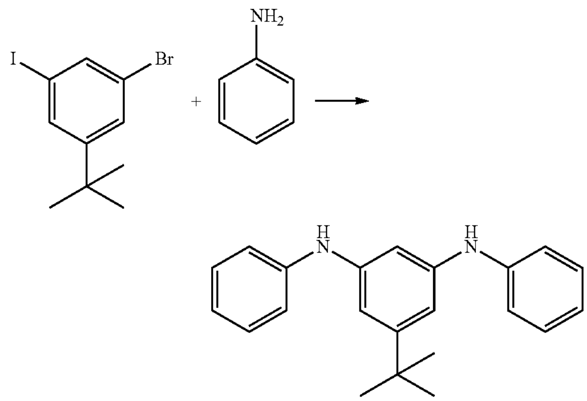

<Intermediate 3-a>

In a 1-L reactor, 1-bromo-3(tert-butyl)-5-iodobenzene (50 g, 177 mmol), aniline (36.2 g, 389 mmol), palladium acetate (1.6 g, 7 mmol), sodium tert-butoxide (51 g, 530 mmol), bis(diphenylphosphino)-1,1'-binaphthyl (4.4 g, 7 mmol), and toluene (500 mL) were stirred under reflux for 24 hours. After completion of the reaction, separation by filtration, concentration, and column chromatography afforded <Intermediate 3-a> (42.5 g, yield 50%).

Synthesis Example 3-2: Synthesis of <Intermediate 3-b>

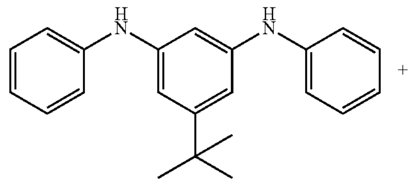

<Intermediate 3-a>

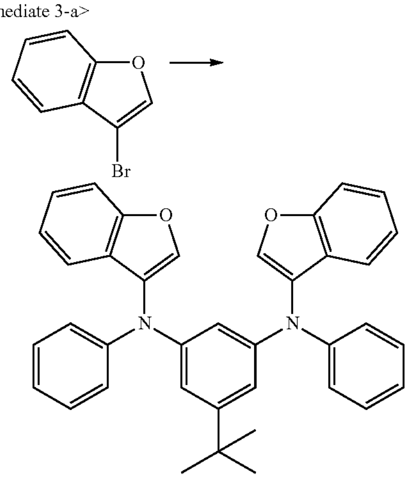

<Intermediate 3-b>

In a 250-mL reactor, <Intermediate 3-a> (11 g, 42 mmol), <Intermediate 1-b> (20 g, 101 mmol), palladium acetate (1 g, 2 mmol), sodium tert-butoxide (12.2 g, 127 mmol), tri-tert-butylphosphine (0.7 g, 3 mmol), and toluene (150 mL) were stirred together under reflux. After completion of the reaction, separation by filtration, concentration, and column chromatography afforded <Intermediate 3-b> (11 g, yield 65%).

Synthesis Example 3-3: Synthesis of <Chemical Formula 13>

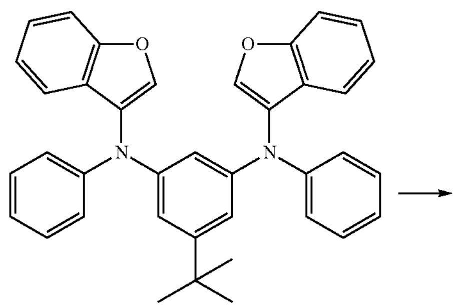

<Intermediate 3-b>

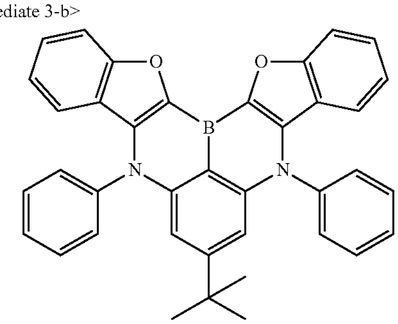

<Chemical Formula 13>

The same procedure as in Synthesis Example 1-7 was carried out, with the exception of using <Intermediate 3-b> instead of <Intermediate 1-f>, to afford <Chemical Formula 13> 0.5 g, yield 8%)

MS (MALDI-TOF): m/z 556.23 $[M^+]$

Synthesis Example 4: Synthesis of Compound of Chemical Formula 65

Synthesis Example 4-1: Synthesis of <Intermediate 4-a>

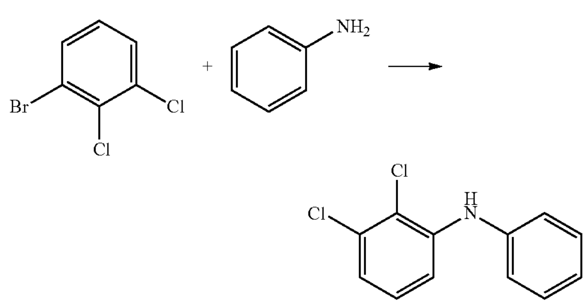

<Intermediate 4-a>

The same procedure as in Synthesis Example 1-3 was carried out, with the exception of using 1-bromo-2,3-dichlorobenzene instead of 1-bromo-3-chlorobenzene, to afford <Intermediate 4-a> (35.6 g, yield 71.2%).

Synthesis Example 4-2: Synthesis of <Intermediate 4-b>

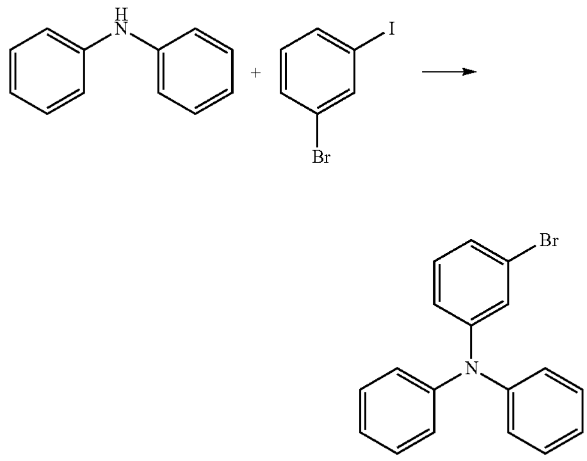

<Intermediate 4-b>

In a 2-L reactor, diphenylamine (60.0 g, 355 mmol), 1-bromo-3-iodobenzene (100.3 g, 355 mmol), palladium acetate (0.8 g, 4 mmol), xantphos (2 g, 4 mmol), sodium tert-butoxide (68.2 g, 709 mmol), and toluene (700 mL) were stirred together under reflux for 2 hours. After completion of the reaction, separation by filtration, concentration, and column chromatography afforded <Intermediate 4-b> (97 g, yield 91.2%).

Synthesis Example 4-3: Synthesis of <Intermediate 4-c>

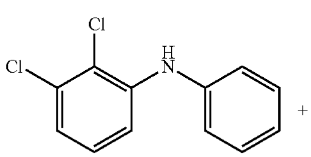

<Intermediate 4-a>

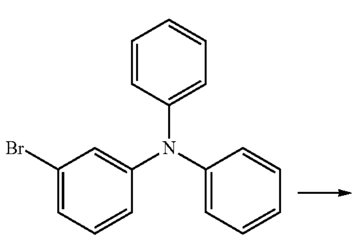

<Intermediate 4-b>

-continued

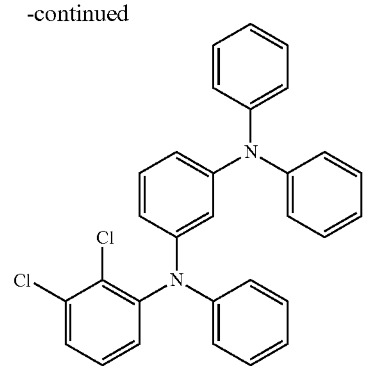

<Intermediate 4-c>

The same procedure as in Synthesis Example 1-(4) was carried out, with the exception of using <Intermediate 4-a> and <Intermediate 4-b> instead of <Intermediate 1-c> and <Intermediate 1-b>, respectively, to afford <Intermediate 4-c> (31 g, yield 77.7%).

Synthesis Example 4-4: Synthesis of <Intermediate 4-d>

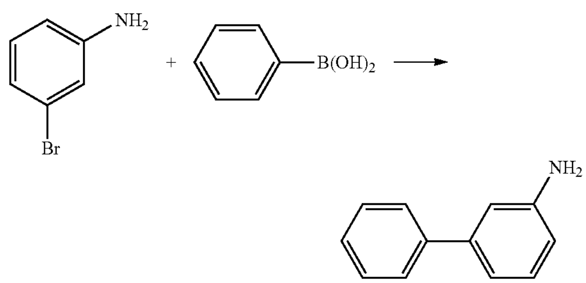

<Intermediate 4-d>

In a 1-L reactor, 3-bromoaniline (30 g, 174 mmol), phenyl bromide (25.5 g, 209 mmol), tetrakis(triphenylphosphine) palladium (4 g, 3 mmol), potassium carbonate (48.2 g, 349 mmol), 1,4-dioxane (150 mL), toluene (150 mL), and distilled water (90 mL) were stirred together under reflux. After completion of the reaction, layers were separated and the organic layer was concentrated in a vacuum and isolated by column chromatography to afford <Intermediate 4-d> (24 g, yield 80%)

Synthesis Example 4-5: Synthesis of <Intermediate 4-e>

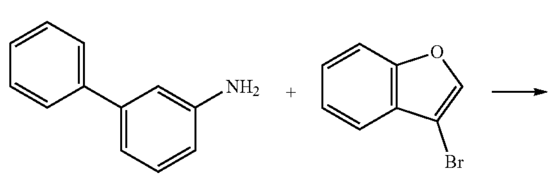

<Intermediate 4-d> <Intermediate 1-b>

-continued

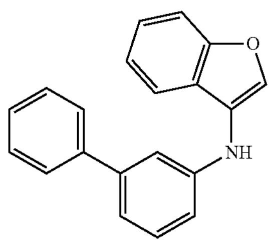

<Intermediate 4-e>

The same procedure as in Synthesis Example 1-3 was carried out, with the exception of using <Intermediate 4-d> and <Intermediate 1-b> instead of 1-bromo-3-chlorobenzene and aniline, respectively, to afford <Intermediate 4-e> (31.6 g, yield 68.2%).

Synthesis Example 4-6: Synthesis of <Intermediate 4-f>

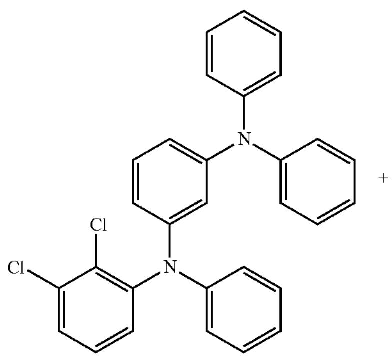

<Intermediate 4-c>

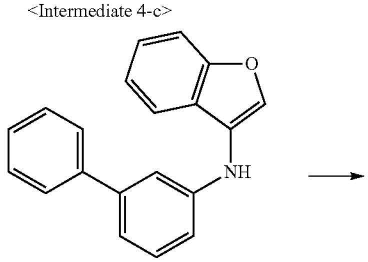

<Intermediate 4-e>

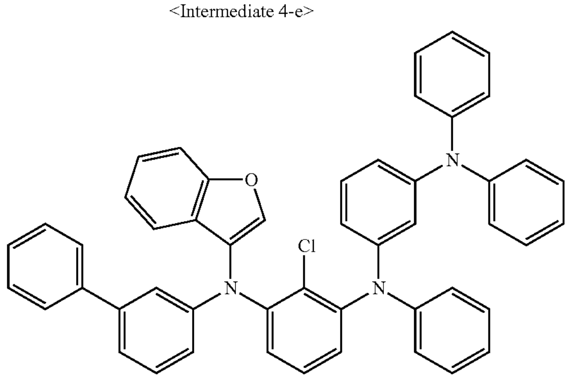

<Intermediate 4-f>

The same procedure as in Synthesis Example 1-(4) was carried out, with the exception of using <Intermediate 4-c> and <Intermediate 4-e> instead of <Intermediate 1-c> and <Intermediate 1-b>, respectively, to afford <Intermediate 4-f> (21 g, yield 67.7%)

Synthesis Example 4-7: Synthesis of Compound of <Chemical Formula 65>

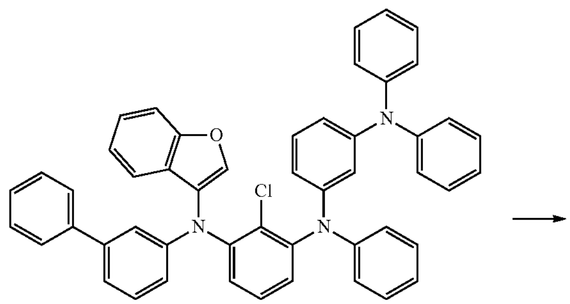

<Intermediate 4-f>

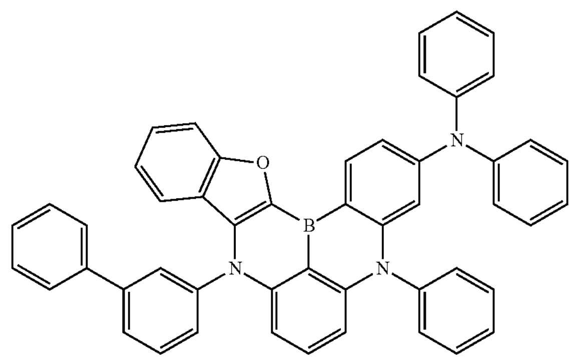

<Chemical Formula 65>

In a 250-mL reactor, <Intermediate 4-f> (21 g, 37 mmol) and tert-butylbenzene were put. At −78° C., tert-butyl lithium (42.4 mL, 74 mmol) was dropwise added, followed by stirring at 60° C. for 3 hours. Then, pentane was removed by blowing nitrogen into the reactor. At −78° C., boron tribromide (7.1 mL, 74 mmol) was dropwise added before stirring at room temperature for 1 hour. Again, N, N-diisopropylethyl amine (6 g, 74 mmol) was dropwise added at 0° C. before stirring at 120° C. for 2 hours. After completion of the reaction, an aqueous sodium acetate solution was added and stirred. The reaction mixture was extracted with ethylacetate, and the organic layer thus formed was concentrated and isolated by column chromatography to afford <Chemical Formula 65> (2.0 g, yield 17.4%).

MS (MALDI-TOF): m/z 703.28 $[M^+]$

Synthesis Example 5: Synthesis of Compound of Chemical Formula 73

Synthesis Example 5-1: Synthesis of <Intermediate 5-a>

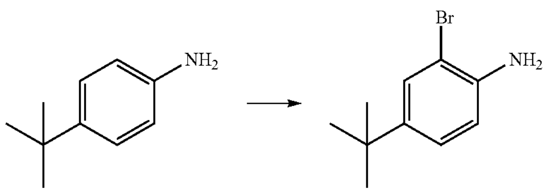

<Intermediate 5-a>

In a 1-L reactor, a solution of 4-tert-butylaniline (40 g, 236 mmol) in methylene chloride (400 mL) was stirred at 0° C. and then added with N-bromosuccinimide (42 g, 236 mmol) before stirring at room temperature for 4 hours. After completion of the reaction, $H_2O$ was dropwise added and then the mixture was extracted with methylene chloride. The organic layer thus formed was concentrated and isolated by column chromatography to afford <Intermediate 5-a> (48 g, yield 80%).

Synthesis Example 5-2: Synthesis of <Intermediate 5-b>

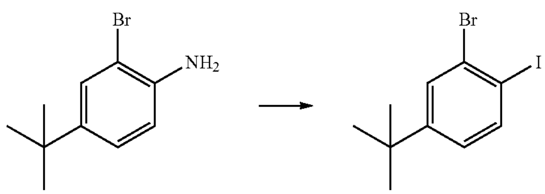

<Intermediate 5-a> <Intermediate 5-b>

In a 2-L reactor, <Intermediate 5-a> (80 g, 351 mmol) and water (450 mL) were stirred together, followed by adding sulfuric acid (104 mL). At 0° C., a solution of sodium nitrite (31.5 g, 456 mmol) in water (240 mL) was stirred for 2 hours. A solution of potassium iodide (116.4 g, 701 mmol) in water (450 mL) was dropwise added at room temperature for 6 hours. After completion of the reaction, an aqueous sodium thiosulfate solution was added and stirred at room temperature. The reaction mixture was extracted with ethylacetate and the organic layer thus formed was isolated by column chromatography to afford <Intermediate 5-b> (58 g, yield 51%).

Synthesis Example 5-3: Synthesis of <Intermediate 5-c>

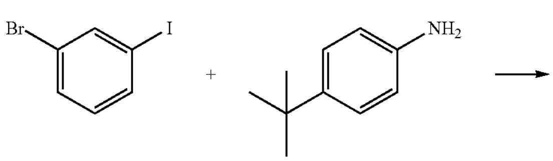

-continued

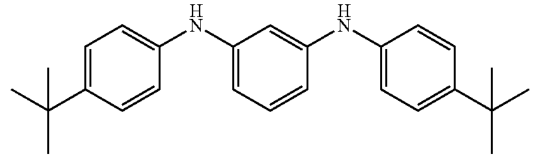

<Intermediate 5-c>

The same procedure as in Synthesis Example 3-1 was carried out, with the exception of using 4-tert-butylaniline instead of aniline, to afford <Intermediate 5-c> (95 g, yield 80.4%).

Synthesis Example 5-4: Synthesis of <Intermediate 5-d>

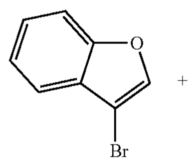

<Intermediate 1-b>

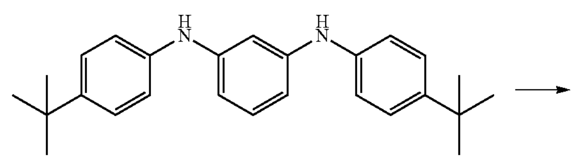

<Intermediate 5-c>

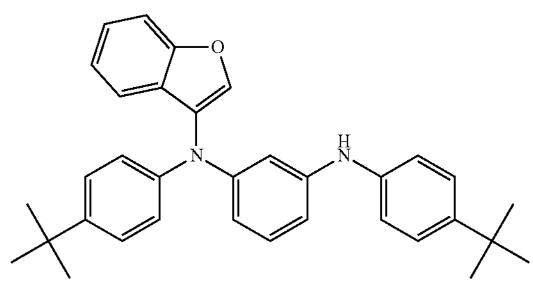

<Intermediate 5-d>

The same procedure as in Synthesis Example 1-(4) was carried out, with the exception of using <Intermediate 5-c> instead of <Intermediate 1-c>, to afford <Intermediate 5-d> (31 g, yield 71.5%).

Synthesis Example 5-5: Synthesis of <Intermediate 5-e>

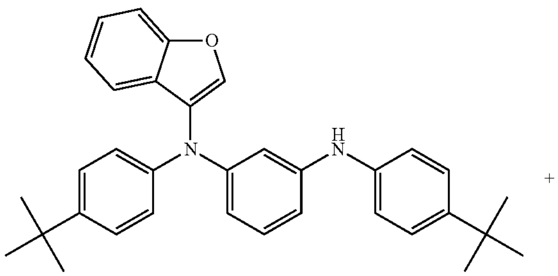

<Intermediate 5-d>

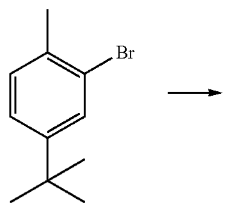

<Intermediate 5-b>

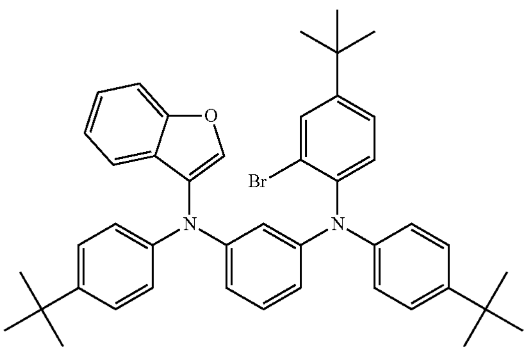

<Intermediate 5-e>

The same procedure as in Synthesis Example 1-(4) was carried out, with the exception of using <Intermediate 5-d> and <Intermediate 5-b> instead of <Intermediate 1-c> and <Intermediate 1-b>, respectively, to afford <Intermediate 5-e> (24 g, yield 67.1%).

Synthesis Example 5-6: Synthesis of <Chemical Formula 73>

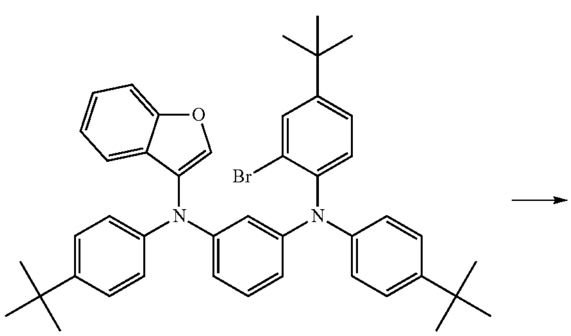

<Intermediate 5-e>

-continued

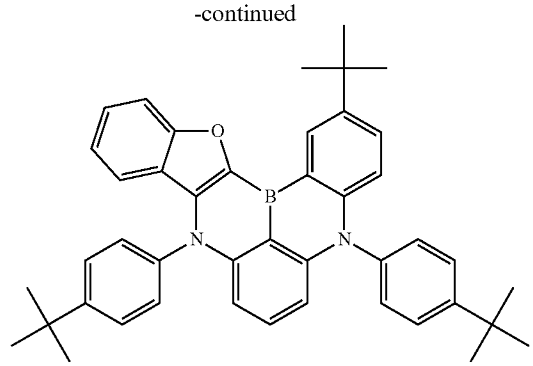

<Chemical Formula 73>

The same procedure as in Synthesis Example 1-7 was carried out, with the exception of using <Intermediate 5-e> instead of <Intermediate 1-f>, to afford <Chemical Formula 73> (2.4 g, yield 15%).

MS (MALDI-TOF): m/z 628.36 [$M^+$]

Synthesis Example 6: Synthesis of Compound of Chemical Formula 109

Synthesis Example 6-1: Synthesis of <Intermediate 6-a>

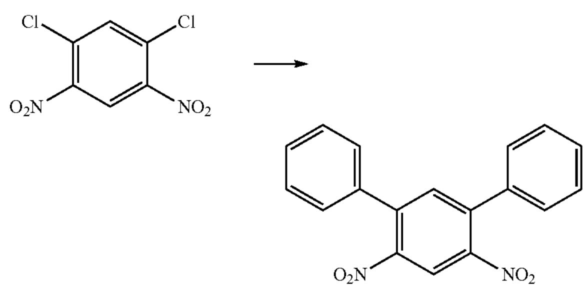

<Intermediate 6-a>

In a 1-L reactor, 1,5-dichloro-2,4-dinitrobenzene (40.0 g, 123 mmol), phenyl boronic acid (44.9 g, 368 mmol), tetrakistriphenylphosphinepalladium (2.8 g, 2.5 mmol), potassium carbonate (50.9 g, 368 mmol), 1,4-dioxane (120 mL), toluene (200 mL), and water (120 mL) were stirred together under reflux. After completion of the reaction, the reaction mixture was extracted and the organic layer thus formed was isolated by column chromatography to afford <Intermediate 6-a> (27.5 g, yield 70%).

Synthesis Example 6-2: Synthesis of <Intermediate 6-b>

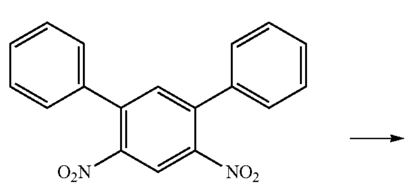

<Intermediate 6-a>

-continued

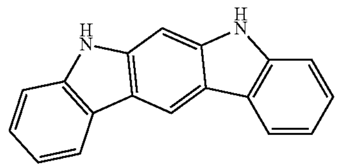

<Intermediate 6-b>

In a 1-L reactor, <Intermediate 6-a> (27.5 g, 86 mmol), triphenylphosphine (57.8 g, 348 mmol), and dichlorobenzene (300 mL were stirred together under reflux for 3 days. After completion of the reaction, dichlorobenzene was removed and separation by column chromatography afforded <Intermediate 6-b> (10.8 g, yield 49.0%).

Synthesis Example 6-3: Synthesis of <Intermediate 6-c>

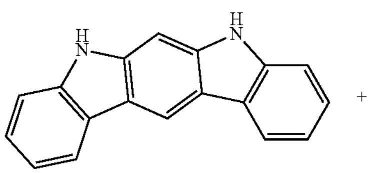

<Intermediate 6-b>

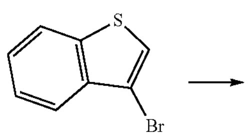

<Intermediate 2-a>

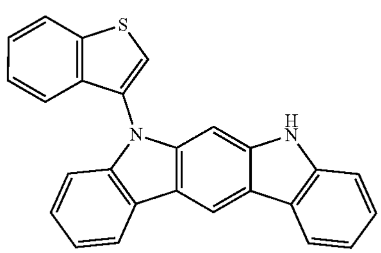

<Intermediate 6-c>

In a 250-mL reactor, <Intermediate 6-b> (10.8 g, 42 mmol), <Intermediate 2-a> (11.0 g, 10.8 mmol), copper powder (10.7 g, 1 mmol), 18-crown-6-ether (4.5 g, 17 mmol), potassium carbonate (34.9 g, 253 mmol), and dichlorobenzene (110 mL) were stirred together under reflux at 180° C. for 24 hours. After completion of the reaction, dichlorobenzene was removed and separation by column chromatography afforded <Intermediate 6-c> (9.5 g, yield 52%).

Synthesis Example 6-4: Synthesis of <Intermediate 6-d>

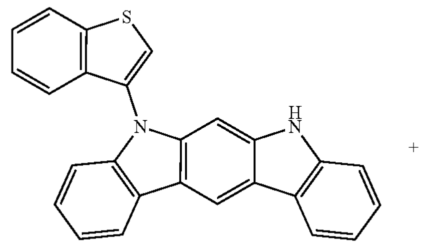

<Intermediate 6-c>

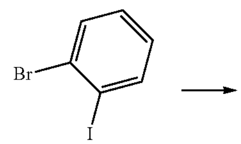

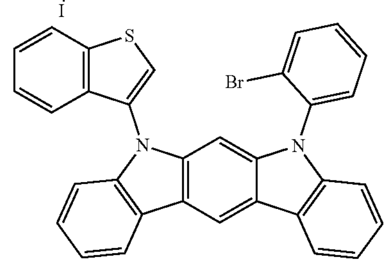

<Intermediate 6-d>

The same procedure as in Synthesis Example 6-3 was carried out, with the exception of using <Intermediate 6-c> and 1-bromo-2-iodobenzene instead of <Intermediate 6-b> and <Intermediate 2-a>, to afford <Intermediate 6-d> (14 g, yield 67.1%).

Synthesis Example 6-5: Synthesis of Compound of <Chemical Formula 109>

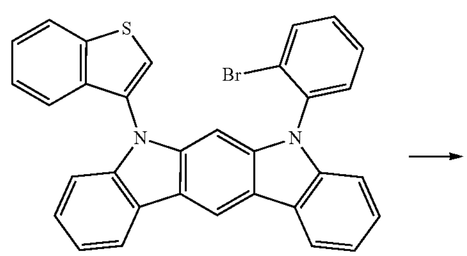

<Intermediate 6-d>

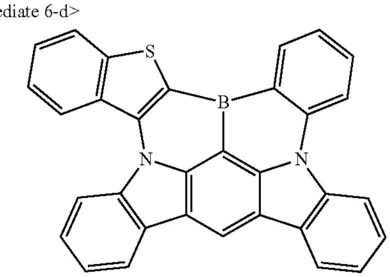

<Chemical Formula 109>

The same procedure as in Synthesis Example 1-7 was carried out, with the exception of using <Intermediate 6-d> instead of <Intermediate 1-f>, to afford <Chemical Formula 109> (2.1 g, yield 14%).

MS (MALDI-TOF): m/z 472.12 [$M^+$]

Synthesis Example 7: Synthesis of Compound of Chemical Formula 126

Synthesis Example 7-1: Synthesis of <Intermediate 7-a>

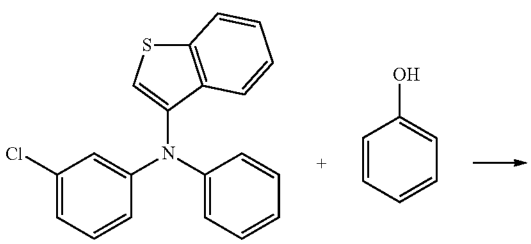

<Intermediate 2-b>

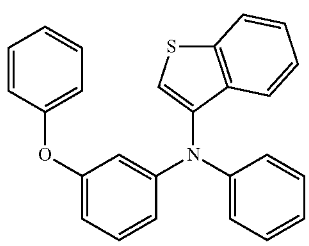

<Intermediate 7-a>

In a 500-mL reactor, <Intermediate 2-b> (30.0 g, 150 mmol), phenol (31.2 g, 160 mmol), potassium carbonate (45.7 g, 300 mmol), and NMP (250 mL) were stirred together under reflux at 160° C. for 12 hours. After completion of the reaction, the reaction mixture was cooled to room temperature and NMP was removed by distillation at a reduced pressure to afford <Intermediate 7-a> (22 g, yield 68%).

Synthesis Example 7-2: Synthesis of <Chemical Formula 126>

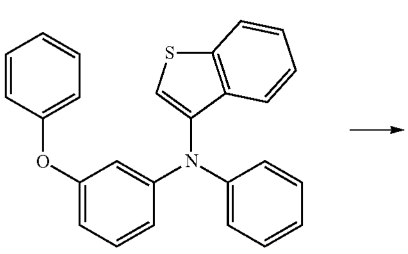

<Intermediate 7-a>

-continued

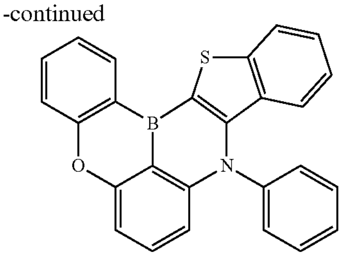

<Chemical Formula 126>

The same procedure as in Synthesis Example 1-7 was carried out, with the exception of using <Intermediate 7-a> instead of <Intermediate 1-f>, to afford <Chemical Formula 126> (1.2 g, yield 13.4%).

MS (MALDI-TOF): m/z 401.10 [$M^+$]

Synthesis Example 8: Synthesis of Compound of Chemical Formula 145

Synthesis Example 8-1: Synthesis of <Intermediate 8-a>

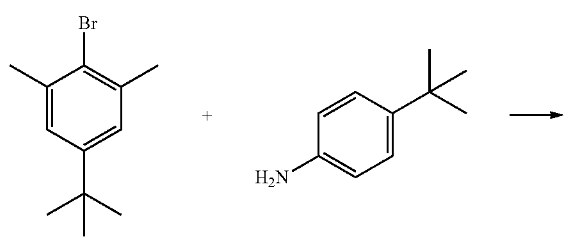

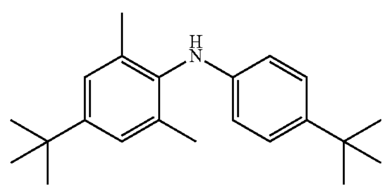

<Intermediate 8-a>

The same procedure as in Synthesis Example 1-(3) was carried out, with the exception of using 2-bromo-5-tert-butyl-1,3-dimethylbenzene and 4-tert-butylaniline instead of 1-bromo-3-chlorobenzene and aniline, respectively, to afford <Intermediate 8-a> (41.6 g, yield 88.2%).

Synthesis Example 8-2: Synthesis of <Intermediate 8-b>

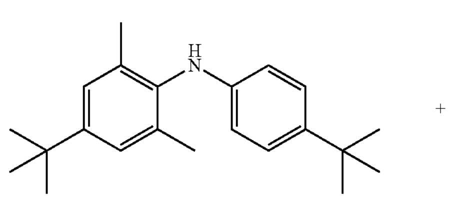

-continued

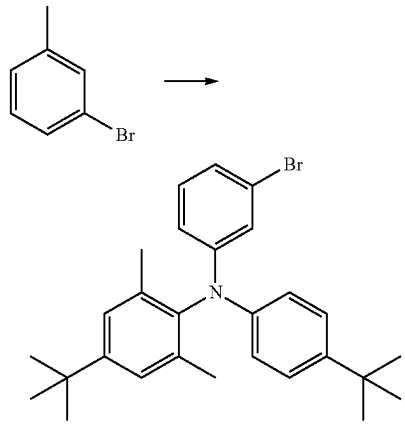

<Intermediate 8-b>

The same procedure as in Synthesis Example 4-2 was carried out, with the exception of using <Intermediate 8-a> instead of diphenylamine, to afford <Intermediate 8-b> (37.6 g, yield 78.4%).

Synthesis Example 8-3: Synthesis of <Intermediate 8-c>

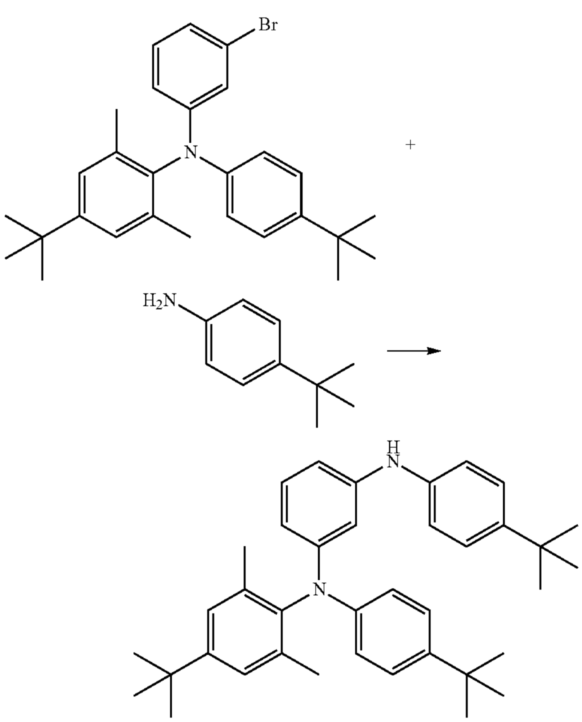

<Intermediate 8-c>

The same procedure as in Synthesis Example 1-3 was carried out, with the exception of using <Intermediate 8-b> and 4-tert-butylaniline instead of 1-bromo-3-chlorobenzene and aniline, respectively, to afford <Intermediate 8-c> (31.2 g, yield 74.2%).

Synthesis Example 8-4: Synthesis of <Intermediate 8-d>

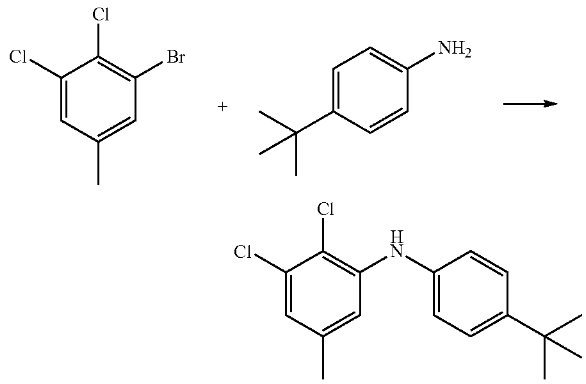

<Intermediate 8-d>

The same procedure as in Synthesis Example 1-(4) was carried out, with the exception of using 1-bromo-2,3-dichloro-5-methylbenzene and 4-tert-butylaniline instead of 1-bromo-3-chlorobenzene and aniline, respectively, to afford <Intermediate 8-d> (30.3 g, yield 89.8%).

Synthesis Example 8-5: Synthesis of <Intermediate 8-e>

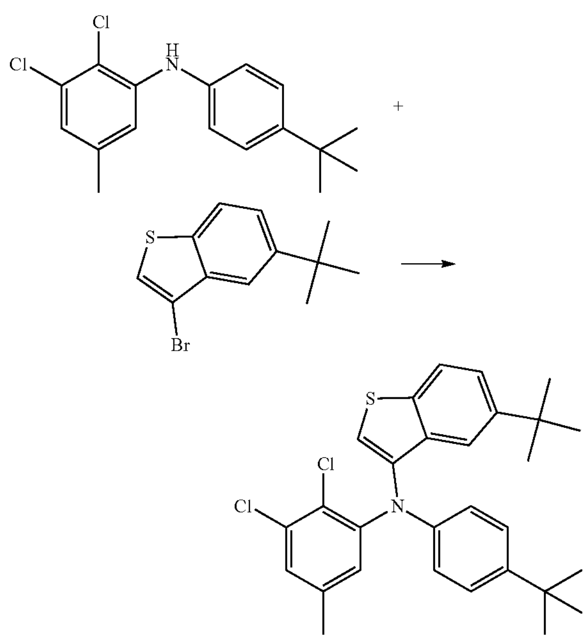

<Intermediate 8-e>

The same procedure as in Synthesis Example 1-(4) was carried out, with the exception of using <Intermediate 8-d> and 3-bromo-5-tert-butylbenzothiophene instead of <Intermediate 1-c> and <Intermediate 1-b>, respectively, to afford <Intermediate 8-e> (27.4 g, yield 77.1%).

Synthesis Example 8-6: Synthesis of <Intermediate 8-f>

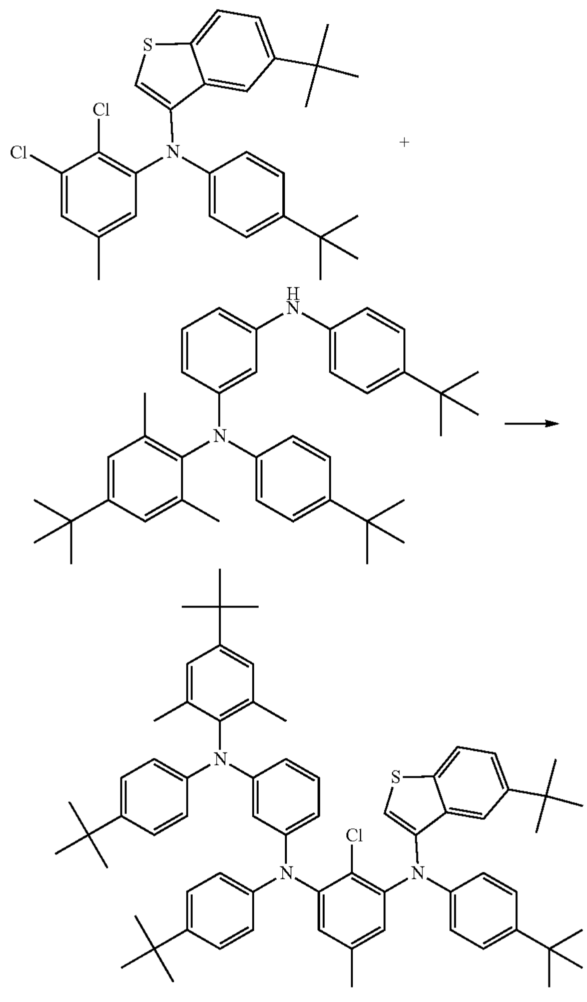

<Intermediate 8-f>

The same procedure as in Synthesis Example 1-(4) was carried out, with the exception of using <Intermediate 8-e> and <Intermediate 8-c> instead of <Intermediate 1-c> and <Intermediate 1-b>, respectively, to afford <Intermediate 8-f> (21 g, yield 74.1%).

Synthesis Example 8-7: Synthesis of <Chemical Formula 145>

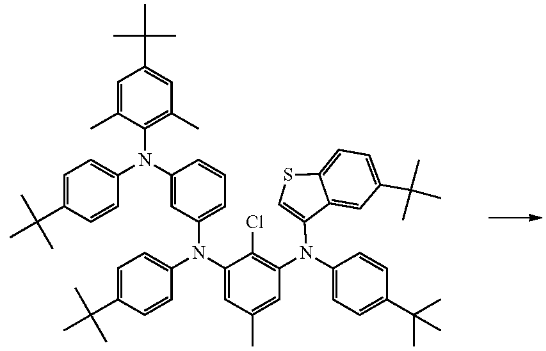

-continued

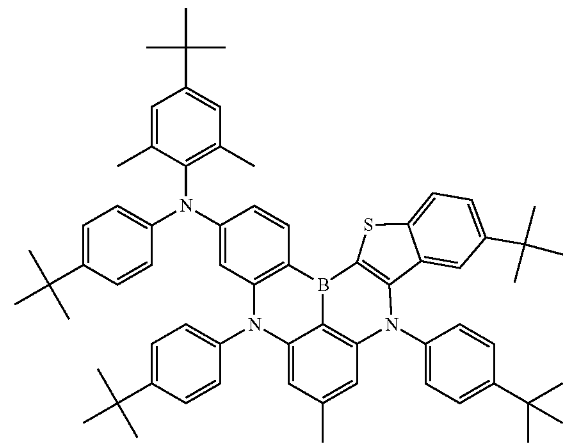

<Chemical Formula 145>

The same procedure as in Synthesis Example 1-7 was carried out, with the exception of using <Intermediate 8-f> instead of <Intermediate 1-f>, to afford <Chemical Formula 145> (3.4 g, yield 19.4%).

MS (MALDI-TOF): m/z 979.60 $[M]^+$

Synthesis Example 9: Synthesis of Compound of Chemical Formula 150

Synthesis Example 9-1: Synthesis of <Intermediate 9-a>

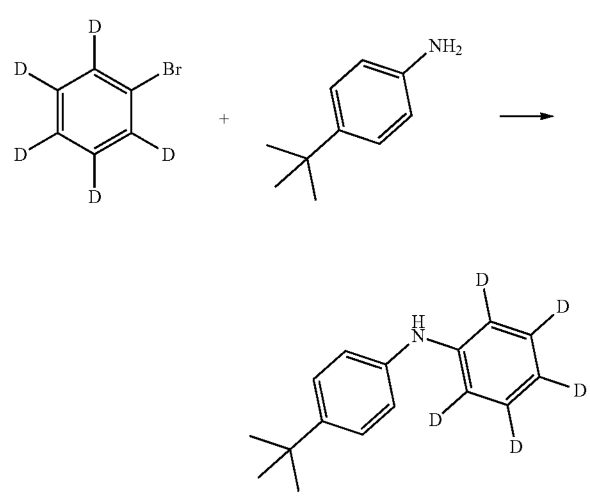

<Intermediate 9-a>

The same procedure as in Synthesis Example 1-3 was carried out, with the exception of using 1-bromo benzene (D-substituted) and 4-tert-butylaniline instead of 1-bromo-3-chlorobenzene and aniline, respectively, to afford <Intermediate 9-a> (32.7 g, yield 78.2%).

Synthesis Example 9-2: Synthesis of <Intermediate 9-b>

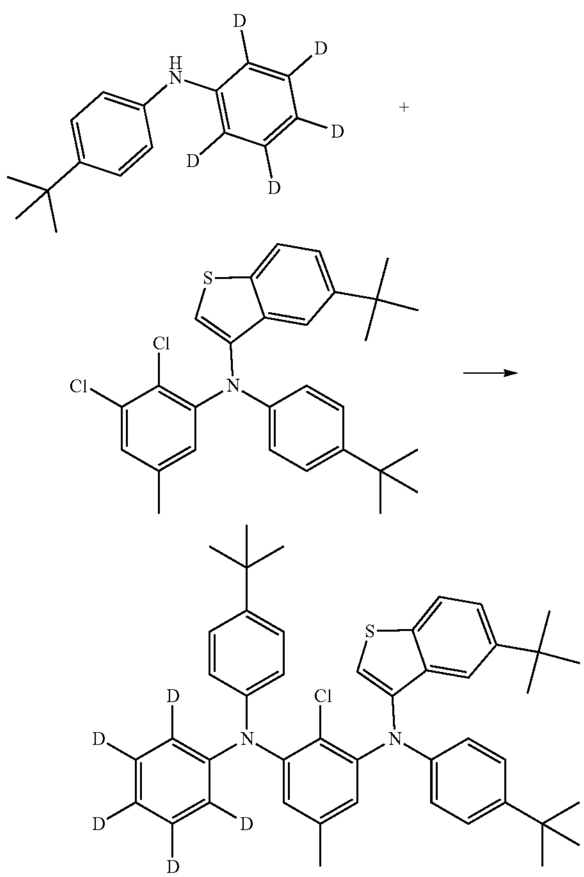

<Intermediate 9-b>

The same procedure as in Synthesis Example 1-(4) was carried out, with the exception of using <Intermediate 8-e> and <Intermediate 9-a> instead of <Intermediate 1-c> and <Intermediate 1-b>, respectively, to afford <Intermediate 9-b> (34.2 g, yield 84.1%).

Synthesis Example 9-3: Synthesis of <Chemical Formula 150>

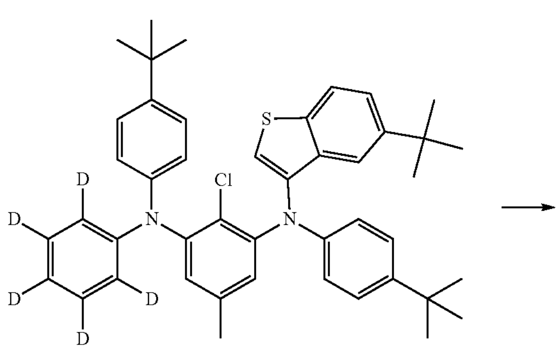

-continued

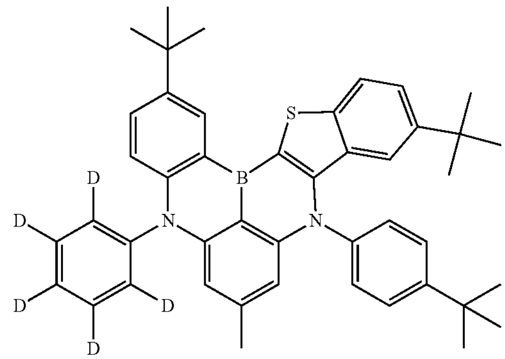

<Chemical Formula 150>

The same procedure as in Synthesis Example 1-7 was carried out, with the exception of using <Intermediate 9-b> instead of <Intermediate 1-f>, to afford <Chemical Formula 150> (2.7 g, yield 11.4%).

MS (MALDI-TOF): m/z 663.39 $[M]^+$

Synthesis Example 10: Synthesis of Compound of Chemical Formula 153

Synthesis Example 10-1: Synthesis of <Intermediate 10-a>

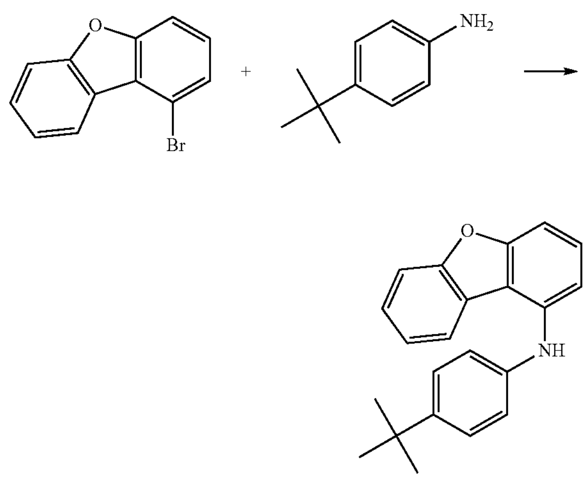

<Intermediate 10-a>

The same procedure as in Synthesis Example 1-3 was carried out, with the exception of using 1-bromo-dibenzofuran and 4-tert-butylaniline instead of 1-bromo-3-chlorobenzene and aniline, respectively, to afford <Intermediate 10-a> (25.6 g, yield 79.2%).

Synthesis Example 10-2: Synthesis of <Intermediate 10-b>

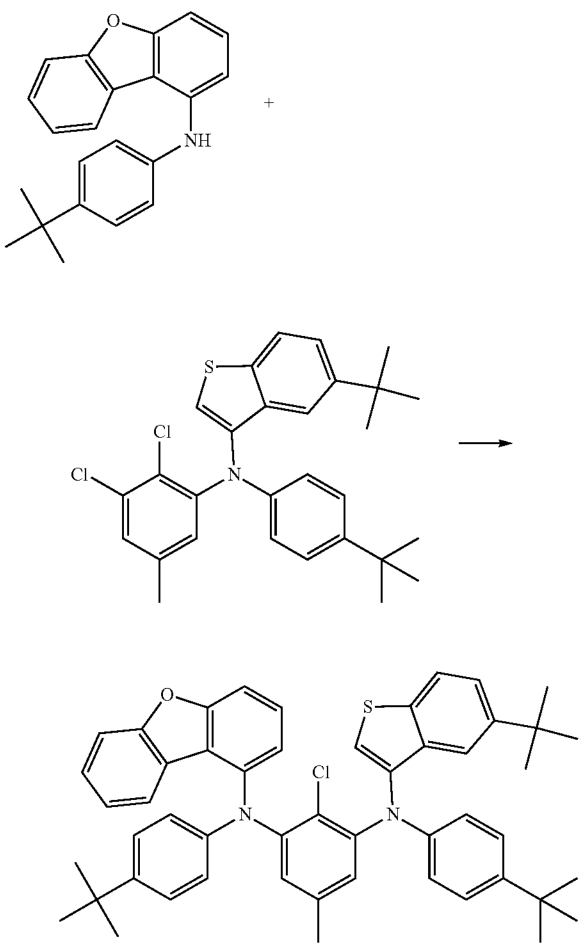

<Intermediate 10-b>

The same procedure as in Synthesis Example 1-(4) was carried out, with the exception of using <Intermediate 8-e> and <Intermediate 10-a> instead of <Intermediate 1-c> and <Intermediate 1-b>, respectively, to afford <Intermediate 10-b> (18.6 g, yield 74.1%).

Synthesis Example 10-3: Synthesis of <Chemical Formula 153>

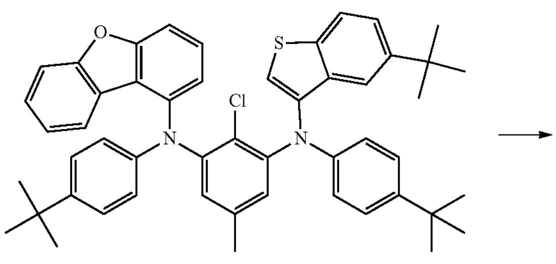

-continued

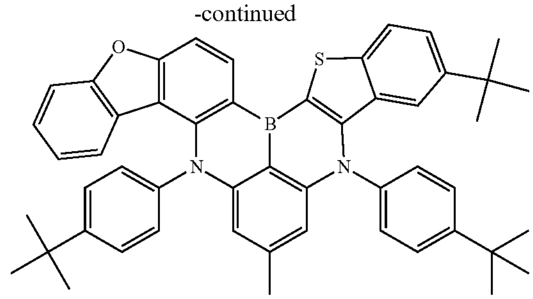

<Chemical Formula 153>

The same procedure as in Synthesis Example 1-7 was carried out, with the exception of using <Intermediate 10-b> instead of <Intermediate 1-f>, to afford <Chemical Formula 153> (3.4 g, yield 15.4%).

MS (MALDI-TOF): m/z 748.37 $[M]^+$

Synthesis Example 11: Synthesis of Compound of Chemical Formula 185

The same procedures as in Synthesis Example 3-1 to 3-3 were carried out, with the exception of using 1-bromo-3-iodobenzene and 4-tert-butylaniline instead of 1-bromo-3 (tert-butyl)-5-iodobenzene and aniline, respectively, in Synthesis Example 3-1, and 3-bromo-5-methylbenzofuran instead of 3-bromobenzofuran <Intermediate 1-b> in Synthesis Example 3-2, to afford <Chemical Formula 185> (2.1 g, yield 12%).

MS (MALDI-TOF): m/z 640.33 $[M]^+$

Synthesis of Compound Represented by Chemical Formula H

Synthesis Example 1: Synthesis of Compound 42

Synthesis Example 1-(1): Synthesis of Intermediate 1-a

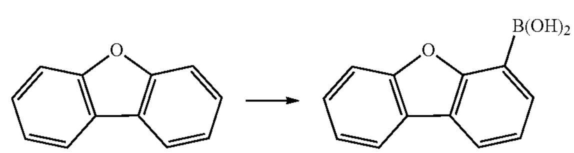

Intermediate 1-a

In a 2-L round-bottom flask, a solution of dibenzofuran (50 g, 0.297 mol) in tetrahydrofuran (500 ml) was cooled to 0° C. and stirred. The cooled solution was added with drops of n-butyl lithium (204 ml, 0.327 mol) and then stirred at room temperature. The reaction mixture was chilled to −78° C. at which drops of trimethyl borate (40.16 g, 0.386 mol) were slowly added, followed by stirring at room temperature. After completion of the reaction, drops of 2 N HCl were slowly added to acidify the solution. Extraction was made with ethyl acetate, and the organic layer thus formed was isolated, dehydrated, and concentrated in a vacuum. The solid thus formed was filtered to afford <Intermediate 1-a> (36 g, 57%).

Synthesis Example 1-(2): Synthesis of Intermediate 1-b

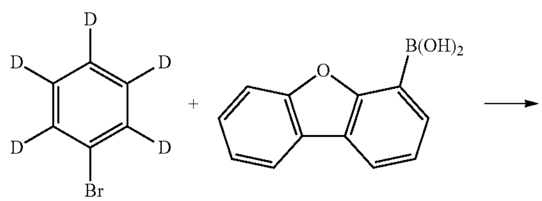

<Intermediate 1-a>

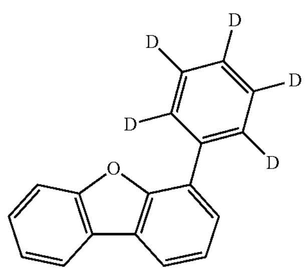

<Intermediate 1-b>

In a 1-L round bottom flask reactor, 1-bromobenzene-D5 (25.0 g, 0.154 mol), Intermediate 1-a (36.0 g, 0.170 mol), tetrakis(triphenylphosphine)palladium (5.4 g, 0.005 mol), and potassium carbonate (32.0 g, 0.231 mol) were put, followed by toluene (175 mL), tetrahydrofuran (75 mL), and water (75 mL). The reactor was heated to 90° C. and the mixture was stirred overnight. After completion of the reaction, extraction was made and the organic layer thus formed was isolated by column chromatography to afford <Intermediate 1-b> (30.0 g, 78.0%).

Synthesis Example 1-(3): Synthesis of Intermediate 1-c

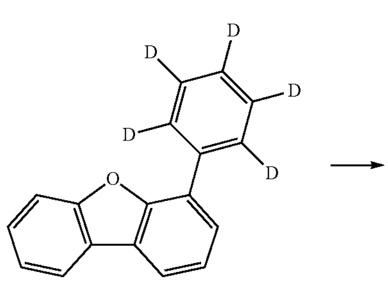

<Intermediate 1-b>

-continued

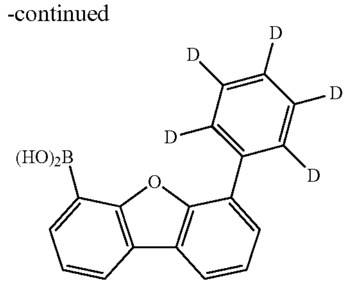

<Intermediate 1-c>

The same procedure as in Synthesis Example 1-(1) was carried out, with the exception of using <Intermediate 1-b> instead of dibenzofuran, to afford <Intermediate 1-c> (22.3 g, 63.2%).

Synthesis Example 1-(4): Synthesis of Compound 42

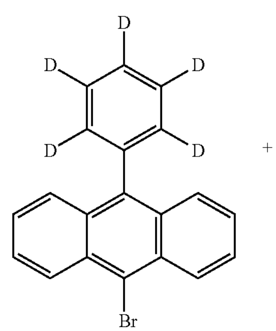

<Intermediate 1-c>

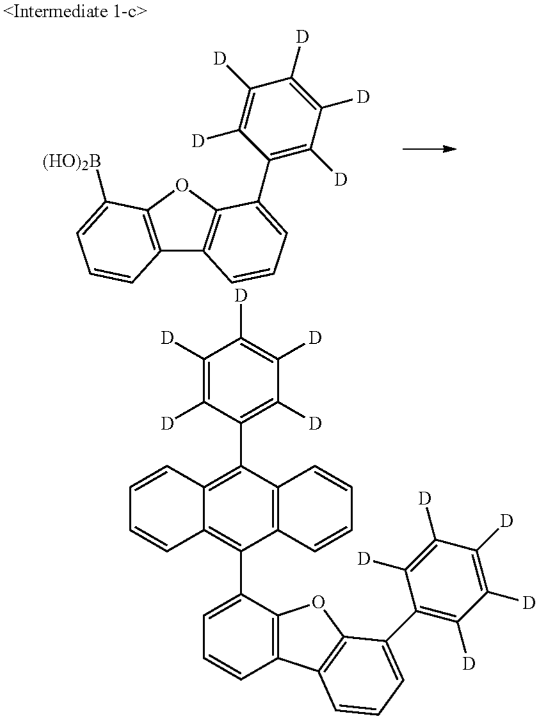

<Compound 42>

In a 250-mL round bottom flask reactor, 9-bromo-10-phenyl(d5)-anthracene (10.0 g, 0.030 mol), <Intermediate 1-c> (8.1 g, 0.033 mol), tetrakis(triphenylphosphine)palladium (0.7 g, 0.001 mol), and potassium carbonate (6.1 g, 0.044 mol) were put, followed by toluene (70 mL), tetrahydrofuran (30 mL), and water (20 mL). The reactor was heated to 90° C. and the mixture was stirred overnight. After completion of the reaction, the reactor was cooled to room temperature and extraction was made with ethylacetate. The organic layer thus formed was concentrated in a vacuum and separated by column chromatography to afford <Compound 42> (5.3 g, 35.4%).

MS (MALDI-TOF): m/z 506.25$[M^+]$

Synthesis Example 2: Synthesis of Compound 32

Synthesis Example 2-(1): Synthesis of Intermediate 2-a

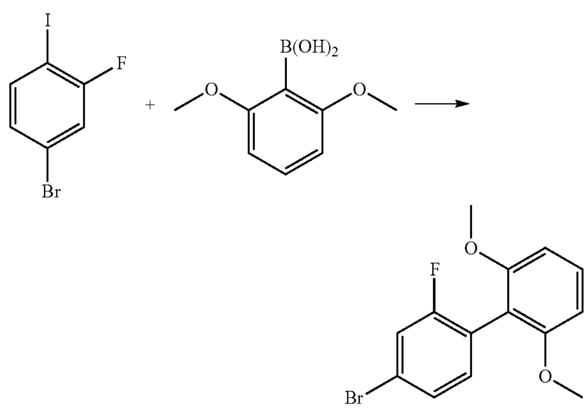

<Intermediate 2-a>

The same procedure as in Synthesis Example 1-(2) was carried out, with the exception of using 1-bromo 3-fluoro-4-iodobenzene and 2,6-dimethoxyphenyl boronic acid instead of 1-bromobenzene-D5 and Intermediate 1-a, to afford <Intermediate 2-a> (21 g, 63%).

Synthesis Example 2-(2): Synthesis of Intermediate 2-b

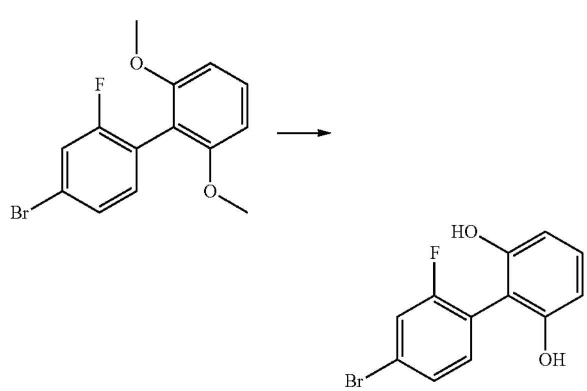

<Intermediate 2-b>

In a 250-ml reactor, a solution of <Intermediate 2-a> (20.0 g, 0.065 mol) in methylene chloride (200 ml) was cooled to 0° C. and stirred. A dilution of boron tribromide (24.2 g, 0.097 mol) in methylene chloride (50 ml) was dropwise added, followed by stirring at room temperature for 2 hours. After completion of the reaction, the organic layer was isolated, filtered, and concentrated in a vacuum. The concentrate was purified by column chromatography to afford <Intermediate 2-b> (17.0 g, 93%).

Synthesis Example 2-(3): Synthesis of Intermediate 2-c

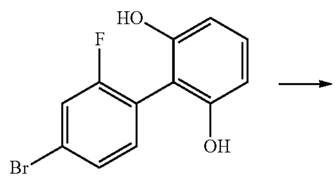

<Intermediate 2-b>

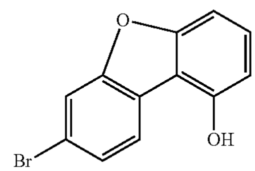

<Intermediate 2-c>

In a 500-ml reactor, <Intermediate 2-b> (17.0 g, 0.060 mol), potassium carbonate (16.6 g, 0.121 mol), and methyl-2-pyrrolidinone (170 ml) were stirred together at 120° C. for 5 hours. After completion of the reaction, the reaction mixture was cooled to room temperature. The solid thus formed was purified by column chromatography to afford <Intermediate 2-c> (10.3 g, 65.2%).

Synthesis Example 2-(4): Synthesis of Intermediate 2-d

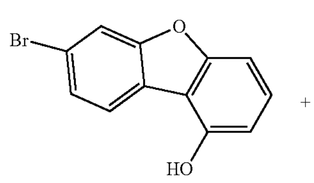

<Intermediate 2-c>

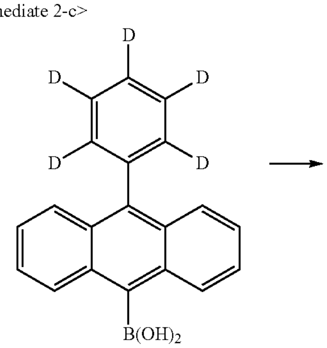

-continued

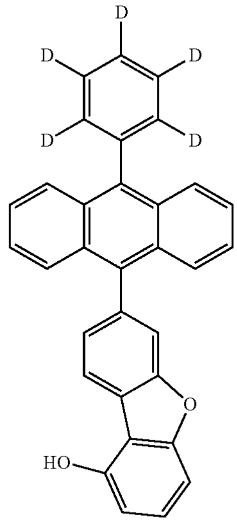

<Intermediate 2-d>

In a 250 mL round-bottom flask [Intermediate 2-c] (10.0 g, 0.038 mol), (10-phenyl(d5)-anthracene-9-boronic acid (13.8 g, 0.046 mol), tetrakis(triphenylphosphine)palladium (1.10 g, 0.001 mol), and potassium carbonate (13.13 g, 0.095 mol) were put, followed by toluene (70 mL), 1,4-dioxane (50 mL), and water (30 mL). The solution was heated to 90° C. and stirred overnight. After completion of the reaction, the reaction mixture was extracted with ethyl acetate. The organic layer thus foiled was separated and concentrated in a vacuum. Purification by column chromatography and subsequent recrystallization afforded [Intermediate 2-d] (12.3 g, 73.3%).

Synthesis Example 2-(5): Synthesis of Intermediate 2-e

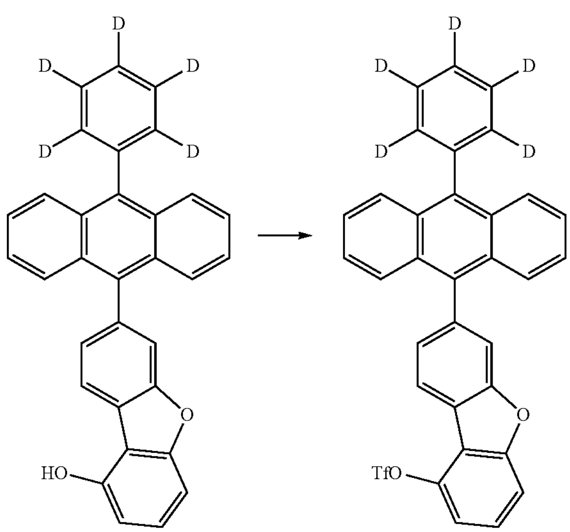

<Intermediate 2-d> <Intermediate 2-e>

In a 300-mL round bottom flask reactor, pyridine (2.3 g, 0.029 mol) was dropwise added to a solution of <Intermediate 2-d> (12.3 g, 0.028 mol) in dichloromethane (120 mL) and stirred at room temperature for 30 min. The reactor was cooled to 0° C. before addition of drops of trifluoromethane sulfonic anhydride (9.8 g, 0.033 mol). The solution was stirred at room temperature for 1 hour and after completion of the reaction, extraction was made and the organic layer was filtered through a silica pad. The filtrate was concentrated and recrystallized to afford <Intermediate 2-e>. (14.1 g, 87.3%)

Synthesis Example 2-(6): Synthesis of Compound 32

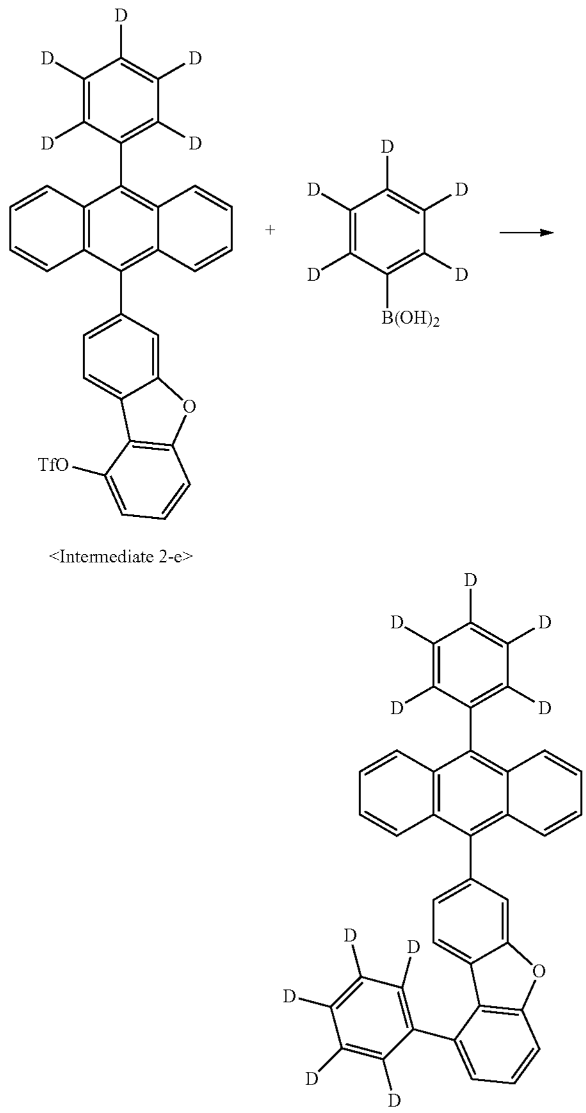

<Compound 32>

In a 250-mL round bottom flask, <Intermediate 2-e> (7.0 g, 0.012 mol), phenylboronic acid (d5) (1.9 g, 0.015 mol), tetrakis(triphenylphosphine)palladium (0.35 g, 0.3 mmol), and potassium carbonate (4.2 g, 0.030 mol) was put, followed by toluene (50 mL), tetrahydrofuran (30 mL), and water (20 mL). The reactor was heated to 90° C. before the mixture was stirred overnight. After completion of the reaction, extraction was made and the organic layer thus formed was separated and concentrated in a vacuum. Column chromatographic purification and recrystallization afforded <Compound 32>. (3.5 g, 56.6%)

MS (MALDI-TOF): m/z 506.25[$M^+$]

Synthesis Example 3: Synthesis of Compound 4

Synthesis Example 3-(1): Synthesis of Intermediate 3-a

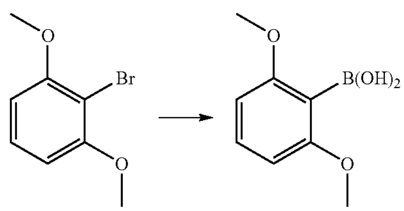

<Intermediate 3-a>

In a 1-L reactor, a solution of 2-bromo-1,3-dimethoxybenzene (50 g, 230 mmol) in tetrahydrofuran (400 ml) was chilled to −78° C. and added with drops of n-butyl lithium (167 ml, 280 mmol). The solution was stirred for 2 hours, mixed with trimethyl borate (36 ml, 320 mmol), and then stirred again at room temperature overnight. After completion of the reaction, drops of 2N-HCl were slowly added for acidification. Extraction and recrystallization afforded <Intermediate 3-a> (20.8 g, 50%).

Synthesis Example 3-(2): Synthesis of Intermediate 3-b

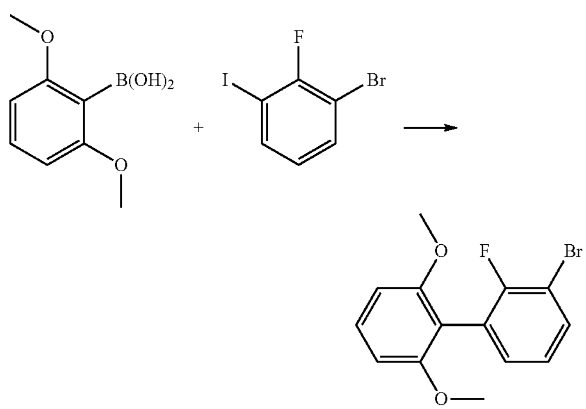

<Intermediate 3-b>

In a 500-ml reactor, <Intermediate 3-a> (20.8 g, 110 mmol), 1-bromo-2-fluoro-3-iodobenzene (28.7 g, 95 mmol), tetrakis(triphenylphosphine)palladium (33 g, 29 mmol), and sodium carbonate (30.3 g, 290 mmol) were put, followed by toluene (200 ml), ethanol (60 ml), and water (60 ml). The reactor was heated to 80° C. before solution was stirred for 12 hours. After completion of the reaction, the reaction mixture was extracted and the organic layer was isolated by column chromatography afforded <Intermediate 3-b> (22.3 g, 63%).

Synthesis Example 3-(3): Synthesis of Intermediate 3-c

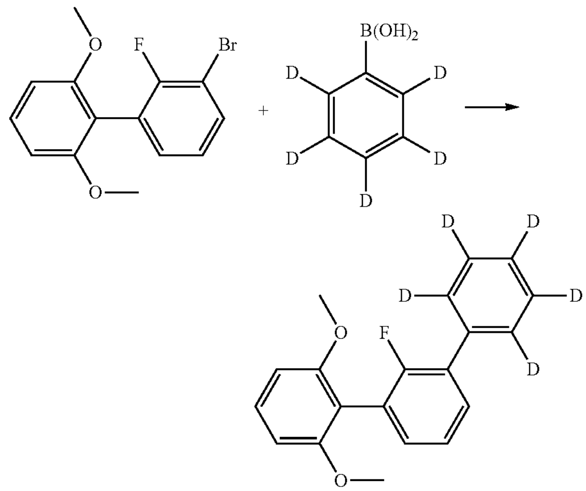

<Intermediate 3-c>

The same procedure as in Synthesis Example 3-(2) was carried out, with the exception of using phenyl-d5-boronic acid and <Intermediate 3-b> instead of <Intermediate 3-a> and 1-bromo-2-fluoro-3-iodobenzene, respectively, to afford <Intermediate 3-c>. (yield 72%)

Synthesis Example 3-(4): Synthesis of Intermediate 3-d

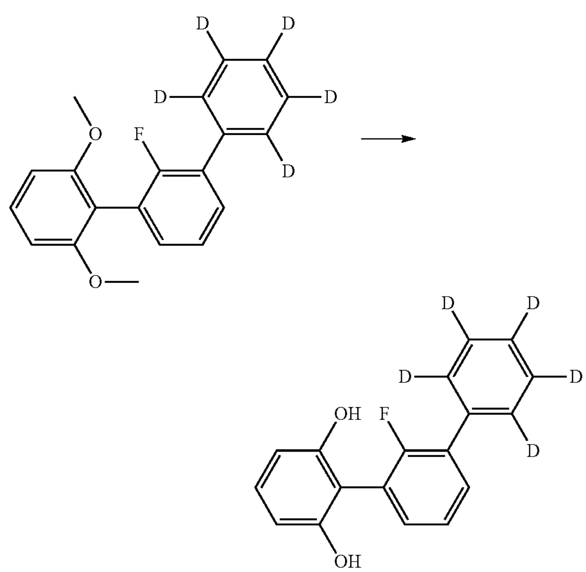

<Intermediate 3-d>

In a 500-ml reactor, <Intermediate 3-c> (16.6 g, 53 mmol), hydrogen bromic acid (48 ml, 260 mmol), and acetic acid (100 ml) were stirred together for 12 hours. After completion of the reaction, the organic layer was concentrated in a vacuum and recrystallized in heptane to afford <Intermediate 3-d> (17.6 g, 95%).

Synthesis Example 3-(5): Synthesis of Intermediate 3-e

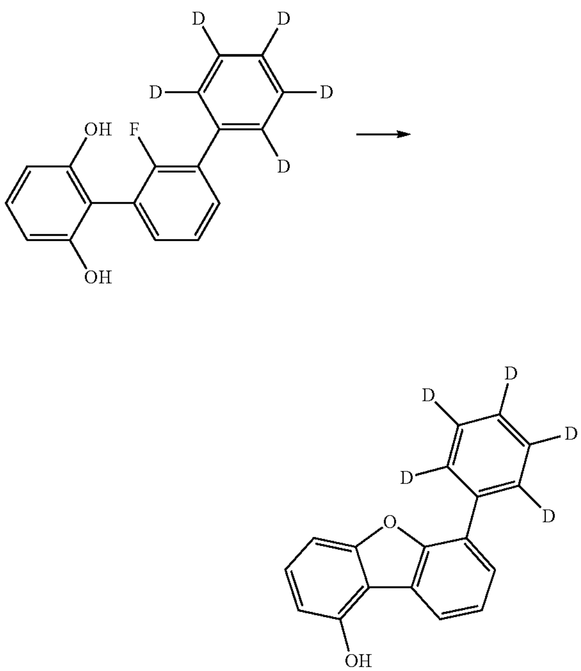

<Intermediate 3-e>

In a 500-ml reactor, <Intermediate 3-d> (14.3 g, 50 mmol), potassium carbonate (20.7 g, 150 mmol), and N-methyl-2-pyrrolidone (112 ml) were stirred together for 12 hours. After completion of the reaction, extraction was made and the organic layer thus formed was isolated. Recrystallization in heptane afforded <Intermediate 3-e> (10.6 g, 80%).

Synthesis Example 3-(6): Synthesis of Intermediate 3-f

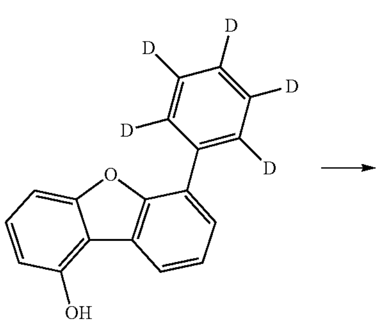

-continued

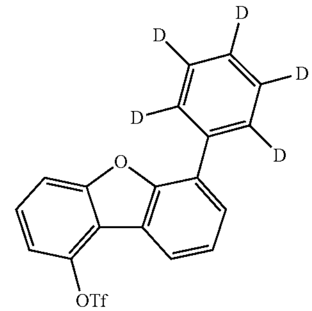

<Intermediate 3-f>

In a 500-ml reactor, <Intermediate 3-e> (10.6 g, 40 mmol) was put under a nitrogen atmosphere, followed by adding dichloromethane (136 ml) to dissolve the intermediate. At 0° C., pyridine (10 ml, 110 mmol) and trifluoromethanesulfonyl anhydride (12.7 g, 68 mmol) were dropwise added. The solution was stirred at room temperature for 12 hours and then together with water (20 ml). After extraction with water and dichloromethane, the organic layer was isolated and recrystallized in heptane to afford <Intermediate 3-f> (7.5 g, 47%).

Synthesis Example 3-(7): Synthesis of Compound 4

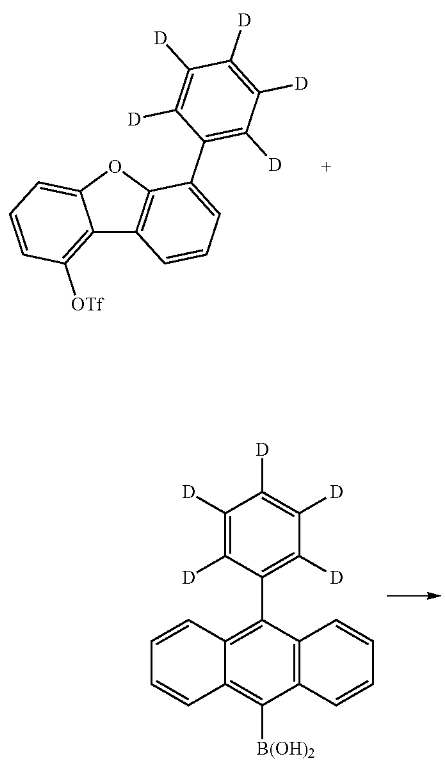

-continued

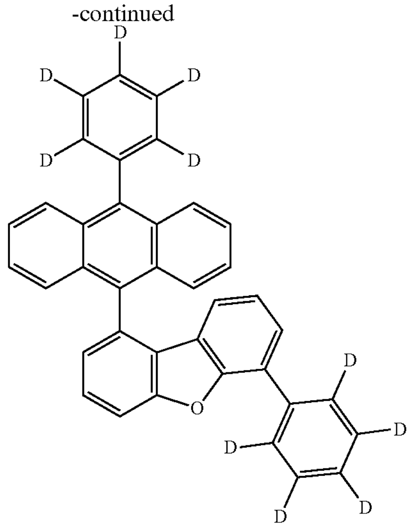

<Compound 4>

In a 250-ml reactor, <Intermediate 3-f> (7.5 g, 19 mmol), 10-phenyl(d5)-anthracene-9-boronic acid (7 g, 23 mmol), tetrakis(triphenylphosphine)palladium (0.66 g, 0.6 mmol), and potassium carbonate (7.9 g, 57 mmol) were put, followed by toluene (53 ml), ethanol (23 ml), and water (23 ml). The solution was heated to 80° C. and stirred for 12 hours under reflux. After completion of the reaction, the reaction mixture was and added with methanol before stirring. The organic layer thus formed was isolated, concentrated in a vacuum, and recrystallized in acetone to afford <Compound 4> (6.2 g, 65%).

MS (MALDI-TOF): m/z 506.25 [M+]

Synthesis Example 4: Synthesis of Compound 13

The same procedure as in Synthesis Example 3-(1) was carried out, with the exception of using 2-bromo-1,4-dimethoxybenzene instead of 2-bromo-1,3-dimethoxybenzene, to afford <Compound 13>. (yield 45%)

MS (MALDI-TOF): m/z 506.25 [M+]

Synthesis Example 5: Synthesis of Compound 24

Synthesis Example 5-(1): Synthesis of Intermediate 5-a

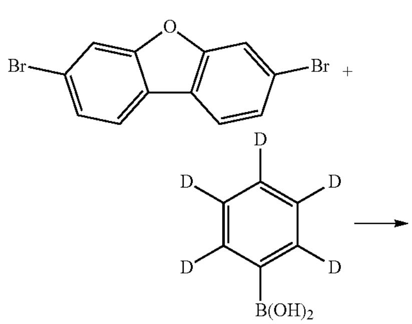

-continued

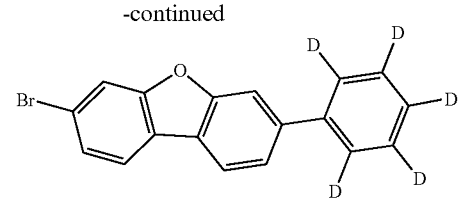

<Intermediate 5-a>

The same procedure as in Synthesis Example 3-(2) was carried out, with the exception of using 3,6-dibromodibenzofuran and phenyl-d5-boronic acid instead of 1-bromo-2-fluoro-3-iodobenzene and <Intermediate 3-a>, to afford <Intermediate 5-a>. (yield 65%)

Synthesis Example 5-(2): Synthesis of Compound 24

The same procedure as in Synthesis Example 3-(7) was carried out, with the exception of using <Intermediate 5-a> instead of <Intermediate 3-f>, to afford <Compound 24>. (yield 75%)

MS (MALDI-TOF): m/z 506.25 [M+]

Synthesis Example 6: Synthesis of Compound 20

Synthesis Example 6-(1): Synthesis of Intermediate 6-a

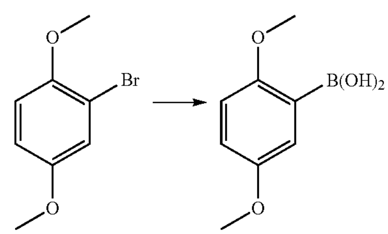

<Intermediate 6-a>

The same procedure as in Synthesis Example 3-(1) was carried out, with the exception of using 2-bromo-1,4-dimethoxybenzene instead of 2-bromo-1,3-dimethoxybenzene, to afford <Intermediate 6-a> (75 g, 74.5%).

Synthesis Example 6-(2): Synthesis of Intermediate 6-b

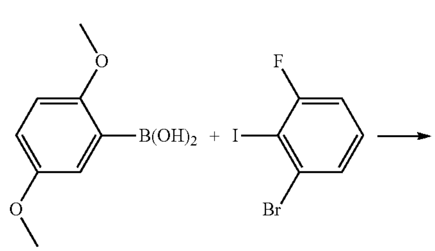

-continued

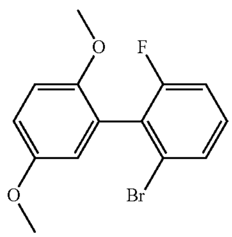

<Intermediate 6-b>

The same procedure as in Synthesis Example 3-(2) was carried out, with the exception of using Intermediate 6-a and 1-bromo-3-fluoro-2-iodobenzene instead of Intermediate 3-a and 1-bromo-2-fluoro-3-iodobenzene, to afford <Intermediate 6-b> (79 g, 61.6%).

Synthesis Example 6-(3): Synthesis of Intermediate 6-c

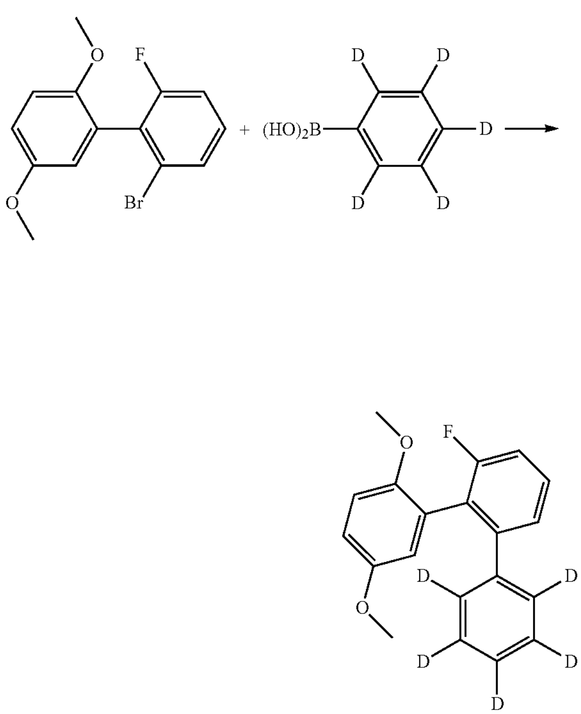

<Intermediate 6-c>

The same procedure as in Synthesis Example 3-(2) was carried out, with the exception of using phenyl-d5-boronic acid and <Intermediate 6-b> instead of <Intermediate 3-a> and 1-bromo-2-fluoro-3-iodobenzene, respectively, afford <Intermediate 6-c> (70 g, 92.7%).

Synthesis Example 6-(4): Synthesis of Intermediate 6-d

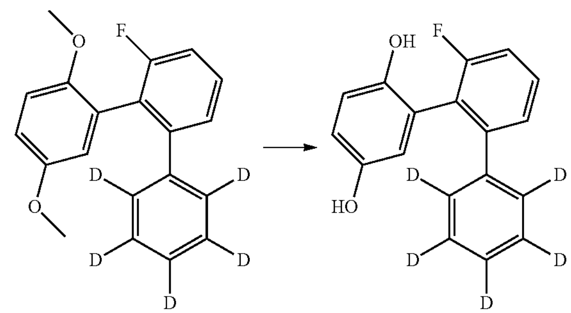

<Intermediate 6-d>

The same procedure as in Synthesis Example 3-(4) was carried out, with the exception of using Intermediate 6-c instead of Intermediate 3-c, to afford <Intermediate 6-d> (60 g, 94.1%).

Synthesis Example 6-(5): Synthesis of Intermediate 6-e

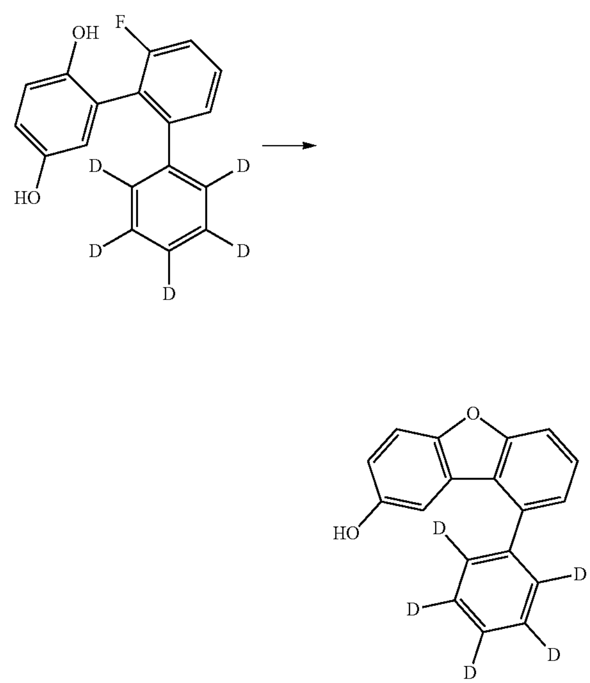

<Intermediate 6-e>

The same procedure as in Synthesis Example 3-(5) was carried out, with the exception of using Intermediate 6-d instead of Intermediate 3-d, to afford <Intermediate 6-e> (48 g, 86%).

Synthesis Example 6-(6): Synthesis of Intermediate 6-f

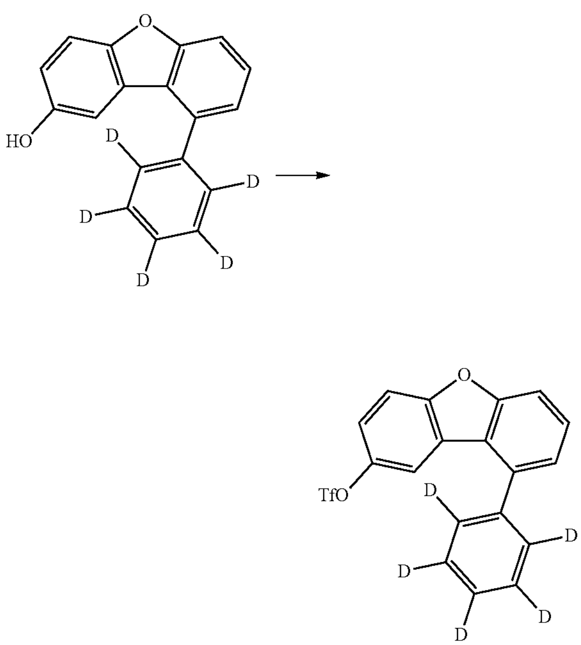

<Intermediate 6-f>

The same procedure as in Synthesis Example 3-(6) was carried out, with the exception of using Intermediate 6-e instead of Intermediate 3-e, to afford <Intermediate 6-f> (62 g, 86.2%).

Synthesis Example 6-(7): Synthesis of Compound 20

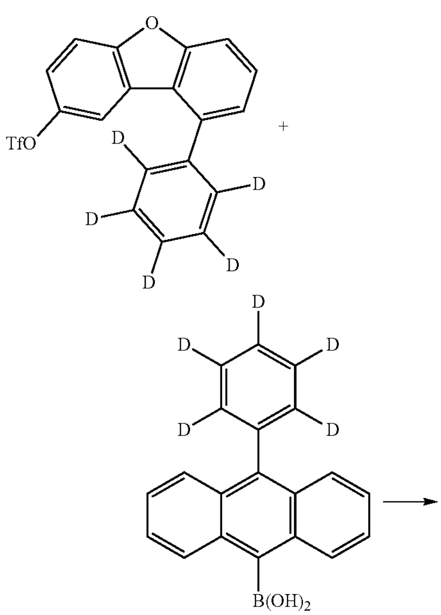

-continued

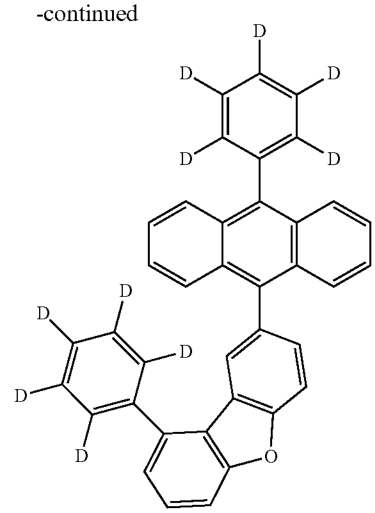

<Compound 20>

The same procedure as in Synthesis Example 3-(7) was carried out, with the exception of using Intermediate 6-f instead of Intermediate 3-f, to afford <Compound 20> (44 g, 55.7%).

MS (MALDI-TOF): m/z 506.25 [M+]

Synthesis Example 7: Synthesis of Compound 66

Synthesis Example 7-(1): Synthesis of Intermediate 7-a

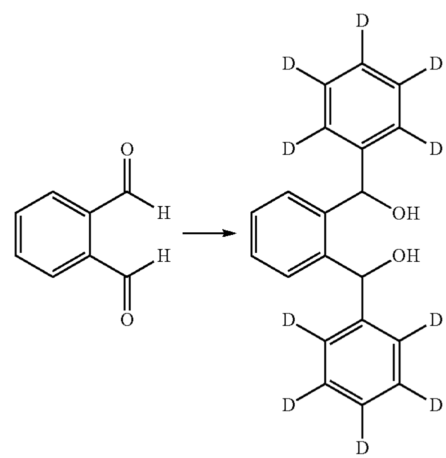

<Intermediate 7-a>

In a 2-L reactor, bromobenzene (d-5) (60.4 g, 0.373 mol) and tetrahydrofuran (480 mL) were chilled to −78° C. and stirred under a nitrogen atmosphere. The chilled solution was added with drops of n-butyl lithium (223.6 mL, 0.357 mol) and stirred at the same temperature for 1 hour. A solution of O-phthalaldehyde (20.0 g, 0.149 mol) in tetrahydrofuran (100 mL) was dropwise added, followed by stirring at room temperature. While being monitored, the reaction was stopped using an aqueous ammonium chloride solution (200 mL). The reaction mixture was extracted with ethylacetate and the organic layer thus formed was separated, concentrated in a vacuum, and purified by column chromatography to afford <Intermediate 7-a> (40 g, 89%).

Synthesis Example 7-2: Synthesis of <Intermediate 7-b>

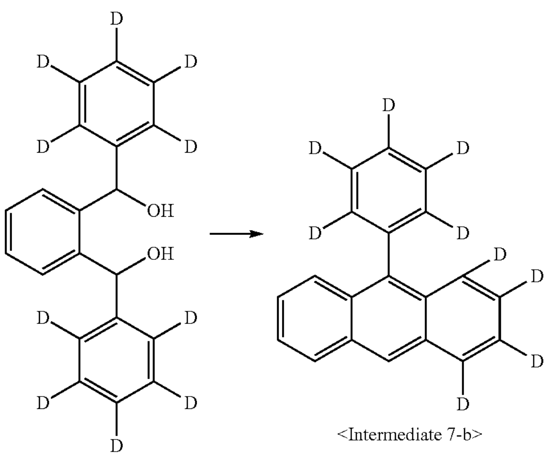 [SMILES: [2H]c1c([2H])c([2H])c(C(O)c2ccccc2C(O)c2c([2H])c([2H])c([2H])c([2H])c2[2H])c([2H])c1[2H] ; [2H]c1c([2H])c([2H])c(-c2c3ccccc3cc3c([2H])c([2H])c([2H])c([2H])c23)c([2H])c1[2H]]

<Intermediate 7-b>

In a 500-mL reactor, a solution of <Intermediate 7-a> (40.0 g, 0.133 mol) in acetic acid (200 mL) was stirred. Hydrogen bromide (2 mL) was added to the solution which was then stirred at 80° C. for 2 hours. After completion of the reaction, the reaction mixture was cooled to room temperature, slowly poured to water (500 mL) in a beaker, and then stirred. The solid thus formed was filtered and washed with water. The solid was purified by column chromatography to afford <Intermediate 7-b> (13 g, yield 37%).

Synthesis Example 7-3: Synthesis of <Intermediate 7-c>

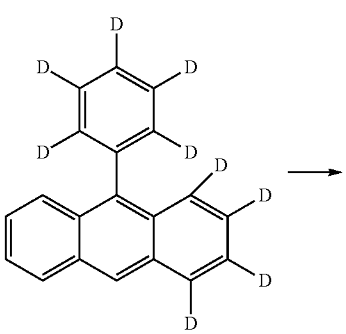

-continued

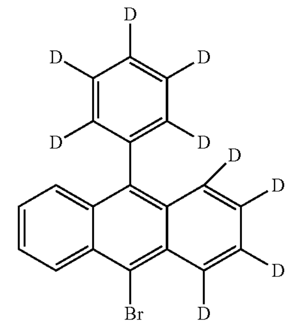

<Intermediate 7-c>

In a 500-mL reactor, a solution of <Intermediate 7-b> (13.0 g, 0.049 mol) in N,N-dimethyl amide (130 mL) was stirred. A solution of N-bromosuccinimide (10.54 g, 0.059 mol) in N,N-dimethyl amide (40 mL) was dropwise added. After being monitored via thin layer chromatography, the reaction was stopped. The reaction mixture was poured to water (500 mL) in a beaker and the solid thus formed was filtered and washed with water. The solid was purified by column chromatography to afford <Intermediate 7-c> (14.0 g, 83%).

Synthesis Example 7-4: Synthesis of <Compound 66>

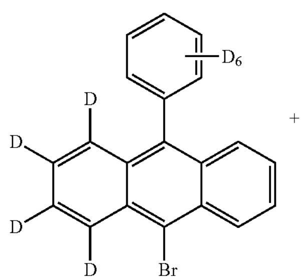

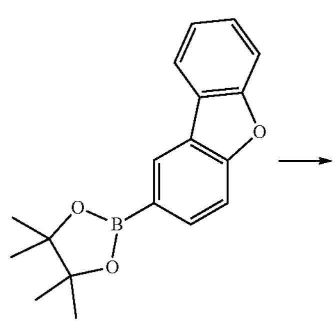

-continued

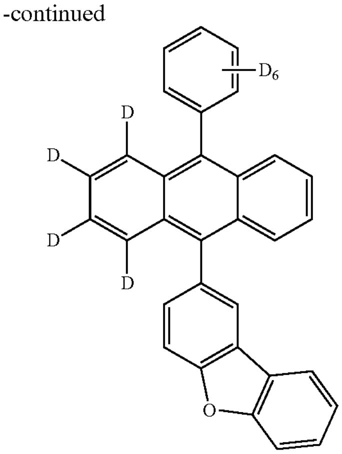

<Compound 66>

The same procedure as in Synthesis Example 1-(4) was carried out, with the exception of using <Intermediate 4-d> and Intermediate 7-c instead of Intermediate 1-c and 9-bromo-10-phenyl(d5)-anthracene, to afford <Compound 66> (5.6 g, 62.1%).

MS (MALDI-TOF): m/z 429.21 [$M^+$]

Examples 1 to 25: Fabrication of Organic Light Emitting Diodes

An ITO glass substrate was patterned to have a translucent area of 2 mm×2 mm and cleansed. The ITO glass was mounted in a vacuum chamber that was then set to have a base pressure of $1\times10^{-7}$ torr. On the ITO glass substrate, films were sequentially formed of DNTPD (700 Å) and [Chemical Formula G] (250 Å) in the order. Subsequently, a light-emitting layer (250 Å) was formed of a combination of host and dopant compounds (98:2) listed in Table 1, below. Then, [Chemical Formula E-1] and [Chemical Formula E-2] were deposited at a ratio of 1:1 to form an electron transport layer (300 Å), on which an electron injecting layer of [Chemical Formula E-1] (5 Å) was formed and then covered with an Al layer (1000 Å) to fabricate an organic light-emitting diode. The organic light-emitting diodes thus obtained were measured at 0.4 mA for luminescence properties:

[DNTPD]

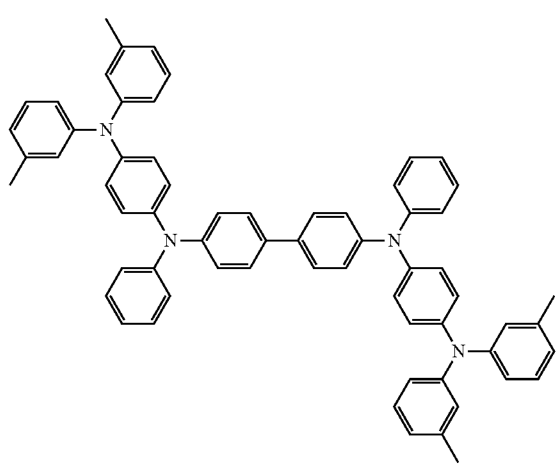

-continued

[Chemical Formula G]

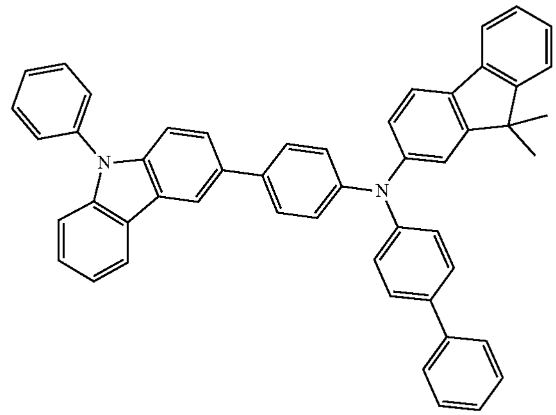

[Chemical Formula E-1]

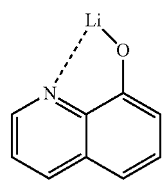

[Chemical Formula E-2]

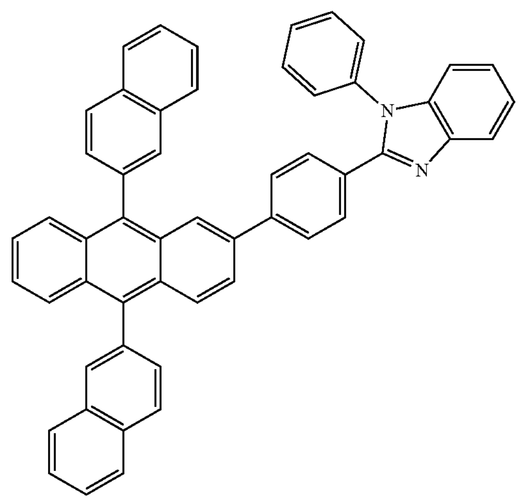

Comparative Examples 1 to 19

Organic light emitting diodes were fabricated in the same manner as in the Examples, with the exception that the host and dopant compounds listed in Table 1, below, for Comparative Examples 1 to 19 were used instead of the compounds according to the present disclosure. The luminescence of the organic light-emitting diodes thus obtained was measured at 0.4 mA. Structures of BH1-BH8 and BD1-BD6 are as follows:

-continued
[BH1]
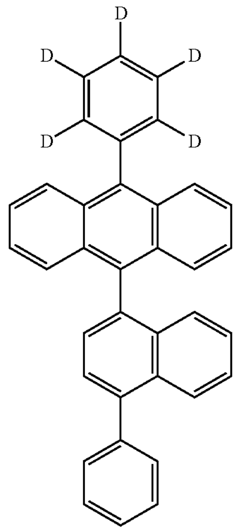
[BH2]
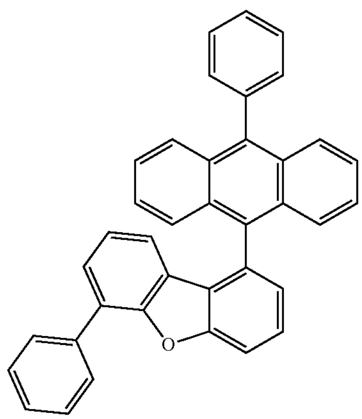
[BH3]
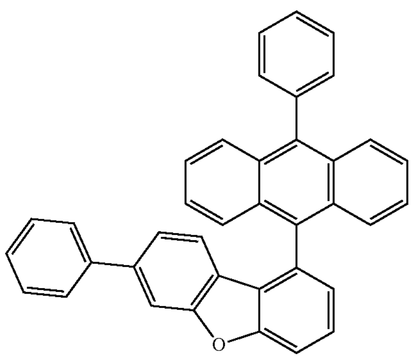
[BH4]
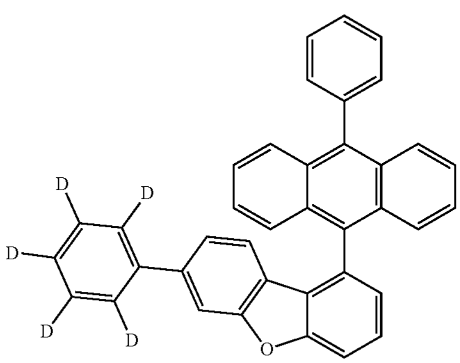
[BH5]
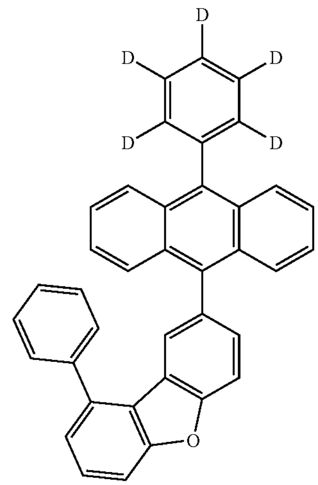
[BH6]
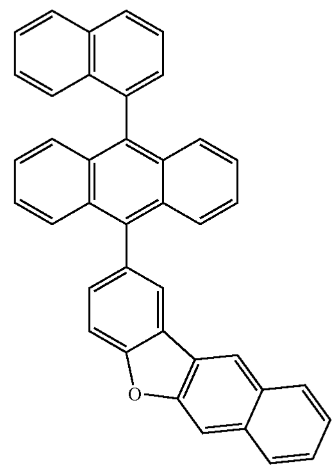
[BH7]
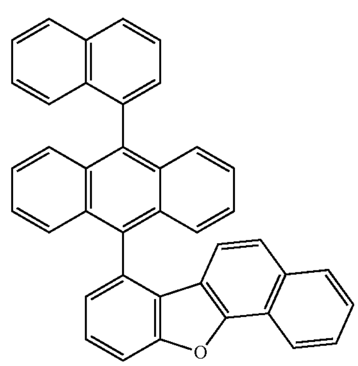

[BH8]
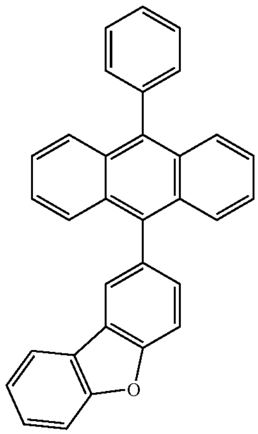
[BD1]
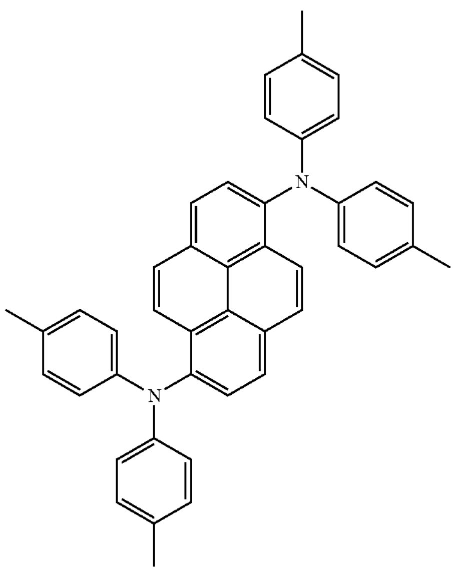
[BD2]
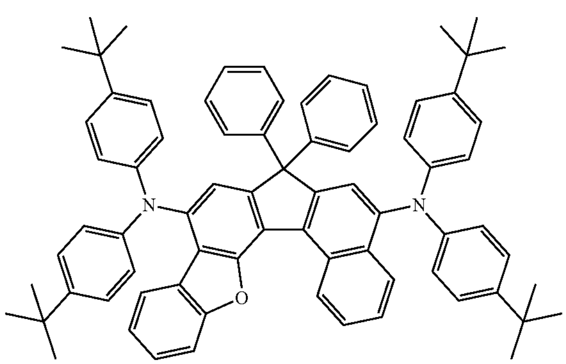
[BD3]
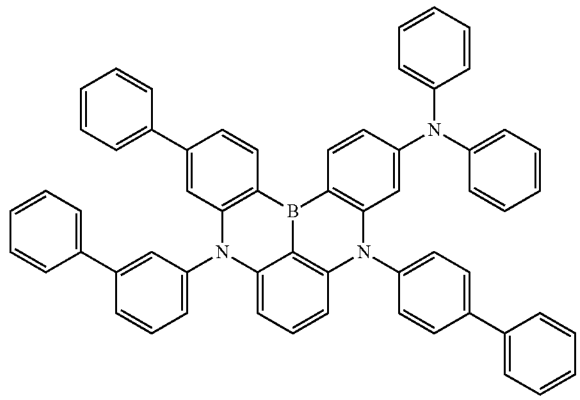
[BD4]
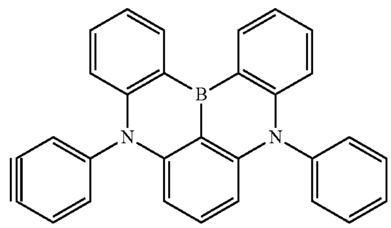
[BD5]
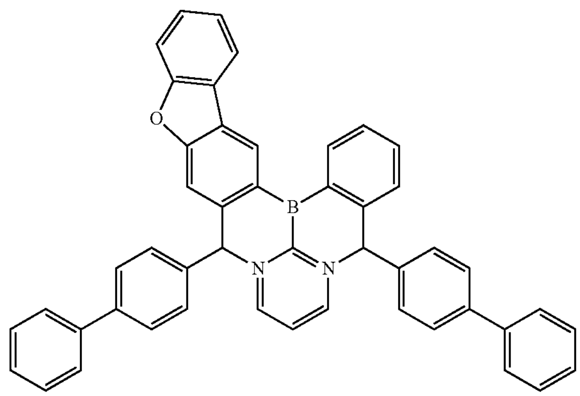
[BD6]
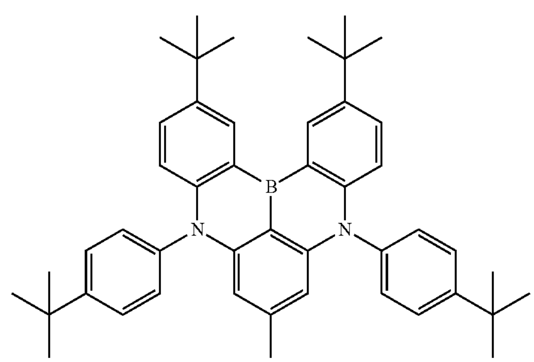
The organic light emitting diodes fabricated in Examples 1 to 25 and Comparative Examples 1 to 19 were measured for voltage, external quantum efficiency, and life span, and the results are summarized in Table, below.

TABLE 1

| No. | Host | Dopant | V | EQE | T97 (h) |
|---|---|---|---|---|---|
| Ex. 1 | Compound 76 | Chemical Formula 4 | 3.72 | 9.51 | 152 |
| Ex. 2 | Compound 8 | Chemical Formula 185 | 3.45 | 9.70 | 149 |
| Ex. 3 | Compound 9 | Chemical Formula 65 | 3.50 | 6.80 | 162 |
| Ex. 4 | Compound 66 | Chemical Formula 109 | 3.81 | 8.63 | 157 |
| Ex. 5 | Compound 4 | Chemical Formula 150 | 3.75 | 10.57 | 214 |
| Ex. 6 | Compound 4 | Chemical Formula 178 | 3.76 | 10.28 | 202 |
| Ex. 7 | Compound 5 | Chemical Formula 150 | 3.5 | 9.89 | 233 |
| Ex. 8 | Compound 8 | Chemical Formula 182 | 3.49 | 9.99 | 209 |
| Ex. 9 | Compound 8 | Chemical Formula 31 | 3.48 | 9.51 | 225 |
| Ex. 10 | Compound 5 | Chemical Formula 183 | 3.53 | 9.89 | 214 |
| Ex. 11 | Compound 9 | Chemical Formula 145 | 3.4 | 9.31 | 236 |
| Ex. 12 | Compound 9 | Chemical Formula 153 | 3.46 | 9.41 | 217 |
| Ex. 13 | Compound 8 | Chemical Formula 179 | 3.49 | 9.99 | 232 |
| Ex. 14 | Compound 9 | Chemical Formula 184 | 3.47 | 9.51 | 229 |
| Ex. 15 | Compound 5 | Chemical Formula 62 | 3.57 | 9.70 | 240 |
| Ex. 16 | Compound 9 | Chemical Formula 180 | 3.45 | 9.12 | 196 |
| Ex. 17 | Compound 5 | Chemical Formula 80 | 3.58 | 9.31 | 194 |
| Ex. 18 | Compound 20 | Chemical Formula 147 | 3.55 | 8.73 | 199 |
| Ex. 19 | Compound 32 | Chemical Formula 145 | 3.66 | 9.31 | 167 |
| Ex. 20 | Compound 28 | Chemical Formula 146 | 3.75 | 9.22 | 162 |
| Ex. 21 | Compound 76 | Chemical Formula 157 | 3.8 | 9.60 | 152 |
| Ex. 22 | Compound 42 | Chemical Formula 163 | 4.09 | 9.51 | 149 |
| Ex. 23 | Compound 77 | Chemical Formula 181 | 3.7 | 9.60 | 155 |
| Ex. 24 | Compound 66 | Chemical Formula 126 | 3.87 | 8.83 | 242 |
| Ex. 25 | Compound 2 | Chemical Formula 155 | 3.74 | 9.99 | 150 |
| C. Ex. 1 | BH1 | BD1 | 3.99 | 7.85 | 34 |
| C. Ex. 2 | BH1 | BD2 | 4.06 | 8.30 | 61 |
| C. Ex. 3 | BH2 | BD4 | 3.88 | 6.77 | 55 |
| C. Ex. 4 | BH3 | Chemical Formula 80 | 3.55 | 9.11 | 106 |
| C. Ex. 5 | BH4 | Chemical Formula 180 | 3.54 | 9.02 | 140 |
| C. Ex. 6 | BH5 | BD2 | 3.56 | 7.85 | 70 |
| C. Ex. 7 | BH6 | BD6 | 3.71 | 8.47 | 56 |
| C. Ex. 8 | Compound 4 | BD2 | 3.82 | 8.03 | 78 |
| C. Ex. 9 | Compound 4 | BD3 | 3.81 | 7.04 | 94 |
| C. Ex. 10 | Compound 4 | BD5 | 3.86 | 6.86 | 73 |
| C. Ex. 11 | Compound 9 | BD3 | 3.40 | 7.80 | 69 |
| C. Ex. 12 | Compound 9 | BD6 | 3.40 | 7.86 | 123 |
| C. Ex. 13 | BH7 | Chemical Formula 126 | 3.41 | 8.9 | 35 |
| C. Ex. 14 | BH8 | Chemical Formula 1 | 3.67 | 5.78 | 38 |
| C. Ex. 15 | BH8 | Chemical Formula 2 | 3.72 | 7.94 | 43 |
| C. Ex. 16 | BH8 | Chemical Formula 4 | 3.72 | 5.99 | 107 |
| C. Ex. 17 | BH8 | Chemical Formula 13 | 3.65 | 6.14 | 11 |

TABLE 1-continued

| No. | Host | Dopant | V | EQE | T97 (h) |
|---|---|---|---|---|---|
| C. Ex. 18 | BH8 | Chemical Formula 185 | 3.72 | 8.54 | 87 |
| C. Ex. 19 | BH8 | Chemical Formula 73 | 3.73 | 5.69 | 27 |

As is understood from data of Table 1, the organic light-emitting diodes according to the present disclosure exhibited excellent luminous efficiency and a long life span, compared to those of the Comparative Examples, and are expected to have high applicability.

As described hitherto, the organic light emitting diode according to the present disclosure exhibits a long life span and improved luminance efficiency, compared to conventional organic light emitting diodes.

What is claimed is:

1. An organic light emitting diode, comprising:

a first electrode;

a second electrode facing the first electrode; and a light emitting layer interposed between the first electrode and the second electrode, wherein the light emitting layer comprises any one of compounds represented by Chemical Formula A or B, below and a compound represented by Chemical Formula H, below:

[Chemical Formula A]

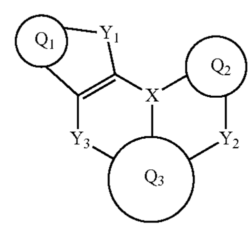

[Chemical Formula B]

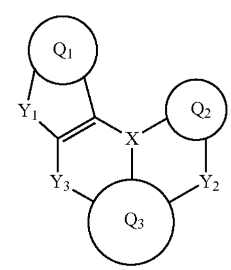

wherein,

Q1 to Q3, which are same or different, are each independently a substituted or unsubstituted aromatic hydrocarbon ring of 6 to 50 carbon atoms or a substituted or unsubstituted heteroaromatic ring of 2 to 50 carbon atoms, X is any one selected from B, P, P═O, and P═S, and $Y_1$ to $Y_3$, which are same or different, are each independently any one selected from N—$R_1$, $CR_2R_3$, O, S, Se, and $SiR_4R_5$, wherein $R_1$ to $R_5$, which are same or different, are each independently any one selected from a hydrogen atom, a deuterium atom, a substituted or unsubstituted alkyl of 1 to 30 carbon atoms, an alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, $R_2$ and $R_4$ can be connected to $R_3$ and $R_5$, respectively, to form an additional mono- or polycyclic aliphatic or aromatic ring, $R_1$ to $R_5$ in $Y_1$ can each be independently connected to the $Q_1$ ring moiety to form an additional mono- or polycyclic aliphatic or aromatic ring, $R_1$ to $R_5$ in $Y_2$ can each be independently connected to the $Q_2$ ring moiety or the $Q_3$ ring moiety to form an additional mono- or polycyclic aliphatic or aromatic ring, $R_1$ to $R_5$ in $Y_3$ can each be independently connected to the $Q_1$ ring moiety or the $Q_3$ ring moiety to form an additional mono- or polycyclic aliphatic or aromatic ring;

in Chemical Formula B, any of $R_1$ to $R_5$ in $Y_1$ can be connected to any of $R_1$ to $R_5$ in $Y_3$ to form an additional mono- or polycyclic aliphatic or aromatic ring; and

[Chemical Formula H]

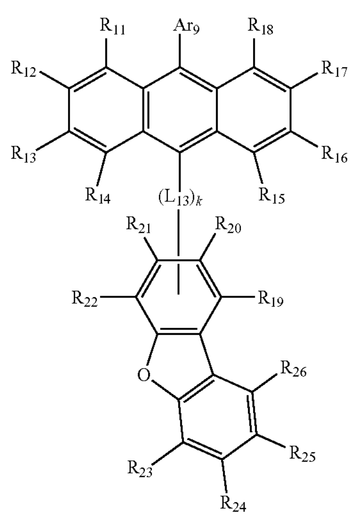

$Ar_9$ is a substituted or unsubstituted aryl of 6 to 50 carbon atoms or a substituted or unsubstituted heteroaryl of 2 to 50 carbon atoms;

$R_{11}$ to $R_{18}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, and $R_{19}$ to $R_{26}$, which are same or difference, are each independently a hydrogen atom, a deuterium atom, or a substituted or unsubstituted aryl, wherein one of $R_{19}$ to $R_{22}$ is a single bond connecting to linker $L_{13}$, $L_{13}$ is a single bond or a substituted or unsubstituted arylene of 6 to 20 carbon atoms, and k is an integer of 1 to 3 wherein when k is 2 or greater, the $L_{13}$'s are same or different, wherein the team "substituted" in the expression "substituted or unsubstituted" used for compounds of Chemical Formulas A, B, and Chemical Formula H means having at least one substituent selected from the group consisting of a deuterium atom, a cyano, a halogen, a hydroxyl, a nitro, an alkyl of 1 to 24 carbon atoms, a halogenated alkyl of 1 to 24 carbon atoms, alkenyl of 2 to 24 carbon atoms, an alkynyl of 2 to 24 carbon atoms, a cycloalkyl of 3 to 24 carbon atoms, a heteroalkyl of 1 to 24 carbon atoms, an aryl of 6 to 24 carbon atoms, an arylalkyl of 7 to 24 carbon atoms, an alkylaryl of 7 to 24 carbon atoms, a heteroaryl of 2 to 24 carbon atoms, a heteroarylalkyl of 2 to 24 carbon atoms, an alkoxy of 1 to 24 carbon atoms, an alkylamino of 1 to 24 carbon atoms, a diarylamino of 12 to 24 carbon atoms, a diheteroarylamino of 2 to 24 carbon atoms, an aryl(heteroaryl)amino of 7 to 24 carbon atoms, an alkylsilyl of 1 to 24 carbon atoms, an arylsilyl of 6 to 24 carbon atoms, an aryloxy of 6 to 24 carbon atoms, and an arylthionyl of 6 to 24 carbon atoms.

2. The light emitting diode of claim 1, wherein at least one of the linkers $Y_2$ and $Y_3$ in Chemical Formulas A and B is N—$R_1$ wherein $R_1$ is as defined in claim 1.

3. The light emitting diode of claim 2, wherein $R_1$ is a substituted or unsubstituted aryl of 6 to 50 carbon atoms or a substituted or unsubstituted heteroaryl of 2 to 50 carbon atoms.

4. The light emitting diode of claim 2, wherein at least one of the linkers $Y_2$ and $Y_3$ in Chemical Formulas A and B, which are same or different is a linker represented by the following Structural Formula A:

[Structural Formula A]

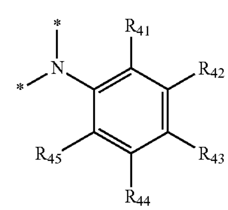

wherein -*" denotes a bonding site at which the N atom is bonded to the doubly bonded carbon atom connected to Y1, the doubly bonded carbon atom connected to Y3 in the 5-membered ring bearing Y1, an aromatic carbon atom in the Q2 ring moiety, or an aromatic carbon atom in the Q3 ring moiety;

$R_{41}$ to $R_{45}$, which are same or different, are each independently any one selected from a hydrogen atom, a deuterium atom, a substituted or unsubstituted alkyl of 1 to 30 carbon atoms, alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen, and $R_{41}$ and $R_{45}$ may each independently be bonded to the $Q_1$, $Q_2$, or $Q_3$ ring moiety to form an additionally aliphatic or aromatic mono- or polycyclic ring.

5. The light emitting diode of claim 2, wherein the linkers $Y_2$ and $Y_3$ in Chemical Formulas A and B are same or different and are each N—$R_1$ wherein $R_1$ is as defined in claim 1.

6. The light emitting diode of claim 1, wherein the linker $Y_1$ in Chemical Formulas A and B is an oxygen atom (O) or sulfur atom (S).

7. The light emitting diode of claim 1, wherein X in Chemical Formulas A and B is a boron atom (B).

8. The light emitting diode of claim 1, wherein $Q_1$ to $Q_3$ are same or different and are each independently a substituted or unsubstituted aromatic hydrocarbon ring of 6 to 50 carbon atoms.

9. The light emitting diode of claim 8, wherein the aromatic hydrocarbon rings of $Q_1$ to $Q_3$ are same or different and are each independently any one selected from [Structural Formula 10] to [Structural Formula 21]:

[Structural Formula 10]

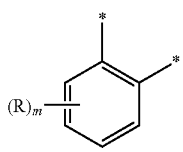

[Structural Formula 11]

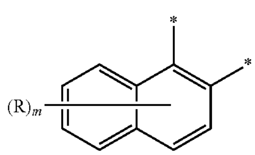

[Structural Formula 12]

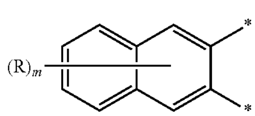

[Structural Formula 13]

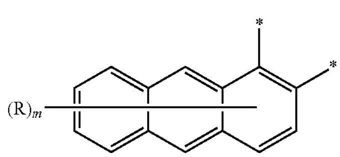

[Structural Formula 14]

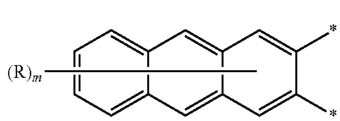

-continued

[Structural Formula 15]

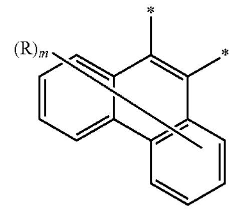

[Structural Formula 16]

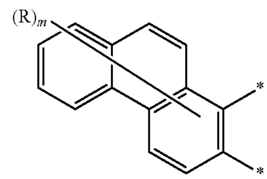

[Structural Formula 17]

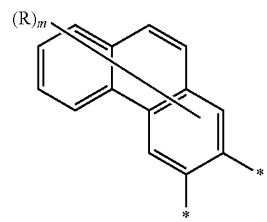

[Structural Formula 18]

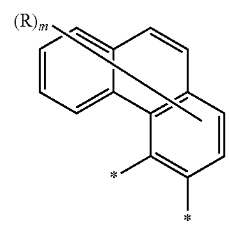

[Structural Formula 19]

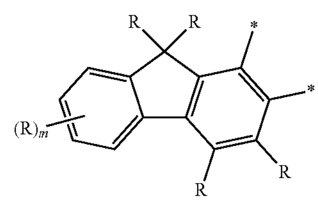

[Structural Formula 20]

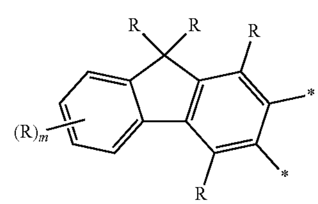

[Structural Formula 21]

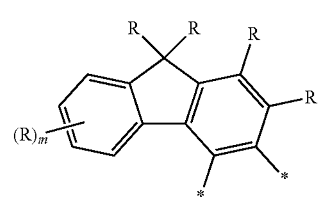

wherein,

"-*" denotes a bonding site at which the carbon ring member of $Q_1$ is bonded to $Y_1$ or a carbon member of the 5-membered ring bearing $Y_1$ or at which the carbon ring member of $Q_2$ is bonded to X or $Y_2$;

R's, which are same or different, are each independently any one selected from a hydrogen atom, a deuterium atom, a substituted or unsubstituted alkyl of 1 to 30 carbon atoms, alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted diarylamino of 12 to 24 carbon atoms, a substituted or unsubstituted diheteroarylamino of 2 to 24 carbon atoms, a substituted or unsubstituted aryl (heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a nitro, a cyano, and a halogen; and m is an integer of 1 to 8 wherein when m is 2 or greater or when two or more R's exist, the individual R's are same or different.

10. The light emitting diode of claim 8, wherein the aromatic hydrocarbon ring of $Q_3$ in Chemical Formulas A and B is a ring represented by the following [Structural Formula B]:

[Structural Formula B]

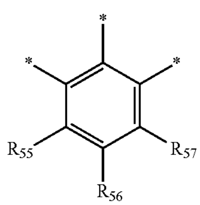

wherein,

"-*" denotes a bonding site at which the corresponding aromatic carbon ring members of $Q_3$ are bonded to $Y_2$, X and $Y_3$, respectively; and $R_{55}$ to $R_{57}$, which are same or different, are each independently any one selected from a hydrogen atom, a deuterium atom, a substituted or unsubstituted alkyl of 1 to 30 carbon atoms, alkenyl of 2 to 24 carbon atoms, an alkynyl of 2 to 24 carbon atoms, a substituted or unsubstituted aryl of 6 to 50 carbon atoms, a substituted or unsubstituted cycloalkyl of 3 to 30 carbon atoms, a substituted or unsubstituted heterocycloalkyl of 1 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 1 to 60 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted diarylamino of 12 to 24 carbon atoms, a substituted or unsubstituted diheteroarylamino of 2 to 24 carbon atoms, a substituted or unsubstituted aryl (heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a nitro, a cyano, and a halogen, and $R_{55}$ to $R_{57}$ can each be linked to an adjacent substituent to form an additional aliphatic or aromatic mono- or polycyclic ring.

11. The light emitting diode of claim 1, wherein the aromatic hydrocarbon ring of 6 to 50 carbon atoms or the heteroaromatic ring of 2 to 50 carbon atoms of at least one of the Q1 to Q3 ring moieties is bonded to an aryl amino radical represented by the following Structural Formula F:

[Structural Formula F]

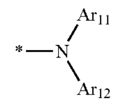

wherein,

"-*" denotes a bonding site participating in forming a bond to a carbon aromatic ring member of any one of $Q_1$ to $Q_3$, and $Ar_{11}$ and $Ar_{12}$, which are same or different, are each independently a substituted or unsubstituted aryl of 6 to 18 carbon atoms, and can be linked to each other to form a ring.

12. The light emitting diode of claim 4, wherein at least one of $R_{41}$ and $R_{45}$ in Structural Formula A is bonded to the $Q_3$ ring moiety to form an additional aliphatic or aromatic mono- or polycyclic ring.

13. The light emitting diode of claim 1, wherein the compound represented by Chemical Formula A or B is any one selected from <Chemical Formula 1> to <Chemical Formula 204>:

[Chemical Formula 1]

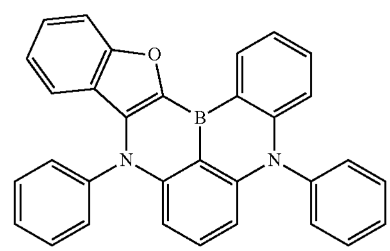

[Chemical Formula 2]

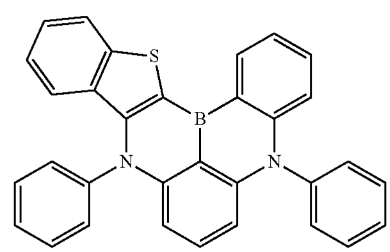

[Chemical Formula 3]

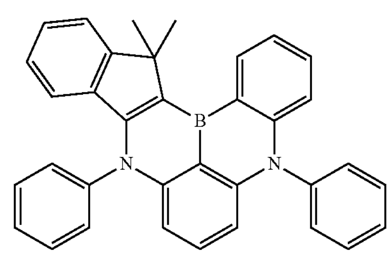

-continued
[Chemical Formula 4]
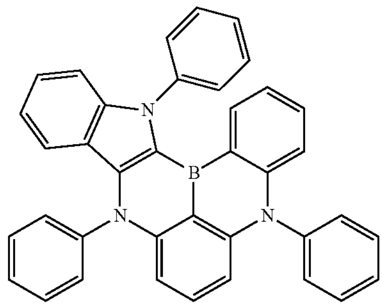
[Chemical Formula 5]
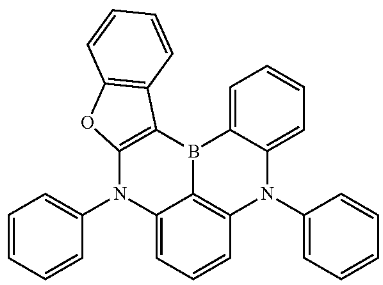
[Chemical Formula 6]
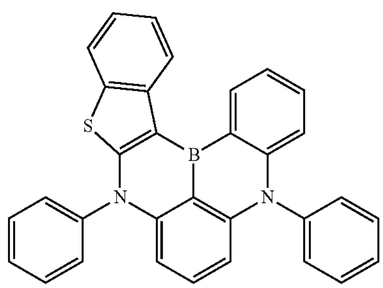
[Chemical Formula 7]
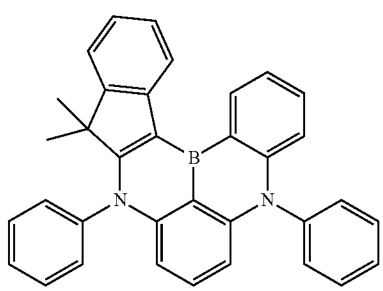
[Chemical Formula 8]
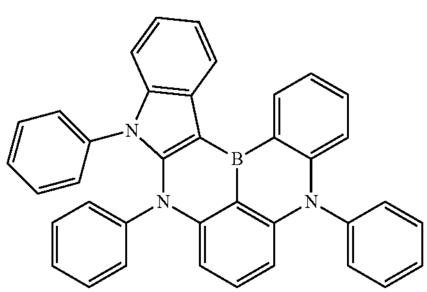
-continued
[Chemical Formula 9]
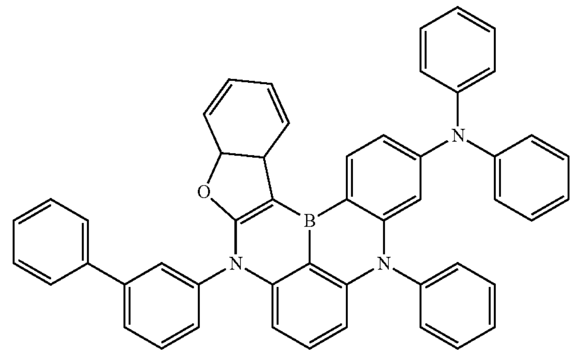
[Chemical Formula 10]
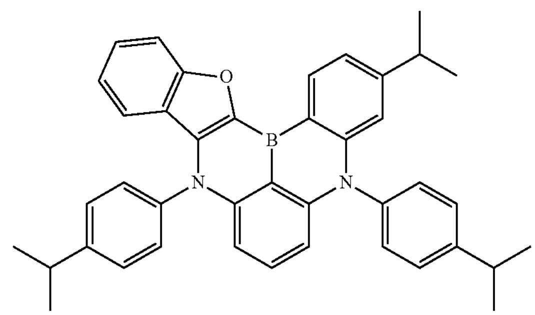
[Chemical Formula 11]
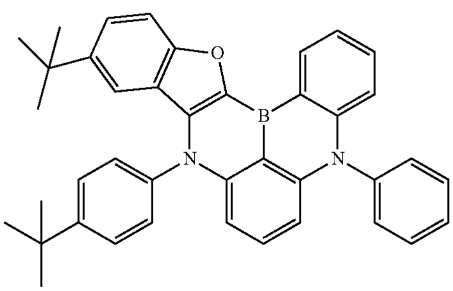
[Chemical Formula 12]
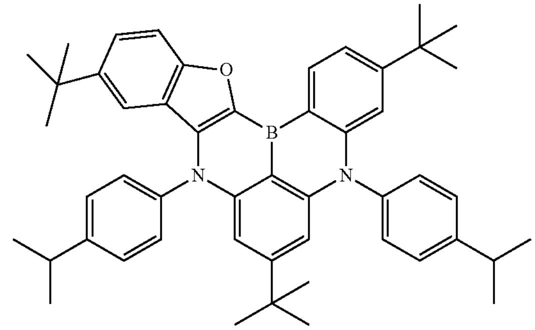

[Chemical Formula 13]
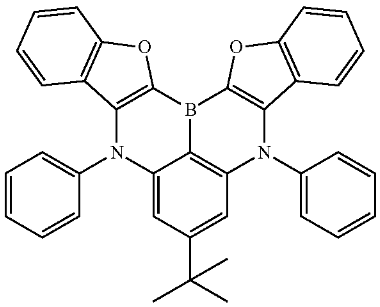
[Chemical Formula 14]
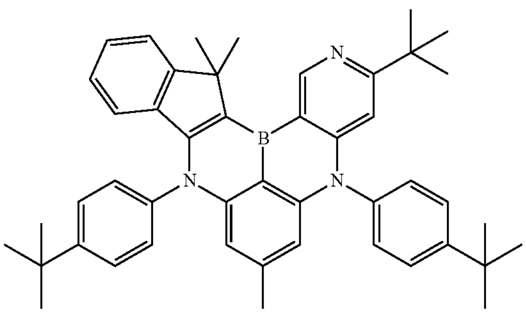
[Chemical Formula 15]
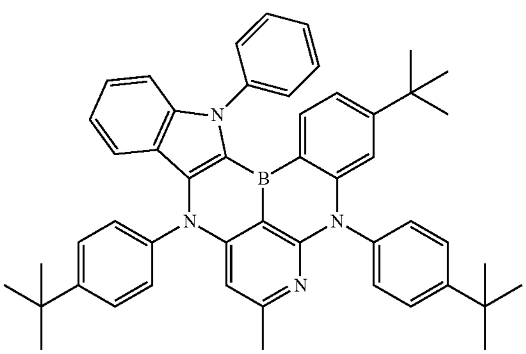
[Chemical Formula 16]
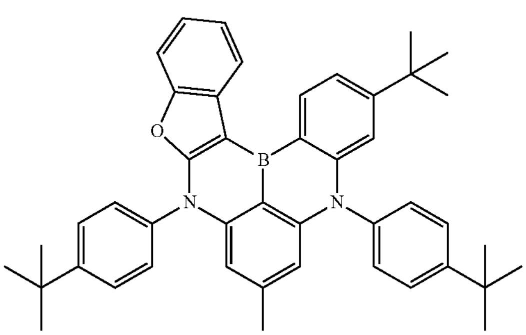
[Chemical Formula 17]
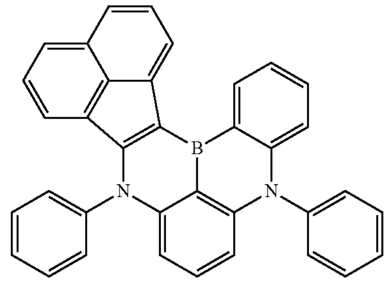
[Chemical Formula 18]
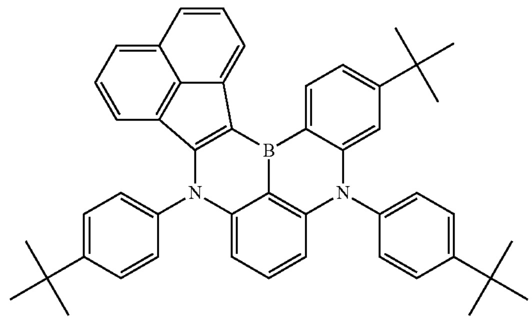
[Chemical Formula 19]
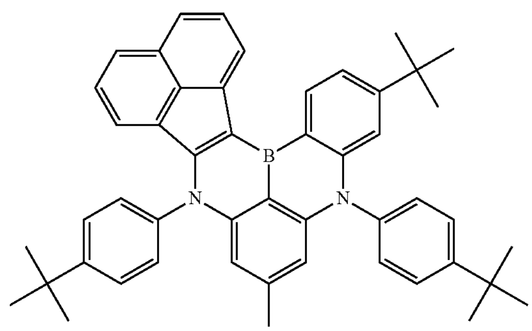
[Chemical Formula 20]
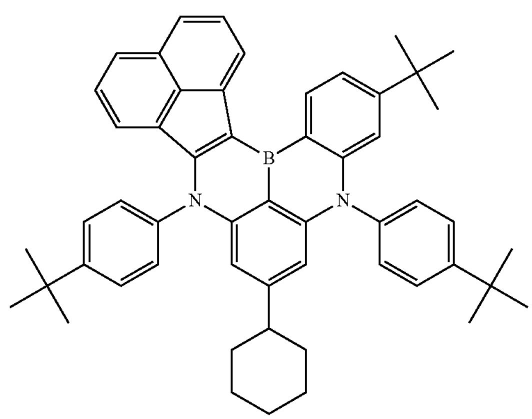

-continued
[Chemical Formula 21]
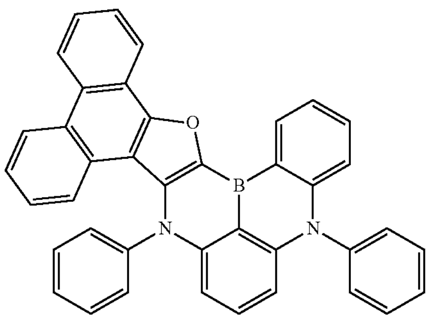
[Chemical Formula 22]
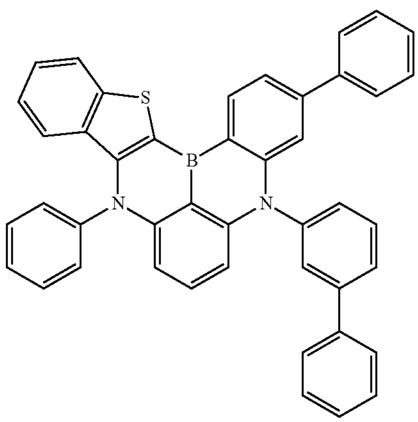
[Chemical Formula 23]
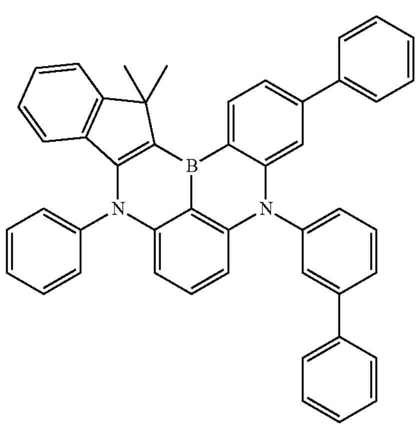
-continued
[Chemical Formula 24]
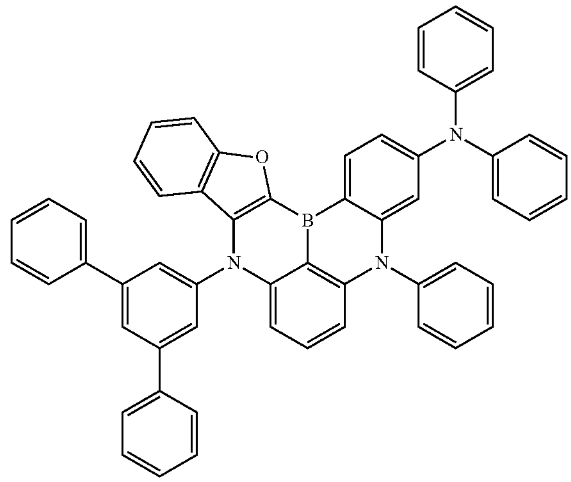
[Chemical Formula 25]
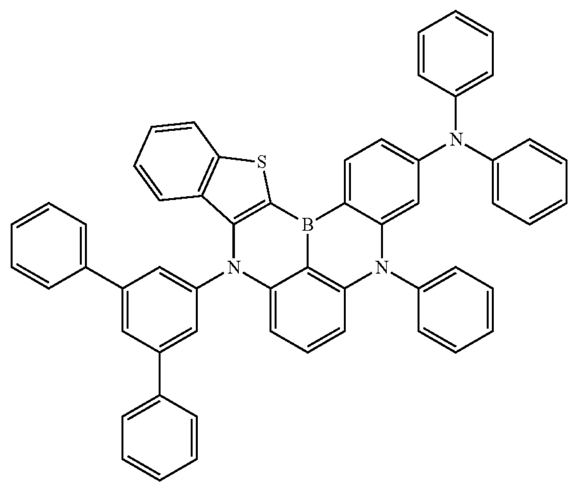
[Chemical Formula 26]
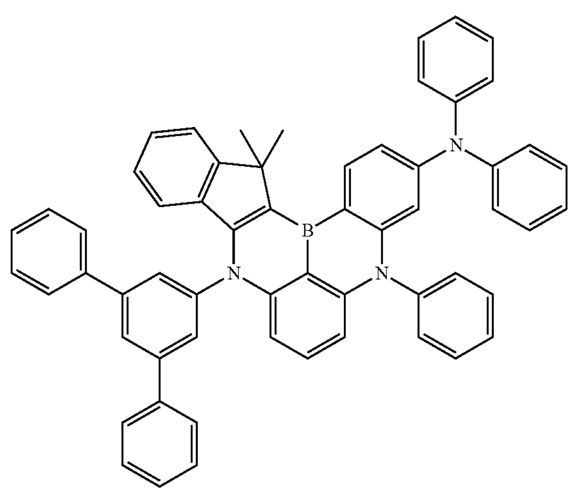

[Chemical Formula 27]
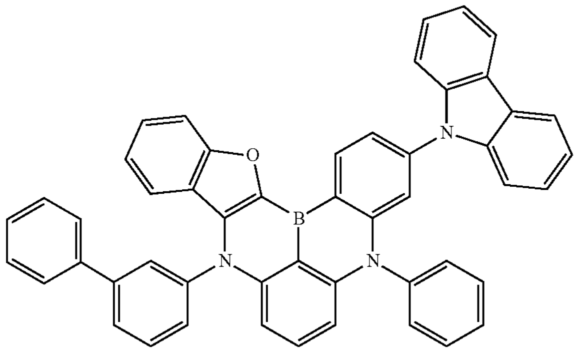
[Chemical Formula 28]
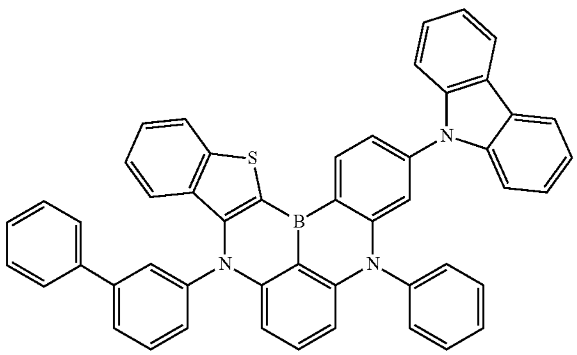
[Chemical Formula 29]
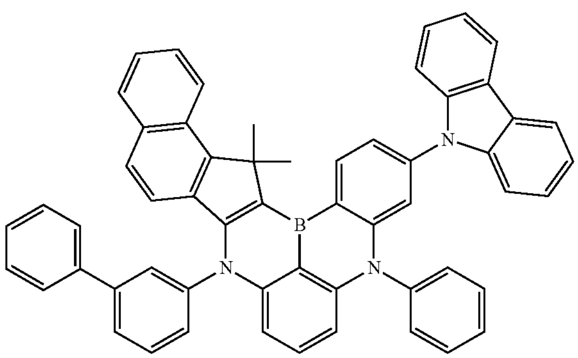
[Chemical Formula 30]
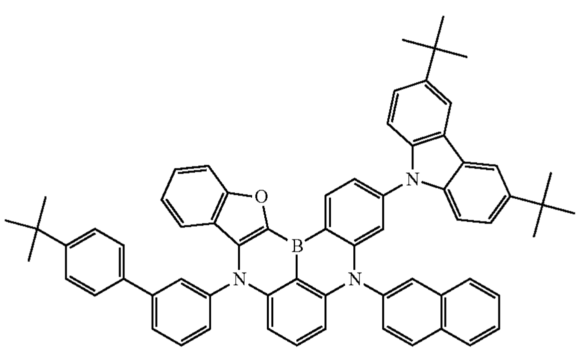
[Chemical Formula 31]
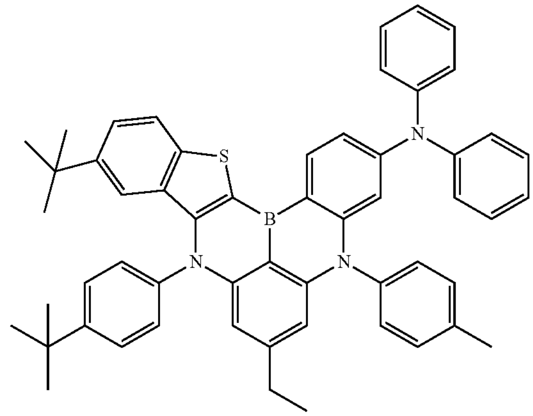
[Chemical Formula 32]
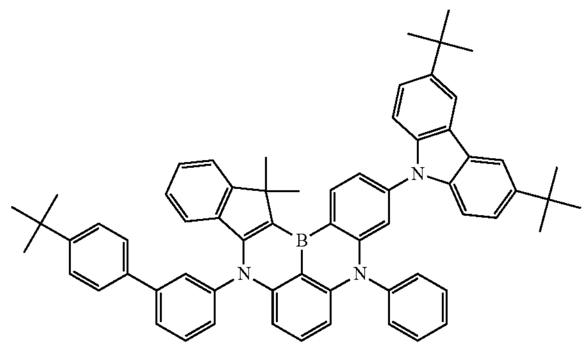
[Chemical Formula 33]
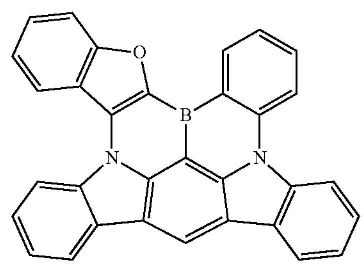
[Chemical Formula 34]
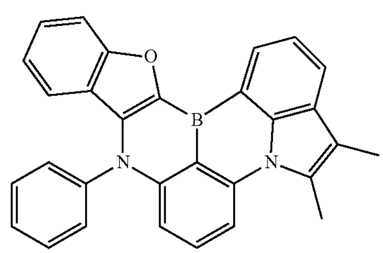
[Chemical Formula 35]
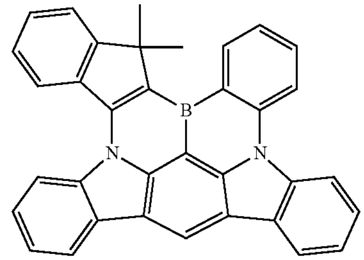

-continued
[Chemical Formula 36]
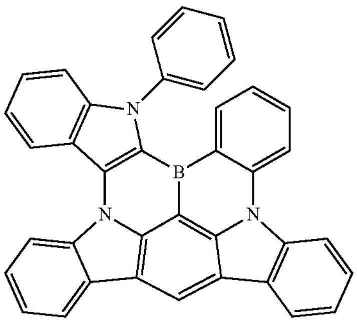
[Chemical Formula 37]
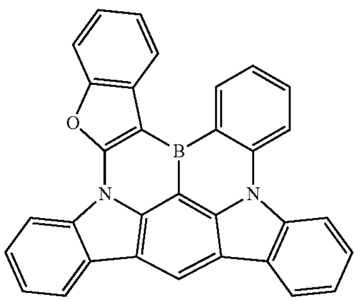
[Chemical Formula 38]
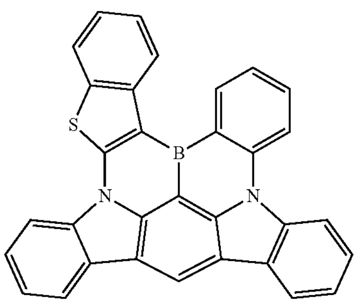
[Chemical Formula 39]
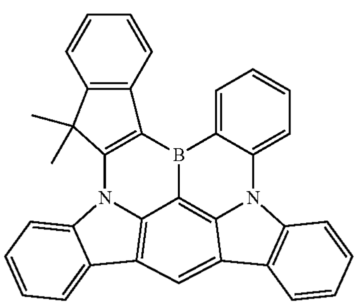
[Chemical Formula 40]
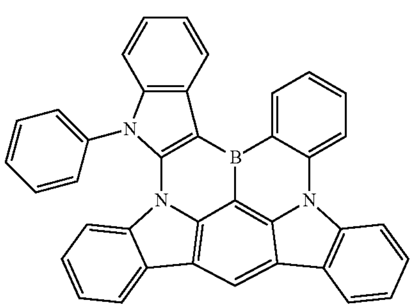
-continued
[Chemical Formula 41]
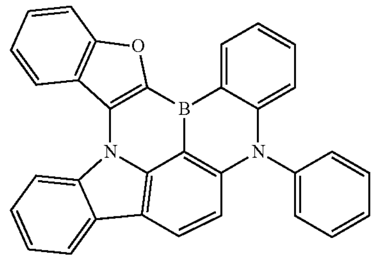
[Chemical Formula 42]
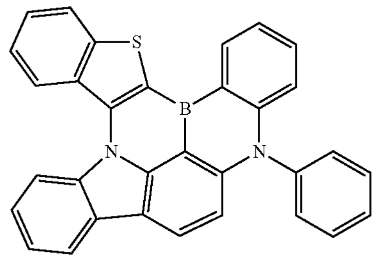
[Chemical Formula 43]
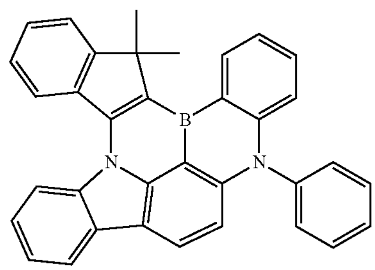
[Chemical Formula 44]
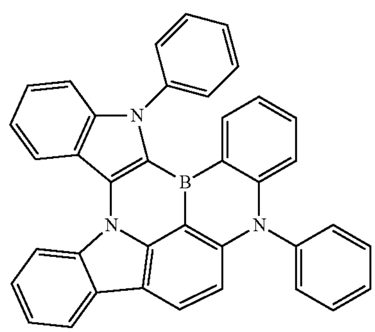
[Chemical Formula 45]
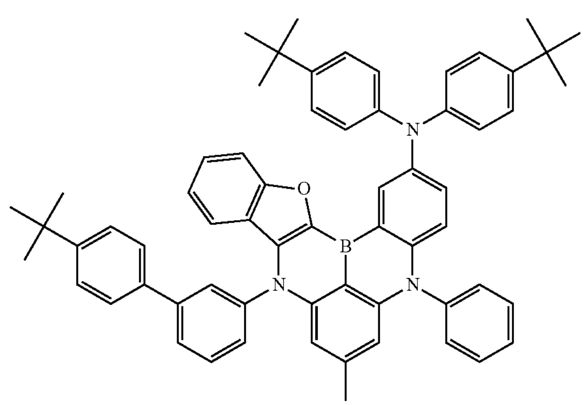

-continued
[Chemical Formula 46]
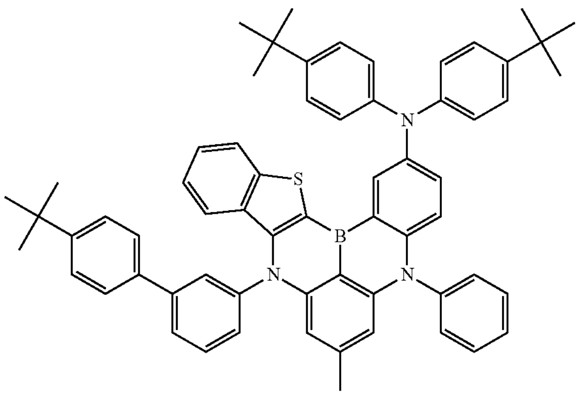
[Chemical Formula 47]
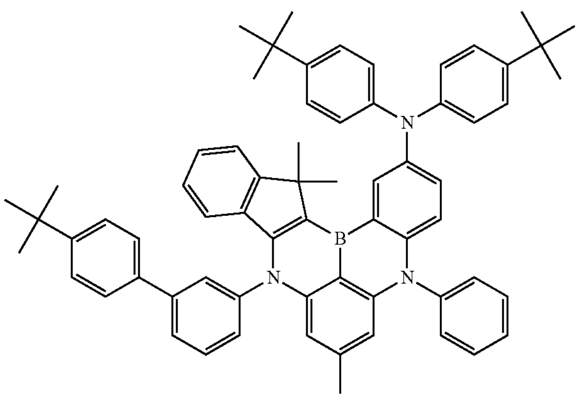
[Chemical Formula 48]
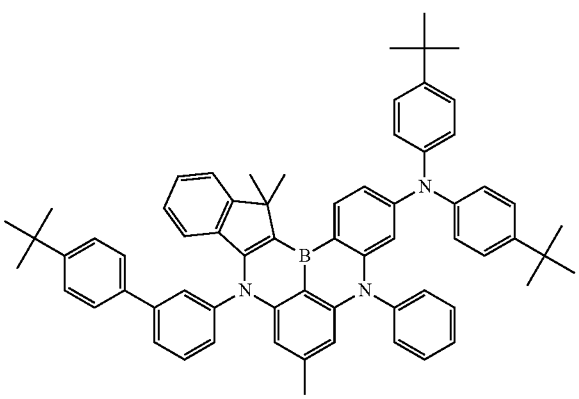
[Chemical Formula 49]
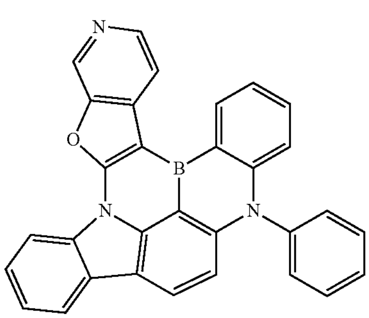
-continued
[Chemical Formula 50]
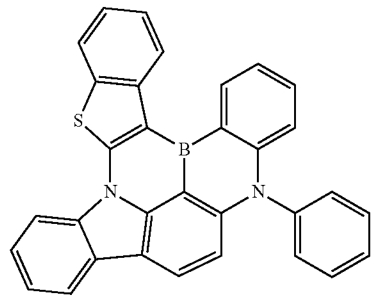
[Chemical Formula 51]
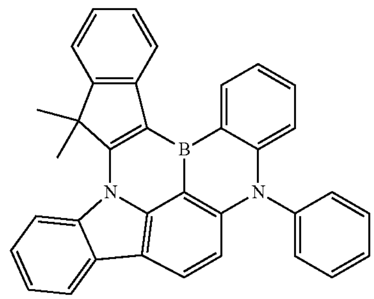
[Chemical Formula 52]
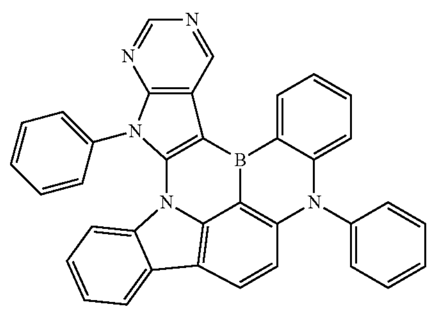
[Chemical Formula 53]
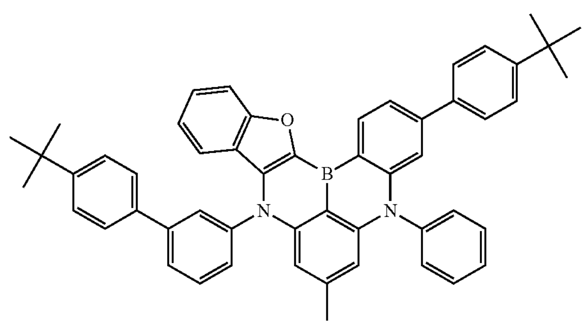
[Chemical Formula 54]
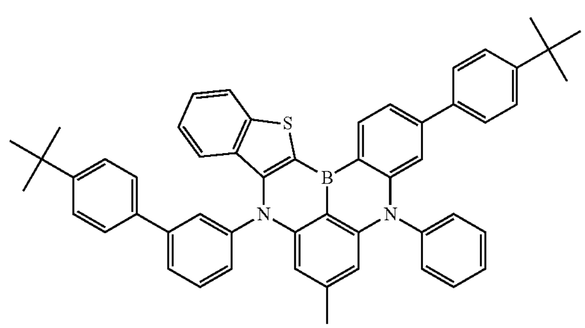

[Chemical Formula 55]
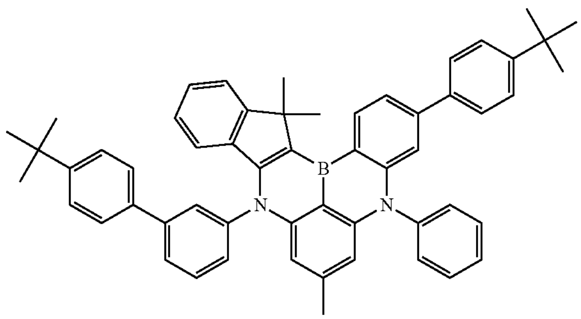
[Chemical Formula 56]
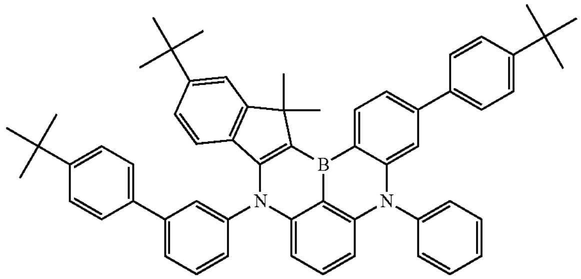
[Chemical Formula 57]
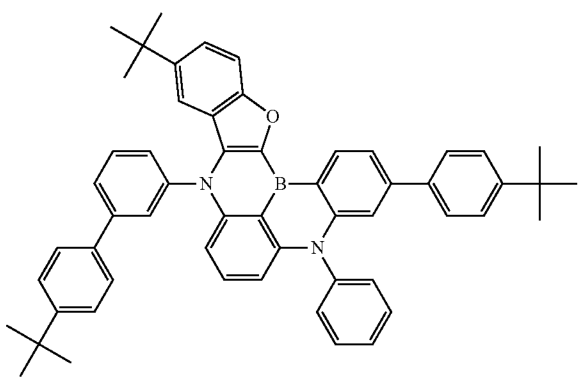
[Chemical Formula 58]
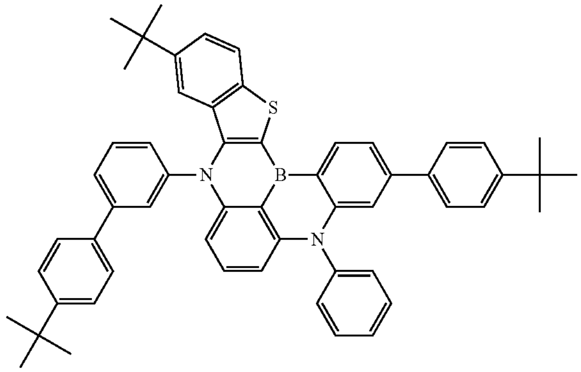
[Chemical Formula 59]
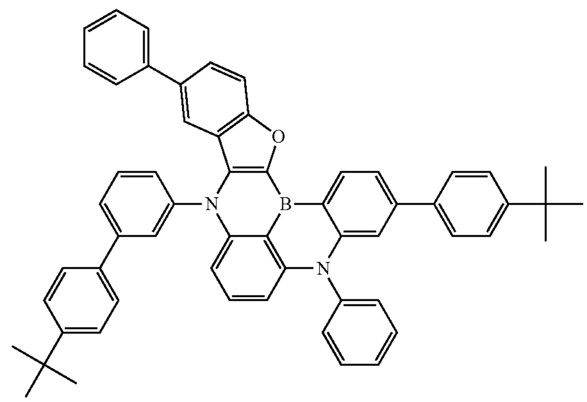
[Chemical Formula 60]
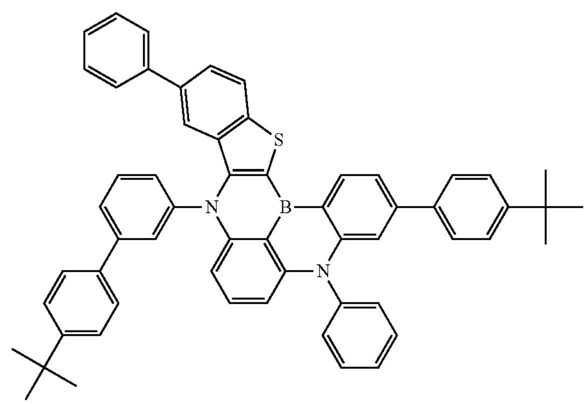
[Chemical Formula 61]
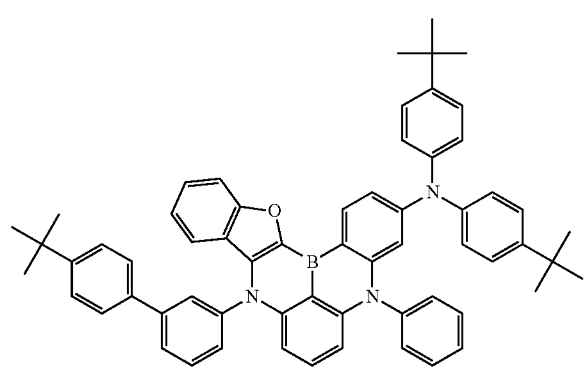

[Chemical Formula 62]
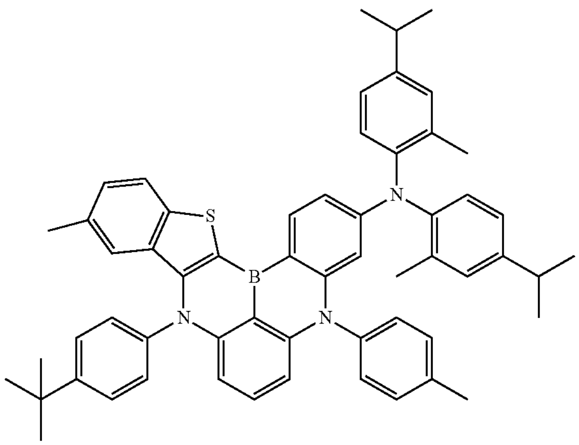
[Chemical Formula 63]
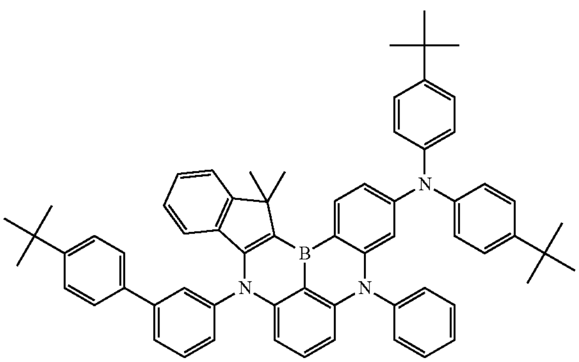
[Chemical Formula 64]
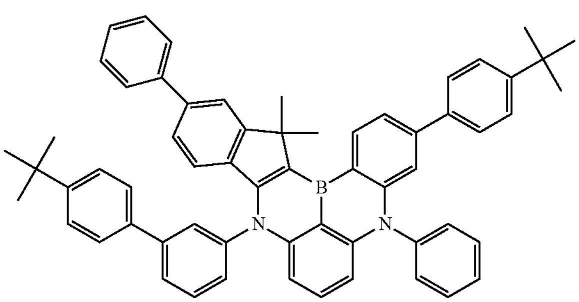
[Chemical Formula 65]
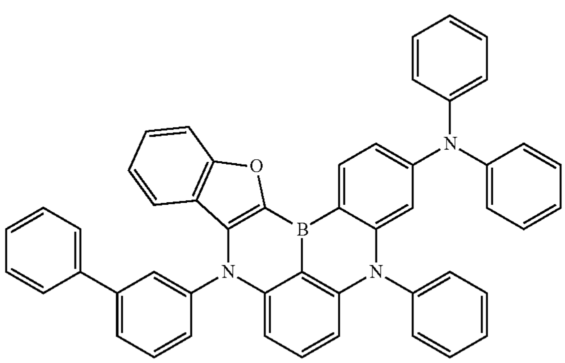
[Chemical Formula 66]
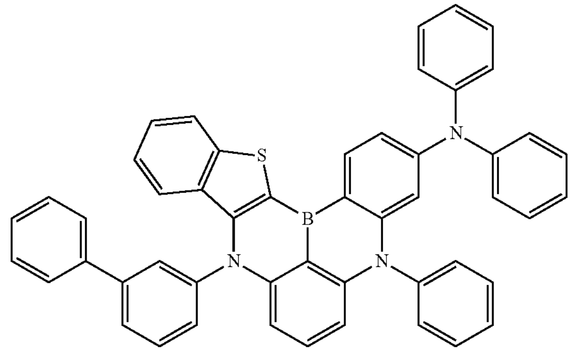
[Chemical Formula 67]
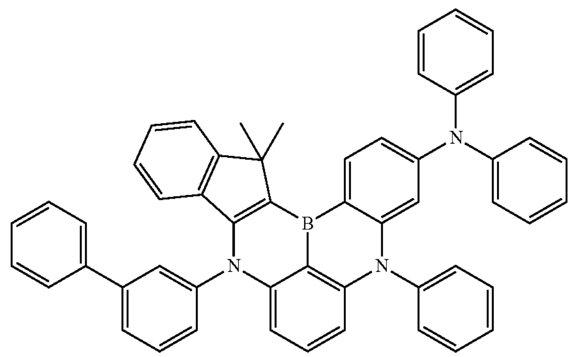
[Chemical Formula 68]
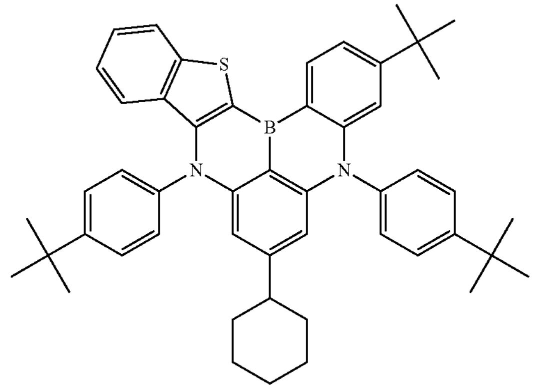
[Chemical Formula 69]
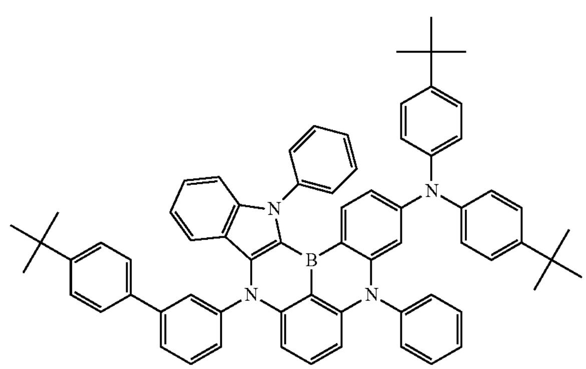

[Chemical Formula 70]
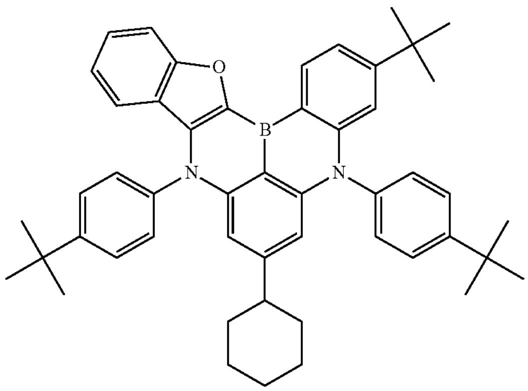
[Chemical Formula 71]
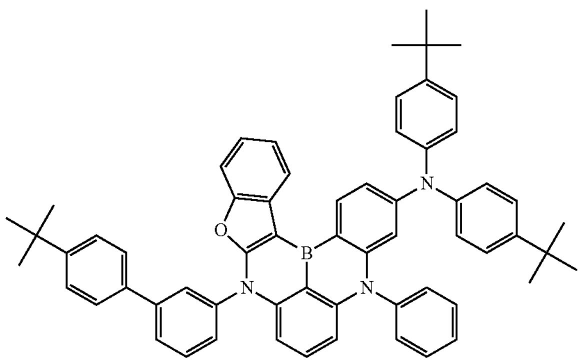
[Chemical Formula 72]
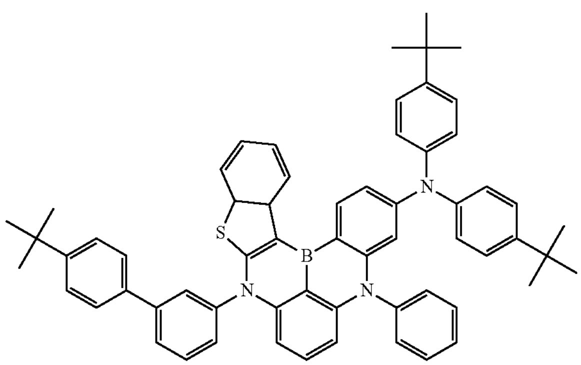
[Chemical Formula 73]
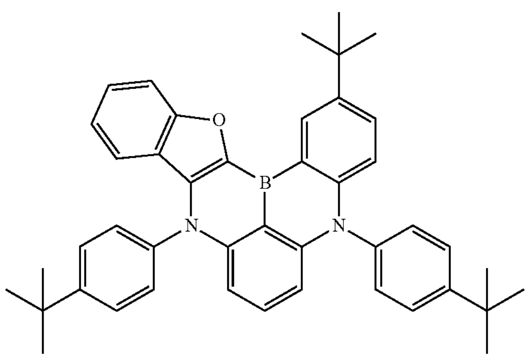
[Chemical Formula 74]
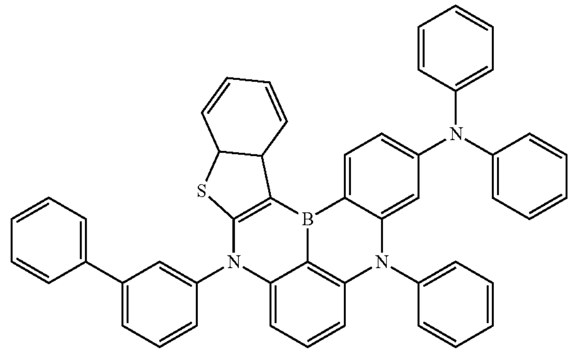
[Chemical Formula 75]
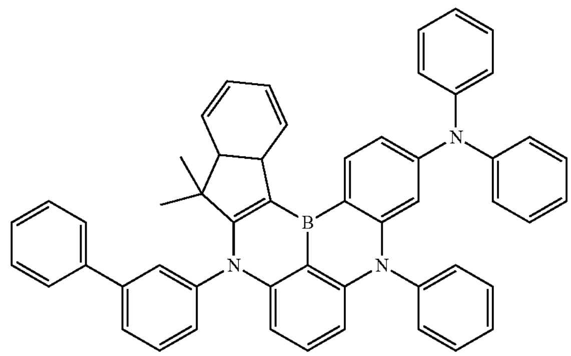
[Chemical Formula 76]
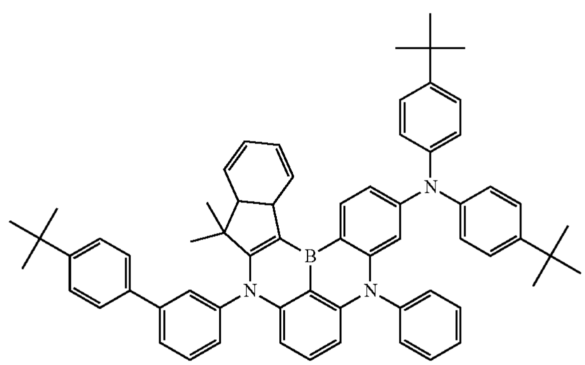
[Chemical Formula 77]
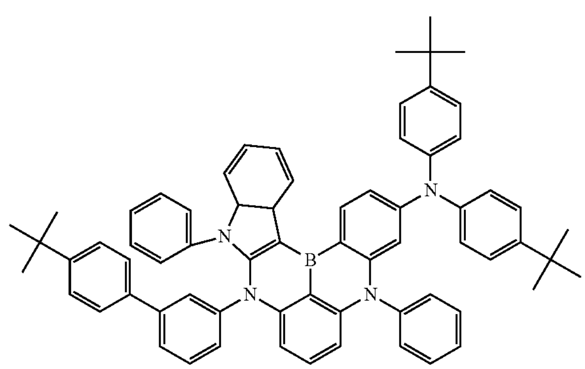

[Chemical Formula 78]
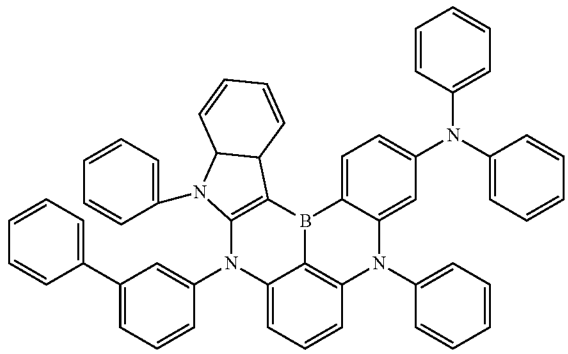
[Chemical Formula 79]
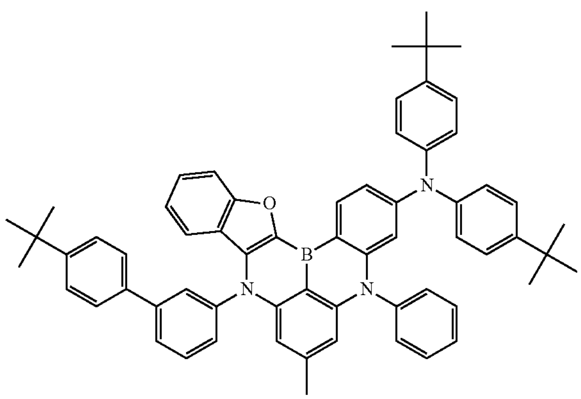
[Chemical Formula 80]
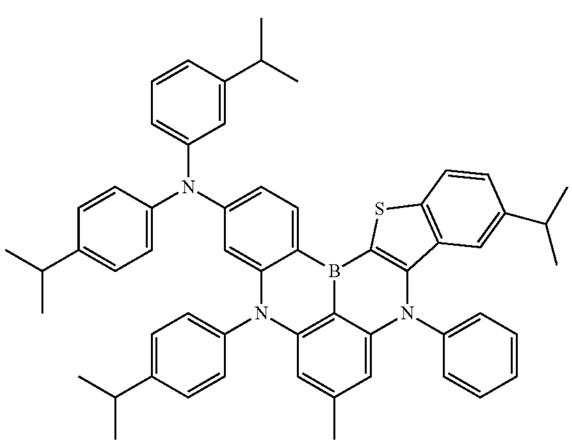
[Chemical Formula 81]
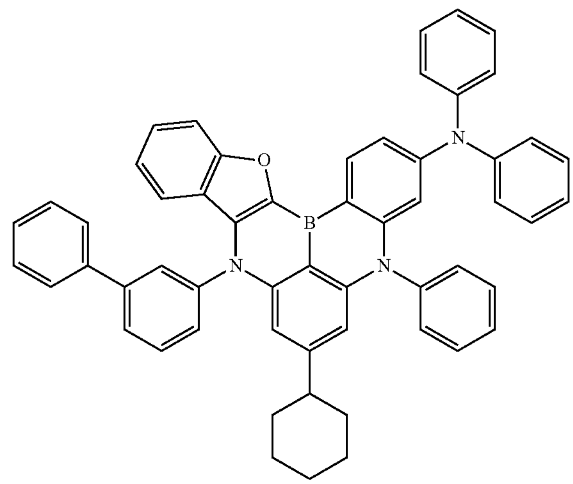
[Chemical Formula 82]
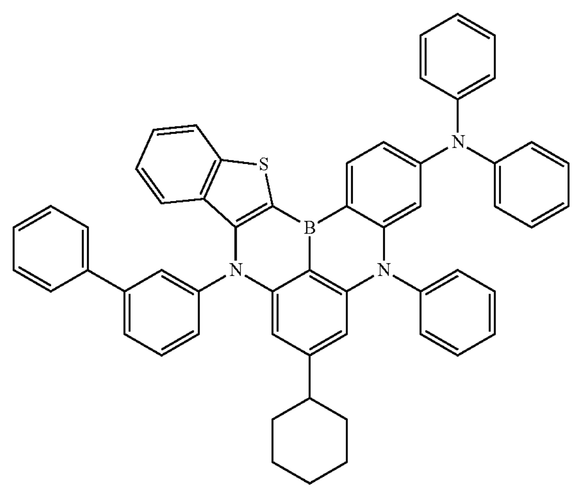
[Chemical Formula 83]
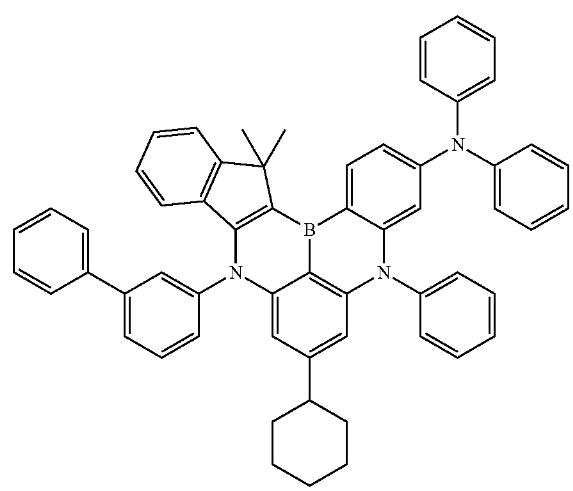

-continued
[Chemical Formula 84]
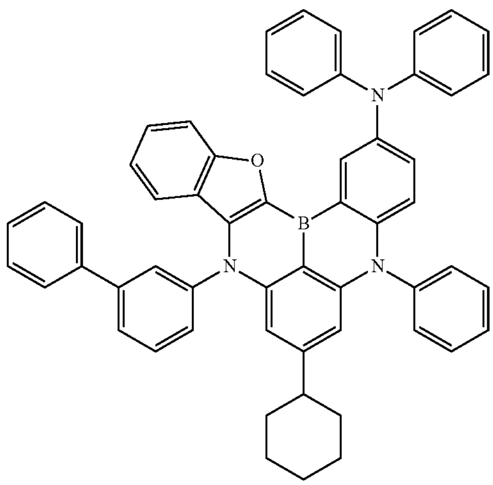
[Chemical Formula 85]
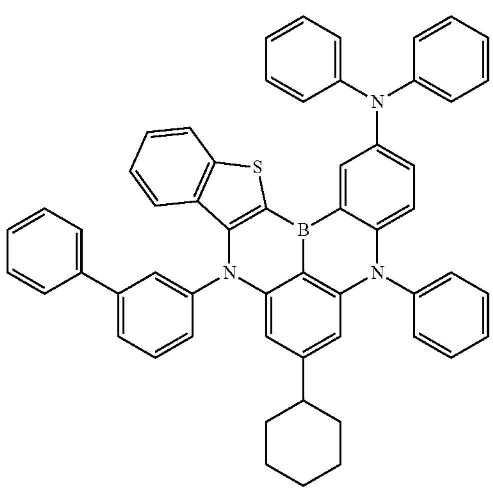
[Chemical Formula 86]
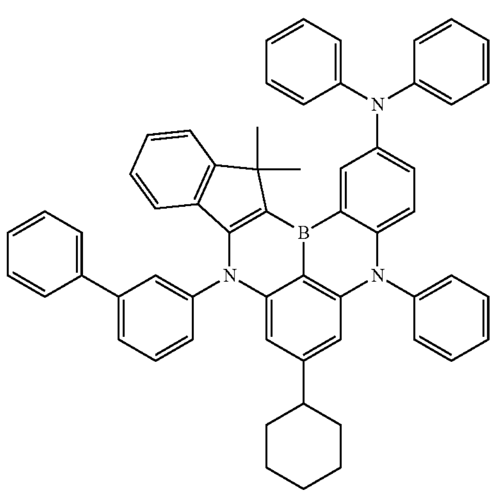
-continued
[Chemical Formula 87]
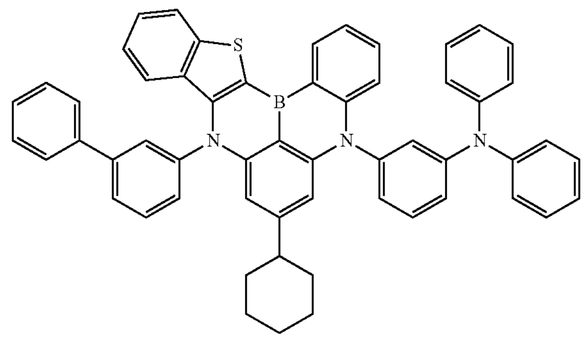
[Chemical Formula 88]
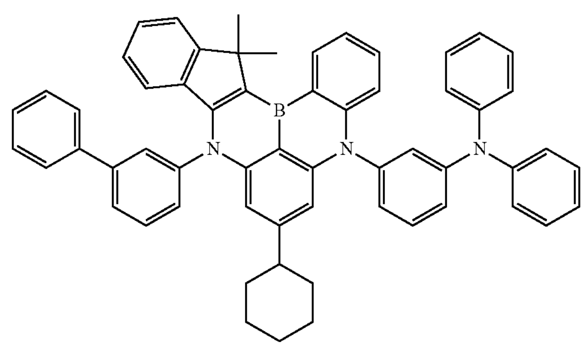
[Chemical Formula 89]
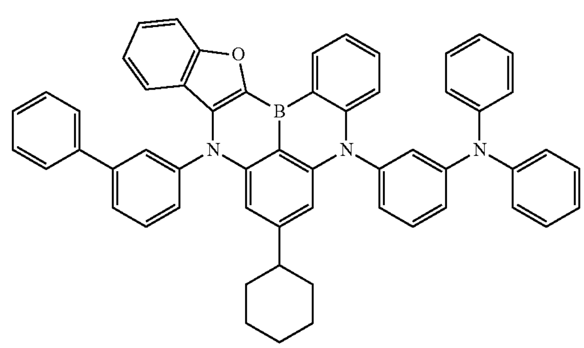
[Chemical Formula 90]
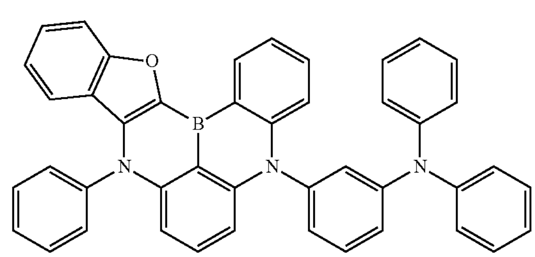
[Chemical Formula 91]
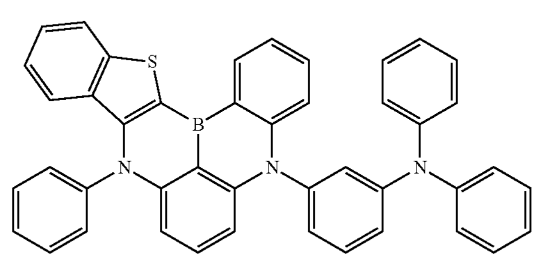

-continued
[Chemical Formula 92]
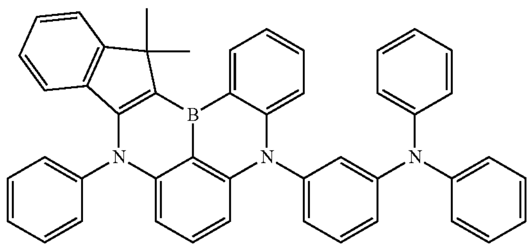
[Chemical Formula 93]
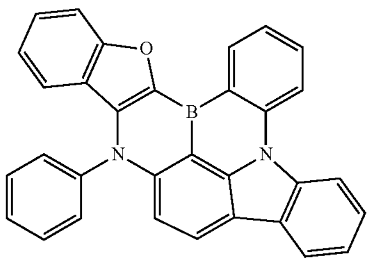
[Chemical Formula 94]
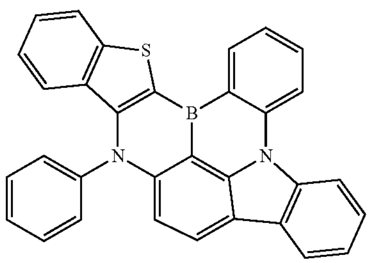
[Chemical Formula 95]
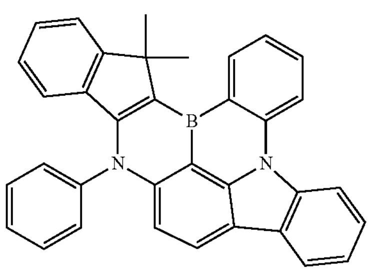
[Chemical Formula 96]
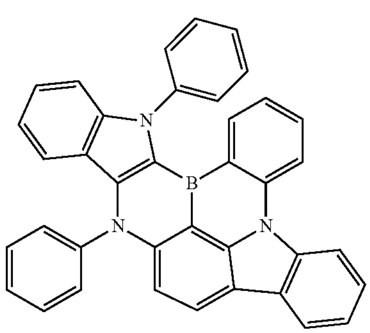
-continued
[Chemical Formula 97]
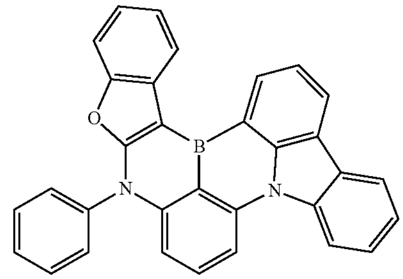
[Chemical Formula 98]
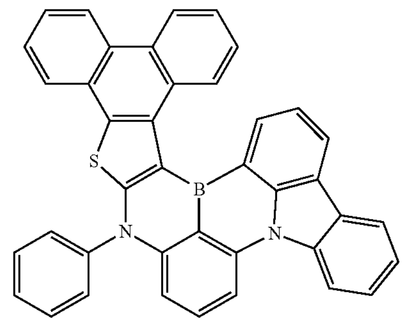
[Chemical Formula 99]
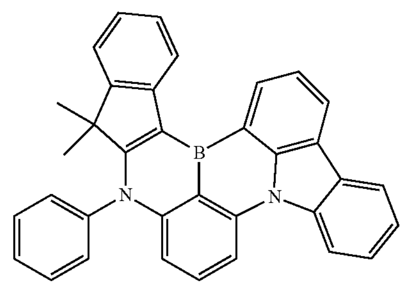
[Chemical Formula 100]
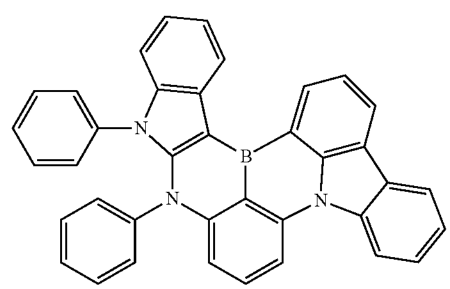
[Chemical Formula 101]
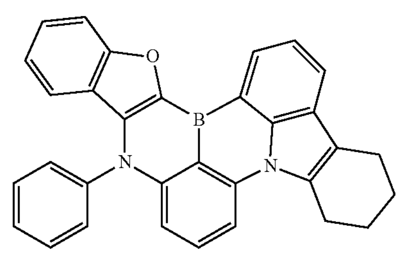

-continued
[Chemical Formula 102]
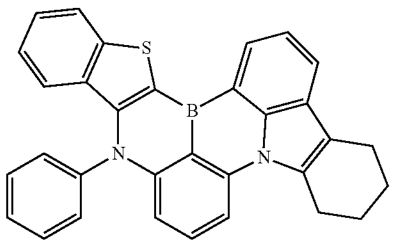
[Chemical Formula 103]
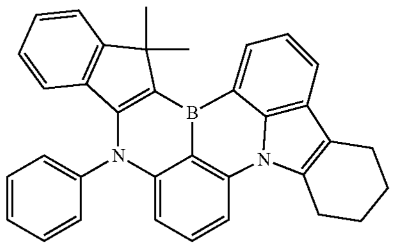
[Chemical Formula 104]
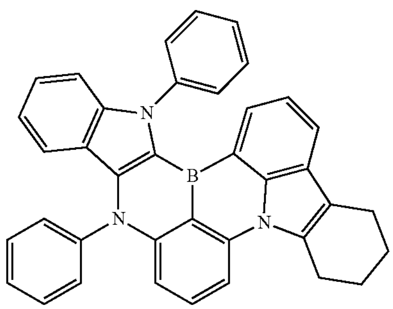
[Chemical Formula 105]
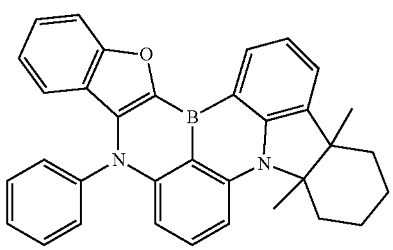
[Chemical Formula 106]
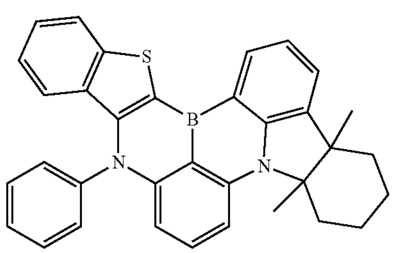
-continued
[Chemical Formula 107]
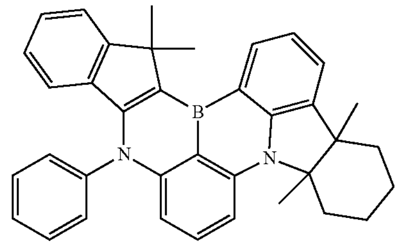
[Chemical Formula 108]
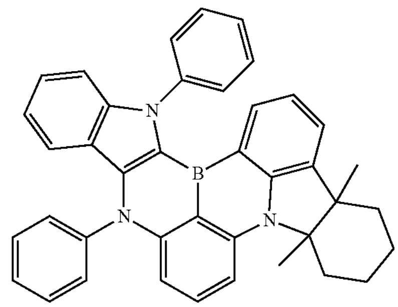
[Chemical Formula 109]
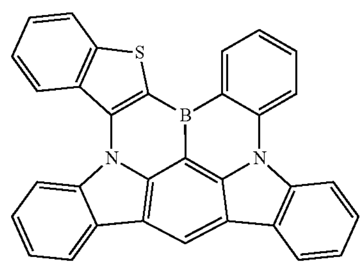
[Chemical Formula 110]
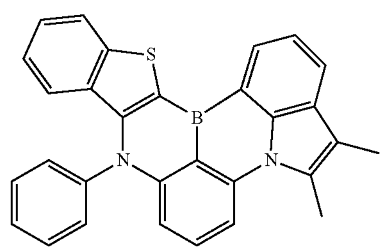
[Chemical Formula 111]
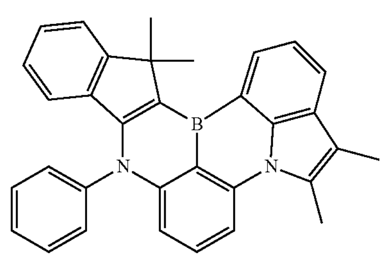

-continued
[Chemical Formula 112]
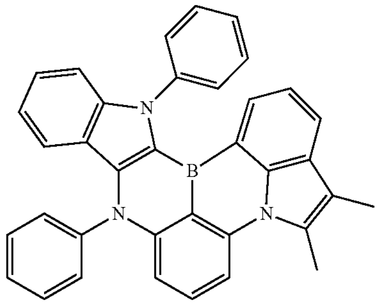
[Chemical Formula 113]
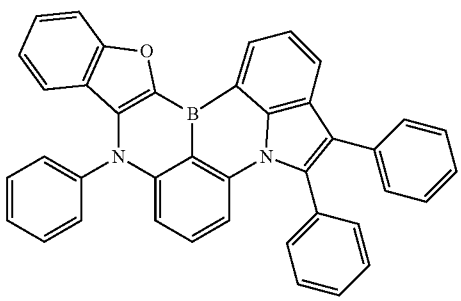
[Chemical Formula 114]
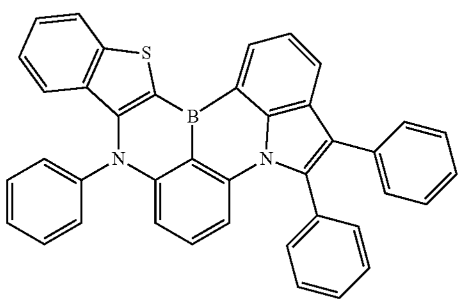
[Chemical Formula 115]
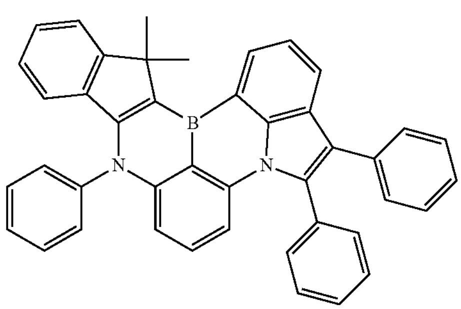
-continued
[Chemical Formula 116]
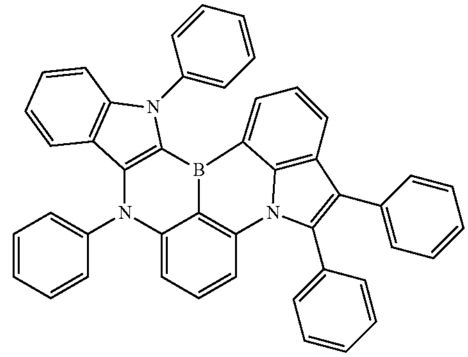
[Chemical Formula 117]
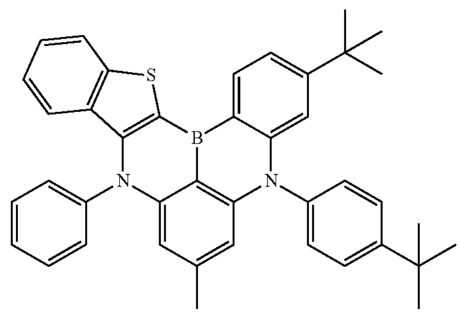
[Chemical Formula 118]
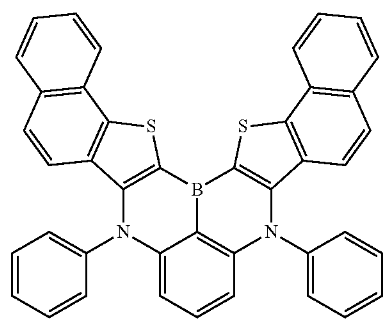
[Chemical Formula 119]
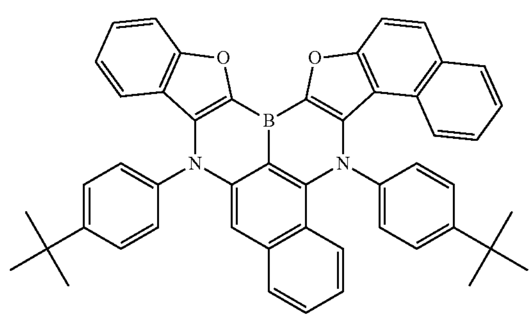

-continued
[Chemical Formula 120]
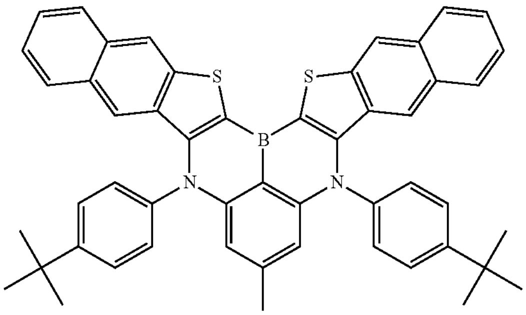
[Chemical Formula 121]
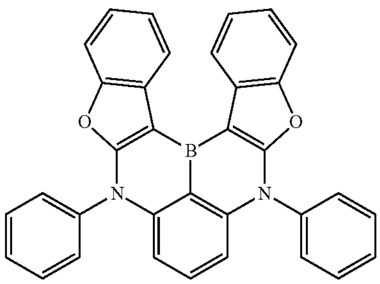
[Chemical Formula 122]
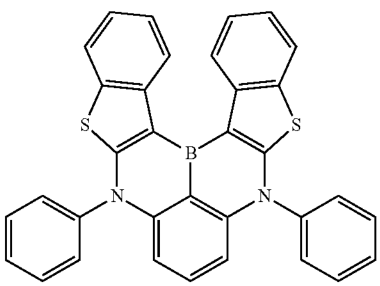
[Chemical Formula 123]
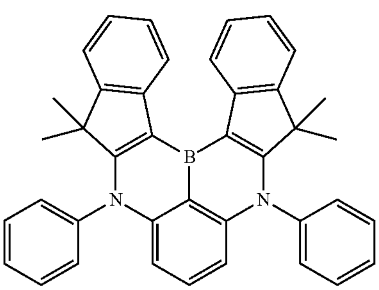
[Chemical Formula 124]
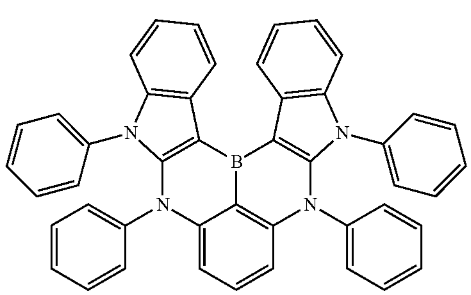
-continued
[Chemical Formula 125]
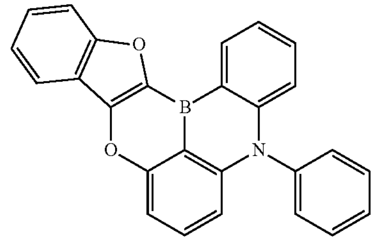
[Chemical Formula 126]
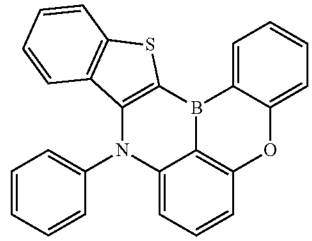
[Chemical Formula 127]
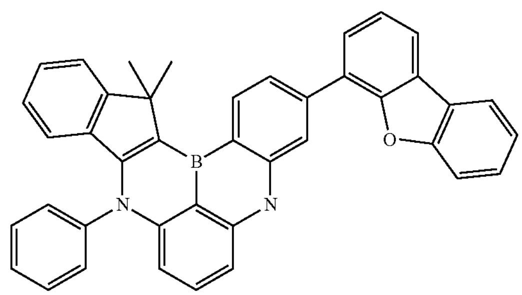
[Chemical Formula 128]
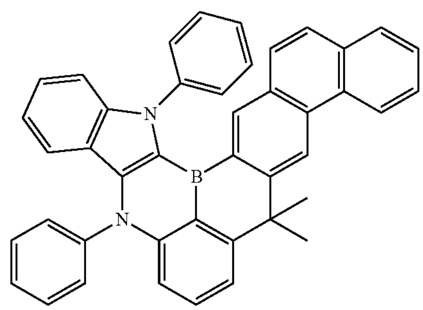
[Chemical Formula 129]
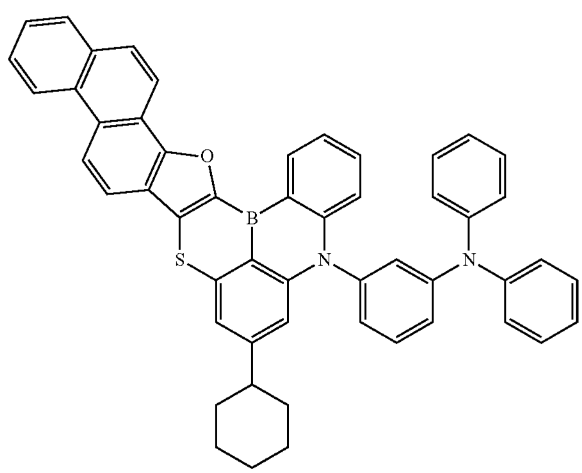

-continued
[Chemical Formula 130]
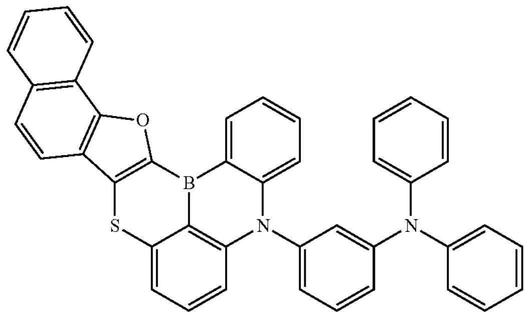
[Chemical Formula 131]
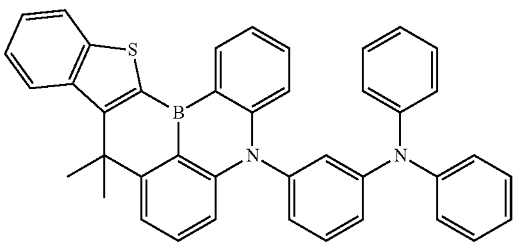
[Chemical Formula 132]
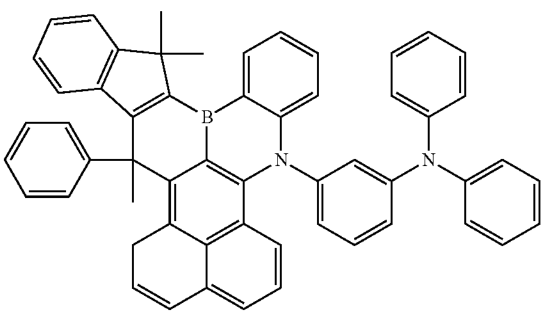
[Chemical Formula 133]
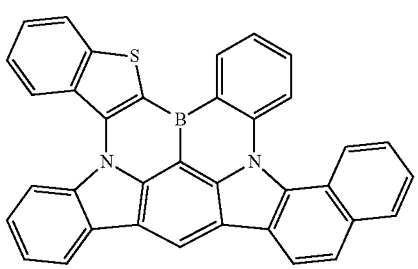
[Chemical Formula 134]
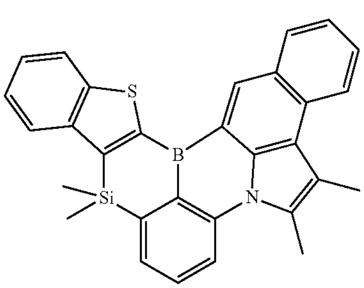
-continued
[Chemical Formula 135]
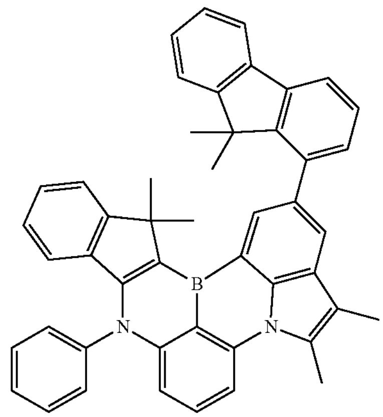
[Chemical Formula 136]
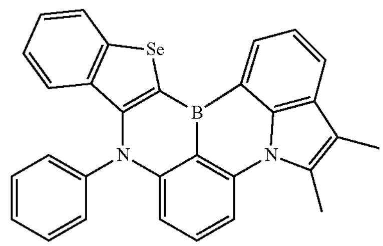
[Chemical Formula 137]
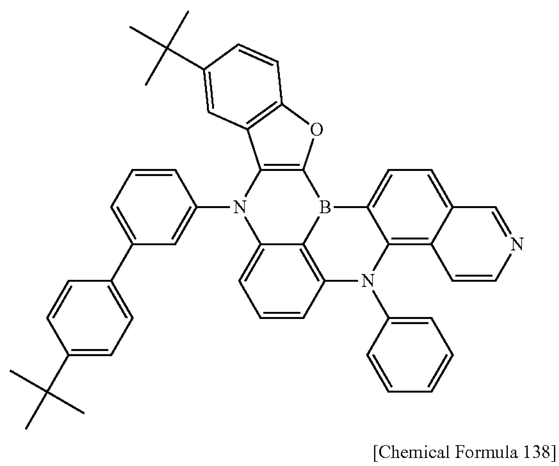
[Chemical Formula 138]
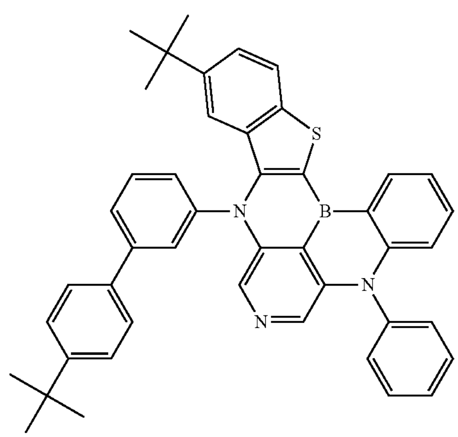

[Chemical Formula 139]
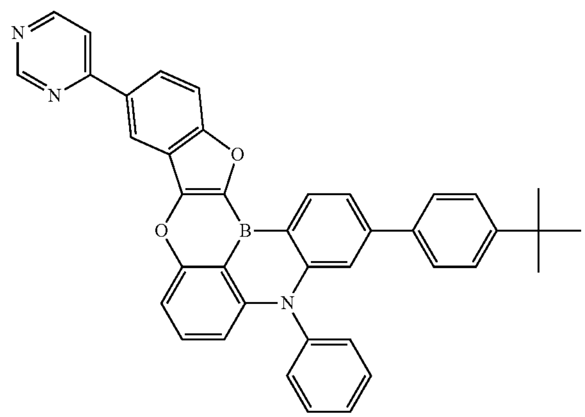
[Chemical Formula 140]
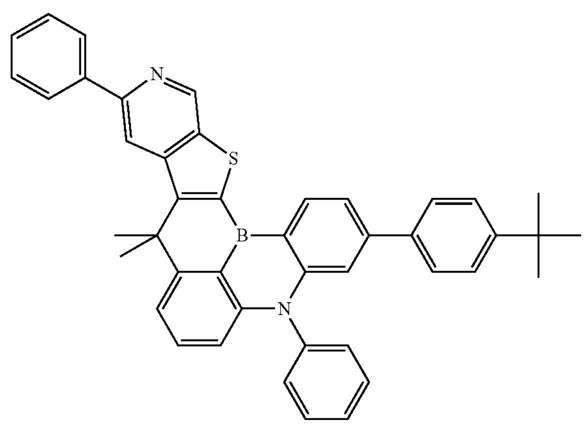
[Chemical Formula 141]
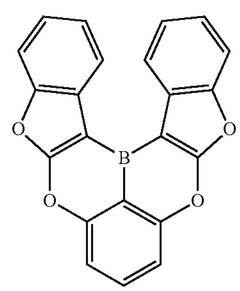
[Chemical Formula 142]
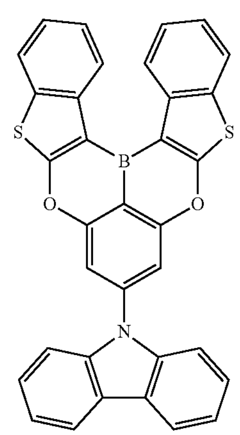
[Chemical Formula 143]
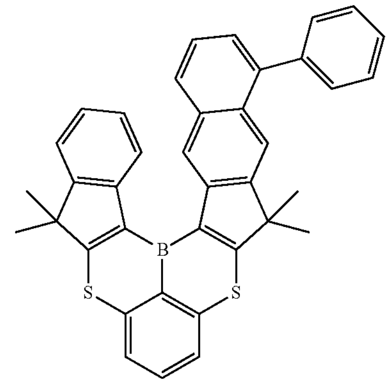
[Chemical Formula 144]
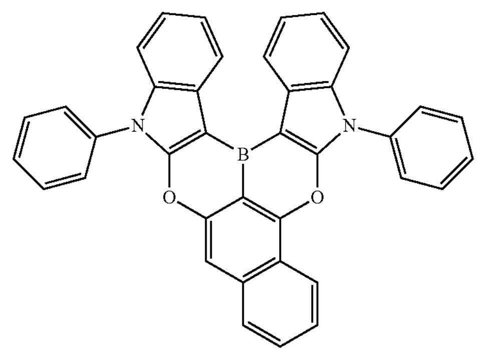
[Chemical Formula 145]
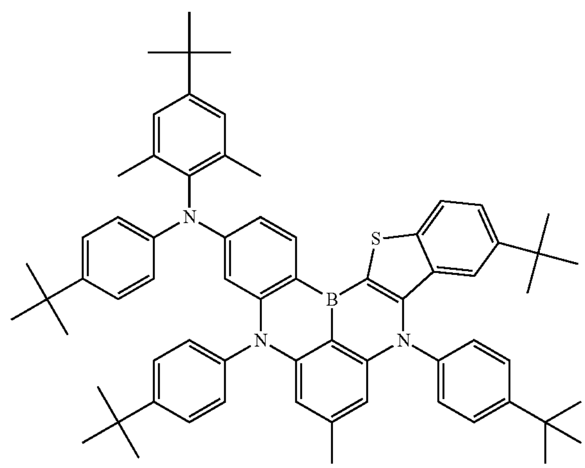
[Chemical Formula 146]
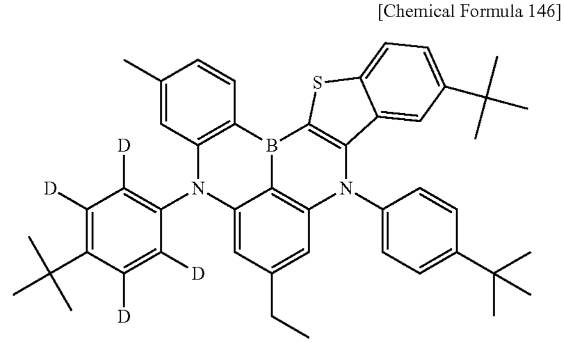

-continued
[Chemical Formula 147]
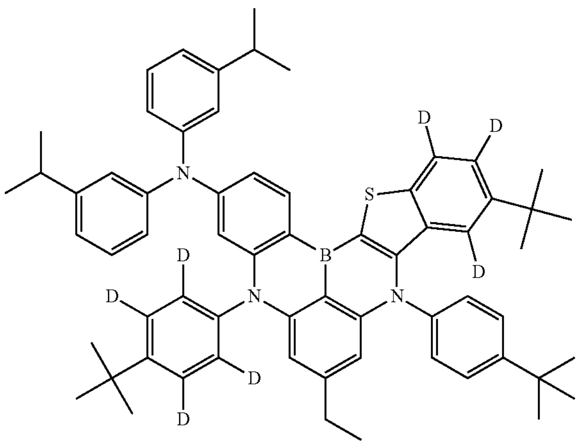
[Chemical Formula 148]
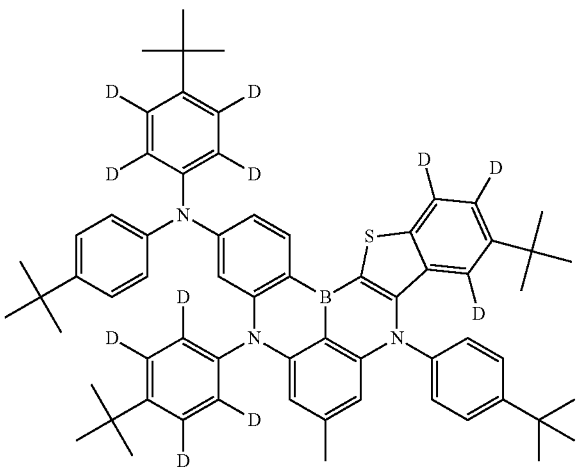
[Chemical Formula 149]
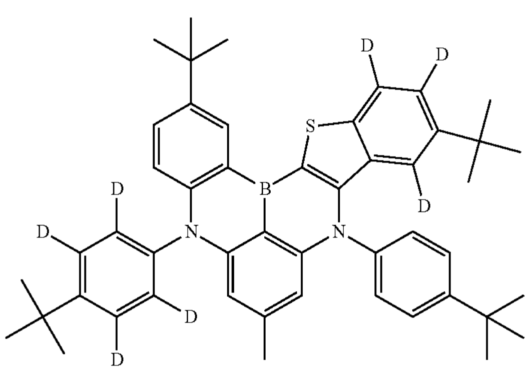
-continued
[Chemical Formula 150]
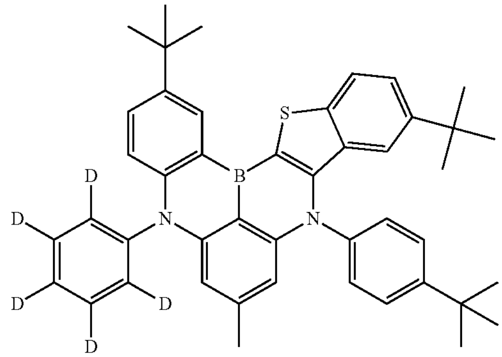
[Chemical Formula 151]
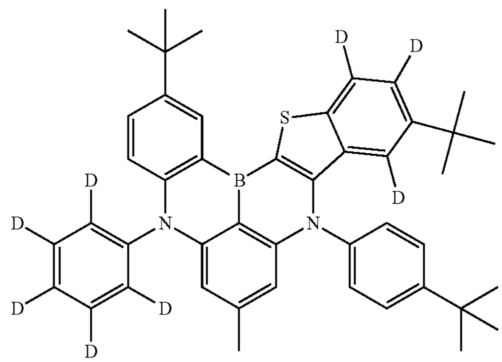
[Chemical Formula 152]
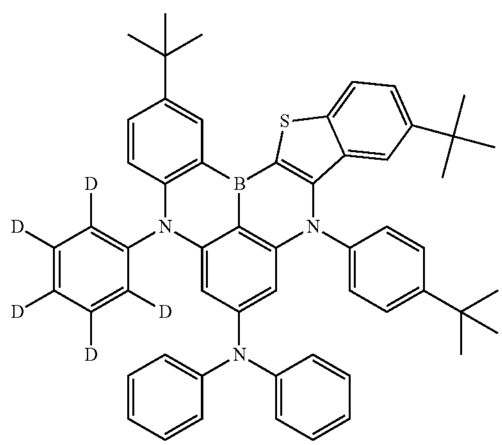
[Chemical Formula 153]
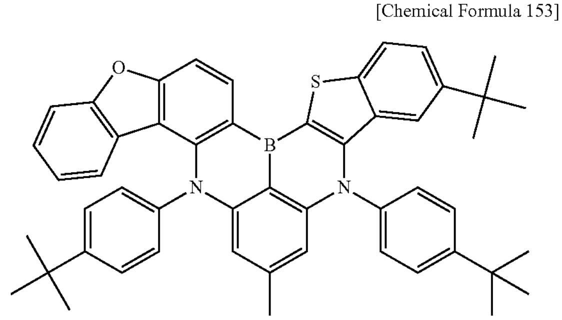

-continued
[Chemical Formula 154]
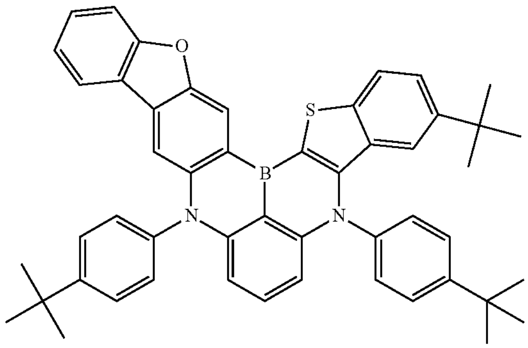
[Chemical Formula 155]
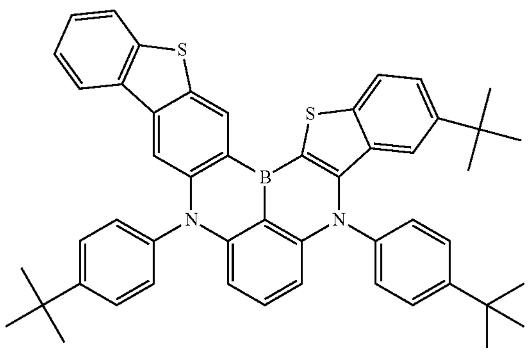
[Chemical Formula 156]
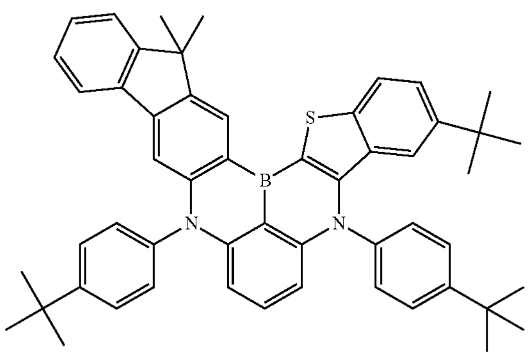
[Chemical Formula 157]
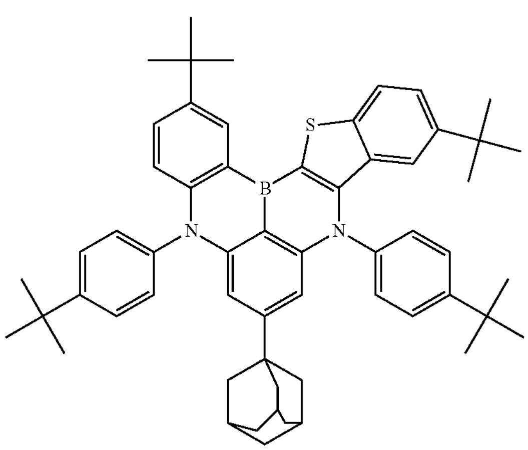
-continued
[Chemical Formula 158]
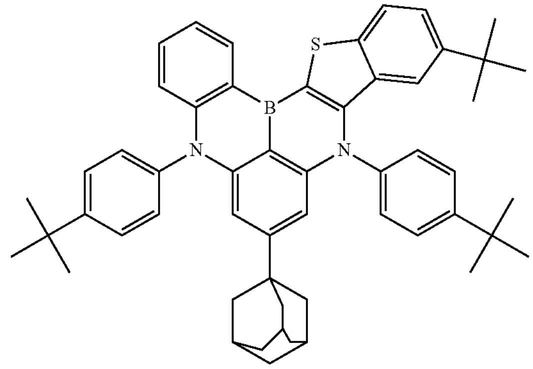
[Chemical Formula 159]
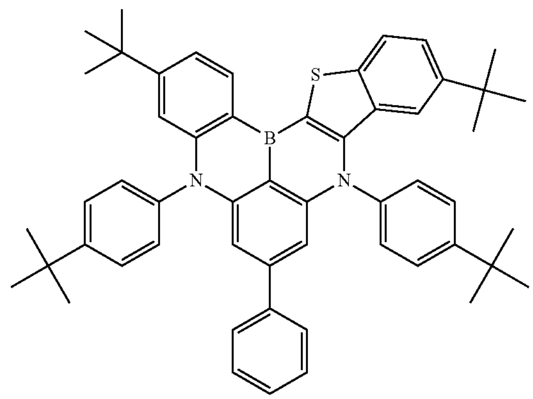
[Chemical Formula 160]
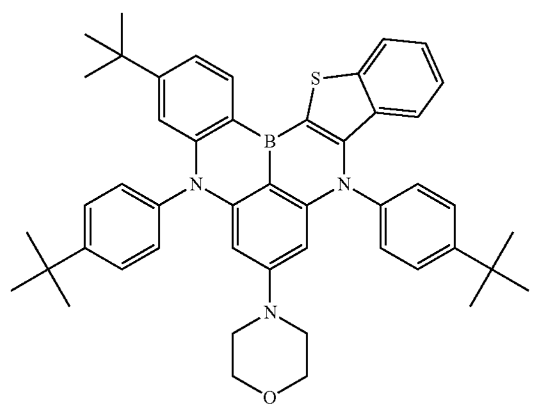
[Chemical Formula 161]
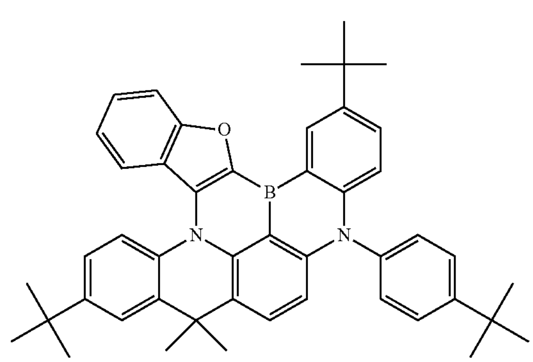

-continued
[Chemical Formula 162]
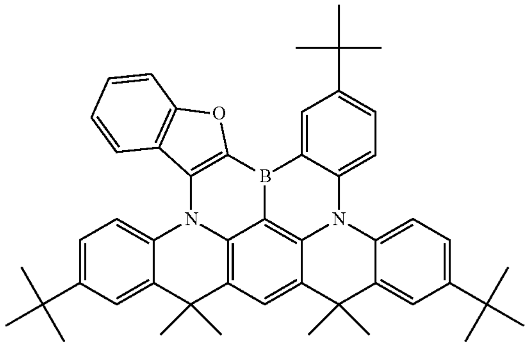
[Chemical Formula 163]
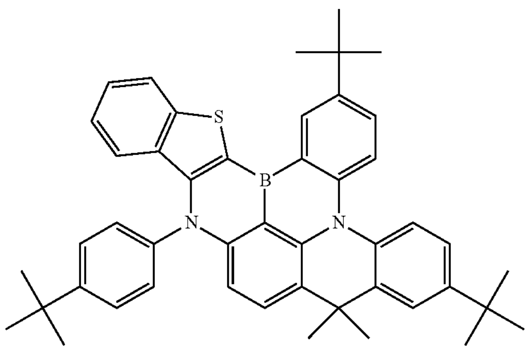
[Chemical Formula 164]
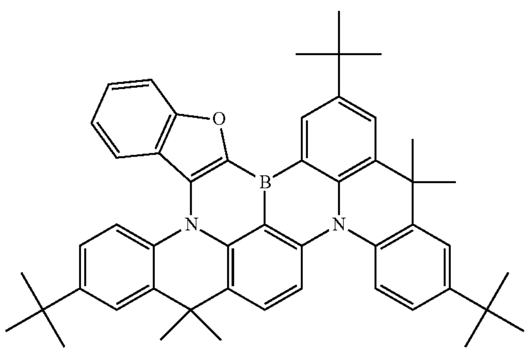
[Chemical Formula 165]
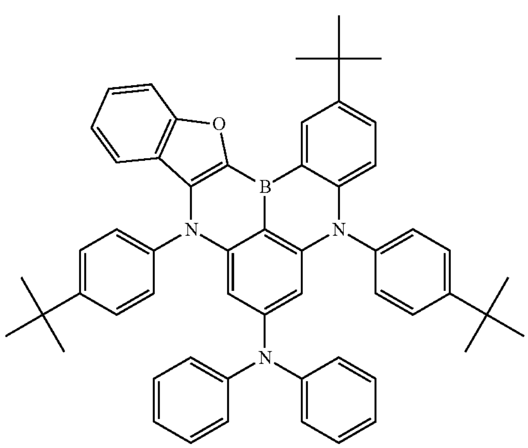
-continued
[Chemical Formula 166]
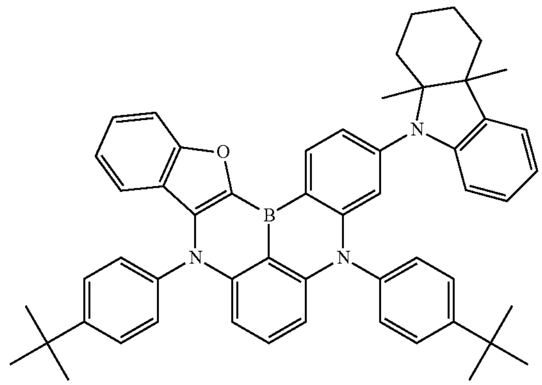
[Chemical Formula 167]
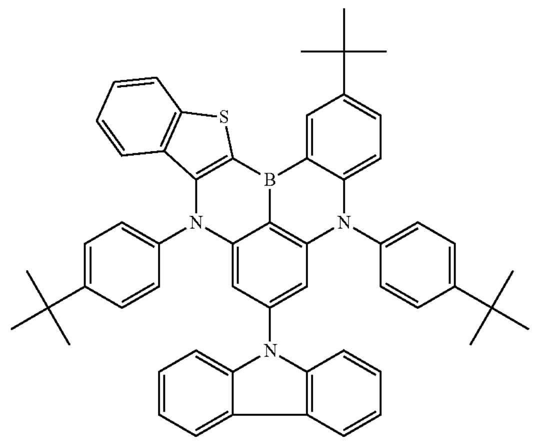
[Chemical Formula 168]
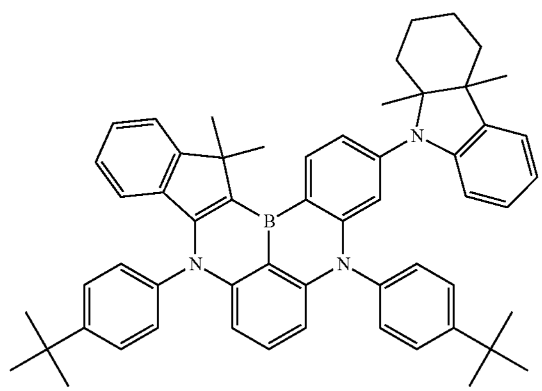
[Chemical Formula 169]
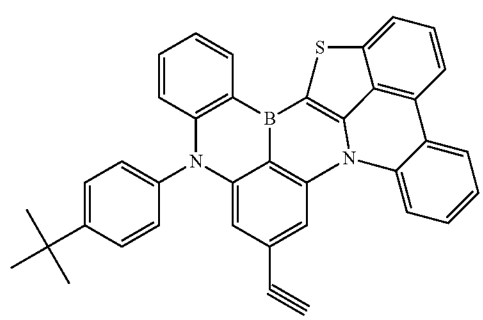

-continued
[Chemical Formula 170]
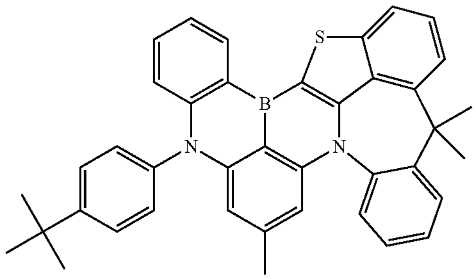
[Chemical Formula 171]
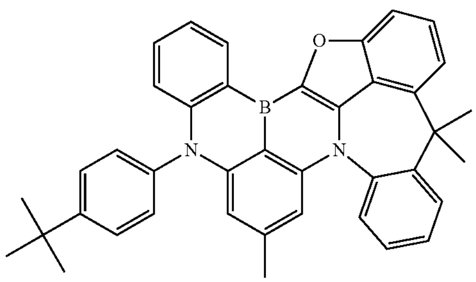
[Chemical Formula 172]
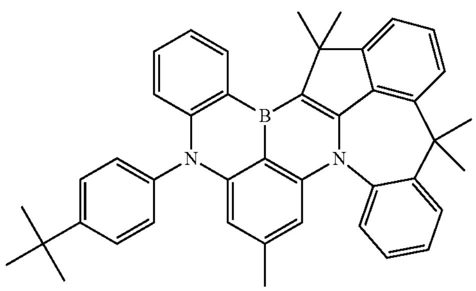
[Chemical Formula 173]
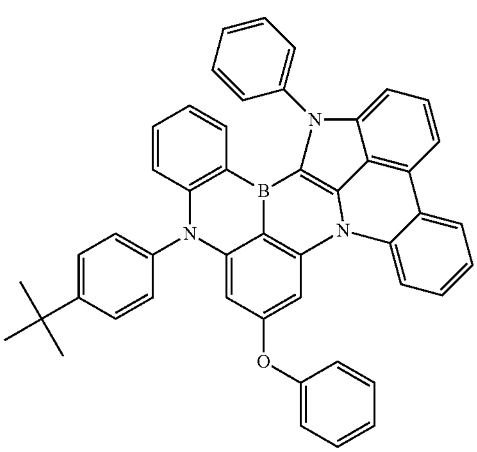
-continued
[Chemical Formula 174]
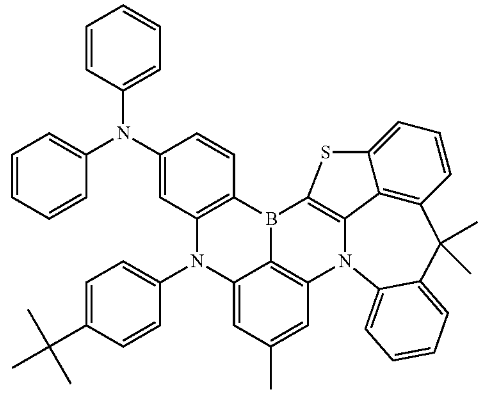
[Chemical Formula 175]
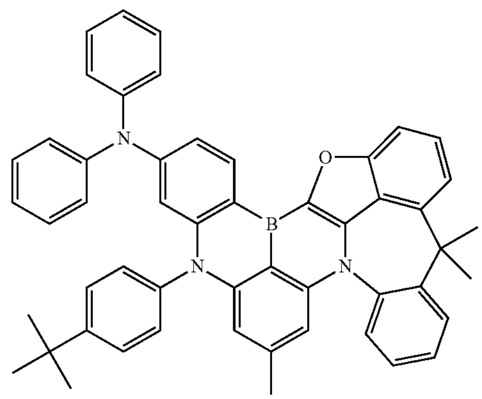
[Chemical Formula 176]
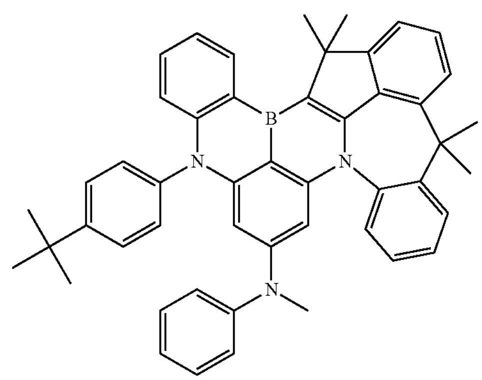
[Chemical Formula 177]
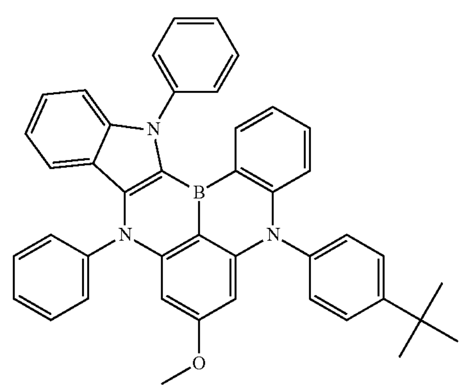

-continued
[Chemical Formula 178]
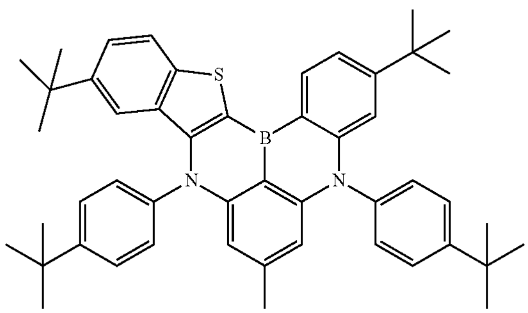
[Chemical Formula 179]
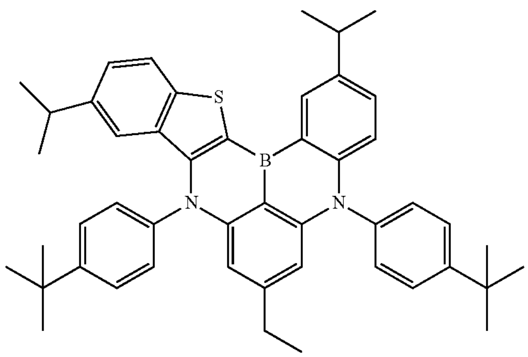
[Chemical Formula 180]
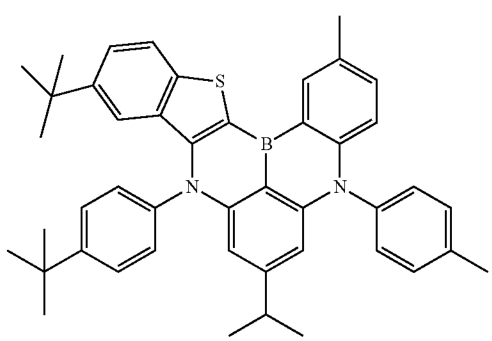
[Chemical Formula 181]
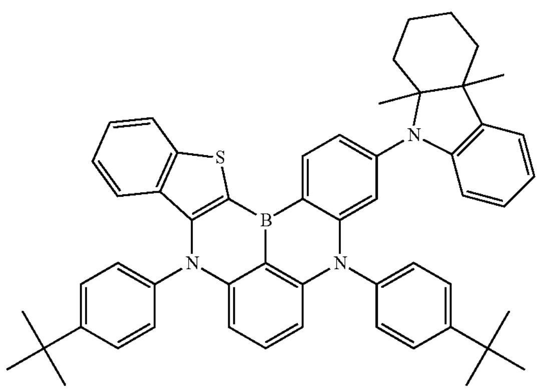
-continued
[Chemical Formula 182]
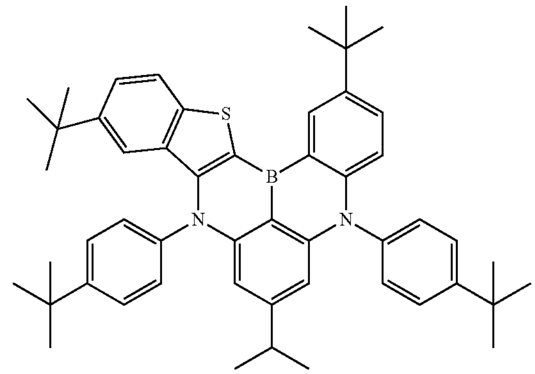
[Chemical Formula 183]
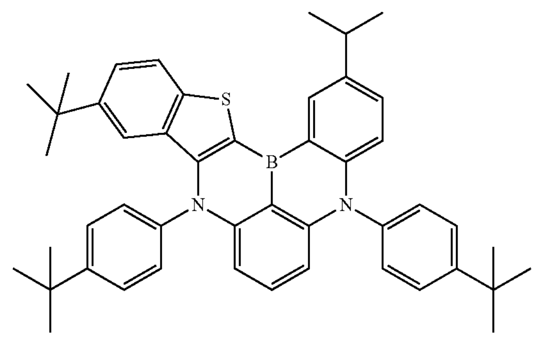
[Chemical Formula 184]
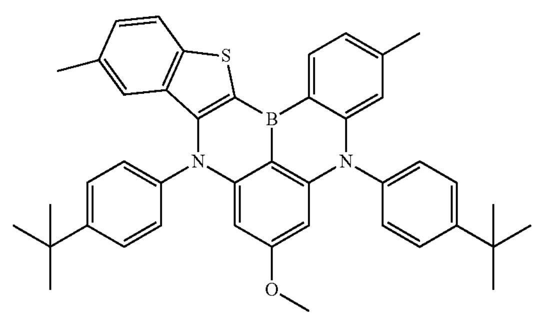
[Chemical Formula 185]
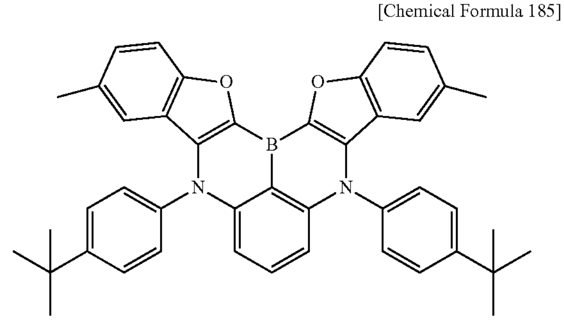

[Chemical Formula 186]
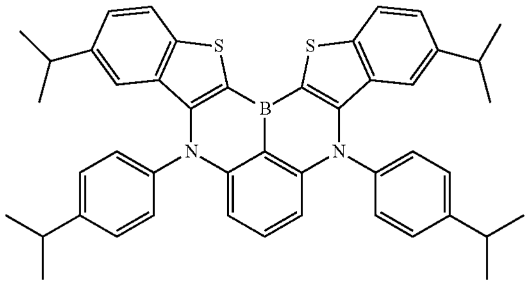
[Chemical Formula 187]
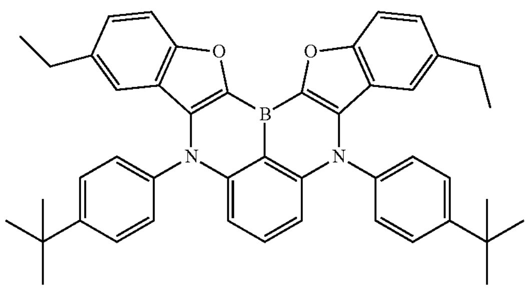
[Chemical Formula 188]
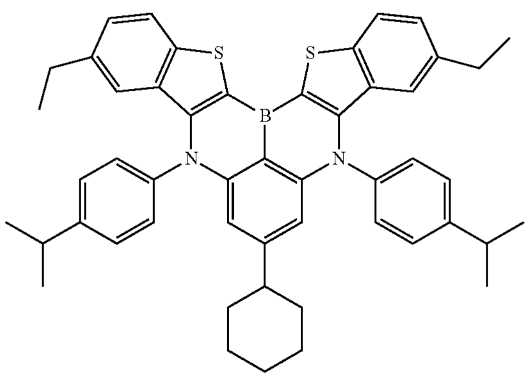
[Chemical Formula 189]
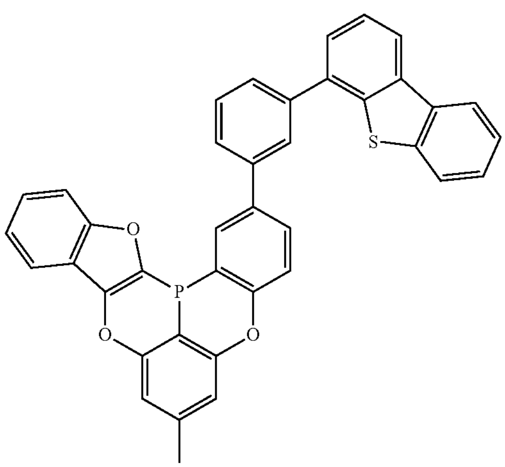
[Chemical Formula 190]
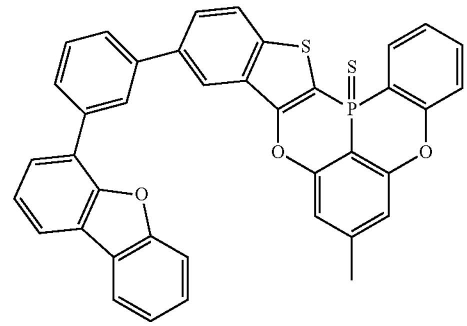
[Chemical Formula 191]
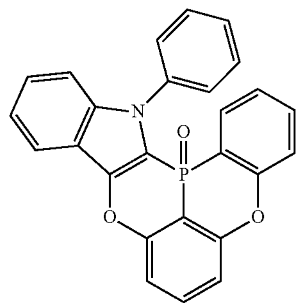
[Chemical Formula 192]
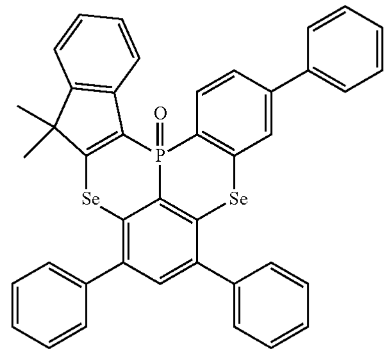
[Chemical Formula 193]
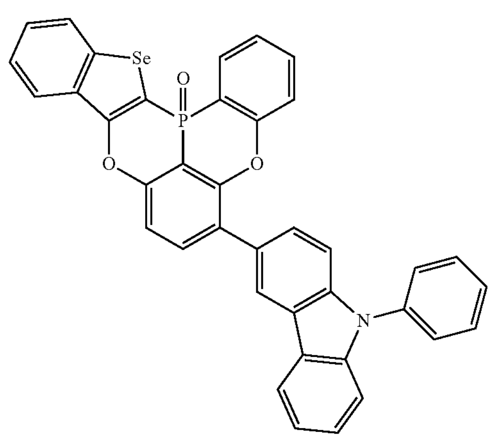

-continued
[Chemical Formula 194]
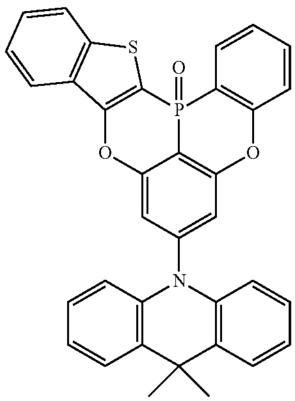
[Chemical Formula 195]
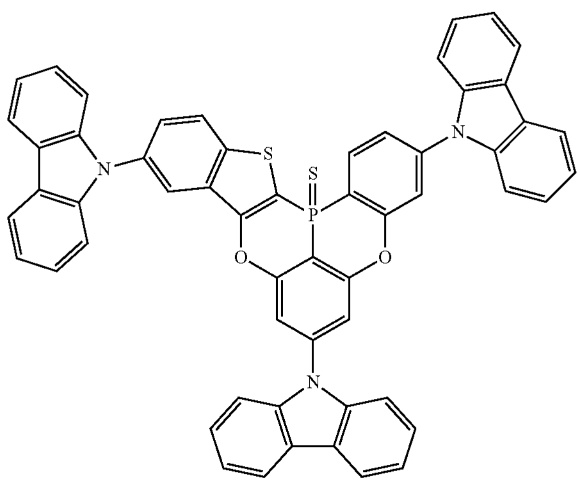
[Chemical Formula 196]
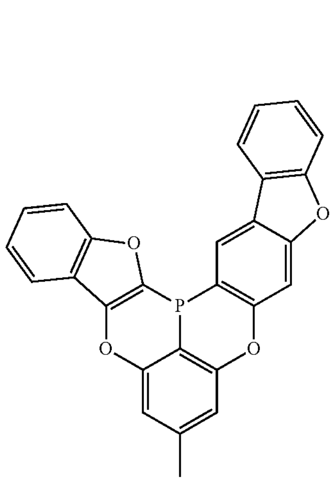
-continued
[Chemical Formula 197]
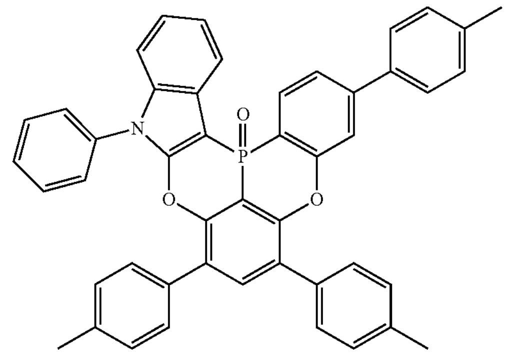
[Chemical Formula 198]
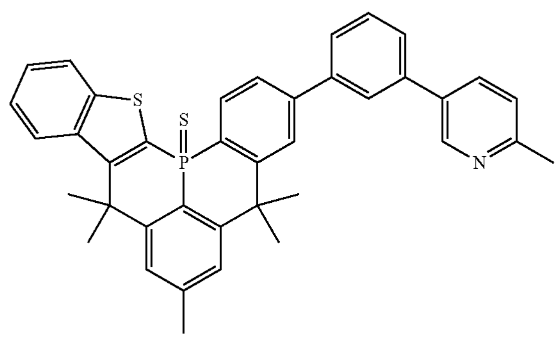
[Chemical Formula 199]
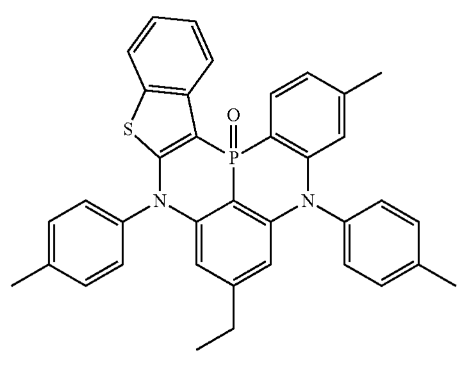
[Chemical Formula 200]
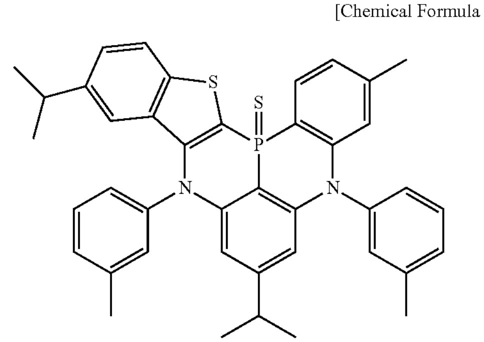

-continued

[Chemical Formula 201]

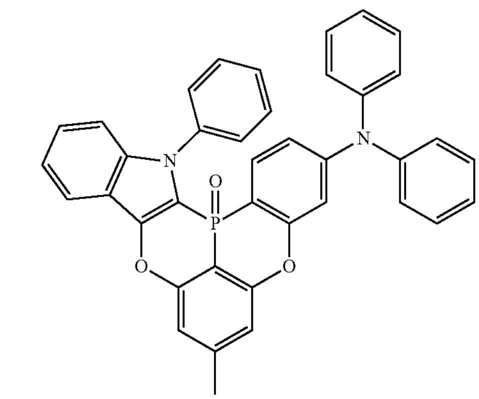

[Chemical Formula 202]

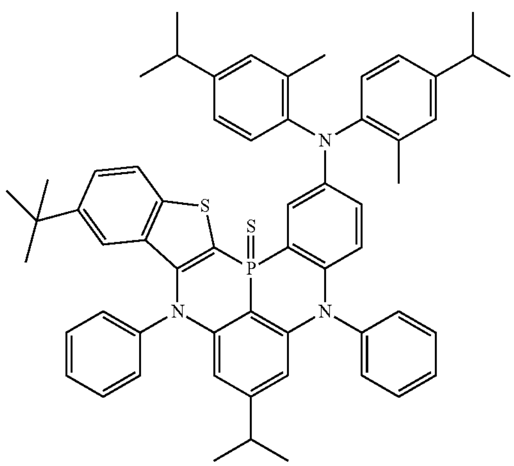

[Chemical Formula 203]

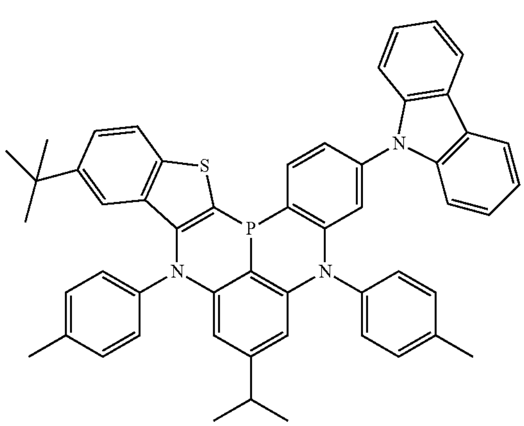

-continued

[Chemical Formula 204]

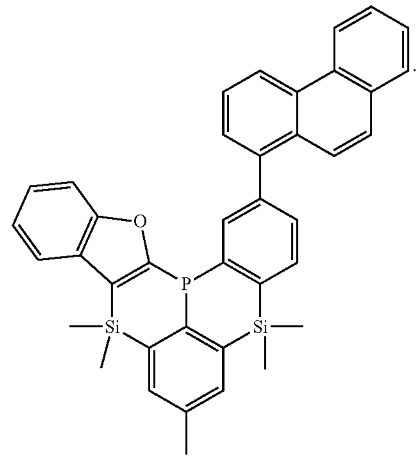

14. The light emitting diode of claim 1, wherein the compound represented by Chemical Formula H is used as a host in the light emitting layer and the compound represented by Chemical Formula A or B is used as a dopant in the light emitting layer.

15. The light emitting diode of claim 14, further comprising at least one of a hole injection layer, a hole transport layer, a functional layer capable of both hole injection and hole transport, an electron transport layer, and an electron injection layer, in addition to the light-emitting layer.

16. The light emitting diode of claim 1, wherein $Ar_9$ is a deuterium-substituted or unsubstituted phenyl, and $R_{11}$ to $R_{18}$ are same or different and are each independently a hydrogen atom or a deuterium atom, in Chemical Formula H.

17. The light emitting diode of claim 16, wherein the anthracene derivative represented by Chemical Formula H is deuterated at a degree of deuteration of 30% or greater.

18. The light emitting diode of claim 17, wherein the anthracene derivative represented by Chemical Formula H has a degree of deuteration of 40% or greater.

19. The light emitting diode of claim 16, wherein all of the carbon aromatic ring members of Arg in Chemical Formula H are deuterated.

20. The light emitting diode of claim 16, wherein $R_{11}$ to $R_{14}$ or $R_{15}$ to $R_{18}$ in Chemical Formula H are each a deuterium atom.

21. The light emitting diode of claim 16, wherein $R_{11}$ to $R_{18}$ in Chemical Formula H are each a deuterium atom.

22. The light emitting diode of claim 1, wherein at least one of $R_{23}$ to $R_{26}$ in Chemical Formula H is a deuterium-substituted aryl of 6 to 20 carbon atoms.

23. The light emitting diode of claim 1, wherein the linker $L_{13}$ in Chemical Formula H is a single bond.

24. The light emitting diode of claim 1, wherein the anthracene derivative in Chemical Formula H is any one selected from the following Compounds 1 to 78:

-continued
<Compound 1>
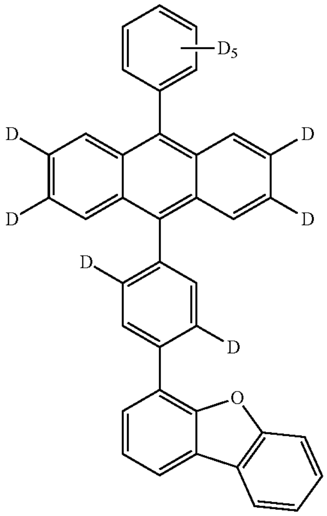
<Compound 2>
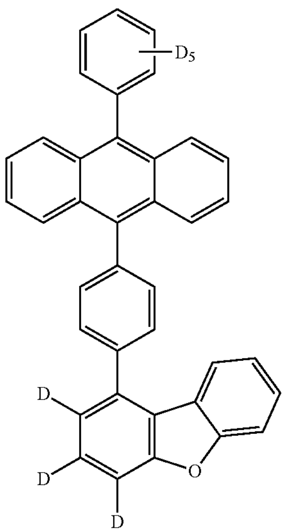
<Compound 3>
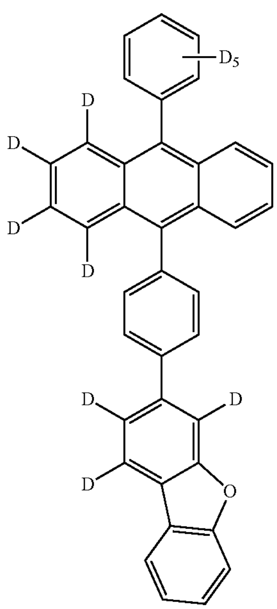
<Compound 4>
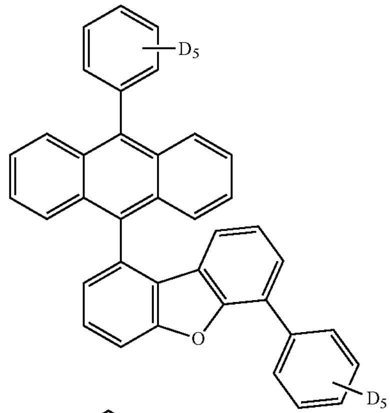
<Compound 5>
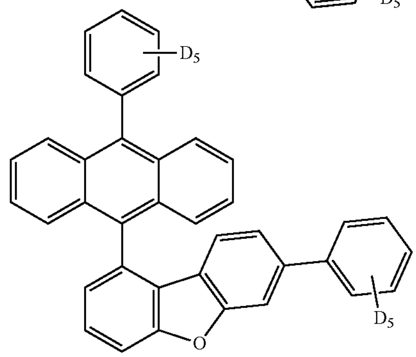
<Compound 6>
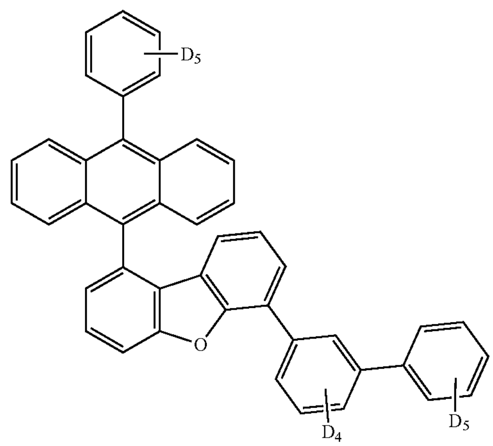
<Compound 7>
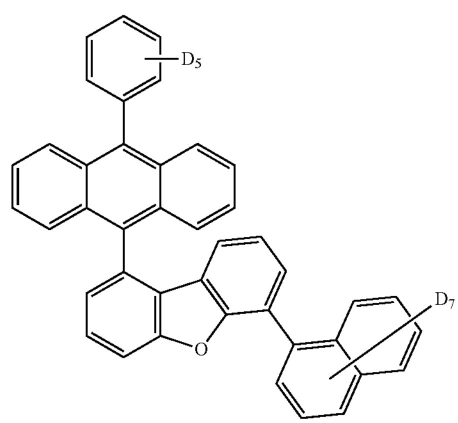

-continued
<Compound 8>
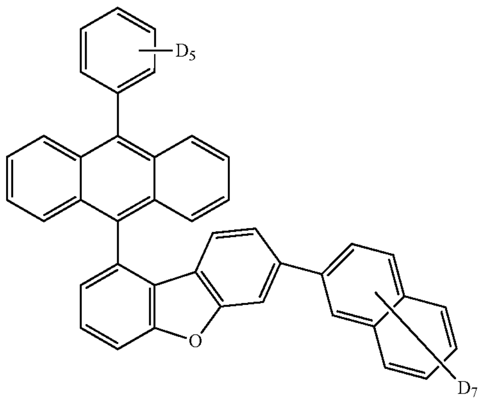
<Compound 9>
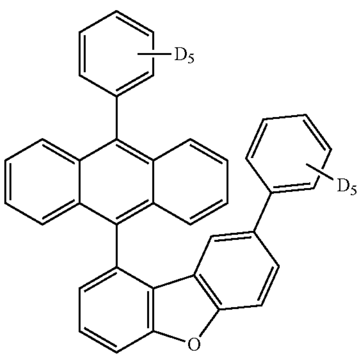
<Compound 10>
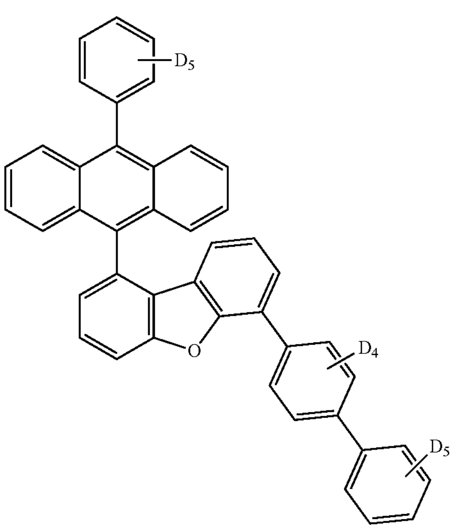
-continued
<Compound 11>
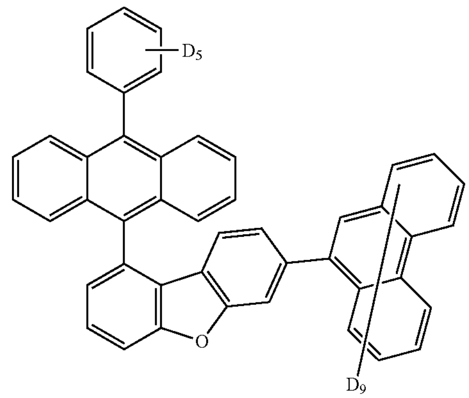
<Compound 12>
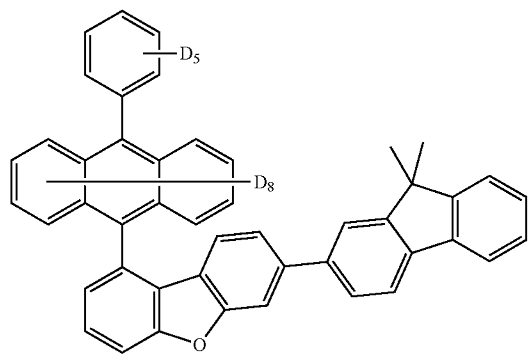
<Compound 13>
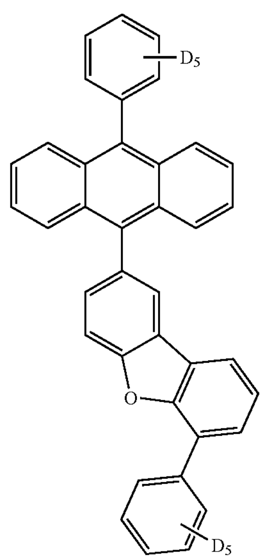

-continued
<Compound 14>
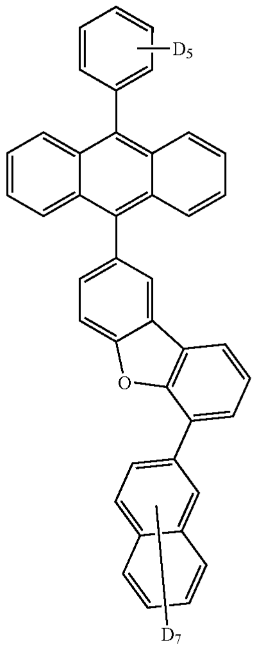
<Compound 15>
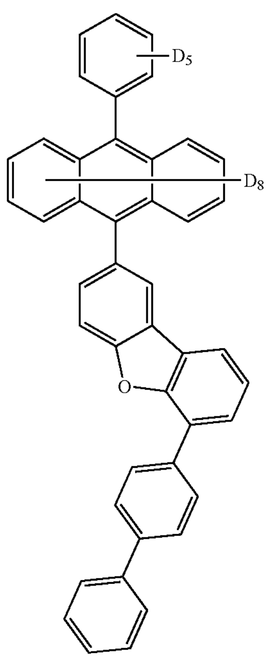
-continued
<Compound 16>
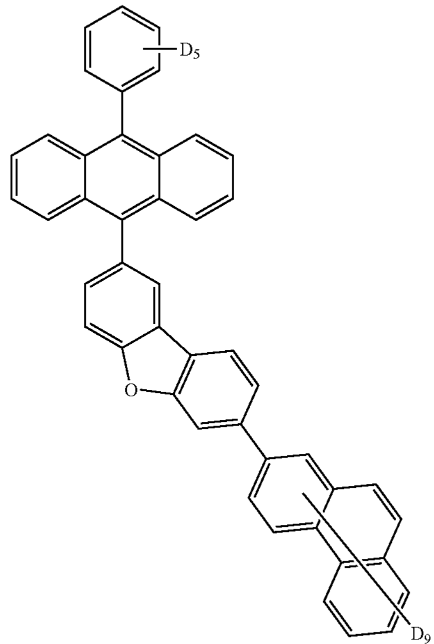
<Compound 17>
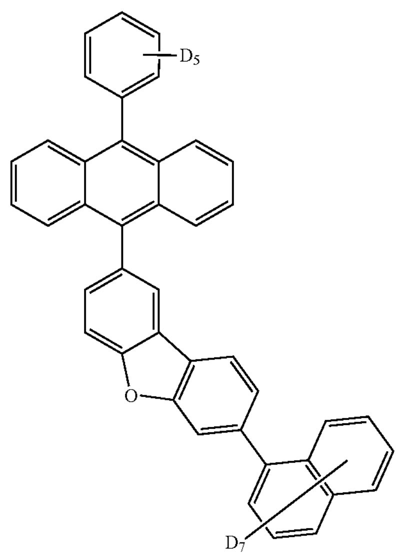
<Compound 18>
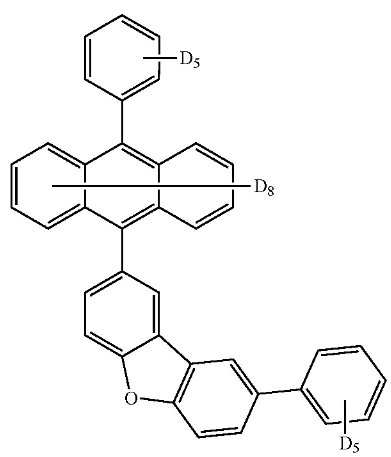

-continued
<Compound 19>
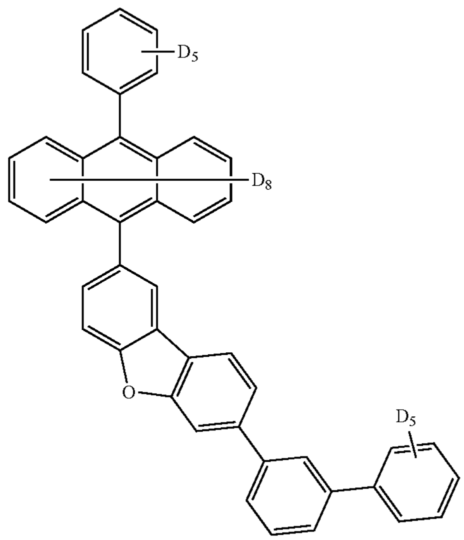
<Compound 20>
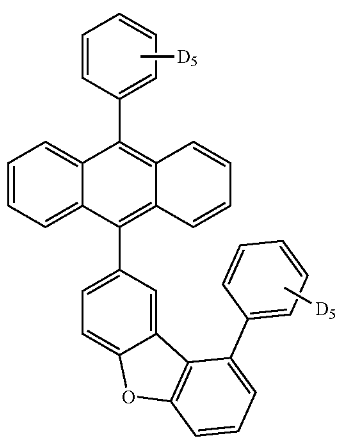
<Compound 21>
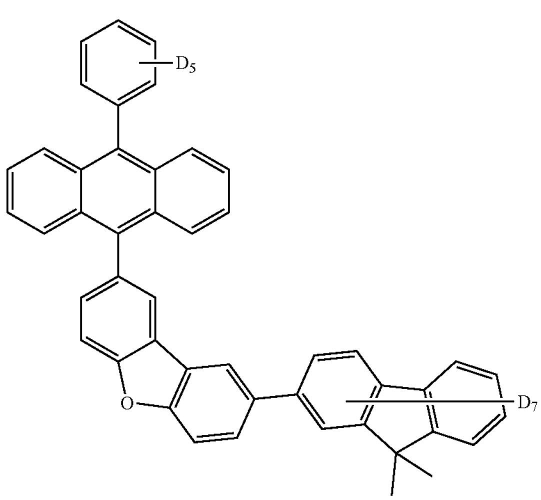
-continued
<Compound 22>
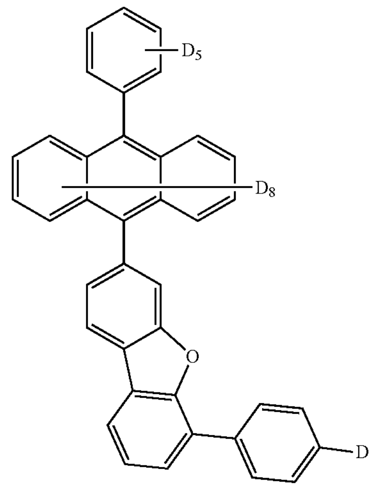
<Compound 23>
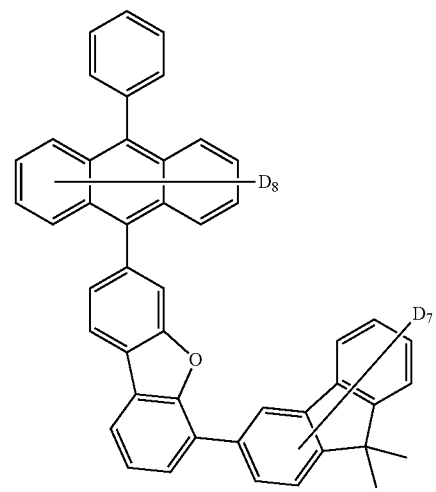
<Compound 24>
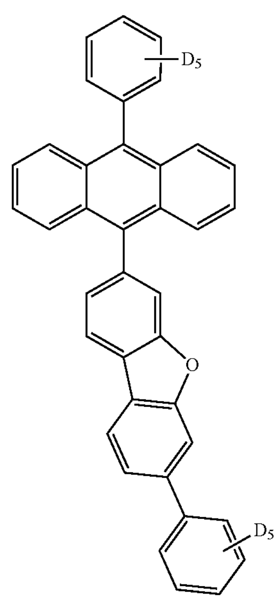

<Compound 25>
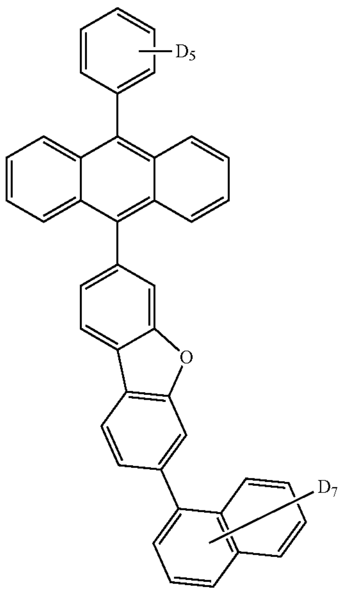
<Compound 26>
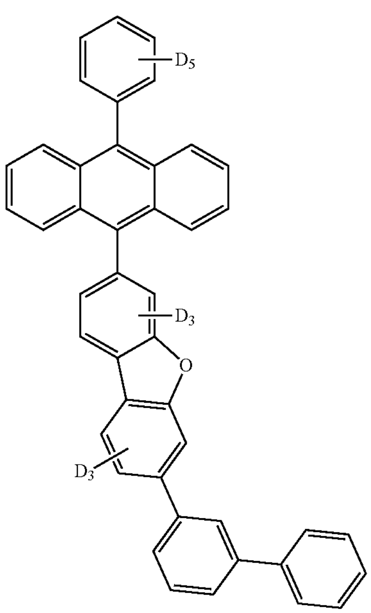
<Compound 27>
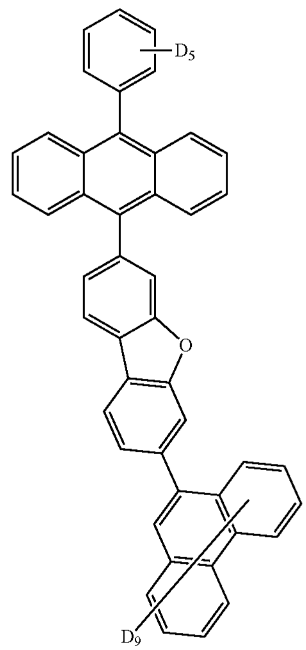
<Compound 28>
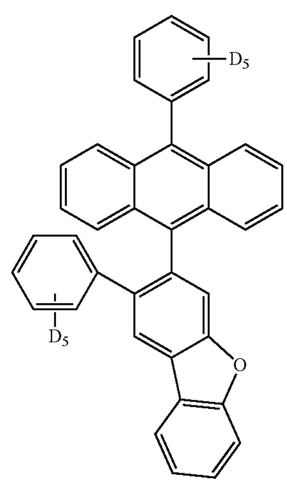

-continued
<Compound 29>
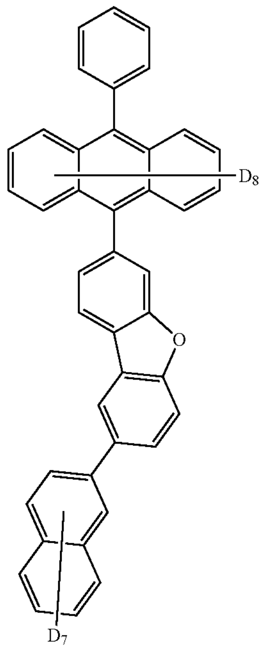
<Compound 30>
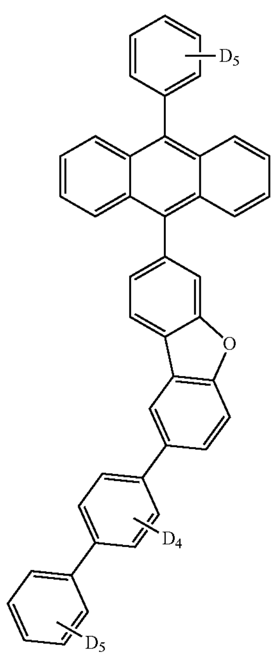
-continued
<Compound 31>
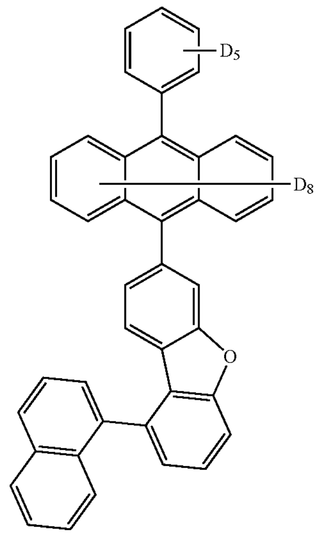
<Compound 32>
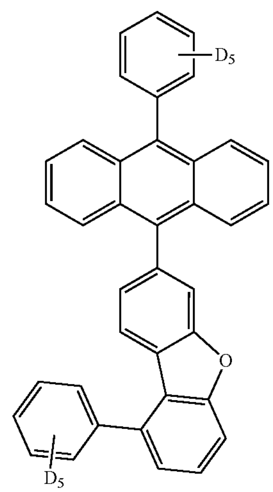
<Compound 33>
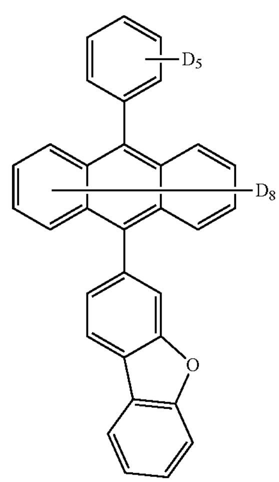

-continued
<Compound 34>
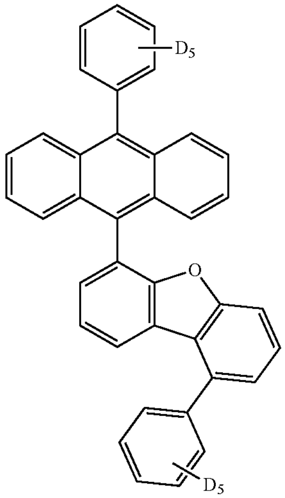
<Compound 35>
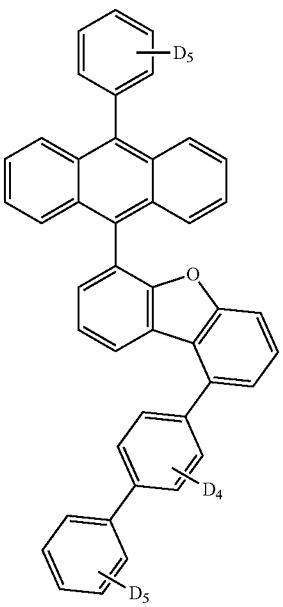
<Compound 36>
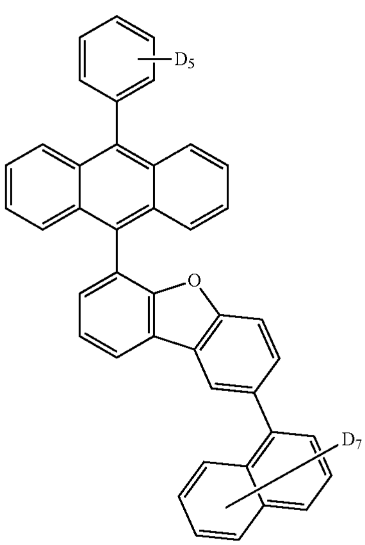
-continued
<Compound 37>
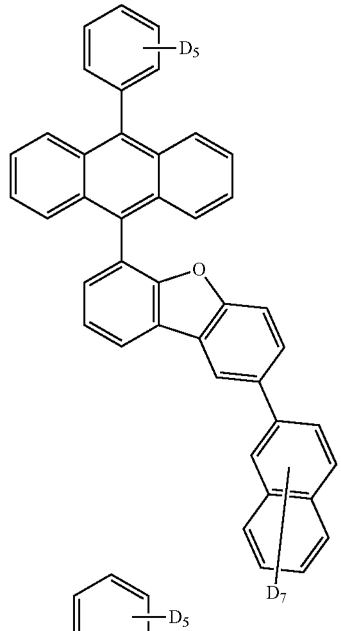
<Compound 38>
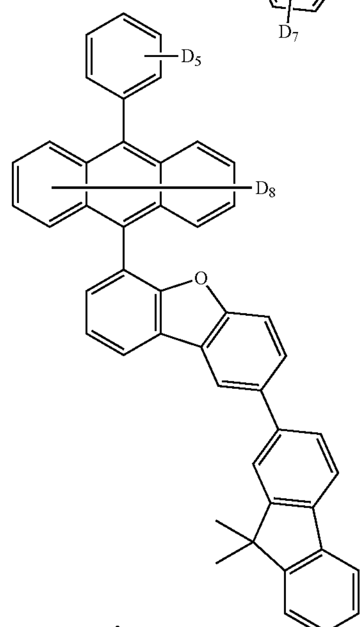
<Compound 39>
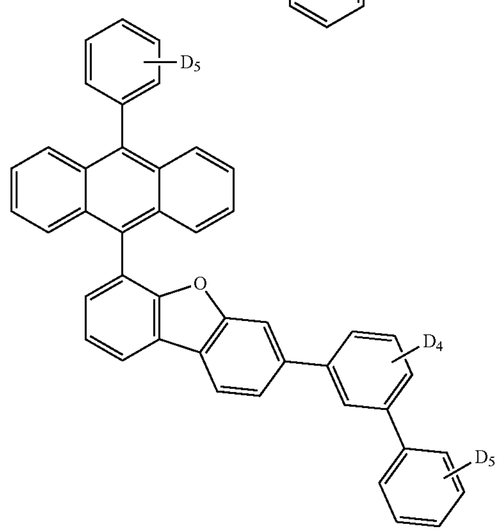

-continued
<Compound 40>
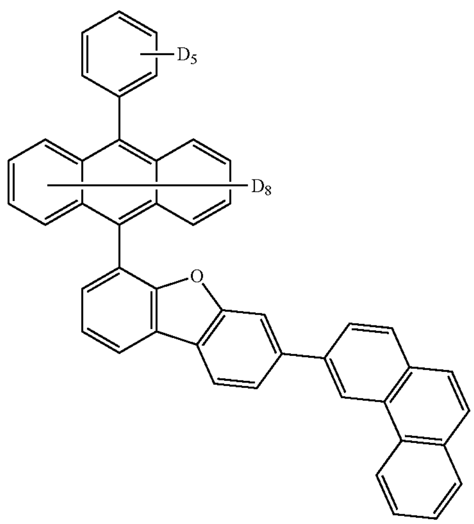
<Compound 41>
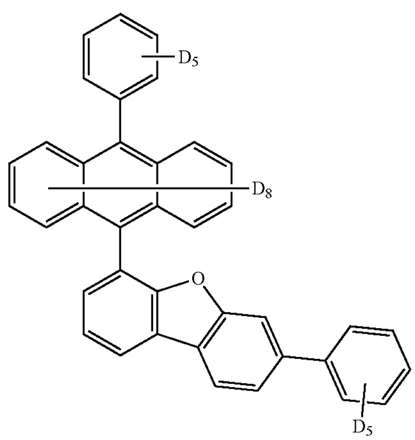
<Compound 42>
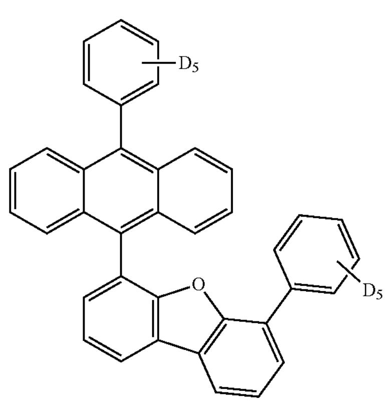
-continued
<Compound 43>
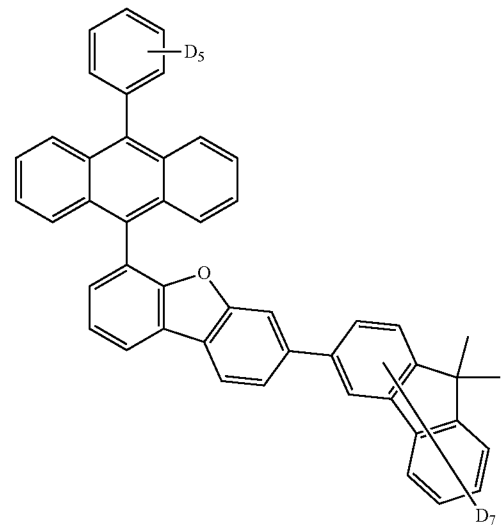
<Compound 44>
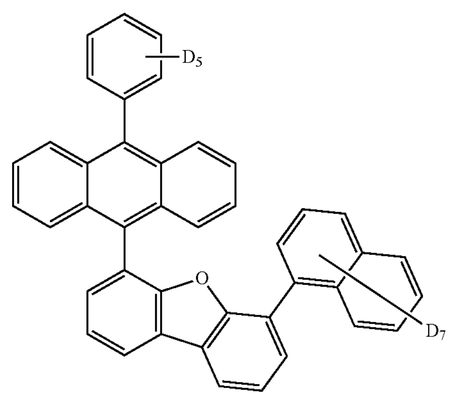
<Compound 45>
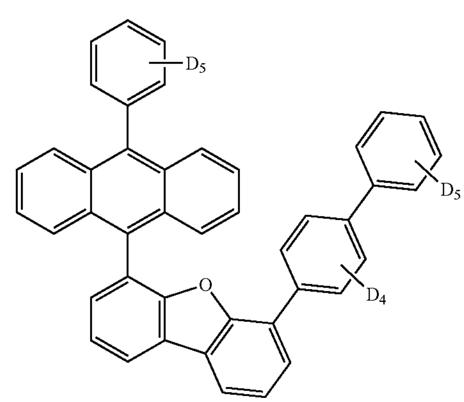

-continued
<Compound 46>
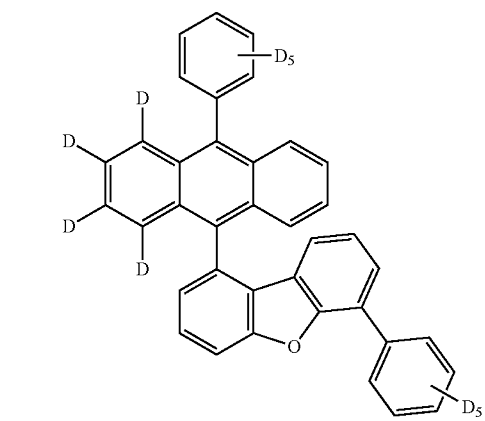
<Compound 47>
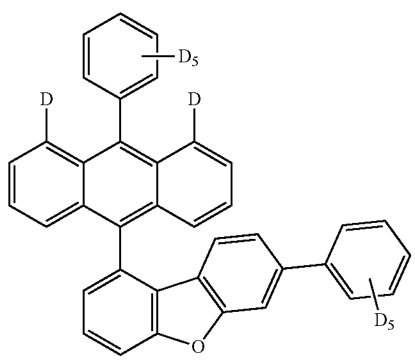
<Compound 48>
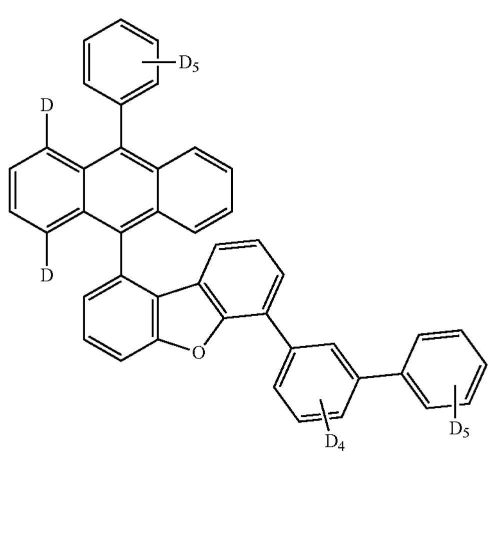
-continued
<Compound 49>
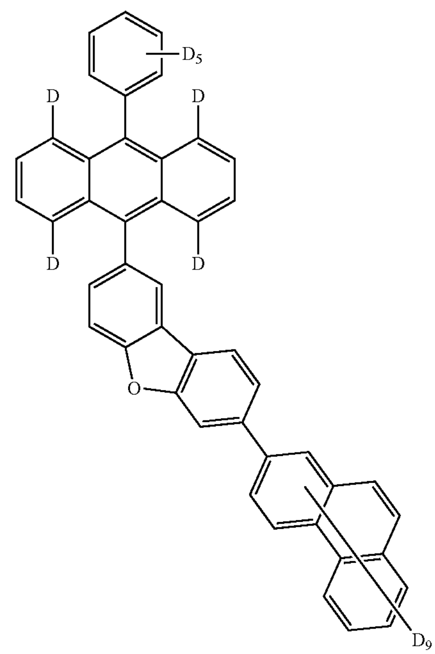
<Compound 50>
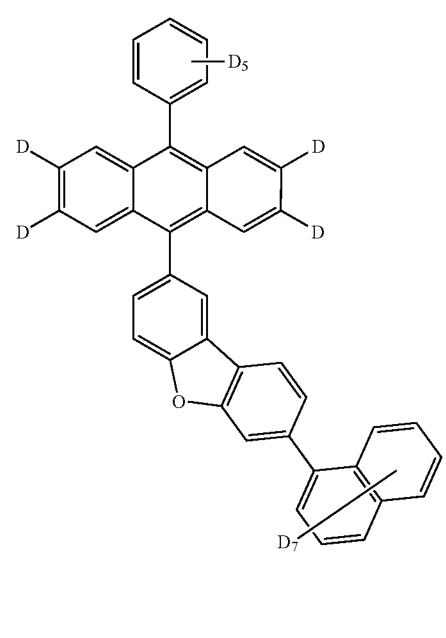

-continued
<Compound 51>
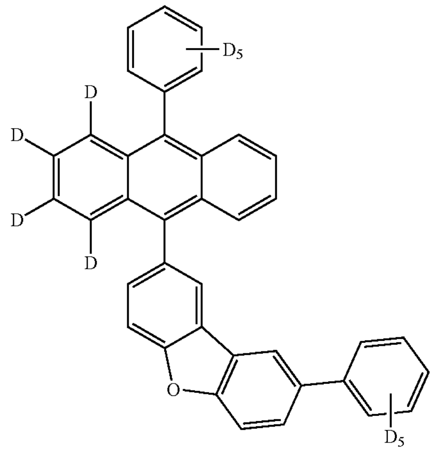
<Compound 52>
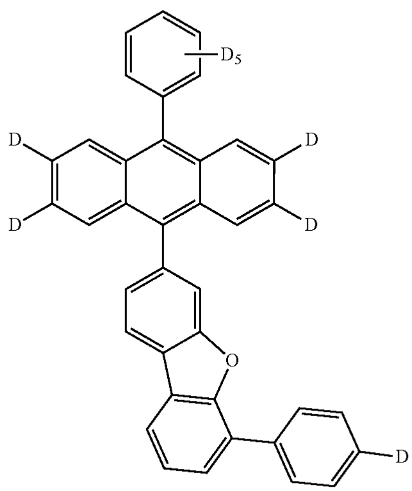
<Compound 53>
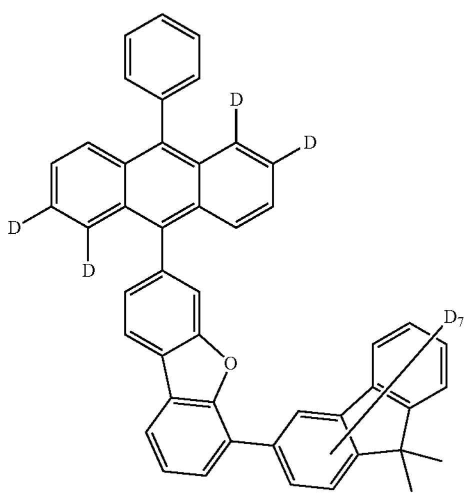
-continued
<Compound 54>
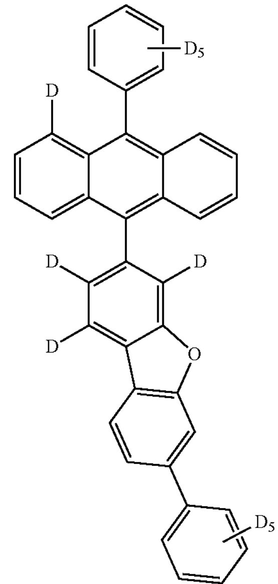
<Compound 55>
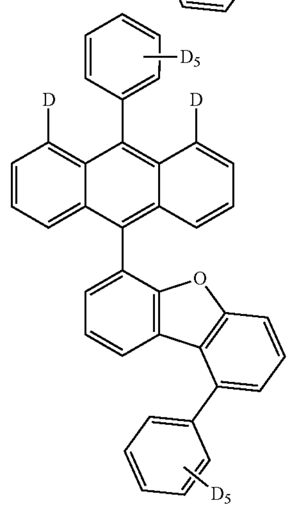
<Compound 56>
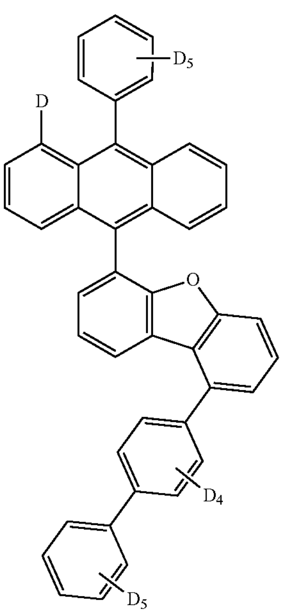

-continued
<Compound 57>
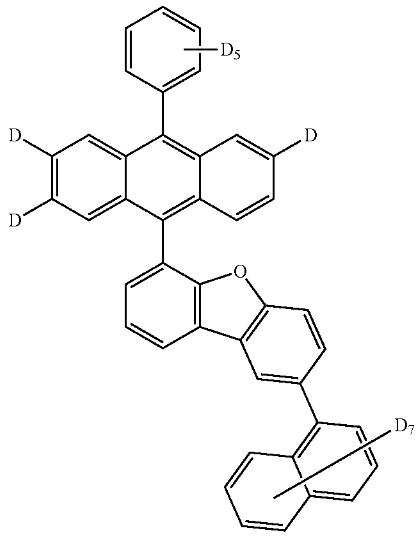
<Compound 58>
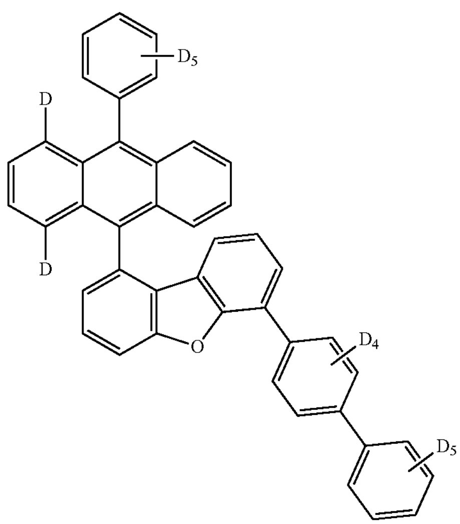
<Compound 59>
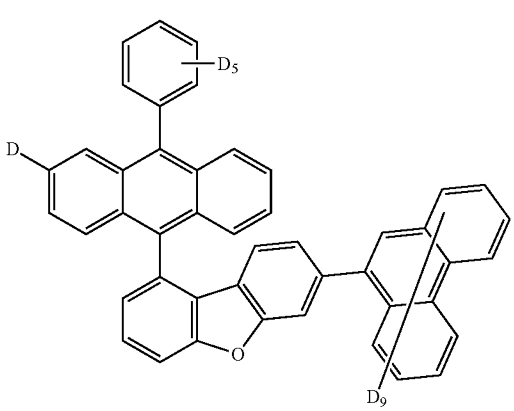
-continued
<Compound 60>
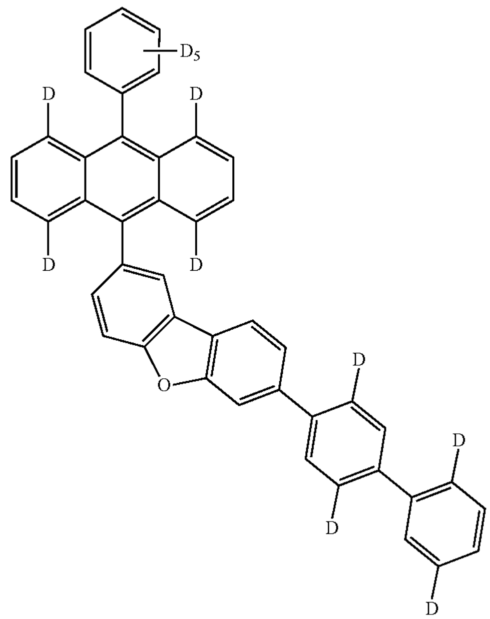
<Compound 61>
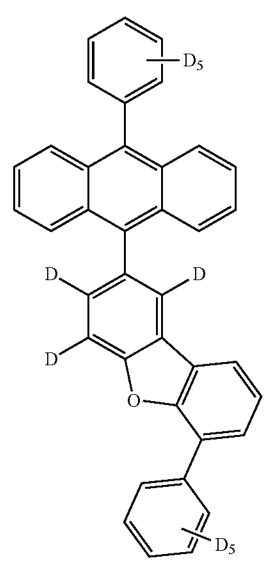

-continued
<Compound 62>
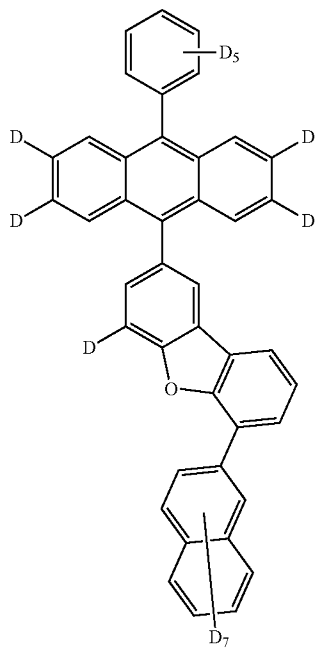
<Compound 63>
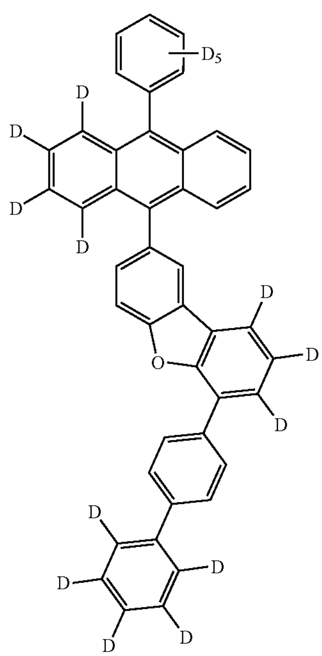
-continued
<Compound 64>
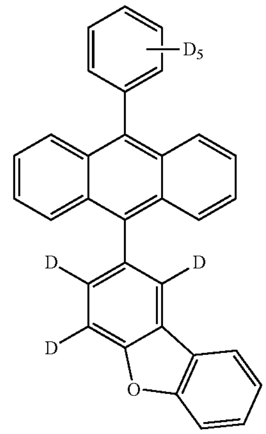
<Compound 65>
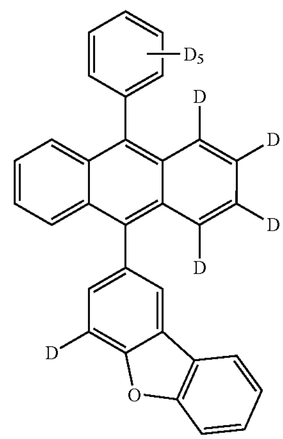
<Compound 66>
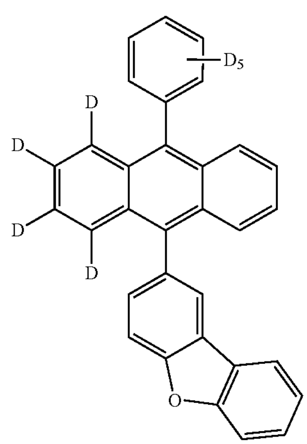

-continued
<Compound 67>
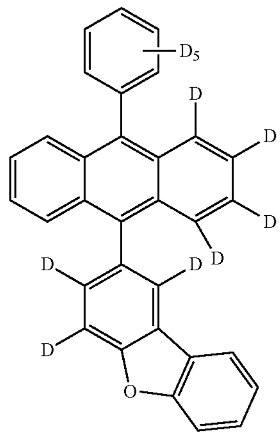
<Compound 68>
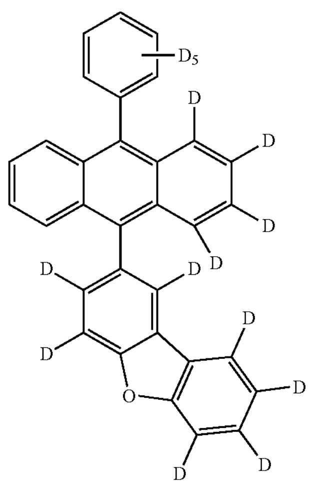
<Compound 69>
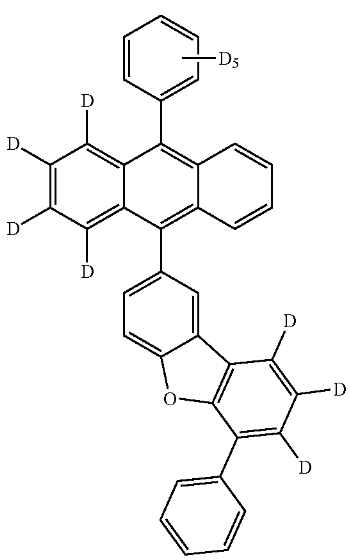
-continued
<Compound 70>
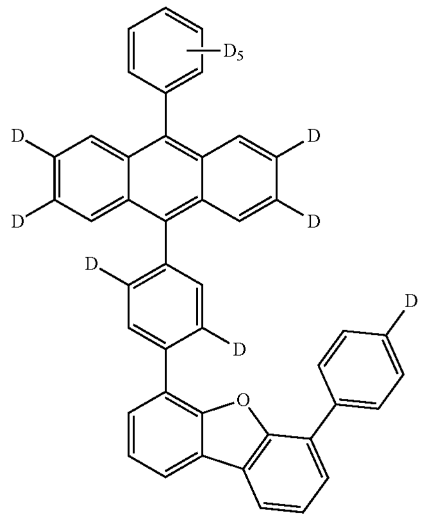
<Compound 71>
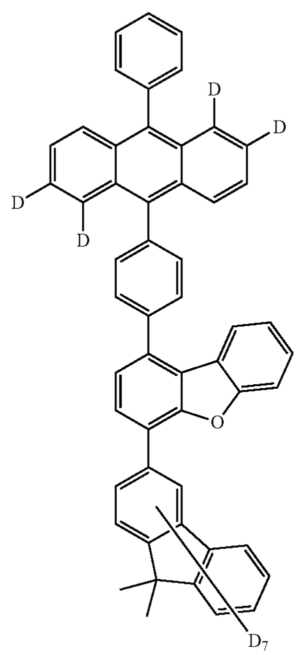

-continued
<Compound 72>
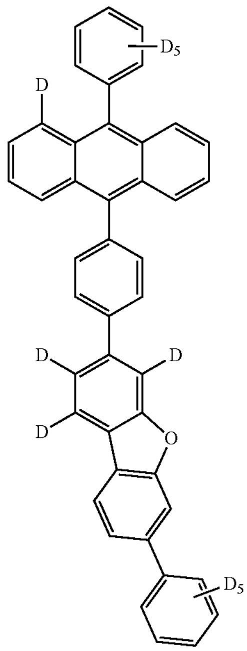
<Compound 73>
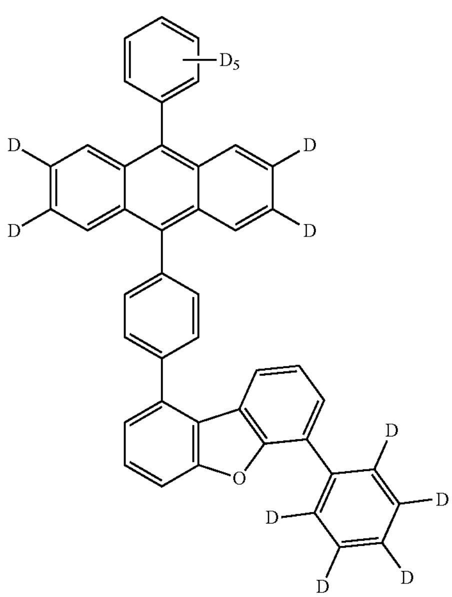
-continued
<Compound 74>
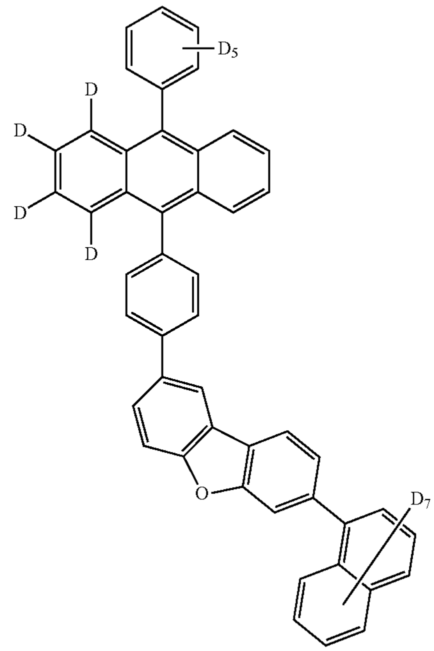
<Compound 75>
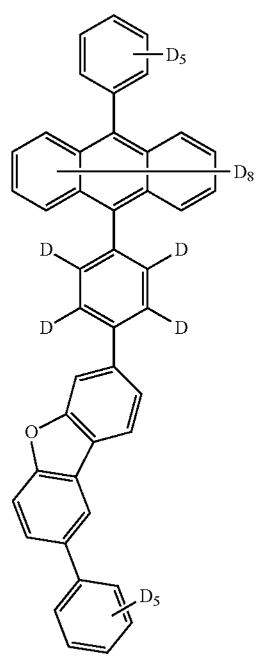

-continued

<Compound 76>

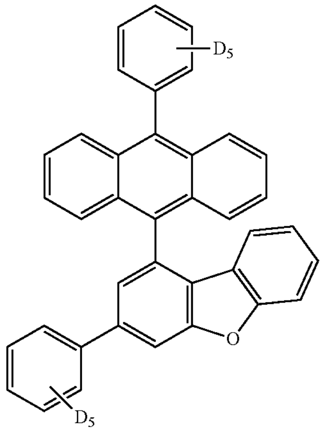

<Compound 77>

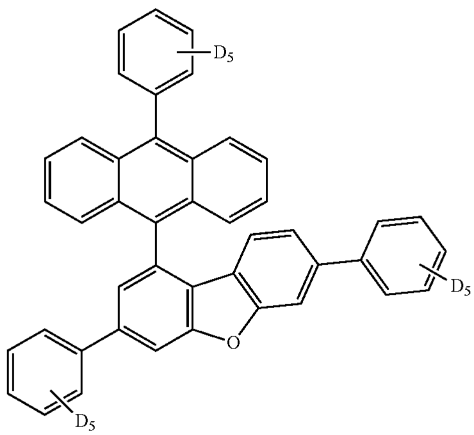

-continued

<Compound 78>

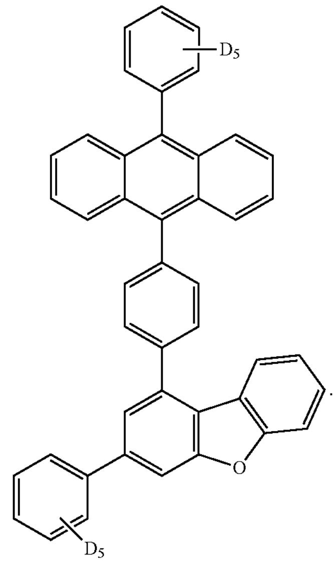

25. The light emitting diode of claim 15, wherein at least one of the layers is formed using a deposition process or a solution process.

26. The light emitting diode of claim 1, wherein the organic light-emitting diode is used for a device selected from among a flat display device; a flexible display device; a monochrome or white flat illumination device; and a monochrome or white flexible illumination device.

* * * * *